US005675330A

United States Patent [19]

McLaughlin

[11] Patent Number: 5,675,330

[45] Date of Patent: Oct. 7, 1997

[54] M=5(4,11)RUNLENGTH LIMITED CODE FOR MULTI-LEVEL DATA

[75] Inventor: Steven W. McLaughlin, Rochester, N.Y.

[73] Assignee: Optex Corporation, Rockville, Md.

[21] Appl. No.: 440,235

[22] Filed: May 12, 1995

[51] Int. Cl.[6] .......... H03M 5/02

[52] U.S. Cl. .......... 341/59; 341/56

[58] Field of Search .......... 341/56, 57, 59; 375/264, 340; 360/41, 46; 371/43

[56] References Cited

U.S. PATENT DOCUMENTS

| | | | |
|---|---|---|---|
| 4,413,251 | 11/1983 | Adler et al. | 341/59 |
| 4,463,344 | 7/1984 | Adler et al. | 341/59 |
| 4,488,142 | 12/1984 | Franaszek | 341/59 |
| 4,506,252 | 3/1985 | Jacoby et al. | 341/57 |
| 4,566,044 | 1/1986 | Langdon, Jr. et al. | 360/40 |
| 4,691,193 | 9/1987 | Khu | 341/59 |
| 4,760,378 | 7/1988 | Iketani et al. | 341/59 |
| 4,864,536 | 9/1989 | Lindmayer | 365/119 |
| 4,870,414 | 9/1989 | Karabed et al. | 341/57 |
| 4,882,583 | 11/1989 | Dimitri et al. | 341/59 |
| 4,914,438 | 4/1990 | Kameyama | 341/59 |
| 4,928,187 | 5/1990 | Rees | 360/40 |
| 4,949,196 | 8/1990 | Davie et al. | 360/40 |
| 5,047,767 | 9/1991 | Weathers et al. | 341/59 |
| 5,099,237 | 3/1992 | Fitingof | 341/59 |
| 5,136,573 | 8/1992 | Kobayashi | 369/116 |
| 5,142,493 | 8/1992 | Lindmayer | 365/119 |
| 5,163,039 | 11/1992 | Lindmayer | 369/100 |
| 5,173,694 | 12/1992 | Lynch, Jr. et al. | 341/59 |
| 5,196,849 | 3/1993 | Galbraith | 341/59 |
| 5,260,703 | 11/1993 | Nguyen et al. | 341/100 |
| 5,271,016 | 12/1993 | Hilden et al. | 371/37.1 |
| 5,287,228 | 2/1994 | Sawaguchi et al. | 360/57 |
| 5,329,512 | 7/1994 | Fukimoto et al. | 369/121 |
| 5,390,198 | 2/1995 | Higgins | 371/43 |
| 5,398,260 | 3/1995 | Min | 375/286 |
| 5,400,313 | 3/1995 | Belser et al. | 369/116 |

OTHER PUBLICATIONS

Siegel, Paul H., "Recording Codes For Digital Magnetic Storage," *IEEE Transactions On Magnetics*, vol. 21, No. 5, pp. 1344–1349, Sep. 1985.

Kobayashi, H. et al., "Application of Partial-response Channel Coding to Magnetic Recording Systems," IBM J. Res. Develop., pp. 368–375, Jul. 1970.

Lindmayer, Dr. Joseph et al., "Electron Trapping Optical Technology—Memory's Next Generation?," *Computer Technology Review*, Summer, 1990.

Earman, Allen, "Optical Data Storage With Electron Trapping Materials Using M-ary Data Channel Coding," *Proceedings of the Optical Data Storage Conference*, SPIE, Feb. 1992, San Jose, California.

Forney, Jr., G. David et al., "Coset Codes For Partial Response Channels; or, Coset Codes With Spectral Nulls," *IEEE Transactions on Information Theory*, vol. 35, No. 5, Sep. 1989, pp. 925–943.

(List continued on next page.)

*Primary Examiner*—Marc S. Hoff

*Attorney, Agent, or Firm*—Sterne, Kessler, Goldstein & Fox P.L.L.C.

[57] ABSTRACT

A system for encoding digital data with an M-ary (d,k) code to provide multi-level coded data where M>2 comprises an M-ary (d,k) encoder for accepting digital input data. The M-ary (d,k) coder encodes the digital input data to produce a plurality of code symbols, where each code symbol is at one of M levels and each pair of non-zero code symbols is separated by at least d but no more than k zeros. A waveform encoder converts the code symbols into waveform signal amplitudes compatible with a multi-level channel. Each waveform signal amplitude is generated by modulo M addition of a current code symbol with a previous waveform signal amplitude. A specific M=5 (4,11) code provides high density recording to a multi-level storage medium. The M=5 (4,11) encoder is implemented using a 22-state encoder and a modulo five waveform encoder.

12 Claims, 3 Drawing Sheets

OTHER PUBLICATIONS

Laroia, Rajiv et al., "A Simple and Effective Precoding Scheme for Noise Whitening on Intersymbol Interference Channels," *IEEE Transactions on Communications*, vol. 41, No. 10, Oct. 1993, pp. 1460–1463.

McLaughlin, Steven et al., "M–ary Runlength Limited Codes for High Density Optical Recording," 1994 *Int'l Symposium on Information Theory*, Trondheim, Norway, Jun. 1994.

McLaughlin, Steven, "Improved Distance M–ary (d,k) Codes for High Density Recording," Rochester Institute of Technology, Rochester, New York, 1994.

Ungerboeck, Gottfried, "Trellis–Coded Modulation with Redundant Signal Sets, Part I: Introduction," *IEEE Communications Magazine*, vol. 25, No. 2, pp. 5–11, Feb. 1987.

Ungerboeck, Gottfried, "Trellis–Coded Modulation with Redundant Signal Sets, Part II: State of the Art," *IEEE Communications Magazine*, vol. 25, No. 2, pp. 12–21, Feb. 1987.

Marcus, Brian et al., "Finite–State Modulation Codes for Data Storage," *IEEE Journal On Selected Areas In Communications*, vol. 10, No. 1, pp. 5–37, Jan. 1992.

Adler, Roy et al., "Algorithms for Sliding Block Codes," *IEEE Transactions in Information Theory*, vol. IT–29, No. 1, pp. 5–22, Jan. 1983.

Forney, Jr., G. David et al., "Combined Equalization and Coding Using Precoding," *IEEE Communications Magazine*, pp. 25–34, Dec. 1991.

McLaughlin, Steven et al., "Modulation Codes for Multi–amplitude Optical Recording Channels," Rochester Institute of Technology, Rochester, New York, paper presented Nov. 1994.

A.B. Marchant, *Optical Recording, A Technical Overview*, Addison–Wesley, Reading, MA, 1990.

M. Tomlinson, "New Automatic Equalizer Employing Modulo Arithmetic," *Electronic Letters*, vol. 7, Nos. 5–6, pp. 138–139, Mar. 25, 1971.

G. Ungerboeck, "Channel Coding With Multilevel/Phase Signals," *IEEE Trans. on Information Theory*, vol. IT–28, No. 1, pp. 55–67, Jan., 1982.

S. W. McLaughlin, "Improved Distance M–ary (d,k) Codes for High Density Recording," Rochester Institute of Technology, Rochester, NY, Jun., 1994.

S. W. McLaughlin et al., "Full Digital Video Read Write Disk Drive Using M–ary Coding," Rochester, Date Unknown.

Brita H. Olson et al., "Multidimensional Partial Response For Parallel Readout Optical Memories," *SPIE*, vol. 2297, pp. 331–337, May, 1994.

M=5(4,11)RUNLENGTH LIMITED CODE FOR MULTI-LEVEL DATA

BACKGROUND OF THE INVENTION

1. Field of the Invention

The present invention relates generally to multi-level coding techniques, and more specifically to a system and method for coding data using an M=5 (4,11) runlength limited code, such code being particularly useful for storing and/or transmitting multi-level data.

2. Related Art

Various techniques are currently in use for increasing the recording density on various digital recording mediums such as magnetic tapes and disks and in other similar media. One technique utilizes an approach known as run-length-limited coding. This technique requires that each "1" in a coded bit sequence must be separated by a specified number of "0's". This number of zeros must be at least a minimum quantity, d, to reduce intersymbol interference, and is limited to a maximum quantity k for self clocking purposes. Such codes are generally referred to as (d,k) run-length-limited (RLL) codes.

Because conventional recording techniques use saturation recording to store information, binary recording techniques are often used to mark the recording medium. As a result, conventional (d,k) RLL codes developed to date are developed and optimized to store binary data.

Significant advances in data storage materials have lead to the development of a storage medium that provides a linear response characteristic. One such material providing a linear response characteristic is an electron trapping material such as is disclosed in U.S. Pat. Nos. 4,864,536, 5,007,037, and 5,142,493, all to Lindmayer.

Using a material which provides a linear response characteristic yields an advantage over saturation-type media in that it adds an analog dimension to the storage capacity of the medium. Because the response is linear, the linear-response storage materials provide the ability to encode information in two dimensions—amplitude and phase.

As a result, the storage medium is no longer confined to storing binary or even tri-level data. Instead, the concept of M-ary, or non-binary, data coding and storage is provided. The increased symbol set allowed by such encoding provides the opportunity to dramatically increase the data recording density and transfer rate of the storage device. For example, the potential storage capacity of a single 5¼ inch disk can be extended to several gigabytes if that disk is implemented using electron trapping materials with M-ary (multi-level) data coding.

SUMMARY OF THE INVENTION

The present invention is directed toward an M=5 (4,11) runlength-limited code for multi-level data storage and/or communications. Also disclosed herein is a system and method for generating multi-level data from a binary input data stream using an M-ary (d,k) code such as the M=5 (4,11) runlength limited code.

According to the invention input data bits are coded using an M-ary (d,k) encoder to generate code symbols. Specifically, input data bits x are encoded using the M-ary (d,k) encoder to generate code symbols y, where:

$$x=(x_0, x_1 \ldots x_{p-1})$$

for p input data bits $$y=(y_0, y_1, \ldots y_{q-1}),$$

where p/a= the code rate R

The code symbols y are multi-level symbols, each being at one of M levels. The code symbol stream provided meets the code specifications of no fewer than d and no greater than k zeros between each non-zero symbol. Thus, according to the M=5 (4,11) code disclosed herein, code symbols are each at one of five levels and there is a minimum of four and a maximum of eleven zeros between each non-zero symbol.

The code symbols y are encoded to generate a series of waveform amplitudes z. The waveform amplitudes are generated by modulo M addition of the current code symbol $y_i$ with the previous waveform amplitude $z_{i-}$. The waveform amplitudes are used to modulate a write laser to store information onto an optical disk or to otherwise store or communicate the input data bits x in the form of multi-level information.

To recover the original data bits x from the medium, the information stored on the medium is read and the resultant signal amplitudes are decoded. Two stages of decoding are provided. In the first stage, the waveform amplitudes are decoded to generate code symbols. In the second stage, the code symbols are decoded to recover the original data bits.

The system and method described herein for coding and decoding the data is described with respect to the M=5 (4,11) code disclosed herein. However, while other codes may not be obvious in light of the code disclosed herein, given a specific M-ary (d,k) code, after reading the below disclosure, it will become apparent to a person skilled in the relevant art how the disclosed system and method can be implemented to code and decode the data using such a specific M-ary (d,k) code.

An advantage of the invention is that the recording density can be increased by coding the input data using the disclosed M=5 (4,11) code. Because there are at least d zeros between every non-zero code symbol, there can be at least d+1 symbols stored for a given minimum feature size. Given a code of rate R, the density achievable is (d+1)R.

It should be noted that the coding techniques described herein are not limited to optical recording. Other recording systems capable of supporting multi-level data would benefit from the coding techniques described herein. Additionally, these coding techniques are also applicable to communications systems where the communications channel is capable of supporting multi-level data. In such an implementation, the waveform amplitudes could be used to modulate a signal carrier for transmission across the multi-level channel.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

1. Introduction

Figure 1:
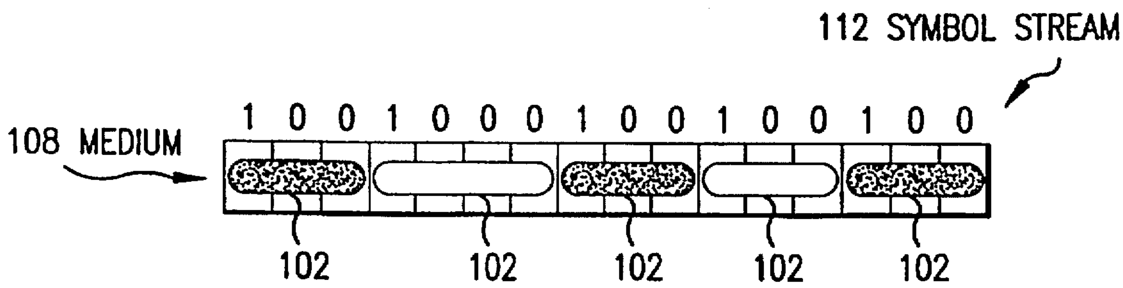
FIG. 1 is a diagram illustrating a portion of an optical storage medium and features thereon.

The present invention is directed toward an M-ary (d,k) code for use in storage and/or transmission of multi-level data, and a system and method for generating the same. This discussion is provided in several sections. In Section 2, before discussing the invention in detail, a brief discussion of binary (d,k) codes is presented. In Section 3, a coding system for coding input data using an M-ary (d,k) code is described. In Section 4, some code design factors are described. In Section 5, a specific M=5 (4,11) code is described that is particularly useful for storage and/or transmission of multi-level data. Section 5 also provides a detailed description of the encoder used to code data using the disclosed M=5 (4,11) code. In Section 6 there is presented a discussion of a sliding block decoder generally useful for decoding M-ary (d,k) codes, as well as a specific decoder for decoding the M=5 (4,11) code described in Section 4.

The present invention is generally described in terms of an embodiment where multi-level data are stored on and retrieved from an optical disk. In such an embodiment, the encoder and decoder described herein may be implemented for multi-level data storage in an optical disk system such as that disclosed in U.S. Pat. No. 5,007,037, which is incorporated herein by reference. However, after reading the below description, it will become apparent to a person skilled in the relevant art how the systems and methods of the invention can be implemented for alternative applications such as multi-level data communications and storage of multi-level data on media other than optical disks. In yet other alternative embodiments, the invention can be implemented to transmit and receive data across an M-ary communications channel. In this document, the term "channel" is sometimes used to refer to the optical disk. It should be understood that in the alternative embodiments the term channel can be used to describe alternative storage media and/or communications channels.

Additionally, after reading the below detailed description of the encoder and decoder of the present invention, it will become apparent to a person skilled in the art that these disclosed components can be implemented using hardware, software or a combination of both hardware and software.

2. Binary (d,k) Run-Length-Limited Coding

Using conventional binary storage techniques, data are written to a storage medium using binary 1's and 0's. Using run-length limited coding, the data to be recorded are first encoded using a run-length-limited encoder. As stated above, with a (d,k) RLL code, there is a minimum and a maximum number of 0's that can occur between each pair of 1's, as specified by the code parameters d and k. Thus, the (d,k) RLL encoder results in a 1 followed by at least d and at most k 0's before another 1 occurs. Such (d,k) RLL codes for binary applications are well known in the art.

To write input data to the saturation storage medium, the input dam are first encoded to create symbols. The encoder is designed such that the output symbols conform to the code specifications: each 1 is followed by a minimum of d and a maximum of k 0's. These symbols are then written to the storage medium as a series of features. For example, for optical disks, a feature is the presence or absence of a bum mark. In a magnetic tape, the feature is a grouping of magnetic particles oriented in a particular manner.

FIG. 1 illustrates a portion of an optical storage medium 108 that stores binary data as features 102. Illustrated are shaded and unshaded features 102, indicating the absence or presence of a burn mark. Also illustrated in FIG. 1 is an example symbol stream 112 that is used to write the features 102 to medium 108. As discussed above, symbol stream 112 is the result of encoding input data using a (d,k) RLL code. Symbol stream 112 is written to medium 108 using an additional coding step as follows: the occurrence of a 1 indicates a change in the type of mark (i.e., absence or presence of a burn mark); the occurrence of a 0 indicates no change in mark type. This additional coding step is sometimes referred to as non-return-to-zero interleaved (NRZI) precoding.

Note that with a (d,k) RLL code where d=2, the minimum number of symbols represented by a single feature 102 is three. Thus, for a minimum feature size (e.g., for the smallest spot size on medium 108) three symbols can be represented. As a result, for a rate ½ code, where each input bit corresponds to two symbols, the minimum density of data written to medium 108 is 1.5 bits per feature. Thus, as a result of using the (d,k) RLL coding in the described scenario, the density of the recording system can be increased by 50%.

3. A Generic M-ary Runlength-Limited (d,k) Coder

A few advantages of (d,k) coding are described above with reference to binary data systems. It is important to note that similar gains in density can be realized for storage and communications systems using multi-level (versus binary) data. To optimize such gains, however, new codes and new coding techniques are required to take full advantage of the unique properties of the multi-level data. Thus, the inventors have developed a system and method for encoding data using M-ary (d,k) codes.

Figure 2:
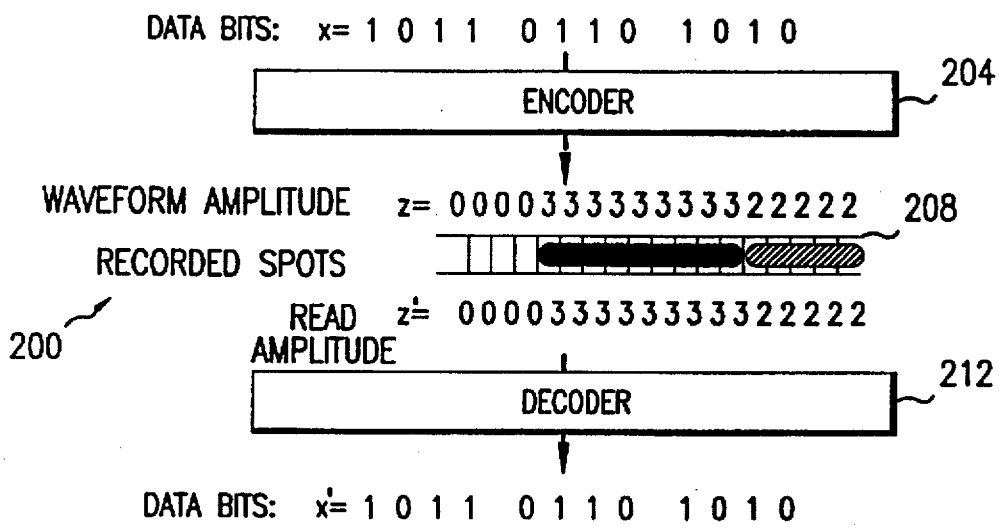
FIG. 2 is a diagram illustrating a data storage system for storing a multi-level coded data.

FIG. 2 is a high-level block diagram generally illustrating a multi-level data recording system 200. The recording system is comprised of an encoder 204, multi-level storage medium 208 and a decoder 212. As stated above, multi-level storage medium 208 can be replaced with a communications channel allowing the multi-level (d,k) code and coding scheme to be used with multi-level data communications. In such a communications embodiment, encoder 204 and decoder 212 can be provided on both ends of the communications channel to allow bi-directional coded communications.

According to the invention, input data bits $x=(x_0, x_1, \ldots, x_{p-1})$ are the actual data that a user wishes to be stored on and retrieved from medium 208. However, to take full advantage of the multi-level properties of medium 208 and to increase the storage density achieved, the invention provides for the encoding of input data x so that multi-level data is stored on medium 208. Such encoding is accomplished using encoder 204.

Figure 3:
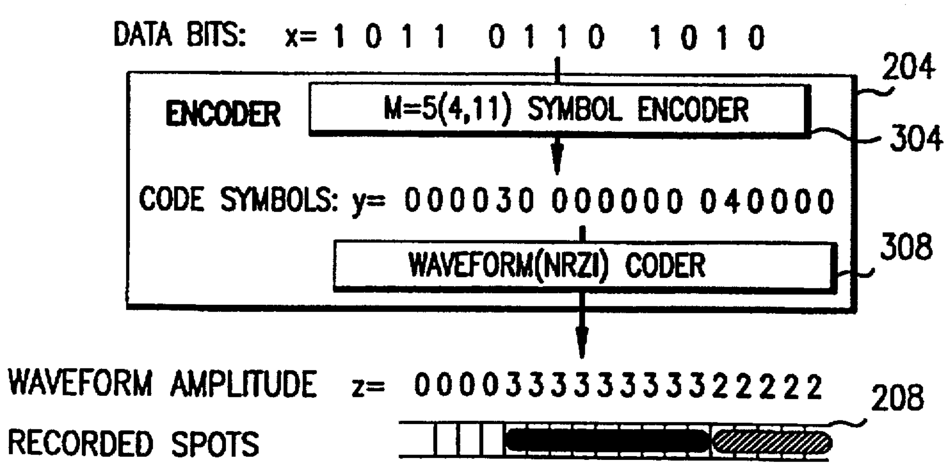
FIG. 3 is a diagram illustrating an encoder for encoding multi-level data using a multi-level (d,k) code.

In one embodiment, encoder 204 is implemented as a two-stage encoder. FIG. 3 is a block diagram illustrating encoder 204 in this embodiment. Referring to FIG. 3, encoder 204 is comprised of a symbol encoder 304 and a waveform encoder 308, referred to herein as encoder 304 and encoder 308, respectively.

Encoder 304 is a (d,k) RLL symbol encoder that accepts the input data bits x and converts them to a stream of code symbols $y=(y_0, y_1, \ldots, y_{q-1})$. To take advantage of the multi-level characteristics of medium 208, encoder 304 generates code symbols y at M different levels, where M>2. A second feature of encoder 304 is that the stream of code symbols y meets the code specification that there are no fewer than d and no greater than k zeros between each non-zero code symbol. Another feature of encoder 304 is that there are R input bits $x_i$ for each code symbol $y_i$ generated. This feature is referred to as the code rate. Thus for a rate 1/N code (i.e., where R=1/N), there are N code symbols $y_i$ generated for each input data bit $x_i$.

Waveform encoder 308 accepts code symbols y and converts them to a series of waveforms $z=(z_0, z_1, \ldots, z_{q-1})$, each of a given amplitude. Waveform encoder 308 generates output waveforms z, each at one of M different amplitudes. The waveform amplitudes are generated by modulo M addition of the current code symbol $Y_i$ with the previous waveform amplitude $z_{i-1}$. It is the waveforms z which are used to modulate a write laser for storing data onto medium 208 (or transmitted across the multi-amplitude channel).

Because there are at a minimum d zeros, between each non-zero code symbol, each waveform amplitude z generated represents, at a minimum, d+1 code symbols y. Also, because there are 1/R code symbols y generated for each input data bit x, each waveform amplitude z generated represents, at a minimum, (d+1)R data bits x. Thus, for a minimum feature size (e.g., the smallest spot that can be written to the storage medium or the shortest pulse that can be transmitted across the communications channel), the density achieved is D=(d+1)R.

Consider this density in terms of the specific M=5 (4,11) code described below. The rate of this code is R=4/6 and d=4. For this code, the density is 3.33 input data bits $x_i$ per minimum feature size. In other words, 3.33 input data bits can be stored using a single minimum-size feature.

4. Code Design Factors

The coding system and method described above can be used to code input data using any of number of M-ary (d,k) codes. However, the design of a specific M-ary (d,k) code is not a trivial matter.

There are several factors that must be taken into consideration when designing M-ary (d,k) codes. The specific coding scheme used to implement a given code impacts the performance of the encoding and decoding systems. For example, the code should be designed such that encoders and decoders can be implemented in a straight-forward and cost-effective manner. Toward this end, the desirable code can be implemented using encoders that have a relatively small number of states while still meeting the code parameters (i.e., M, d and k). Additionally, the decoder required to decode the coded data should be implementable using a small sliding block window size and the decoder should have a relatively a small table size.

Further, the code design must result in an encoder and decoder that operate such that errors in the decoder side have a minimum effect. It would be undesirable for errors to propagate too far in the decoded data stream. In some less-than-desirable systems, a single decoding error can result in a very large, if not infinite, number of additional decoding errors.

Achievement of such design goals is not a trivial matter. Not every M-ary (d,k) code of a given set of parameter values will perform in a desirable manner. Provided in the next section of this document is a specific M=5 (4,11) runlength-limited code that meets the design goals outlined above.

5. M=5 (4,11) runlength-limited code

As stated above, code design is not a trivial matter as there are several coding factors that affect the performance of the system. The specific code implemented for a given set of parameters can impact the overall performance of the system. This section of the patent document describes a specific M-ary (d,k) code and the specific encoder used to implement this code. In particular, this section describes a specific M=5 (4,11) runlength-limited code having a rate R=4/6.

Table 1 is a state table illustrating a state machine 400 for encoding input data x to generate code symbols y for the M=5 (4,11) code (i.e. a specific version of encoder 304). State machine 400 is a 22-state, M=5 (4,11) encoder. For each input data bit set $x_i \ldots x_{i+3}$, an output code symbol set $y_i \ldots Y_{i+5}$ is produced; each output code symbol $y_i$ is at one of five levels (0–4). The various states as well as the inputs and outputs of state machine 400 are illustrated using Table 1.

Figure 4:
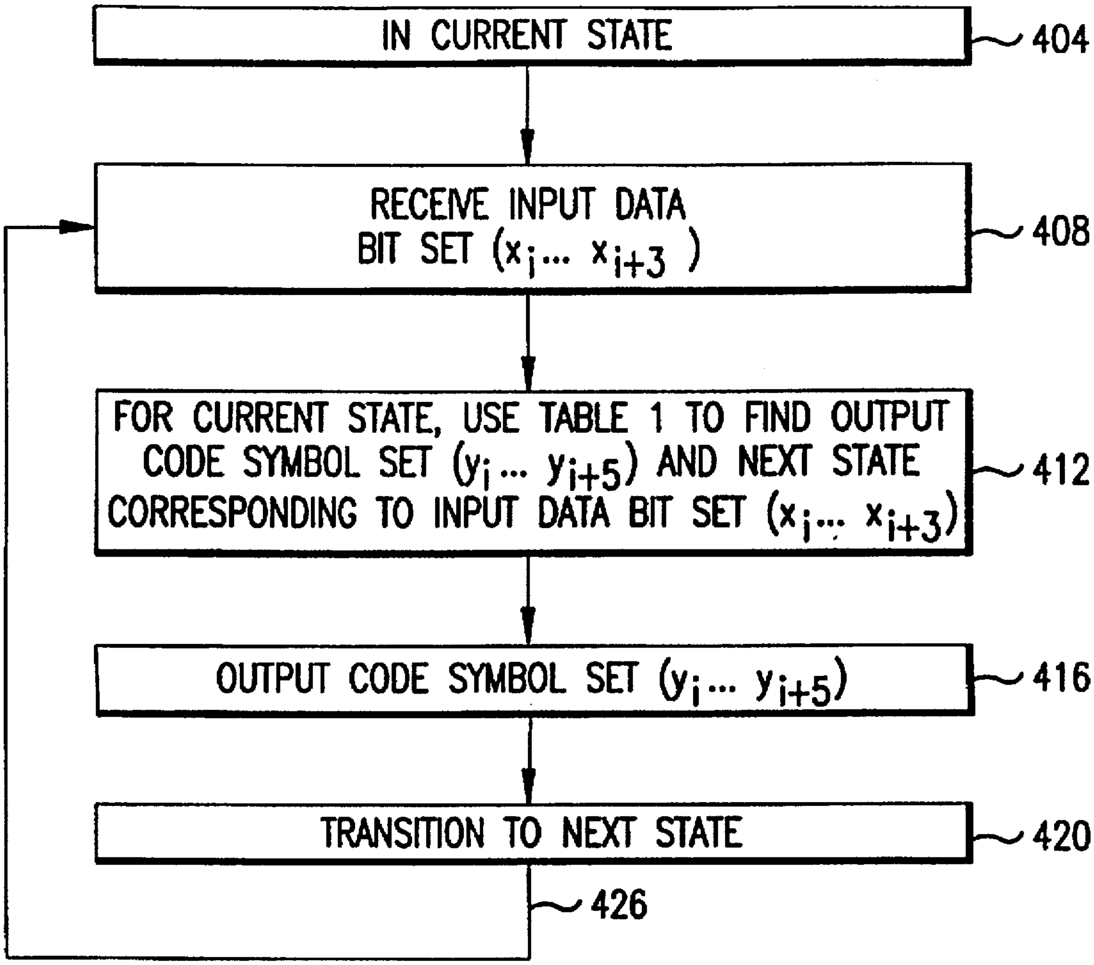
FIG. 4 is a flow diagram illustrating the operation of a multi-state encoder.

FIG. 4 is an operational flow diagram illustrating the operation of state machine 400. The operation of state machine 400 is now described with reference to Table 1 and FIG. 4. In a step 404, the operation starts in a given state at time t=0. In a step 408, an input data bit set $x_i \ldots x_{+3}$ is received. In a step 412, Table 1 is used to determine the output code symbol set $y_i \ldots y_{i+5}$ and next state from the current state and the input data bit set $x_i \ldots x_{i+3}$ received in step 408. In a step 416, encoder 304 outputs code symbol set $y_i \ldots y_{+5}$ determined in step 412. In a step 420, state machine 400 transitions to the next state determined in step 412. At this time, the operation continues at step 408 as indicated by flow line 426.

As is evident by the above description, an output code symbol set $y_i \ldots y_{i+5}$ of encoder 304 is a function of the input data bit set $x_i \ldots x_{i+3}$, and the current state 404 of encoder 304. For the M=5 (4,11) encoder of the present invention, Table 1 describes the output code symbol set $y_i \ldots y_{i+5}$ and next state of encoder 304 for each current state and input data bit set $x_i \ldots x_{i+3}$.

TABLE 1

| INPUT | OUTPUT | NEXT STATE |
|---|---|---|
| | STATE 0 | |
| 0 | 000000 | 7 |
| 1 | 000000 | 8 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000003 | 0 |
| 13 | 000003 | 1 |
| 14 | 000001 | 0 |
| 15 | 000001 | 1 |
| | STATE 1 | |
| 0 | 000002 | 0 |
| 1 | 000002 | 1 |
| 2 | 000004 | 0 |
| 3 | 000004 | 1 |
| 4 | 000010 | 1 |
| 5 | 000010 | 2 |
| 6 | 000010 | 3 |
| 7 | 000020 | 1 |
| 8 | 000020 | 2 |
| 9 | 000020 | 3 |
| 10 | 000030 | 1 |
| 11 | 000030 | 2 |
| 12 | 000030 | 3 |

TABLE 1-continued

| INPUT | OUTPUT | NEXT STATE |
|---|---|---|
| 13 | 000040 | 1 |
| 14 | 000040 | 2 |
| 15 | 000040 | 3 |
| | STATE 2 | |
| 0 | 000100 | 5 |
| 1 | 000003 | 0 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000000 | 6 |
| 13 | 000100 | 1 |
| 14 | 000100 | 2 |
| 15 | 000100 | 3 |
| | STATE 3 | |
| 0 | 000200 | 1 |
| 1 | 000200 | 2 |
| 2 | 000200 | 3 |
| 3 | 000200 | 4 |
| 4 | 000200 | 5 |
| 5 | 000300 | 1 |
| 6 | 000300 | 2 |
| 7 | 000300 | 3 |
| 8 | 000300 | 4 |
| 9 | 000300 | 5 |
| 10 | 000400 | 1 |
| 11 | 000400 | 2 |
| 12 | 000400 | 3 |
| 13 | 000400 | 4 |
| 14 | 000001 | 0 |
| 15 | 000001 | 1 |
| | STATE 4 | |
| 0 | 001000 | 17 |
| 1 | 001000 | 18 |
| 2 | 001000 | 19 |
| 3 | 001000 | 20 |
| 4 | 001000 | 21 |
| 5 | 001000 | 4 |
| 6 | 001000 | 5 |
| 7 | 001000 | 7 |
| 8 | 003000 | 17 |
| 9 | 003000 | 18 |
| 10 | 003000 | 19 |
| 11 | 003000 | 20 |
| 12 | 003000 | 21 |
| 13 | 003000 | 4 |
| 14 | 003000 | 5 |
| 15 | 003000 | 7 |
| | STATE 5 | |
| 0 | 002000 | 17 |
| 1 | 002000 | 18 |
| 2 | 002000 | 19 |
| 3 | 002000 | 20 |
| 4 | 002000 | 21 |
| 5 | 002000 | 4 |
| 6 | 002000 | 5 |
| 7 | 002000 | 7 |
| 8 | 004000 | 17 |
| 9 | 004000 | 18 |
| 10 | 004000 | 19 |
| 11 | 004000 | 20 |
| 12 | 004000 | 21 |
| 13 | 004000 | 4 |
| 14 | 004000 | 5 |
| 15 | 004000 | 7 |
| | STATE 6 | |

TABLE 1-continued

| INPUT | OUTPUT | NEXT STATE |
|---|---|---|
| 0 | 000100 | 5 |
| 1 | 000100 | 4 |
| 2 | 000200 | 1 |
| 3 | 000200 | 2 |
| 4 | 000200 | 3 |
| 5 | 000300 | 1 |
| 6 | 000300 | 2 |
| 7 | 000300 | 3 |
| 8 | 000300 | 4 |
| 9 | 000400 | 1 |
| 10 | 000400 | 2 |
| 11 | 000400 | 3 |
| 12 | 000400 | 4 |
| 13 | 000100 | 1 |
| 14 | 000100 | 2 |
| 15 | 000100 | 3 |
| | STATE 7 | |
| 0 | 000100 | 5 |
| 1 | 000100 | 4 |
| 2 | 000020 | 1 |
| 3 | 000020 | 2 |
| 4 | 000020 | 3 |
| 5 | 000300 | 1 |
| 6 | 000300 | 2 |
| 7 | 000300 | 3 |
| 8 | 000300 | 4 |
| 9 | 000300 | 5 |
| 10 | 000040 | 1 |
| 11 | 000040 | 2 |
| 12 | 000040 | 3 |
| 13 | 000100 | 1 |
| 14 | 000100 | 2 |
| 15 | 000100 | 3 |
| | STATE 8 | |
| 0 | 000010 | 1 |
| 1 | 000010 | 2 |
| 2 | 000200 | 1 |
| 3 | 000200 | 2 |
| 4 | 000200 | 3 |
| 5 | 000200 | 4 |
| 6 | 000200 | 5 |
| 7 | 000010 | 3 |
| 8 | 000030 | 1 |
| 9 | 000400 | 1 |
| 10 | 000400 | 2 |
| 11 | 000400 | 3 |
| 12 | 000400 | 4 |
| 13 | 000400 | 5 |
| 14 | 000030 | 2 |
| 15 | 000030 | 3 |
| | STATE 9 | |
| 0 | 400000 | 7 |
| 1 | 400000 | 8 |
| 2 | 400000 | 9 |
| 3 | 400000 | 10 |
| 4 | 400000 | 11 |
| 5 | 400000 | 12 |
| 6 | 400000 | 13 |
| 7 | 400000 | 14 |
| 8 | 400000 | 15 |
| 9 | 400000 | 16 |
| 10 | 400000 | 4 |
| 11 | 400000 | 5 |
| 12 | 200004 | 0 |
| 13 | 200004 | 1 |
| 14 | 300001 | 0 |
| 15 | 300001 | 1 |
| | STATE 10 | |
| 0 | 300000 | 7 |
| 1 | 300000 | 8 |
| 2 | 300000 | 9 |
| 3 | 300000 | 10 |
| 4 | 300000 | 11 |

TABLE 1-continued

| INPUT | OUTPUT | NEXT STATE |
|---|---|---|
| 5 | 300000 | 12 |
| 6 | 300000 | 13 |
| 7 | 300000 | 14 |
| 8 | 300000 | 15 |
| 9 | 300000 | 16 |
| 10 | 300000 | 4 |
| 11 | 300000 | 5 |
| 12 | 200003 | 0 |
| 13 | 200003 | 1 |
| 14 | 300002 | 0 |
| 15 | 300002 | 1 |
| | STATE 11 | |
| 0 | 200000 | 7 |
| 1 | 200000 | 8 |
| 2 | 200000 | 9 |
| 3 | 200000 | 10 |
| 4 | 200000 | 11 |
| 5 | 200000 | 12 |
| 6 | 200000 | 13 |
| 7 | 200000 | 14 |
| 8 | 200000 | 15 |
| 9 | 200000 | 16 |
| 10 | 200000 | 4 |
| 11 | 200000 | 5 |
| 12 | 200002 | 0 |
| 13 | 200002 | 1 |
| 14 | 300003 | 0 |
| 15 | 300003 | 1 |
| | STATE 12 | |
| 0 | 100000 | 7 |
| 1 | 100000 | 8 |
| 2 | 100000 | 9 |
| 3 | 100000 | 10 |
| 4 | 100000 | 11 |
| 5 | 100000 | 12 |
| 6 | 100000 | 13 |
| 7 | 100000 | 14 |
| 8 | 100000 | 15 |
| 9 | 100000 | 16 |
| 10 | 100000 | 4 |
| 11 | 100000 | 5 |
| 12 | 200001 | 0 |
| 13 | 200001 | 1 |
| 14 | 300004 | 0 |
| 15 | 300004 | 1 |
| | STATE 13 | |
| 0 | 040000 | 7 |
| 1 | 040000 | 8 |
| 2 | 040000 | 9 |
| 3 | 040000 | 10 |
| 4 | 040000 | 11 |
| 5 | 040000 | 12 |
| 6 | 040000 | 13 |
| 7 | 040000 | 14 |
| 8 | 040000 | 15 |
| 9 | 040000 | 16 |
| 10 | 040000 | 4 |
| 11 | 040000 | 5 |
| 12 | 100004 | 0 |
| 13 | 100004 | 1 |
| 14 | 400001 | 0 |
| 15 | 400001 | 1 |
| | STATE 14 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |

TABLE 1-continued

| INPUT | OUTPUT | NEXT STATE |
|---|---|---|
| 10 | 030000 | 4 |
| 11 | 030000 | 5 |
| 12 | 100001 | 0 |
| 13 | 100001 | 1 |
| 14 | 400002 | 0 |
| 15 | 400002 | 1 |
| | STATE 15 | |
| 0 | 020000 | 7 |
| 1 | 020000 | 8 |
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 100003 | 0 |
| 13 | 100003 | 1 |
| 14 | 400003 | 0 |
| 15 | 400003 | 1 |
| | STATE 16 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |
| 8 | 010000 | 15 |
| 9 | 010000 | 16 |
| 10 | 010000 | 4 |
| 11 | 010000 | 5 |
| 12 | 100002 | 0 |
| 13 | 100002 | 1 |
| 14 | 400004 | 0 |
| 15 | 400004 | 1 |
| | STATE 17 | |
| 0 | 000030 | 2 |
| 1 | 000030 | 3 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000010 | 1 |
| 13 | 000010 | 2 |
| 14 | 000010 | 3 |
| 15 | 000030 | 1 |
| | STATE 18 | |
| 0 | 040000 | 7 |
| 1 | 040000 | 8 |
| 2 | 040000 | 9 |
| 3 | 040000 | 10 |
| 4 | 040000 | 11 |
| 5 | 040000 | 12 |
| 6 | 040000 | 13 |
| 7 | 040000 | 14 |
| 8 | 040000 | 15 |
| 9 | 040000 | 16 |
| 10 | 040000 | 4 |
| 11 | 040000 | 5 |
| 12 | 000003 | 0 |
| 13 | 000003 | 1 |
| 14 | 000001 | 0 |

TABLE 1-continued

| INPUT | OUTPUT | NEXT STATE |
|---|---|---|
| 15 | 000001 | 1 |
| | STATE 19 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |
| 10 | 030000 | 4 |
| 11 | 030000 | 5 |
| 12 | 000002 | 0 |
| 13 | 000002 | 1 |
| 14 | 000004 | 0 |
| 15 | 000004 | 1 |
| | STATE 20 | |
| 0 | 020000 | 7 |
| 1 | 020000 | 8 |
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 000200 | 1 |
| 13 | 000200 | 2 |
| 14 | 000200 | 3 |
| 15 | 000200 | 4 |
| | STATE 21 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |
| 8 | 010000 | 15 |
| 9 | 010000 | 16 |
| 10 | 010000 | 4 |
| 11 | 010000 | 5 |
| 12 | 000400 | 1 |
| 13 | 000400 | 2 |
| 14 | 000400 | 3 |
| 15 | 000400 | 4 |

To further illustrate the operation of symbol encoder 304, consider an example input data stream x as illustrated in Table 2. In this example, assume the encoder 304 starts in state 1 and that the first input data bit set $x_i \ldots x_{i+3}$ is '1011'. Referring to Table 1 for state 1, the row where $x_i \ldots x_{i+3}$='1011' indicates that encoder 304 outputs symbol '000030' and transitions to state 2.

Figure 5:
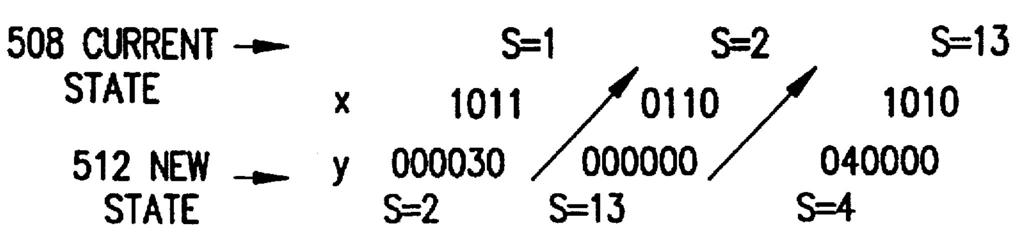
FIG. 5 is a diagram illustrating an example input data stream being coded using the encoder illustrated in FIG. 4.

FIG. 5 is a diagram further illustrating the example. FIG. 5 illustrates a current state 508 and a new state 512 for the example input data stream provided in Table 2. Referring to FIG. 5 and state machine 400, given the input data stream illustrated in Table 2, for each input data bit set $x_i \ldots x_{i+3}$, encoder 304 transitions from a current state 508 to a new state 512 produces an output symbol set $y_i \ldots y_{+5}$. FIG. 5 illustrates the example for data bits x of the input data stream while Table 2 is an example for data bits x.

TABLE 2

| | | | | | | | | | | | | |
|---|---|---|---|---|---|---|---|---|---|---|---|---|
| x | 1 | 0 | 1 | 1 | 0 | 1 | 1 | 0 | 1 | 0 | 1 | 0 |
| y | | 000030 | | | | 000000 | | | | 040000 | | |
| z | | 000033 | | | | 333333 | | | | 322222 | | |

As described above with reference to FIG. 3, code symbols y are further coded by waveform encoder 308 to generate a sequence of amplitudes z used to modulate the write laser. According to one embodiment, waveform encoder 308 is a modulo five encoder that, for a given time, determines the waveform amplitude $z_i$ by $$z_i=(z_{i-1}+y_i) \bmod M$$

Note that z is a transformed version of y, where the difference (mod M) between waveform amplitudes $z_i$ and $z_{i-1}$ is the coded symbol $y_i$. Thus, in this embodiment, each new code symbol $y_i$ is modulo five added to the previous waveform amplitude $z_{i-1}$ to result in the current waveform amplitude $z_i$. In following the example described above and illustrated in FIG. 5 and Table 2, the code symbols y are encoded by waveform encoder 308 to waveform amplitudes z, as illustrated in Table 2.

To briefly summarize the encoding process, input digital data bits x are first encoded using an M=5 (4,11) symbol encoder to produce code symbols y at M=5 levels. Code symbols y are then encoded by waveform encoder 308 to produce waveform amplitudes z. According to the current code, M=5 amplitudes (illustrated in the above examples as 0–4) are possible. These amplitudes are written to the media by the write laser as illustrated in FIG. 3.

6. Decoder

In order to recover the original data bits x from the amplitudes z stored on the media (or transmitted across the communications channel) a decoder is implemented. In one embodiment, the decoder uses a state independent lookup table to decode amplitude levels z read from the disk. In this embodiment, the decoder is a sliding block decoder, where a sliding window is used to decode amplitudes read from the disk.

Figure 6:
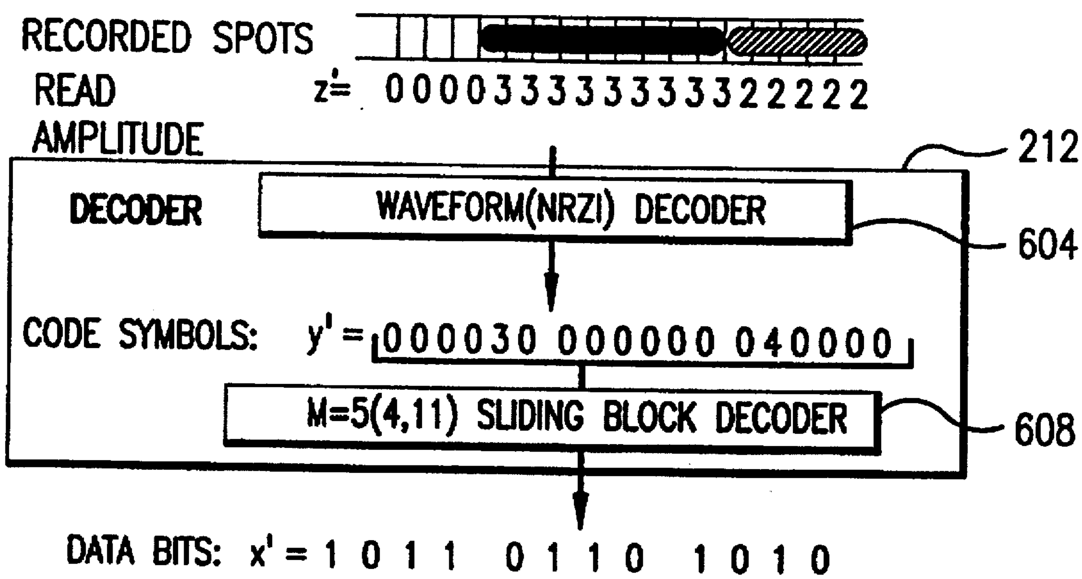
FIG. 6 is a diagram illustrating a decoder for decoding multi-level (d,k) coded data.

FIG. 6 is a block diagram illustrating the decoder. As illustrated in FIG. 6, decoder 212 is comprised of a waveform decoder 604 and a sliding block decoder 608. Waveform decoder 604 receives the signal amplitudes z' (multilevel) from the media and converts them to a sequence of digital code symbols y'. Sliding block decoder 608 performs a table lookup to convert output code symbols y' into output data bits x'. Note that in an error free environment, output code symbols y' correspond identically to input code symbols y and output data bits x' correspond identically to input data bits x.

Any of a number of different techniques can be implemented to read waveform amplitudes z off of the media to provide the signal amplitudes z' to waveform decoder 604. It should be noted that the actual read scheme implemented is not important to the invention as long as data are read accurately.

As stated above, the purpose of waveform decoder 604 is to decode signal amplitudes z' to recover the actual code symbols y'. Waveform decoder converts a sequence of amplitudes $z'=(z'_0, z'_1, \ldots, z'_{N-1})$ where $z'_i \in [0,A]$, for some real number A, to a sequence of code symbols $y'=(y'_0, y'_1, \ldots, y'_{N-1})$.

The operation of waveform decoder 604 is now described. For a given time i, the code symbol $y'_i$ is determined by $$y'_i=(z'-z'_{i-1}) \bmod M$$

According to this technique, each output symbol y' is determined as being the modulo M difference between the current amplitude waveform $z'_i$ and the previous amplitude waveform $z'_{i-1}$. This decoding essentially undoes the coding performed by waveform encoder 308. Specifically, for M=5 (d,k) codes, such as the M=5 (4,11) code described above in Section 5, the decoding is implemented using a modulo five difference.

6.1 Sliding Block Decoder

The purpose of sliding block decoder 608 is to convert the sequence of code symbols y' into a sequence of data bits x' that coincide with input data bits x. In a preferred embodiment, the decoder is a state independent lookup table. The size of the lookup table is dependent on the specific code implemented. Therefore, the design of encoder 304 affects the size of the lookup table implemented.

Figure 7:
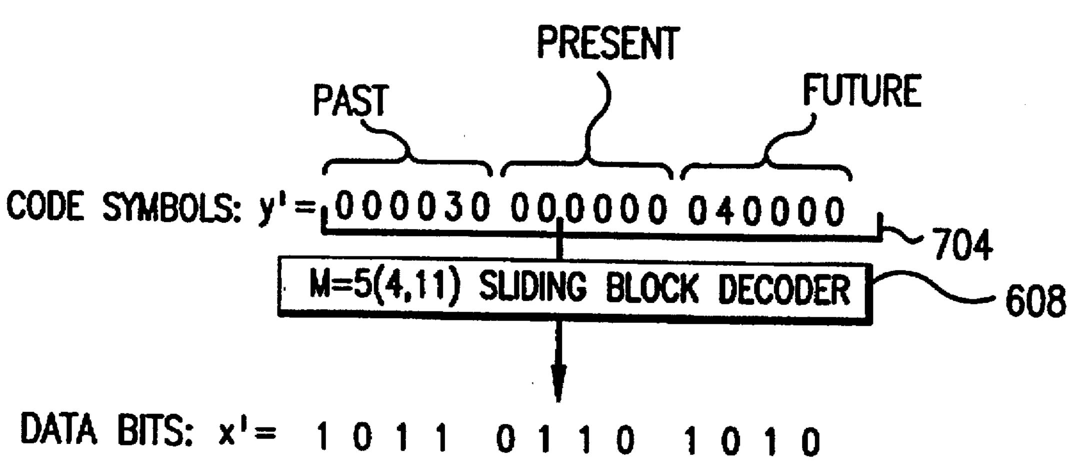
FIG. 7 is a diagram illustrating a sliding block decoder.

Sliding block decoder 608 is illustrated in FIG. 7. Sliding block decoder comprises a sliding window 704 to decode the code symbols y' to arrive at output data bits x'. Whereas encoder 304 accepts one data bit set $x_i \ldots x_{i+3}$ and generates one code symbol set $y_i \ldots y_{i+5}$ therefrom, sliding block decoder 608 must look at multiple code symbols y' to decode one data bit set. Specifically, for the encoder described above with reference to Table 1, sliding block decoder 608 requires a block of eighteen code symbols $y_i'$ to uniquely decode one data bit set $x_i' \ldots x_{i+3}'$.

The actual size of sliding window 704 is determined during code design. An optimally sized sliding window 704 is large enough such that the symbols y' within sliding window 704 unambiguously define the correct output bit set x' without being so large that unneeded code symbols y' are included therein. In other words, the window size is chosen as the smallest window which guarantees unique decodability.

With the use of a sliding window 704 to decode the data, knowledge of state information is not required. In fact, the contents of sliding window 704 at any given time contain sufficient information such that state information can be determined therefrom. Thus, sliding block decoder 608 is computationally less complex than conventional decoders; more importantly, the sliding block decoder limits the propagation of errors.

Sliding window 704 actually represents the past, present and future. The code symbols y' actually being decoded to generate data bits x' represent the present. Past symbols y' are those occurring earlier in time than the present symbols. Likewise, future symbols y' are those that occur after the present symbols. In FIG. 7, the past is represented by '000030', the present by '000000', and the future by '040000'.

Note that sliding block decoders are well known for decoding binary data. One well known technique for implementing sliding block decoders with binary data is the Adler-Coppersmith-Hassner technique disclosed in U.S. Pat. No. 4,413,251. Another, related technique is disclosed in U.S. Pat. No. 4,882,583 to Dimitri et al. According to these techniques, the number of past symbols required in the window is fixed based on the code design. The number of future symbols should be maintained as small as possible. These goals apply to the M-ary sliding block decoder as well.

The lookup table contains a plurality of entries. In one embodiment, each entry contains a possible sequence of N code symbols y', where N is the size of sliding window 704. In alternative embodiments, each entry of the lookup table is addressed by (directly, indirectly or via a decoding scheme) one of the possible sequences of code symbols.

Based on the specific design of coder 304, there are a limited number of possible occurrences of N code symbols y'. The lookup table comprises a sufficient number of entries such that there is one entry for each of the possible occurrences of N code symbols. As stated above, N is chosen such that for each sequence of N code symbols y' an output bit set x' is unambiguously defined.

For the encoder 304 described above with reference to Table 1, the preferred lookup table has 4404 entries and is illustrated in Table 3. For each entry of eighteen code symbols y', there is an output bit set x'. Thus, to decode code symbols y', eighteen consecutive code symbols y' are loaded into sliding window 704. The entry corresponding to those eighteen code symbols y' is located in the lookup table and the corresponding data bit set x' is output. To determine the next output data bit set x', sliding window 704 is 'slid' one code symbol set y' into the future (i.e., in one embodiment, a next code symbol set y' is shifted into window 704 and the oldest shifted out) and the lookup process is repeated. This sliding process continues as long as code symbols y' are provided to sliding block decoder 608.

In one embodiment, the contents of window 704 are real-valued and, therefore, the table entry retrieved is the entry that is closest in squared Euclidean distance. Specifically, for a given window $w=(w_1, \ldots, w_{18})$, the distance $d_j$ for each table entry $t_j$ is computed as:

$$d_j^2 = \sum_{i=1}^{18} (w_i - t_{ji})^2 \text{ for } j = 1, \ldots 5446$$

where, $t_{ji}$ is the i'th component of the j'th table entry. The window w is then decoded to the table entry with the minimum distance $d_j$.

Other embodiments are contemplated where the contents of window 704 are used as an address or used to generate an address of an entry in a memory, where the contents of that entry contain the appropriate output data bit set x'.

The complexity of the decoding process can be reduced significantly by making hard decisions regarding read signal amplitudes. Specifically, in one embodiment, the read signal amplitudes z' are rounded-off or quantized to be one of the five permissible amplitude levels. Even though this results in a decrease in the performance of the decoder it can significantly reduce its complexity: that is, the table can be a true lookup table requiring no distance calculations.

It should be noted that at the beginning and the end of a data stream, there is a period of time during which window 704 is not full.

TABLE 3

| Sequence of Code Symbols | x' |
|---|---|
| xxxxxx000100002000 | 0000 |
| xxxxxx000100004000 | 0000 |
| xxxxxx000100001000 | 0001 |
| xxxxxx000100003000 | 0001 |
| 000000000020000002 | 0010 |
| 000000000020000004 | 0010 |
| 000000000020000010 | 0010 |
| 000000000020000020 | 0010 |
| 000000000020000030 | 0010 |
| 000000000020000040 | 0010 |
| 000000000020000100 | 0011 |
| 000000000020000003 | 0011 |
| 000000000020000000 | 0011 |
| 000000000020000200 | 0100 |
| 000000000020000300 | 0100 |

TABLE 3-continued

| Sequence of Code Symbols | x' |
|---|---|
| 00000000020000400 | 0100 |
| 00000000020000001 | 0100 |
| xxxxxx000300000002 | 0101 |
| xxxxxx000300000004 | 0101 |
| xxxxxx000300000010 | 0101 |
| xxxxxx000300000020 | 0101 |
| xxxxxx000300000030 | 0101 |
| xxxxxx000300000040 | 0101 |
| xxxxxx000300000100 | 0110 |
| xxxxxx000300000003 | 0110 |
| xxxxxx000300000000 | 0110 |
| xxxxxx000300000200 | 0111 |
| xxxxxx000300000300 | 0111 |
| xxxxxx000300000400 | 0111 |
| xxxxxx000300000001 | 0111 |
| xxxxxx000300001000 | 1000 |
| xxxxxx000300003000 | 1000 |
| xxxxxx000300002000 | 1001 |
| xxxxxx000300004000 | 1001 |
| 00000000040000002 | 1010 |
| 00000000040000004 | 1010 |
| 00000000040000010 | 1010 |
| 00000000040000020 | 1010 |
| 00000000040000030 | 1010 |
| 00000000040000040 | 1010 |
| 00000000040000100 | 1011 |
| 00000000040000003 | 1011 |
| 00000000040000000 | 1011 |
| 00000000040000200 | 1100 |
| 00000000040000300 | 1100 |
| 00000000040000400 | 1100 |
| 00000000040000001 | 1100 |
| xxxxxx000100000002 | 1101 |
| xxxxxx000100000004 | 1101 |
| xxxxxx000100000010 | 1101 |
| xxxxxx000100000020 | 1101 |
| xxxxxx000100000030 | 1101 |
| xxxxxx000100000040 | 1101 |
| xxxxxx000100000100 | 1110 |
| xxxxxx000100000003 | 1110 |
| xxxxxx000100000000 | 1110 |
| xxxxxx000100000200 | 1111 |
| xxxxxx000100000300 | 1111 |
| xxxxxx000100000400 | 1111 |
| xxxxxx000100000001 | 1111 |
| xxxxxx000010000002 | 0000 |
| xxxxxx000010000004 | 0000 |
| xxxxxx000010000010 | 0000 |
| xxxxxx000010000020 | 0000 |
| xxxxxx000010000030 | 0000 |
| xxxxxx000010000040 | 0000 |
| xxxxxx000010000100 | 0001 |
| xxxxxx000010000003 | 0001 |
| xxxxxx000010000000 | 0001 |
| 00000000200000002 | 0010 |
| 00000000200000004 | 0010 |
| 00000000200000010 | 0010 |
| 00000000200000020 | 0010 |
| 00000000200000030 | 0010 |
| 00000000200000040 | 0010 |
| 00000000200000100 | 0011 |
| 00000000200000003 | 0011 |
| 00000000200000000 | 0011 |
| 00000000200000200 | 0100 |
| 00000000200000300 | 0100 |
| 00000000200000400 | 0100 |
| 00000000200000001 | 0100 |
| 00000000200001000 | 0101 |
| 00000000200003000 | 0101 |
| 00000000200002000 | 0110 |
| 00000000200004000 | 0110 |
| xxxxxx000010000200 | 0111 |
| xxxxxx000010000300 | 0111 |
| xxxxxx000010000400 | 0111 |
| xxxxxx000010000001 | 0111 |
| xxxxxx000030000002 | 1000 |

TABLE 3-continued

| Sequence of Code Symbols | x' |
|---|---|
| xxxxxx000030000004 | 1000 |
| xxxxxx000030000010 | 1000 |
| xxxxxx000030000020 | 1000 |
| xxxxxx000030000030 | 1000 |
| xxxxxx000030000040 | 1000 |
| 00000000400000002 | 1001 |
| 00000000400000004 | 1001 |
| 00000000400000010 | 1001 |
| 00000000400000020 | 1001 |
| 00000000400000030 | 1001 |
| 00000000400000040 | 1001 |
| 00000000400000100 | 1010 |
| 00000000400000003 | 1010 |
| 00000000400000000 | 1010 |
| 00000000400000200 | 1011 |
| 00000000400000300 | 1011 |
| 00000000400000400 | 1011 |
| 00000000400000001 | 1011 |
| 00000000400001000 | 1100 |
| 00000000400003000 | 1100 |
| 00000000400002000 | 1101 |
| 00000000400004000 | 1101 |
| 00000000030000100 | 1110 |
| 00000000030000003 | 1110 |
| 00000000030000000 | 1110 |
| 00000000030000200 | 1111 |
| 00000000030000300 | 1111 |
| 00000000030000400 | 1111 |
| 00000000030000001 | 0000 |
| xxxxxx400000000100 | 0000 |
| xxxxxx400000000020 | 0000 |
| xxxxxx400000000300 | 0000 |
| xxxxxx400000000040 | 0000 |
| xxxxxx400000000010 | 0001 |
| xxxxxx400000000200 | 0001 |
| xxxxxx400000000030 | 0001 |
| xxxxxx400000000400 | 0001 |
| xxxxxx400000400000 | 0010 |
| xxxxxx400000200004 | 0010 |
| xxxxxx400000300001 | 0010 |
| xxxxxx400000300000 | 0011 |
| xxxxxx400000200003 | 0011 |
| xxxxxx400000300002 | 0011 |
| xxxxxx400000200000 | 0100 |
| xxxxxx400000200002 | 0100 |
| xxxxxx400000300003 | 0100 |
| xxxxxx400000100000 | 0101 |
| xxxxxx400000200001 | 0101 |
| xxxxxx400000300004 | 0101 |
| xxxxxx400000040000 | 0110 |
| xxxxxx400000100004 | 0110 |
| xxxxxx400000400001 | 0110 |
| xxxxxx400000030000 | 0111 |
| xxxxxx400000100001 | 0111 |
| xxxxxx400000400002 | 0111 |
| xxxxxx400000020000 | 1000 |
| xxxxxx400000100003 | 1000 |
| xxxxxx400000400003 | 1000 |
| xxxxxx400000010000 | 1001 |
| xxxxxx400000100002 | 1001 |
| xxxxxx400000400004 | 1001 |
| xxxxxx400000001000 | 1101 |
| xxxxxx400000003000 | 1010 |
| xxxxxx400000002000 | 1011 |
| xxxxxx400000004000 | 1011 |
| xxxxxx200004000000 | 1100 |
| xxxxxx200004000003 | 1100 |
| xxxxxx200004000001 | 1100 |
| xxxxxx200004000002 | 1101 |
| xxxxxx200004000004 | 1101 |
| xxxxxx200004000010 | 1101 |
| xxxxxx200004000020 | 1101 |
| xxxxxx200004000030 | 1101 |
| xxxxxx200004000040 | 1101 |
| xxxxxx300001000000 | 1110 |
| xxxxxx300001000003 | 1110 |

TABLE 3-continued

| Sequence of Code Symbols | x' |
|---|---|
| xxxxxx300001000001 | 1110 |
| xxxxxx300001000002 | 1111 |
| xxxxxx300001000004 | 1111 |
| xxxxxx300001000010 | 1111 |
| xxxxxx300001000020 | 1111 |
| xxxxxx300001000030 | 1111 |
| xxxxxx300001000040 | 1111 |
| xxxxxx300000000100 | 0000 |
| xxxxxx300000000020 | 0000 |
| xxxxxx300000000300 | 0000 |
| xxxxxx300000000040 | 0000 |
| xxxxxx300000000010 | 0001 |
| xxxxxx300000000200 | 0001 |
| xxxxxx300000000030 | 0001 |
| xxxxxx300000000400 | 0001 |
| xxxxxx300000400000 | 0010 |
| xxxxxx300000200004 | 0010 |
| xxxxxx300000300001 | 0010 |
| xxxxxx300000300000 | 0011 |
| xxxxxx300000200003 | 0011 |
| xxxxxx300000300002 | 0011 |
| xxxxxx300000200000 | 0100 |
| xxxxxx300000200002 | 0100 |
| xxxxxx300000300003 | 0100 |
| xxxxxx300000100000 | 0101 |
| xxxxxx300000200001 | 0101 |
| xxxxxx300000300004 | 0101 |
| xxxxxx300000040000 | 0110 |
| xxxxxx300000100004 | 0110 |
| xxxxxx300000400001 | 0110 |
| xxxxxx300000030000 | 0111 |
| xxxxxx300000100001 | 0111 |
| xxxxxx300000400002 | 0111 |
| xxxxxx300000020000 | 1000 |
| xxxxxx300000100003 | 1000 |
| xxxxxx300000400003 | 1000 |
| xxxxxx300000010000 | 1001 |
| xxxxxx300000100002 | 1001 |
| xxxxxx300000400004 | 1001 |
| xxxxxx300000001000 | 1010 |
| xxxxxx300000003000 | 1010 |
| xxxxxx300000002000 | 1011 |
| xxxxxx303000004000 | 1011 |
| xxxxxx200003000000 | 1100 |
| xxxxxx200003000003 | 1100 |
| xxxxxx200003000001 | 1100 |
| xxxxxx200003000002 | 1100 |
| xxxxxx200003000004 | 1101 |
| xxxxxx200003000010 | 1101 |
| xxxxxx200003000020 | 1101 |
| xxxxxx200003000030 | 1101 |
| xxxxxx200003000040 | 1101 |
| xxxxxx300002000000 | 1110 |
| xxxxxx300002000003 | 1110 |
| xxxxxx300002000001 | 1110 |
| xxxxxx300002000002 | 1111 |
| xxxxxx300002000004 | 1111 |
| xxxxxx300002000010 | 1111 |
| xxxxxx300002000020 | 1111 |
| xxxxxx300002000030 | 1111 |
| xxxxxx300002000040 | 1111 |
| xxxxxx200000000100 | 0000 |
| xxxxxx200000000020 | 0000 |
| xxxxxx200000000300 | 0000 |
| xxxxxx200000000040 | 0000 |
| xxxxxx200000000010 | 0001 |
| xxxxxx200000000200 | 0001 |
| xxxxxx200000000030 | 0001 |
| xxxxxx200000000400 | 0001 |
| xxxxxx200000400000 | 0010 |
| xxxxxx200000200004 | 0010 |
| xxxxxx200000300001 | 0010 |
| xxxxxx200000300000 | 0011 |
| xxxxxx200000200003 | 0011 |
| xxxxxx200000300002 | 0011 |
| xxxxxx200000200000 | 0100 |

TABLE 3-continued

| Sequence of Code Symbols | x' |
|---|---|
| xxxxxx200000200002 | 0100 |
| xxxxxx200000300003 | 0100 |
| xxxxxx200000100000 | 0101 |
| xxxxxx200000200001 | 0101 |
| xxxxxx200000300004 | 0101 |
| xxxxxx200000040000 | 0110 |
| xxxxxx200000100004 | 0110 |
| xxxxxx200000400001 | 0110 |
| xxxxxx200000030000 | 0111 |
| xxxxxx200000100001 | 0111 |
| xxxxxx200000400002 | 0111 |
| xxxxxx200000020000 | 1000 |
| xxxxxx200000100003 | 1000 |
| xxxxxx200000400003 | 1000 |
| xxxxxx200000010000 | 1001 |
| xxxxxx200000100002 | 1001 |
| xxxxxx200000400004 | 1001 |
| xxxxxx200000001000 | 1010 |
| xxxxxx200000003000 | 1010 |
| xxxxxx200000002000 | 1011 |
| xxxxxx200000004000 | 1011 |
| xxxxxx200002000000 | 1100 |
| xxxxxx200002000003 | 1100 |
| xxxxxx200002000001 | 1100 |
| xxxxxx200002000002 | 1101 |
| xxxxxx200002000004 | 1101 |
| xxxxxx200002000010 | 1101 |
| xxxxxx200002000020 | 1101 |
| xxxxxx200002000030 | 1101 |
| xxxxxx200002000040 | 1101 |
| xxxxxx300003000000 | 1110 |
| xxxxxx300003000003 | 1110 |
| xxxxxx300003000001 | 1110 |
| xxxxxx300003000002 | 1111 |
| xxxxxx300003000004 | 1111 |
| xxxxxx300003000010 | 1111 |
| xxxxxx300003000020 | 1111 |
| xxxxxx300003000030 | 1111 |
| xxxxxx300003000040 | 1111 |
| xxxxxx100000000100 | 0000 |
| xxxxxx100000000020 | 0000 |
| xxxxxx100000000300 | 0000 |
| xxxxxx100000000040 | 0000 |
| xxxxxx100000000010 | 0001 |
| xxxxxx100000000200 | 0001 |
| xxxxxx100000000030 | 0001 |
| xxxxxx100000000400 | 0001 |
| xxxxxx100000400000 | 0010 |
| xxxxxx100000200004 | 0010 |
| xxxxxx100000300001 | 0010 |
| xxxxxx100000300000 | 0011 |
| xxxxxx100000200003 | 0011 |
| xxxxxx100000300002 | 0011 |
| xxxxxx100000200000 | 0100 |
| xxxxxx100000200002 | 0100 |
| xxxxxx100000300003 | 0100 |
| xxxxxx100000100000 | 0101 |
| xxxxxx100000200001 | 0101 |
| xxxxxx100000300004 | 0101 |
| xxxxxx100000400000 | 0110 |
| xxxxxx100000100004 | 0110 |
| xxxxxx100000400001 | 0110 |
| xxxxxx100000030000 | 0111 |
| xxxxxx100000100001 | 0111 |
| xxxxxx100000400002 | 0111 |
| xxxxxx100000020000 | 1000 |
| xxxxxx100000100003 | 1000 |
| xxxxxx100000400003 | 1000 |
| xxxxxx100000010000 | 1001 |
| xxxxxx100000100002 | 1001 |
| xxxxxx100000400004 | 1001 |
| xxxxxx100000001000 | 1010 |
| xxxxxx100000003000 | 1010 |
| xxxxxx100000002000 | 1011 |
| xxxxxx100000004000 | 1011 |
| xxxxxx200001000000 | 1100 |

TABLE 3-continued

| Sequence of Code Symbols | x' |
|---|---|
| xxxxxx200001000003 | 1100 |
| xxxxxx200001000001 | 1100 |
| xxxxxx200001000002 | 1101 |
| xxxxxx200001000004 | 1101 |
| xxxxxx200001000010 | 1101 |
| xxxxxx200001000020 | 1101 |
| xxxxxx200001000030 | 1101 |
| xxxxxx200001000040 | 1101 |
| xxxxxx300004000000 | 1110 |
| xxxxxx300004000003 | 1110 |
| xxxxxx300004000001 | 1110 |
| xxxxxx300004000002 | 1111 |
| xxxxxx300004000004 | 1111 |
| xxxxxx300004000010 | 1111 |
| xxxxxx300004000020 | 1111 |
| xxxxxx300004000030 | 1111 |
| xxxxxx300004000040 | 1111 |
| xxxxxx040000000100 | 0000 |
| xxxxxx040000000020 | 0000 |
| xxxxxx040000000300 | 0000 |
| xxxxxx040000000040 | 0000 |
| xxxxxx040000000010 | 0001 |
| xxxxxx040000000200 | 0001 |
| xxxxxx040000000030 | 0001 |
| xxxxxx040000000400 | 0001 |
| xxxxxx040000400000 | 0010 |
| xxxxxx040000200004 | 0010 |
| xxxxxx040000300001 | 0010 |
| xxxxxx040000300000 | 0011 |
| xxxxxx040000200003 | 0011 |
| xxxxxx040000300002 | 0011 |
| xxxxxx040000200000 | 0100 |
| xxxxxx040000200002 | 0100 |
| xxxxxx040000300003 | 0100 |
| xxxxxx040000100000 | 0101 |
| xxxxxx040000200001 | 0101 |
| xxxxxx040000300004 | 0101 |
| xxxxxx040000040000 | 0110 |
| xxxxxx040000100004 | 0110 |
| xxxxxx040004000010 | 0110 |
| xxxxxx040000030000 | 0111 |
| xxxxxx040000100001 | 0111 |
| xxxxxx040000400002 | 0111 |
| xxxxxx040000020000 | 1000 |
| xxxxxx040000100003 | 1000 |
| xxxxxx040000400003 | 1000 |
| xxxxxx040000010000 | 1001 |
| xxxxxx040000100002 | 1001 |
| xxxxxx040000400004 | 1001 |
| xxxxxx040000001000 | 1010 |
| xxxxxx040000003000 | 1010 |
| xxxxxx040000002000 | 1011 |
| xxxxxx040000004000 | 1011 |
| xxxxxx100004000000 | 1100 |
| xxxxxx100004000003 | 1100 |
| xxxxxx100004000001 | 1100 |
| xxxxxxL00004000002 | 1101 |
| xxxxxx100004000004 | 1101 |
| xxxxxx100004000010 | 1101 |
| xxxxxx100004000020 | 1101 |
| xxxxxx100004000030 | 1101 |
| xxxxxx100004000040 | 1101 |
| xxxxxx400001000000 | 1110 |
| xxxxxx400001000003 | 1110 |
| xxxxxx400001000001 | 1110 |
| xxxxxx400001000001 | 1111 |
| xxxxxx400001000004 | 1111 |
| xxxxxx400001000010 | 1111 |
| xxxxxx400001000020 | 1111 |
| xxxxxx400001000030 | 1111 |
| xxxxxx400001000040 | 1111 |
| xxxxxx030000000100 | 0000 |
| xxxxxx030000000020 | 0000 |
| xxxxxx030000000300 | 0000 |
| xxxxxx030000000040 | 0000 |
| xxxxxx030000000010 | 0001 |

TABLE 3-continued

| Sequence of Code Symbols | x' |
|---|---|
| xxxxxx030000000200 | 0001 |
| xxxxxx030000000030 | 0001 |
| xxxxxx030000000400 | 0001 |
| xxxxxx030000400000 | 0010 |
| xxxxxx030000200004 | 0010 |
| xxxxxx030000300001 | 0010 |
| xxxxxx030000300000 | 0011 |
| xxxxxx030000200003 | 0011 |
| xxxxxx030000300002 | 0011 |
| xxxxxx030000200000 | 0100 |
| xxxxxx030000200002 | 0100 |
| xxxxxx030000300003 | 0100 |
| xxxxxx030000100000 | 0101 |
| xxxxxx030000200001 | 0101 |
| xxxxxx030000300004 | 0101 |
| xxxxxx030000040000 | 0110 |
| xxxxxx030000100004 | 0110 |
| xxxxxx030000400001 | 0110 |
| xxxxxx030000030000 | 0111 |
| xxxxxx030000100001 | 0111 |
| xxxxxx030000400002 | 0111 |
| xxxxxx030000020000 | 1000 |
| xxxxxx030000100003 | 1000 |
| xxxxxx030000400003 | 1000 |
| xxxxxx030000010000 | 1001 |
| xxxxxx030000100002 | 1001 |
| xxxxxx030000400004 | 1001 |
| xxxxxx030000001000 | 1010 |
| xxxxxx030000003000 | 1010 |
| xxxxxx030000002000 | 1011 |
| xxxxxx030000004000 | 1011 |
| xxxxxx100001000000 | 1100 |
| xxxxxx000001000003 | 1100 |
| xxxxxx000001000001 | 1100 |
| xxxxxx100001000002 | 1101 |
| xxxxxx100001000004 | 1101 |
| xxxxxx100001000010 | 1101 |
| xxxxxx100001000020 | 1101 |
| xxxxxx100001000030 | 1101 |
| xxxxxx100001000040 | 1101 |
| xxxxxx400002000000 | 1110 |
| xxxxxx400002000003 | 1110 |
| xxxxxx400002000001 | 1110 |
| xxxxxx400002000002 | 1111 |
| xxxxxx400002000004 | 1111 |
| xxxxxx400002000010 | 1111 |
| xxxxxx400002000020 | 1111 |
| xxxxxx400002000030 | 1111 |
| xxxxxx400002000040 | 1111 |
| xxxxxx020000000100 | 0000 |
| xxxxxx020000000020 | 0000 |
| xxxxxx020000000300 | 0000 |
| xxxxxx020000000040 | 0000 |
| xxxxxx020000000010 | 0001 |
| xxxxxx020000000200 | 0001 |
| xxxxxx020000000030 | 0001 |
| xxxxxx020000000400 | 0001 |
| xxxxxx020000400000 | 0010 |
| xxxxxx020000200004 | 0010 |
| xxxxxx020000300001 | 0010 |
| xxxxxx020000300000 | 0011 |
| xxxxxx020000200003 | 0011 |
| xxxxxx020000300002 | 0011 |
| xxxxxx020000200000 | 0100 |
| xxxxxx020000200002 | 0100 |
| xxxxxx020000300003 | 0100 |
| xxxxxx020000100000 | 0101 |
| xxxxxx020000200001 | 0101 |
| xxxxxx020000300004 | 0101 |
| xxxxxx020000040000 | 0110 |
| xxxxxx020000100004 | 0110 |
| xxxxxx020000400001 | 0110 |
| xxxxxx020000030000 | 0111 |
| xxxxxx020000100001 | 0111 |
| xxxxxx020000400002 | 0111 |
| xxxxxx020000020000 | 1000 |

TABLE 3-continued

| Sequence of Code Symbols | x' |
|---|---|
| xxxxxx020000100003 | 1000 |
| xxxxxx020000400003 | 1000 |
| xxxxxx020000010000 | 1001 |
| xxxxxx020000100002 | 1001 |
| xxxxxx020000400004 | 1001 |
| xxxxxx020000001000 | 1010 |
| xxxxxx020000003000 | 1010 |
| xxxxxx020000002000 | 1011 |
| xxxxxx020000004000 | 1011 |
| xxxxxx100003000000 | 1100 |
| xxxxxx100003000003 | 1100 |
| xxxxxx100003000001 | 1100 |
| xxxxxx100003000002 | 1101 |
| xxxxxx100003000004 | 1101 |
| xxxxxx100003000010 | 1101 |
| xxxxxx100003000020 | 1101 |
| xxxxxx100003000030 | 1101 |
| xxxxxx100003000040 | 1101 |
| xxxxxx400003000000 | 1110 |
| xxxxxx400003000003 | 1110 |
| xxxxxx400003000001 | 1110 |
| xxxxxx400003000002 | 1111 |
| xxxxxx400003000004 | 1111 |
| xxxxxx400003000010 | 1111 |
| xxxxxx400003000020 | 1111 |
| xxxxxx400003000030 | 1111 |
| xxxxxx400003000040 | 1111 |
| xxxxxx010000000100 | 0000 |
| xxxxxx010000000020 | 0000 |
| xxxxxx010000000300 | 0000 |
| xxxxxx010000000040 | 0000 |
| xxxxxx010000000010 | 0001 |
| xxxxxx010000000200 | 0001 |
| xxxxxx010000000030 | 0001 |
| xxxxxx010000000400 | 0001 |
| xxxxxx010000400000 | 0010 |
| xxxxxx010000200004 | 0010 |
| xxxxxx010000300001 | 0010 |
| xxxxxx010000300000 | 0011 |
| xxxxxx010000200003 | 0011 |
| xxxxxx010000300002 | 0011 |
| xxxxxx010000200000 | 0100 |
| xxxxxx010000200002 | 0100 |
| xxxxxx010000300003 | 0100 |
| xxxxxx010000100000 | 0101 |
| xxxxxx010000200001 | 0101 |
| xxxxxx010000300004 | 0101 |
| xxxxxx010000040000 | 0110 |
| xxxxxx010000100004 | 0110 |
| xxxxxx010000400001 | 0110 |
| xxxxxx010000030000 | 0111 |
| xxxxxx010000100001 | 0111 |
| xxxxxx010000400002 | 0111 |
| xxxxxx010000020000 | 1000 |
| xxxxxx010000100003 | 1000 |
| xxxxxx010000400003 | 1000 |
| xxxxxx010000010000 | 1001 |
| xxxxxx010000100002 | 1001 |
| xxxxxx010000400004 | 1001 |
| xxxxxx010000001000 | 1010 |
| xxxxxx010000003000 | 1010 |
| xxxxxx010000002000 | 1011 |
| xxxxxx010000004000 | 1011 |
| xxxxxx100002000000 | 1100 |
| xxxxxx100002000003 | 1100 |
| xxxxxx100002000001 | 1100 |
| xxxxxx100002000002 | 1101 |
| xxxxxx100002000004 | 1101 |
| xxxxxx100002000010 | 1101 |
| xxxxxx100002000020 | 1101 |
| xxxxxx100002000030 | 1101 |
| xxxxxx100002000040 | 1101 |
| xxxxxx400004000000 | 1110 |
| xxxxxx400004000003 | 1110 |
| xxxxxx400004000001 | 1110 |
| xxxxxx400004000002 | 1111 |

TABLE 3-continued

| Sequence of Code Symbols | x' |
|---|---|
| xxxxxx400004000004 | 1111 |
| xxxxxx400004000010 | 1111 |
| xxxxxx400004000020 | 1111 |
| xxxxxx400004000030 | 1111 |
| xxxxxx400004000040 | 1111 |
| xxxxxx001000000030 | 0000 |
| xxxxxx001000000000 | 0000 |
| xxxxxx001000000010 | 0000 |
| xxxxxx001000040000 | 0001 |
| xxxxxx001000000003 | 0001 |
| xxxxxx001000000001 | 0001 |
| xxxxxx001000030000 | 0010 |
| xxxxxx001000000002 | 0010 |
| xxxxxx001000000004 | 0010 |
| xxxxxx001000020000 | 0011 |
| xxxxxx001000000200 | 0011 |
| xxxxxx001000010000 | 0100 |
| xxxxxx001000000400 | 0100 |
| xxxxxx001000001000 | 0101 |
| xxxxxx001000003000 | 0101 |
| xxxxxx001000002000 | 0110 |
| xxxxxx001000004000 | 0110 |
| xxxxxx001000000100 | 0111 |
| xxxxxx001000000020 | 0111 |
| xxxxxx001000000300 | 0111 |
| xxxxxx001000000040 | 0111 |
| xxxxxx003000000030 | 1000 |
| xxxxxx003000000000 | 1000 |
| xxxxxx003000000010 | 1000 |
| xxxxxx003000040000 | 1001 |
| xxxxxx003000000003 | 1001 |
| xxxxxx003000000001 | 1001 |
| xxxxxx003000030000 | 1010 |
| xxxxxx003000000002 | 1010 |
| xxxxxx003000000004 | 1010 |
| xxxxxx003000020000 | 1011 |
| xxxxxx003000000200 | 1011 |
| xxxxxx003000010000 | 1100 |
| xxxxxx003000000400 | 1100 |
| xxxxxx003000001000 | 1101 |
| xxxxxx003000003000 | 1101 |
| xxxxxx003000002000 | 1110 |
| xxxxxx003000004000 | 1110 |
| xxxxxx003000000100 | 1111 |
| xxxxxx003000000020 | 1111 |
| xxxxxx003000000300 | 1111 |
| xxxxxx003000000040 | 1111 |
| xxxxxx002000000030 | 0000 |
| xxxxxx002000000000 | 0000 |
| xxxxxx002000000010 | 0000 |
| xxxxxx002000040000 | 0001 |
| xxxxxx002000000003 | 0001 |
| xxxxxx002000000001 | 0001 |
| xxxxxx002000030000 | 0010 |
| xxxxxx002000000002 | 0010 |
| xxxxxx002000000004 | 0010 |
| xxxxxx002000020000 | 0011 |
| xxxxxx002000000200 | 0011 |
| xxxxxx002000010000 | 0100 |
| xxxxxx002000000400 | 0100 |
| xxxxxx002000001000 | 0101 |
| xxxxxx002000003000 | 0101 |
| xxxxxx002000002000 | 0110 |
| xxxxxx002000004000 | 0110 |
| xxxxxx002000000100 | 0111 |
| xxxxxx002000000020 | 0111 |
| xxxxxx002000000300 | 0111 |
| xxxxxx002000000040 | 0111 |
| xxxxxx004000000030 | 1000 |
| xxxxxx004000000000 | 1000 |
| xxxxxx004000000010 | 1000 |
| xxxxxx004000040000 | 1001 |
| xxxxxx004000000003 | 1001 |
| xxxxxx004000000001 | 1001 |
| xxxxxx004000030000 | 1010 |
| xxxxxx004000000002 | 1010 |

TABLE 3-continued

| Sequence of Code Symbols | x' |
|---|---|
| xxxxxx004000000004 | 1010 |
| xxxxxx004000020000 | 1011 |
| xxxxxx004000000200 | 1011 |
| xxxxxx004000010000 | 1100 |
| xxxxxx004000000400 | 1100 |
| xxxxxx004000001000 | 1101 |
| xxxxxx004000003000 | 1101 |
| xxxxxx004000002000 | 1110 |
| xxxxxx004000004000 | 1110 |
| xxxxxx004000000100 | 1111 |
| xxxxxx004000000020 | 1111 |
| xxxxxx004000000300 | 1111 |
| xxxxxx004000000040 | 1111 |
| xxxxxx000000000100 | 0000 |
| xxxxxx000000000020 | 0000 |
| xxxxxx000000000300 | 0000 |
| xxxxxx000000000040 | 0000 |
| xxxxxx000000000010 | 0001 |
| xxxxxx000000000200 | 0001 |
| xxxxxx000000000030 | 0001 |
| xxxxxx000000000400 | 0001 |
| xxxxxx000000400000 | 0010 |
| xxxxxx000000200004 | 0010 |
| xxxxxx000000300001 | 0010 |
| xxxxxx000000300000 | 0011 |
| xxxxxx000000200003 | 0011 |
| xxxxxx000000300002 | 0011 |
| xxxxxx000000200000 | 0100 |
| xxxxxx000000200002 | 0100 |
| xxxxxx000000300003 | 0100 |
| xxxxxx000000100000 | 0101 |
| xxxxxx000000200001 | 0101 |
| xxxxxx000000300004 | 0101 |
| xxxxxx000000040000 | 0110 |
| xxxxxx000000100004 | 0110 |
| xxxxxx000000400001 | 0110 |
| xxxxxx000000030000 | 0111 |
| xxxxxx000000100001 | 0111 |
| xxxxxx000000400002 | 0111 |
| xxxxxx000000020000 | 1000 |
| xxxxxx000000100003 | 1000 |
| xxxxxx000000400003 | 1000 |
| xxxxxx000000010000 | 1001 |
| xxxxxx000000100002 | 1001 |
| xxxxxx000000400004 | 1001 |
| xxxxxx000000001000 | 1010 |
| xxxxxx000000003000 | 1010 |
| xxxxxx000000002000 | 1011 |
| xxxxxx000000004000 | 1011 |
| 000003000003000000 | 1100 |
| 000003000003000003 | 1100 |
| 000003000003000001 | 1100 |
| 000003000003000002 | 1101 |
| 000003000003000004 | 1101 |
| 000003000003000010 | 1101 |
| 000003000003000020 | 1101 |
| 000003000003000030 | 1101 |
| 000003000003000040 | 1101 |
| xxxxxx000001000000 | 1110 |
| xxxxxx000001000003 | 1110 |
| xxxxxx000001000001 | 1110 |
| xxxxxx000001000002 | 1111 |
| xxxxxx000001000004 | 1111 |
| xxxxxx000001000010 | 1111 |
| xxxxxx000001000020 | 1111 |
| xxxxxx000001000030 | 1111 |
| xxxxxx000001000040 | 1111 |
| 000003000002000000 | 0000 |
| 000003000002000003 | 0000 |
| 000003000002000001 | 0000 |
| 000003000002000002 | 0001 |
| 000003000002000004 | 0001 |
| 000003000002000010 | 0001 |
| 000003000002000020 | 0001 |
| 000003000002000030 | 0001 |
| 000003000002000040 | 0001 |

TABLE 3-continued

| Sequence of Code Symbols | x' |
|---|---|
| 000003000004000000 | 0010 |
| 000003000004000003 | 0010 |
| 000003000004000001 | 0010 |
| 000003000004000002 | 0011 |
| 000003000004000004 | 0011 |
| 000003000004000010 | 0011 |
| 000003000004000020 | 0011 |
| 000003000004000030 | 0011 |
| 000003000004000040 | 0011 |
| 000003000020000002 | 0111 |
| 000003000020000004 | 0111 |
| 000003000020000010 | 0111 |
| 000003000020000020 | 0111 |
| 000003000020000030 | 0111 |
| 000003000020000040 | 0111 |
| 000003000020000100 | 1000 |
| 000003000020000003 | 1000 |
| 000003000020000000 | 1000 |
| 000003000020000200 | 1001 |
| 000003000020000300 | 1001 |
| 000003000020000400 | 1001 |
| 000003000020000001 | 1001 |
| 000003000030000100 | 1011 |
| 000003000030000003 | 1011 |
| 000003000030000000 | 1011 |
| 000003000030000200 | 1100 |
| 000003000030000300 | 1100 |
| 000003000030000400 | 1100 |
| 000003000030000001 | 1100 |
| 000003000040000002 | 1101 |
| 000003000040000004 | 1101 |
| 000003000040000010 | 1101 |
| 000003000040000020 | 1101 |
| 000003000040000030 | 1101 |
| 000003000040000040 | 1101 |
| 000003000040000100 | 1110 |
| 000003000040000003 | 1110 |
| 000003000040000000 | 1110 |
| 000003000040000200 | 1111 |
| 000003000040000300 | 1111 |
| 000003000040000400 | 1111 |
| 000003000040000001 | 1111 |
| 000003000003000000 | 1100 |
| 000001000003000003 | 1100 |
| 000001000003000001 | 1100 |
| 000001000003000002 | 1101 |
| 000001000003000004 | 1101 |
| 000001000003000010 | 1101 |
| 000001000003000020 | 1101 |
| 000001000003000030 | 1101 |
| 000001000003000040 | 1101 |
| 000001000002000000 | 0000 |
| 000001000002000003 | 0000 |
| 000001000002000001 | 0000 |
| 000001000002000002 | 0001 |
| 000001000002000004 | 0001 |
| 000001000002000010 | 0001 |
| 000001000002000020 | 0001 |
| 000001000002000030 | 0001 |
| 000001000002000040 | 0001 |
| 000001000004000000 | 0010 |
| 000001000004000003 | 0010 |
| 000001000004000001 | 0010 |
| 000001000004000002 | 0011 |
| 000001000004000004 | 0011 |
| 000001000004000010 | 0011 |
| 000001000004000020 | 0011 |
| 000001000004000030 | 0011 |
| 000001000004000040 | 0011 |
| 000001000020000002 | 0111 |
| 000001000020000004 | 0111 |
| 000001000020000010 | 0111 |
| 000001000020000020 | 0111 |
| 000001000020060030 | 0111 |
| 000001000020000040 | 0111 |
| 000001000020000100 | 1000 |

TABLE 3-continued

| Sequence of Code Symbols | x' |
|---|---|
| 000001000020000003 | 1000 |
| 000001000020000000 | 1000 |
| 000001000020000200 | 1001 |
| 000001000020000300 | 1001 |
| 000001000020000400 | 1001 |
| 000001000020000001 | 1001 |
| 000001000030000100 | 1011 |
| 000001000030000003 | 1011 |
| 000001000030000000 | 1011 |
| 000001000030000200 | 1100 |
| 000001000030000300 | 1100 |
| 000001000030000400 | 1100 |
| 000001000030000001 | 1100 |
| 000001000040000002 | 1101 |
| 000001000040000004 | 1101 |
| 000001000040000010 | 1101 |
| 000001000040000020 | 1101 |
| 000001000040000030 | 1101 |
| 000001000040000040 | 1101 |
| 000001000040000100 | 1110 |
| 000001000040000003 | 1110 |
| 000001000040000000 | 1110 |
| 000001000040000200 | 1111 |
| 000001000040000300 | 1111 |
| 000001000040000400 | 1111 |
| 000001000040000001 | 1111 |
| 000002000003000000 | 1100 |
| 000002000003000003 | 1100 |
| 000002000003000001 | 1100 |
| 000002000003000002 | 1101 |
| 000002000003000004 | 1101 |
| 000002000003000010 | 1101 |
| 000002000003000020 | 1101 |
| 000002000003000030 | 1101 |
| 000002000003000040 | 1101 |
| 000002000002000000 | 0000 |
| 000002000002000003 | 0000 |
| 000002000002000001 | 0000 |
| 000002000002000002 | 0001 |
| 000002000002000004 | 0001 |
| 000002000002000010 | 0001 |
| 000002000002000020 | 0001 |
| 000002000002000030 | 0001 |
| 000002000002000040 | 0001 |
| 000002000004000000 | 0010 |
| 000002000004000003 | 0010 |
| 000002000004000001 | 0010 |
| 000002000004000002 | 0011 |
| 000002000004000004 | 0011 |
| 000002000004000010 | 0011 |
| 000002000004000020 | 0011 |
| 000002000004000030 | 0011 |
| 000002000004000040 | 0011 |
| 000002000020000002 | 0111 |
| 000002000020000004 | 0111 |
| 000002000020000010 | 0111 |
| 000002000020000020 | 0111 |
| 000002000020000030 | 0111 |
| 000002000020000040 | 0111 |
| 000002000020000100 | 1000 |
| 000002000020000003 | 1000 |
| 000002000020000000 | 1000 |
| 000002000020000200 | 1001 |
| 000002000020000300 | 1001 |
| 000002000020000400 | 1001 |
| 000002000020000001 | 1001 |
| 000002000030000100 | 1011 |
| 000002000030000003 | 1011 |
| 000002000030000000 | 1011 |
| 000002000030000200 | 1100 |
| 000002000030000300 | 1100 |
| 000002000030000400 | 1100 |
| 000002000030000001 | 1100 |
| 000002000040000002 | 1101 |
| 000002000040000004 | 1101 |
| 000002000040000010 | 1101 |
| 000002000040000020 | 1101 |
| 000002000040000030 | 1101 |
| 000002000040000040 | 1101 |
| 000002000040000100 | 1110 |
| 000002000040000003 | 1110 |
| 000002000040000000 | 1110 |
| 000002000040000200 | 1110 |
| 000002000040000300 | 1111 |
| 000002000040000400 | 1111 |
| 000002000040000001 | 1111 |
| 000004000003000000 | 1111 |
| 000004000003000003 | 1100 |
| 000004000003000001 | 1100 |
| 000004000003000002 | 1101 |
| 000004000003000004 | 1101 |
| 000004000003000010 | 1101 |
| 000004000003000020 | 1101 |
| 000004000003000030 | 1101 |
| 000004000003000040 | 1101 |
| 000004000002000000 | 0000 |
| 000004000002000003 | 0000 |
| 000004000002000001 | 0000 |
| 000004000002000002 | 0001 |
| 000004000002000004 | 0001 |
| 000004000002000010 | 0001 |
| 000004000002000020 | 0001 |
| 000004000002000030 | 0001 |
| 000004000002000040 | 0001 |
| 000004000004000000 | 0010 |
| 000004000004000003 | 0010 |
| 000004000004000001 | 0010 |
| 000000400004000002 | 0011 |
| 000004000004000004 | 0011 |
| 000004000004000010 | 0011 |
| 000004000004000020 | 0011 |
| 000004000004000030 | 0011 |
| 000004000004000040 | 0011 |
| 000004000020000002 | 0111 |
| 000004000020000004 | 0111 |
| 000004000020000010 | 0111 |
| 000004000020000020 | 0111 |
| 000004000020000030 | 0111 |
| 000004000020000040 | 0111 |
| 000004000020000100 | 1000 |
| 000004000020000003 | 1000 |
| 000004000020000000 | 1000 |
| 000004000020000200 | 1001 |
| 000004000020000300 | 1001 |
| 000004000020000400 | 1001 |
| 000004000020000001 | 1001 |
| 000004000030000100 | 1011 |
| 000004000030000003 | 1011 |
| 000004000030000000 | 1011 |
| 000004000030000200 | 1100 |
| 000004000030000300 | 1100 |
| 000004000030000400 | 1100 |
| 000004000030000001 | 1100 |
| 000004000040000002 | 1101 |
| 000004000040000004 | 1101 |
| 000004000040000010 | 1101 |
| 000004000040000020 | 1101 |
| 000004000040000030 | 1101 |
| 000004000040000040 | 1101 |
| 000004000040000100 | 1110 |
| 000004000040000003 | 1110 |
| 000004000040000000 | 1110 |
| 000004000040000200 | 1111 |
| 000004000040000300 | 1111 |
| 000004000040000400 | 1111 |
| 000004000040000001 | 1111 |
| 000010000002000000 | 0000 |
| 000010000002000003 | 0000 |
| 000010000002000001 | 0000 |
| 000010000002000002 | 0001 |
| 000010000002000004 | 0001 |
| 000010000002000010 | 0001 |

TABLE 3-continued

| Sequence of Code Symbols | x' |
|---|---|
| 00001000002000020 | 0001 |
| 00001000002000030 | 0001 |
| 00001000002000040 | 0001 |
| 00001000004000000 | 0010 |
| 00001000004000003 | 0010 |
| 00001000004000001 | 0010 |
| 00001000004000002 | 0011 |
| 00001000004000004 | 0011 |
| 00001000004000010 | 0011 |
| 00001000004000020 | 0011 |
| 00001000004000030 | 0011 |
| 00001000004000040 | 0011 |
| 00001000020000002 | 0111 |
| 00001000020000004 | 0111 |
| 00001000020000010 | 0111 |
| 00001000020000020 | 0111 |
| 00001000020000030 | 0111 |
| 00001000020000040 | 0111 |
| 00001000020000100 | 1000 |
| 00000000020000003 | 1000 |
| 00001000020000000 | 1000 |
| 00001000020000200 | 1001 |
| 00001000020000300 | 1001 |
| 00001000020000400 | 1001 |
| 00001000020000001 | 1001 |
| 00001000030000100 | 1011 |
| 00001000030000003 | 1011 |
| 00001000030000000 | 1011 |
| 00001000030000200 | 1100 |
| 00001000030000300 | 1100 |
| 00001000030000400 | 1100 |
| 00001000030000001 | 1100 |
| 00001000040000002 | 1101 |
| 00001000040000004 | 1101 |
| 00001000040000010 | 1101 |
| 00001000040000020 | 1101 |
| 00001000040000030 | 1101 |
| 00001000040000040 | 1101 |
| 00001000040000100 | 1110 |
| 00001000040000003 | 1110 |
| 00001000040000000 | 1110 |
| 00001000040000200 | 1111 |
| 00001000040000300 | 1111 |
| 00001000040000400 | 1111 |
| 00001000040000001 | 1111 |
| 00001000003000000 | 0001 |
| 00001000003000003 | 0001 |
| 00001000003000001 | 0001 |
| 00001000200000002 | 0000 |
| 00001000200000004 | 0000 |
| 00001000200000010 | 0000 |
| 00001000200000020 | 0000 |
| 00001000200000030 | 0000 |
| 00001000200000040 | 0000 |
| 00001000200000100 | 0001 |
| 00001000200000003 | 0001 |
| 00001000200000000 | 0001 |
| 00001000200000200 | 0010 |
| 00001000200000300 | 0010 |
| 00001000200000400 | 0010 |
| 00001000200000001 | 0010 |
| 00001000200001000 | 0011 |
| 00001000200003000 | 0011 |
| 00001000200002000 | 0100 |
| 00001000200004000 | 0100 |
| 00001000400000002 | 1010 |
| 00001000400000004 | 1010 |
| 00001000400000010 | 1010 |
| 00001000400000020 | 1010 |
| 00001000400000030 | 1010 |
| 00001000400000040 | 1010 |
| 00001000400000100 | 1011 |
| 00001000400000003 | 1011 |
| 00001000400000000 | 1011 |
| 00001000400000200 | 1100 |
| 00001000400000300 | 1100 |

TABLE 3-continued

| Sequence of Code Symbols | x' |
|---|---|
| 00001000400000400 | 1100 |
| 00001000400000001 | 1100 |
| 00001000400001000 | 1101 |
| 00001000400003000 | 1101 |
| 00002000002000000 | 0000 |
| 00002000002000003 | 0000 |
| 00002000002000001 | 0000 |
| 00002000002000002 | 0001 |
| 00002000002000004 | 0001 |
| 00002000002000010 | 0001 |
| 00002000002000020 | 0001 |
| 00002000002000030 | 0001 |
| 00002000002000040 | 0001 |
| 00002000004000000 | 0010 |
| 00002000004000003 | 0010 |
| 00002000004000001 | 0010 |
| 00002000004000002 | 0011 |
| 00002000004000004 | 0011 |
| 00002000004000010 | 0011 |
| 00002000004000020 | 0011 |
| 00002000004000030 | 0011 |
| 00002000004000040 | 0011 |
| 00002000020000002 | 0111 |
| 00002000020000004 | 0111 |
| 00002000020000010 | 0111 |
| 00002000020000020 | 0111 |
| 00002000020000030 | 0111 |
| 00002000020000040 | 0111 |
| 00002000020000100 | 1000 |
| 00002000020000003 | 1000 |
| 00002000020000000 | 1000 |
| 00002000020000200 | 1001 |
| 00002000020000300 | 1001 |
| 00002000020000400 | 1001 |
| 00002000020000001 | 1001 |
| 00002000030000100 | 1011 |
| 00002000030000003 | 1011 |
| 00002000030000000 | 1011 |
| 00002000030000200 | 1100 |
| 00002000030000300 | 1100 |
| 00002000030000400 | 1100 |
| 00002000030000001 | 1100 |
| 00002000040000002 | 1101 |
| 00002000040000004 | 1101 |
| 00002000040000010 | 1101 |
| 00002000040000020 | 1101 |
| 00002000040000030 | 1101 |
| 00002000040000040 | 1101 |
| 00002000040000100 | 1110 |
| 00002000040000003 | 1110 |
| 00002000040000000 | 1110 |
| 00002000040000200 | 1111 |
| 00002000040000300 | 1111 |
| 00002000040000400 | 1111 |
| 00002000040000001 | 1111 |
| 00002000003000000 | 0001 |
| 00002000003000003 | 0001 |
| 00002000003000001 | 0001 |
| 00002000200000002 | 0000 |
| 00002000200000004 | 0000 |
| 00002000200000010 | 0000 |
| 00002000200000020 | 0000 |
| 00002000200000030 | 0000 |
| 00002000200000040 | 0000 |
| 00002000200000100 | 0001 |
| 00002000200000003 | 0001 |
| 00002000200000000 | 0001 |
| 00002000200000200 | 0010 |
| 00002000200000300 | 0010 |
| 00002000200000400 | 0010 |
| 00002000200000001 | 0010 |
| 00002000200001000 | 0011 |
| 00002000200003000 | 0011 |
| 00002000200002000 | 0100 |
| 00002000200004000 | 0100 |
| 00002000400000002 | 1010 |

TABLE 3-continued

| Sequence of Code Symbols | x' |
|---|---|
| 000020000400000004 | 1010 |
| 000020000400000010 | 1010 |
| 000020000400000020 | 1010 |
| 000020000400000030 | 1010 |
| 000020000400000040 | 1010 |
| 000020000400000100 | 1011 |
| 000020000400000003 | 1011 |
| 000020000400000000 | 1011 |
| 000020000400000200 | 1100 |
| 000020000400000300 | 1100 |
| 000020000400000400 | 1100 |
| 000020000400000001 | 1100 |
| 000020000400001000 | 1101 |
| 000020000400003000 | 1101 |
| 000030000002000000 | 0000 |
| 000030000002000003 | 0000 |
| 000030000002000001 | 0000 |
| 000030000002000002 | 0001 |
| 000030000002000004 | 0001 |
| 000030000002000010 | 0001 |
| 000030000002000020 | 0001 |
| 000030000002000030 | 0001 |
| 000030000002000040 | 0001 |
| 000030000004000000 | 0010 |
| 000030000004000003 | 0010 |
| 000030000004000001 | 0010 |
| 000030000004000002 | 0011 |
| 000030000004000004 | 0011 |
| 000030000004000010 | 0011 |
| 000030000004000020 | 0011 |
| 000030000004000030 | 0011 |
| 000030000004000040 | 0011 |
| 000030000020000002 | 0111 |
| 000030000020000004 | 0111 |
| 000030000020000010 | 0111 |
| 000030000020000020 | 0111 |
| 000030000020000030 | 0111 |
| 000030000020000040 | 0111 |
| 000030000020000100 | 1000 |
| 000030000020000003 | 1000 |
| 000030000020000000 | 1000 |
| 000030000020000200 | 1001 |
| 000030000020000300 | 1001 |
| 000030000020000400 | 1001 |
| 000030000020000001 | 1001 |
| 000030000030000100 | 1011 |
| 000030000030000003 | 1011 |
| 000030000030000000 | 1011 |
| 000030000030000200 | 1100 |
| 000030000030000300 | 1100 |
| 000030000030000400 | 1100 |
| 000030000030000001 | 1100 |
| 000030000040000002 | 1101 |
| 000030000040000004 | 1101 |
| 000030000040000010 | 1101 |
| 000030000040000020 | 1101 |
| 000030000040000030 | 1101 |
| 000030000040000040 | 1101 |
| 000030000040000100 | 1110 |
| 000030000040000003 | 1110 |
| 000030000040000000 | 1110 |
| 000030000040000200 | 1111 |
| 000030000040000300 | 1111 |
| 000030000040000400 | 1111 |
| 000030000040000001 | 1111 |
| 000030000003000000 | 0001 |
| 000030000003000003 | 0001 |
| 000030000003000001 | 0001 |
| 000030000200000002 | 0000 |
| 000030000200000004 | 0000 |
| 000030000200000010 | 0000 |
| 000030000200000020 | 0000 |
| 000030000200000030 | 0000 |
| 000030000200000040 | 0000 |
| 000030000200000100 | 0001 |
| 000030000200000003 | 0001 |

TABLE 3-continued

| Sequence of Code Symbols | x' |
|---|---|
| 000030000200000000 | 0001 |
| 000030000200000200 | 0010 |
| 000030000200000300 | 0010 |
| 000030000200000400 | 0010 |
| 000030000200000001 | 0010 |
| 000030000200001000 | 0011 |
| 000030000200003000 | 0011 |
| 000030000200002000 | 0100 |
| 000030000200004000 | 0100 |
| 000030000400000002 | 1010 |
| 000030000400000004 | 1010 |
| 000030000400000010 | 1010 |
| 000030000400000020 | 1010 |
| 000030000400000030 | 1010 |
| 000030000400000040 | 1010 |
| 000030000400000100 | 1011 |
| 000030000400000003 | 1011 |
| 000030000400000000 | 1011 |
| 000040000200000200 | 0010 |
| 000040000200000300 | 0010 |
| 000040000200000400 | 0010 |
| 000040000200000001 | 0010 |
| 000040000200001000 | 0011 |
| 000040000200003000 | 0011 |
| 000040000200002000 | 0100 |
| 000040000200004000 | 0100 |
| 000040000400000002 | 1010 |
| 000040000400000004 | 1010 |
| 000040000400000010 | 1010 |
| 000040000400000020 | 1010 |
| 000040000400000030 | 1010 |
| 000040000400000040 | 1010 |
| 000040000400000100 | 1011 |
| 000040000400000003 | 1011 |
| 000040000400000000 | 1011 |
| 000040000400000200 | 1100 |
| 000040000400000300 | 1100 |
| 000040000400000400 | 1100 |
| 000040000400000001 | 1100 |
| 000040000400001000 | 1101 |
| 000040000400003000 | 1101 |
| 000003000003000000 | 1100 |
| 000003000003000003 | 1100 |
| 000003000003000001 | 1100 |
| 000003000003000002 | 1101 |
| 000003000003000004 | 1101 |
| 000003000003000010 | 1101 |
| 000003000003000020 | 1101 |
| 000003000003000030 | 1101 |
| 000003000003000040 | 1101 |
| 000000000200000002 | 0010 |
| 000000000200000004 | 0010 |
| 000000000200000010 | 0010 |
| 000000000200000020 | 0010 |
| 000000000200000030 | 0010 |
| 000000000200000040 | 0010 |
| 000000000200000100 | 0011 |
| 000000000200000003 | 0011 |
| 000000000200000000 | 0011 |
| 000000000200000200 | 0100 |
| 000000000200000300 | 0100 |
| 000000000200000400 | 0100 |
| 000000000200000001 | 0100 |
| 000000000400000002 | 1001 |
| 000000000400000004 | 1001 |
| 000000000400000010 | 1001 |
| 000000000400000020 | 1001 |
| 000000000400000030 | 1001 |
| 000000000400000040 | 1001 |
| 000000000400000100 | 1010 |
| 000000000400000003 | 1010 |
| 000000000400000000 | 1010 |
| 000000000400000200 | 1011 |
| 000000000400000300 | 1011 |
| 000000000400000400 | 1011 |
| 000000000400000001 | 1011 |

TABLE 3-continued

| Sequence of Code Symbols | x' |
|---|---|
| 000000000400001000 | 1100 |
| 000000000400003000 | 1100 |
| 000100000002000000 | 0000 |
| 000100000002000003 | 0000 |
| 000100000002000001 | 0000 |
| 000100000002000002 | 0001 |
| 000100000002000004 | 0001 |
| 000100000002000010 | 0001 |
| 000100000002000020 | 0001 |
| 000100000002000030 | 0001 |
| 000100000002000040 | 0001 |
| 000100000004000000 | 0010 |
| 000100000004000003 | 0010 |
| 000100000004000001 | 0010 |
| 000100000004000002 | 0011 |
| 000100000004000004 | 0011 |
| 000100000004000010 | 0011 |
| 000100000004000020 | 0011 |
| 000100000004000030 | 0011 |
| 000100000004000040 | 0011 |
| 000100000020000002 | 0111 |
| 000100000020000004 | 0111 |
| 000100000020000010 | 0111 |
| 000100000020000020 | 0111 |
| 000100000020000030 | 0111 |
| 000100000020000040 | 0111 |
| 000100000020000100 | 1000 |
| 000100000020000003 | 1000 |
| 000100000020000000 | 1000 |
| 000100000020000200 | 1001 |
| 000100000020000300 | 1001 |
| 000100000020000400 | 1001 |
| 000100000020000001 | 1001 |
| 000100000030000100 | 1011 |
| 000100000030000003 | 1011 |
| 000100000030000000 | 1011 |
| 000100000030000200 | 1100 |
| 000100000030000300 | 1100 |
| 000100000030000400 | 1100 |
| 000100000030000001 | 1100 |
| 000100000040000002 | 1101 |
| 000100000040000004 | 1101 |
| 000100000040000010 | 1101 |
| 000100000040000020 | 1101 |
| 000100000040000030 | 1101 |
| 000100000040000040 | 1101 |
| 000100000040000100 | 1110 |
| 000100000040000003 | 1110 |
| 000100000040000000 | 1110 |
| 000100000040000200 | 1111 |
| 000100000040000300 | 1111 |
| 000100000040000400 | 1111 |
| 000100000040000001 | 1111 |
| 000100000003000000 | 0001 |
| 000100000003000003 | 0001 |
| 000100000003000001 | 0001 |
| 000100000200000002 | 0000 |
| 000100000200000004 | 0000 |
| 000100000200000010 | 0000 |
| 000100000200000020 | 0000 |
| 000100000200000030 | 0000 |
| 000100000200000040 | 0000 |
| 000100000200000100 | 0001 |
| 000100000200000003 | 0001 |
| 000100000200000000 | 0001 |
| 000100000200000200 | 0010 |
| 000100000200000300 | 0010 |
| 000100000200000400 | 0010 |
| 000100000200000001 | 0010 |
| 000100000200001000 | 0011 |
| 000100000200003000 | 0011 |
| 000100000200002000 | 0100 |
| 000100000200004000 | 0100 |
| 000100000400000002 | 1010 |
| 000100000400000004 | 1010 |
| 000100000400000010 | 1010 |

TABLE 3-continued

| Sequence of Code Symbols | x' |
|---|---|
| 000100000400000020 | 1010 |
| 000100000400000030 | 1010 |
| 000100000400000040 | 1010 |
| 000100000400000100 | 1011 |
| 000100000400000003 | f011 |
| 000100000400000000 | 1011 |
| 000100000400000200 | 1100 |
| 000100000400000300 | 1100 |
| 000100000400000400 | 1100 |
| 000100000400000001 | 1100 |
| 000100000400001000 | 1101 |
| 000100000400003000 | 1101 |
| 000200000002000000 | 0000 |
| 000200000002000003 | 0000 |
| 000200000002000001 | 0000 |
| 000200000002000002 | 0001 |
| 000200000002000004 | 0001 |
| 000200000002000010 | 0001 |
| 000200000002000020 | 0001 |
| 000200000002000030 | 0001 |
| 000200000002000040 | 0001 |
| 000200000004000000 | 0010 |
| 000200000004000003 | 0010 |
| 000200000004000001 | 0010 |
| 000200000004000002 | 0011 |
| 000200000004000004 | 0011 |
| 000200000004000010 | 0011 |
| 000200000004000020 | 0011 |
| 000200000004000030 | 0011 |
| 000200000004000040 | 0011 |
| 000200000020000002 | 0111 |
| 000200000020000004 | 0111 |
| 000200000020000010 | 0111 |
| 000200000020000020 | 0111 |
| 000200000020000030 | 0111 |
| 000200000020000040 | 0111 |
| 000200000020000100 | 1000 |
| 000200000020000003 | 1000 |
| 000200000020000000 | 1000 |
| 000200000020000200 | 1001 |
| 000200000020000300 | 1001 |
| 000200000020000400 | 1001 |
| 000200000020000001 | 1001 |
| 000200000030000100 | 1011 |
| 000200000030000003 | 1011 |
| 000200000030000000 | 1011 |
| 000200000030000200 | 1100 |
| 000200000030000300 | 1100 |
| 000200000030000400 | 1100 |
| 000200000030000001 | 1100 |
| 000200000040000002 | 1101 |
| 000200000040000004 | 1101 |
| 000200000040000010 | 1101 |
| 000200000040000020 | 1101 |
| 000200000040000030 | 1101 |
| 000200000040000040 | 1101 |
| 000200000040000100 | 1110 |
| 000200000040000003 | 1110 |
| 000200000040000000 | 1110 |
| 000200000040000200 | 1111 |
| 000200000040000300 | 1111 |
| 000200000040000400 | 1111 |
| 000200000040000001 | 1111 |
| 000200000003000000 | 0001 |
| 000200000003000003 | 0001 |
| 000200000003000001 | 0001 |
| 000200000200000002 | 0000 |
| 000200000200000004 | 0000 |
| 000200000200000010 | 0000 |
| 000200000200000020 | 0000 |
| 000200000200000030 | 0000 |
| 000200000200000040 | 0000 |
| 000200000200000100 | 0001 |
| 000200000200000003 | 0001 |
| 000200000200000000 | 0001 |
| 000200000200000200 | 0010 |

TABLE 3-continued

| Sequence of Code Symbols | x' |
|---|---|
| 000200000200000300 | 0010 |
| 000200000200000400 | 0010 |
| 000200000200000001 | 0010 |
| 000200000200001000 | 0011 |
| 000200000200003000 | 0011 |
| 000200000200002000 | 0100 |
| 000200000200004000 | 0100 |
| 000200000400000002 | 1010 |
| 000200000400000004 | 1010 |
| 000200000400000010 | 1010 |
| 000200000400000020 | 1010 |
| 000200000400000030 | 1010 |
| 000200000400000040 | 1010 |
| 000200000400000100 | 1011 |
| 000200000400000003 | 1011 |
| 000200000400000000 | 1011 |
| 000200000400000200 | 1100 |
| 000200000400000300 | 1100 |
| 000200000400000400 | 1100 |
| 000200000400000001 | 1100 |
| 000200000400001000 | 1101 |
| 000200000400003000 | 1101 |
| 000300000002000000 | 0000 |
| 000300000002000003 | 0000 |
| 000300000002000001 | 0000 |
| 000300000002000002 | 0001 |
| 000300000002000004 | 0001 |
| 000300000002000010 | 0001 |
| 000300000002000020 | 0001 |
| 000300000002000030 | 0001 |
| 000300000002000040 | 0001 |
| 000300000004000000 | 0010 |
| 000300000004000003 | 0010 |
| 000300000004000001 | 0010 |
| 000300000004000002 | 0011 |
| 000300000004000004 | 0011 |
| 000300000004000010 | 0011 |
| 000300000004000020 | 0011 |
| 000300000004000030 | 0011 |
| 000300000004000040 | 0011 |
| 000300000020000002 | 0111 |
| 000300000020000004 | 0111 |
| 000300000020000010 | 0111 |
| 000300000020000020 | 0111 |
| 000300000020000030 | 0111 |
| 000300000020000040 | 0111 |
| 000300000020000100 | 1000 |
| 000300000020000003 | 1000 |
| 000300000020000000 | 1000 |
| 000300000020000200 | 1001 |
| 000300000020000300 | 1001 |
| 000300000020000400 | 1001 |
| 000300000020000001 | 1001 |
| 000300000030000100 | 1011 |
| 000300000030000003 | 1011 |
| 000300000030000000 | 1011 |
| 000300000030000200 | 1100 |
| 000300000030000300 | 1100 |
| 000300000030000400 | 1100 |
| 000300000030000001 | 1100 |
| 000300000040000002 | 1101 |
| 000300000040000004 | 1101 |
| 000300000040000010 | 1101 |
| 000300000040000020 | 1101 |
| 000300000040000030 | 1101 |
| 000300000040000040 | 1101 |
| 000300000040000100 | 1110 |
| 000300000040000003 | 1110 |
| 000300000040000000 | 1110 |
| 000300000040000200 | 1111 |
| 000300000040000300 | 1111 |
| 000300000040000400 | 1111 |
| 000300000040000001 | 1111 |
| 000300000003000000 | 0001 |
| 000300000003000003 | 0001 |
| 000300000003000001 | 0001 |

TABLE 3-continued

| Sequence of Code Symbols | x' |
|---|---|
| 000300000200000002 | 0000 |
| 000300000200000004 | 0000 |
| 000300000200000010 | 0000 |
| 000300000200000020 | 0000 |
| 000300000200000030 | 0000 |
| 000300000200000040 | 0000 |
| 000300000200000100 | 0001 |
| 000300000200000003 | 0001 |
| 000300000200000000 | 0001 |
| 000300000200000200 | 0010 |
| 000300000200000300 | 0010 |
| 000300000200000400 | 0010 |
| 000300000200000001 | 0010 |
| 000300000200001000 | 0011 |
| 000300000200003000 | 0011 |
| 000300000200002000 | 0100 |
| 000300000200004000 | 0100 |
| 000300000400000002 | 1010 |
| 000300000400000004 | 1010 |
| 000300000400000010 | 1010 |
| 000300000400000020 | 1010 |
| 000300000400000030 | 1010 |
| 000300000400000040 | 1010 |
| 000300000400000100 | 1011 |
| 000300000400000003 | 1011 |
| 000300000400000000 | 1011 |
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1100 |
| 000400000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |
| 000400000040000030 | 1101 |
| 000400000040000040 | 1101 |

TABLE 3-continued

| Sequence of Code Symbols | x' |
|---|---|
| 00040000040000100 | 1110 |
| 00040000040000003 | 1110 |
| 00040000040000000 | 1110 |
| 00040000040000200 | 1111 |
| 00040000040000300 | 1111 |
| 00040000040000400 | 1111 |
| 00040000040000001 | 1111 |
| 00040000003000000 | 0001 |
| 00040000003000003 | 0001 |
| 00040000003000001 | 0001 |
| 00040000200000002 | 0000 |
| 00040000200000004 | 0000 |
| 00040000200000010 | 0000 |
| 00040000200000020 | 0000 |
| 00040000200000030 | 0000 |
| 00040000200000040 | 0000 |
| 00040000200000100 | 0001 |
| 00040000200000003 | 0001 |
| 00040000200000000 | 0001 |
| 00040000200000200 | 0010 |
| 00040000200000300 | 0010 |
| 00040000200000400 | 0010 |
| 00040000200000001 | 0010 |
| 00040000200001000 | 0011 |
| 00040000200003000 | 0011 |
| 00040000200002000 | 0100 |
| 00040000200004000 | 0100 |
| 00040000400000002 | 1010 |
| 00040000400000004 | 1010 |
| 00040000400000010 | 1010 |
| 00040000400000020 | 1010 |
| 00040000400000030 | 1010 |
| 00040000400000040 | 1010 |
| 00040000400000100 | 1011 |
| 00040000400000003 | 1011 |
| 00040000400000000 | 1011 |
| 00040000400000200 | 1100 |
| 00040000400000300 | 1100 |
| 00040000400000400 | 1100 |
| 00040000400000001 | 1100 |
| 00040000400001000 | 1101 |
| 00040000400003000 | 1101 |
| 00000100003000000 | 1100 |
| 00000100003000003 | 1100 |
| 00000100003000001 | 1100 |
| 00000100003000002 | 1101 |
| 00000100003000004 | 1101 |
| 00000100003000010 | 1101 |
| 00000100003000020 | 1101 |
| 00000100003000030 | 1101 |
| 00000100003000040 | 1101 |
| 00000100002000000 | 0000 |
| 00000100002000003 | 0000 |
| 00000100002000001 | 0000 |
| 00000100002000002 | 0001 |
| 00000100002000004 | 0001 |
| 00000100002000010 | 0001 |
| 00000100002000020 | 0001 |
| 00000100002000030 | 0001 |
| 00000100002000040 | 0001 |
| 00000100004000000 | 0010 |
| 00000100004000003 | 0010 |
| 00000100004000001 | 0010 |
| 00000100004000002 | 0011 |
| 00000100004000004 | 0011 |
| 00000100004000010 | 0011 |
| 00000100004000020 | 0011 |
| 00000100004000030 | 0011 |
| 00000100004000040 | 0011 |
| 00000100020000002 | 0111 |
| 00000100020000004 | 0111 |
| 00000100020000010 | 0111 |
| 00000100020000020 | 0111 |
| 00000100020000030 | 0111 |
| 00000100020000040 | 0111 |
| 00000100020000100 | 1000 |

TABLE 3-continued

| Sequence of Code Symbols | x' |
|---|---|
| 00000100020000003 | 1000 |
| 00000100020000000 | 1000 |
| 00000100020000200 | 1001 |
| 00000100020000300 | 1001 |
| 00000100020000400 | 1001 |
| 00000100020000001 | 1001 |
| 00000100030000100 | 1011 |
| 00000100030000003 | 1011 |
| 00000100030000000 | 1011 |
| 00000100030000200 | 1100 |
| 00000100030000300 | 1100 |
| 00000100030000400 | 1100 |
| 00000100030000001 | 1100 |
| 00000100040000002 | 1101 |
| 00000100040000004 | 1101 |
| 00000100040000010 | 1101 |
| 00000100040000020 | 1101 |
| 00000100040000030 | 1101 |
| 00000100040000040 | 1101 |
| 00000100040000100 | 1110 |
| 00000100040000003 | 1110 |
| 00000100040000000 | 1110 |
| 00000100040000200 | 1111 |
| 00000100040000300 | 1111 |
| 00000100040000400 | 1111 |
| 00000100040000001 | 1111 |
| 00100000030000100 | 0000 |
| 00100000030000003 | 0000 |
| 00100000030000000 | 0000 |
| 00100000030000200 | 0001 |
| 00100000030000300 | 0001 |
| 00100000030000400 | 0001 |
| 00100000030000001 | 0001 |
| 00100000003000000 | 1100 |
| 00100000003000003 | 1100 |
| 00100000003000001 | 1100 |
| 00100000003000002 | 1101 |
| 00100000003000004 | 1101 |
| 00100000003000010 | 1101 |
| 00100000003000020 | 1101 |
| 00100000003000030 | 1101 |
| 00100000003000040 | 1101 |
| 00100000002000000 | 1100 |
| 00100000002000003 | 1100 |
| 00100000002000001 | 1100 |
| 00100000002000002 | 1101 |
| 00100000002000004 | 1101 |
| 00100000002000010 | 1101 |
| 00100000002000020 | 1101 |
| 00100000002000030 | 1101 |
| 00100000002000040 | 1101 |
| 00100000004000000 | 1110 |
| 00100000004000003 | 1110 |
| 00100000004000001 | 1110 |
| 00100000004000002 | 1111 |
| 00100000004000004 | 1111 |
| 00100000004000010 | 1111 |
| 00100000004000020 | 1111 |
| 00100000004000030 | 1111 |
| 00100000004000040 | 1111 |
| 00100000200000002 | 1100 |
| 00100000200000004 | 1100 |
| 00100000200000010 | 1100 |
| 00100000200000020 | 1100 |
| 00100000200000030 | 1100 |
| 00100000200000040 | 1100 |
| 00100000200000100 | 1101 |
| 00100000200000003 | 1101 |
| 00100000200000000 | 1101 |
| 00100000200000200 | 1110 |
| 00100000200000300 | 1110 |
| 00100000200000400 | 1110 |
| 00100000200000001 | 1110 |
| 00100000200001000 | 1111 |
| 00100000200003000 | 1111 |
| 00100000400000002 | 1100 |

TABLE 3-continued

| Sequence of Code Symbols | x' |
|---|---|
| 001000000400000004 | 1100 |
| 001000000400000010 | 1100 |
| 001000000400000020 | 1100 |
| 001000000400000030 | 1100 |
| 001000000400000040 | 1100 |
| 001000000400000100 | 1101 |
| 001000000400000003 | 1101 |
| 001000000400000000 | 1101 |
| 001000000400000200 | 1110 |
| 001000000400000300 | 1110 |
| 001000000400000400 | 1110 |
| 001000000400000001 | 1110 |
| 001000000400001000 | 1111 |
| 001000000400003000 | 1111 |
| 001000000020000002 | 0010 |
| 001000000020000004 | 0010 |
| 001000000020000010 | 0010 |
| 001000000020000020 | 0010 |
| 001000000020000030 | 0010 |
| 001000000020000040 | 0010 |
| 001000000020000100 | 0011 |
| 001000000020000003 | 0011 |
| 001000000020000000 | 0011 |
| 001000000020000200 | 0100 |
| 001000000020000300 | 0100 |
| 001000000020000400 | 0100 |
| 001000000020000001 | 0100 |
| 001000000040000002 | 1010 |
| 001000000040000004 | 1010 |
| 001000000040000010 | 1010 |
| 001000000040000020 | 1010 |
| 001000000040000030 | 1010 |
| 001000000040000040 | 1010 |
| 001000000040000100 | 1011 |
| 001000000040000003 | 1011 |
| 001000000040000000 | 1011 |
| 001000000040000200 | 1100 |
| 001000000040000300 | 1100 |
| 001000000040000400 | 1100 |
| 001000000040000001 | 1100 |
| 003000000030000100 | 0000 |
| 003000000030000003 | 0000 |
| 003000000030000000 | 0000 |
| 003000000030000200 | 0001 |
| 003000000030000300 | 0001 |
| 003000000030000400 | 0001 |
| 003000000030000001 | 0001 |
| 003000000003000000 | 1100 |
| 003000000003000003 | 1100 |
| 003000000003000001 | 1100 |
| 003000000003000002 | 1101 |
| 003000000003000004 | 1101 |
| 003000000003000010 | 1101 |
| 003000000003000020 | 1101 |
| 003000000003000030 | 1101 |
| 003000000003000040 | 1101 |
| 003000000002000000 | 1100 |
| 003000000002000003 | 1100 |
| 003000000002000001 | 1100 |
| 003000000002000002 | 1101 |
| 003000000002000004 | 1101 |
| 003000000002000010 | 1101 |
| 003000000002000020 | 1101 |
| 003000000002000030 | 1101 |
| 003000000002000040 | 1101 |
| 003000000004000000 | 1110 |
| 003000000004000003 | 1110 |
| 003000000004000001 | 1110 |
| 003000000004000002 | 1111 |
| 003000000004000004 | 1111 |
| 003000000004000010 | 1111 |
| 003000000004000020 | 1111 |
| 003000000004000030 | 1111 |
| 003000000004000040 | 1111 |
| 003000000200000002 | 1100 |
| 003000000200000004 | 1100 |

TABLE 3-continued

| Sequence of Code Symbols | x' |
|---|---|
| 003000000200000010 | 1100 |
| 003000000200000020 | 1100 |
| 003000000200000030 | 1100 |
| 003000300200000040 | 1100 |
| 003000000200000100 | 1101 |
| 003000000200000003 | 1101 |
| 003000000200000000 | 1101 |
| 003000000200000200 | 1110 |
| 003000000200000300 | 1110 |
| 003000000200000400 | 1110 |
| 003000000200000001 | 1110 |
| 003000000200001000 | 1111 |
| 003000000200003000 | 1111 |
| 003000000400000002 | 1100 |
| 003000000400000004 | 1100 |
| 003000000400000010 | 1100 |
| 003000000400000020 | 1100 |
| 003000000400000030 | 1100 |
| 003000000400000040 | 1100 |
| 003000000400000100 | 1101 |
| 003000000400000003 | 1101 |
| 003000000400000000 | 1101 |
| 003000000400000200 | 1110 |
| 003000000400000300 | 1110 |
| 003000000400000400 | 1110 |
| 003000000400000001 | 1110 |
| 003000000400001000 | 1111 |
| 003000000400003000 | 1111 |
| 003000000020000002 | 0010 |
| 003000000020000004 | 0010 |
| 003000000020000010 | 0010 |
| 003000000020000020 | 0010 |
| 003000000020000030 | 0010 |
| 003000000020000040 | 0010 |
| 003000000020000100 | 0011 |
| 003000000020000003 | 0011 |
| 003000000020000000 | 0011 |
| 003000000020000200 | 0100 |
| 003000000020000300 | 0100 |
| 003000000020000400 | 0100 |
| 003000000020000001 | 0100 |
| 003000000040000002 | 1010 |
| 003000000040000004 | 1010 |
| 003000000040000010 | 1010 |
| 003000000040000020 | 1010 |
| 003000000040000030 | 1010 |
| 003000000040000040 | 1010 |
| 003000000040000100 | 1011 |
| 003000000040000003 | 1011 |
| 003000000040000000 | 1011 |
| 003000000040000200 | 1100 |
| 003000000040000300 | 1100 |
| 003000000040000400 | 1100 |
| 003000000040000001 | 1100 |
| 002000000030000100 | 0000 |
| 002000000030000003 | 0000 |
| 002000000030000000 | 0000 |
| 002000000030000200 | 0001 |
| 002000000030000300 | 0001 |
| 002000000030000400 | 0001 |
| 002000000030000001 | 0001 |
| 002000000003000000 | 1100 |
| 002000000003000003 | 1100 |
| 002000000003000001 | 1100 |
| 002000000003000002 | 1101 |
| 002000000003000004 | 1101 |
| 002000000003000010 | 1101 |
| 002000000003000020 | 1101 |
| 002000000003000030 | 1101 |
| 002000000003000040 | 1101 |
| 002000000002000000 | 1100 |
| 002000000002000003 | 1100 |
| 002000000002000001 | 1100 |
| 002000000002000002 | 1101 |
| 002000000002000004 | 1101 |
| 002000000002000010 | 1101 |

TABLE 3-continued

| Sequence of Code Symbols | x' |
|---|---|
| 002000000002000020 | 1101 |
| 002000000002000030 | 1101 |
| 002000000002000040 | 1101 |
| 002000000004000000 | 1110 |
| 002000000004000003 | 1110 |
| 002000000004000001 | 1110 |
| 002000000004000002 | 1111 |
| 002000000004000004 | 1111 |
| 002000000004000010 | 1111 |
| 002000000004000020 | 1111 |
| 002000000004000030 | 1111 |
| 002000000004000040 | 1111 |
| 002000000200000002 | 1100 |
| 002000000200000004 | 1100 |
| 002000000200000010 | 1100 |
| 002000000200000020 | 1100 |
| 002000000200000030 | 1100 |
| 002000000200000040 | 1100 |
| 002000000200000100 | 1101 |
| 002000000200000003 | 1101 |
| 002000000200000000 | 1101 |
| 002000000200000200 | 1110 |
| 002000000200000300 | 1110 |
| 002000000200000400 | 1110 |
| 002000000200000001 | 1110 |
| 002000000200001000 | 1111 |
| 002000000200003000 | 1111 |
| 002000000400000002 | 1100 |
| 002000000400000004 | 1100 |
| 002000000400000010 | 1100 |
| 002000000400000020 | 1100 |
| 002000000400000030 | 1100 |
| 002000000400000040 | 1100 |
| 002000000400000100 | 1101 |
| 002000000400000003 | 1101 |
| 002000000400000000 | 1101 |
| 002000000400000200 | 1110 |
| 002000000400000300 | 1110 |
| 002000000400000400 | 1110 |
| 002000000400000001 | 1110 |
| 002000000400001000 | 1111 |
| 002000000400003000 | 1111 |
| 002000000020000002 | 0010 |
| 002000000020000004 | 0010 |
| 002000000020000010 | 0010 |
| 002000000020000020 | 0010 |
| 002000000020000030 | 0010 |
| 002000000020000040 | 0010 |
| 002000000020000100 | 0011 |
| 002000000020000003 | 0011 |
| 002000000020000000 | 0011 |
| 002000000020000200 | 0100 |
| 002000000020000300 | 0100 |
| 002000000020000400 | 0100 |
| 002000000020000001 | 0100 |
| 002000000040000002 | 1010 |
| 002000000040000004 | 1010 |
| 002000000040000010 | 1010 |
| 002000000040000020 | 1010 |
| 002000000040000030 | 1010 |
| 002000000040000040 | 1010 |
| 002000000040000100 | 1011 |
| 002000000040000003 | 1011 |
| 002000000040000000 | 1011 |
| 002000000040000200 | 1100 |
| 002000000040000300 | 1100 |
| 002000000040000400 | 1100 |
| 002000000040000001 | 1100 |
| 004000000030000100 | 0000 |
| 004000000030000003 | 0000 |
| 004000000030000000 | 0000 |
| 004000000030000200 | 0001 |
| 004000000030000300 | 0001 |
| 004000000030000400 | 0001 |
| 004000000030000001 | 0001 |
| 004000000003000000 | 1100 |

TABLE 3-continued

| Sequence of Code Symbols | x' |
|---|---|
| 004000000003000003 | 1100 |
| 004000000003000001 | 1100 |
| 004000000003000002 | 1101 |
| 004000000003000004 | 1101 |
| 004000000003000010 | 1101 |
| 004000000003000020 | 1101 |
| 004000000003000030 | 1101 |
| 004000000003000040 | 1101 |
| 004000000002000000 | 1100 |
| 004000000002000003 | 1100 |
| 004000000002000001 | 1100 |
| 004000000002000002 | 1101 |
| 004000000002000004 | 1101 |
| 004000000002000010 | 1101 |
| 004000000002000020 | 1101 |
| 004000000002000030 | 1101 |
| 004000000002000040 | 1101 |
| 004000000004000000 | 1110 |
| 004000000004000003 | 1110 |
| 004000000004000001 | 1110 |
| 004000000004000002 | 1111 |
| 004000000004000004 | 1111 |
| 004000000004000010 | 1111 |
| 004000000004000020 | 1111 |
| 004000000004000030 | 1111 |
| 004000000004000040 | 1111 |
| 004000000200000002 | 1100 |
| 004000000200000004 | 1100 |
| 004000000200000010 | 1100 |
| 004000000200000020 | 1100 |
| 004000000200000030 | 1100 |
| 004000000200000040 | 1100 |
| 004000000200000100 | 1101 |
| 004000000200000003 | 1101 |
| 004000000200000000 | 1101 |
| 004000000200000200 | 1110 |
| 004000000200000300 | 1110 |
| 004000000200000400 | 1110 |
| 004000000200000001 | 1110 |
| 004000000200001000 | 1111 |
| 004000000200003000 | 1111 |
| 004000000400000002 | 1100 |
| 004000000400000004 | 1100 |
| 004000000400000010 | 1100 |
| 004000000400000020 | 1100 |
| 004000000400000030 | 1100 |
| 004000000400000040 | 1100 |
| 004000000400000100 | 1101 |
| 004000000400000003 | 1101 |
| 004000000400000000 | 1101 |
| 004000000400000200 | 1110 |
| 004000000400000300 | 1110 |
| 004000000400000400 | 1110 |
| 004000000400000001 | 1110 |
| 004000000400001000 | 1111 |
| 004000000400003000 | 1111 |
| 004000000020000002 | 0010 |
| 004000000020000004 | 0010 |
| 004000000020000010 | 0010 |
| 004000000020000020 | 0010 |
| 004000000020000030 | 0010 |
| 004000000020000040 | 0010 |
| 004000000020000100 | 0011 |
| 004000000020000003 | 0011 |
| 004000000020000000 | 0011 |
| 004000000020000200 | 0100 |
| 004000000020000300 | 0100 |
| 004000000020000400 | 0100 |
| 004000000020000001 | 0100 |
| 004000000040000002 | 1010 |
| 004000000040000004 | 1010 |
| 004000000040000010 | 1010 |
| 004000000040000020 | 1010 |
| 004000000040000030 | 1010 |
| 004000000040000040 | 1010 |
| 004000000040000100 | 1011 |

TABLE 3-continued

| Sequence of Code Symbols | x' |
|---|---|
| 004000000040000003 | 1011 |
| 004000000040000000 | 1011 |
| 004000000040000200 | 1100 |
| 004000000040000300 | 1100 |
| 004000000040000400 | 1100 |
| 004000000040000001 | 1100 |
| 000200000002000000 | 0000 |
| 000200000002000003 | 0000 |
| 000200000002000001 | 0000 |
| 000200000002000002 | 0001 |
| 000200000002000004 | 0001 |
| 000200000002000010 | 0001 |
| 000200000002000020 | 0001 |
| 000200000002000030 | 0001 |
| 000200000002000040 | 0001 |
| 000200000004000000 | 0010 |
| 000200000004000003 | 0010 |
| 000200000004000001 | 0010 |
| 000200000004000002 | 0011 |
| 000200000004000004 | 0011 |
| 000200000004000010 | 0011 |
| 000200000004000020 | 0011 |
| 000200000004000030 | 0011 |
| 000200000004000040 | 0011 |
| 000200000020000002 | 0111 |
| 000200000020000004 | 0111 |
| 000200000020000010 | 0111 |
| 000200000020000020 | 0111 |
| 000200000020000030 | 0111 |
| 000200000020000040 | 0111 |
| 000200000020000100 | 1000 |
| 000200000020000003 | 1000 |
| 000200000020000000 | 1000 |
| 000200000020000200 | 1001 |
| 000200000020000300 | 1001 |
| 000200000020000400 | 1001 |
| 000200000020000001 | 1001 |
| 000200000030000100 | 1011 |
| 000200000030000003 | 1011 |
| 000200000030000000 | 1011 |
| 000200000030000200 | 1100 |
| 000200000030000300 | 1100 |
| 000200000030000400 | 1100 |
| 000200000030000001 | 1100 |
| 000200000040000002 | 1101 |
| 000200000040000004 | 1101 |
| 000200000040000010 | 1101 |
| 000200000040000020 | 1101 |
| 000200000040000030 | 1101 |
| 000200000040000040 | 1101 |
| 000200000040000100 | 1110 |
| 000200000040000003 | 1110 |
| 000200000040000000 | 1110 |
| 000200000040000200 | 1111 |
| 000200000040000300 | 1111 |
| 000200000040000400 | 1111 |
| 000200000040000001 | 1111 |
| 000200000003000000 | 0001 |
| 000200000003000003 | 0001 |
| 000200000003000001 | 0001 |
| 000200000200000002 | 0000 |
| 000200000200000004 | 0000 |
| 000200000200000010 | 0000 |
| 000200000200000020 | 0000 |
| 000200000200000030 | 0000 |
| 000200000200000040 | 0000 |
| 000200000200000100 | 0001 |
| 000200000200000003 | 0001 |
| 000200000200000000 | 0001 |
| 000200000200000200 | 0010 |
| 000200000200000300 | 0010 |
| 000200000200000400 | 0010 |
| 000200000200000001 | 0010 |
| 000200000200001000 | 0011 |
| 000200000200003000 | 0011 |
| 000200000200002000 | 0100 |

TABLE 3-continued

| Sequence of Code Symbols | x' |
|---|---|
| 000200000200004000 | 0100 |
| 000200000400000002 | 1010 |
| 000200000400000004 | 1010 |
| 000200000400000010 | 1010 |
| 000200000400000020 | 1010 |
| 000200000400000030 | 1010 |
| 000200000400000040 | 1010 |
| 000200000400000100 | 1011 |
| 000200000400000003 | 1011 |
| 000200000400000000 | 1011 |
| 000200000400000200 | 1100 |
| 000200000400000300 | 1100 |
| 000200000400000400 | 1100 |
| 000200000400000001 | 1100 |
| 000200000400001000 | 1101 |
| 000200000400003000 | 1101 |
| 000300000002000000 | 0000 |
| 000300000002000003 | 0000 |
| 000300000002000001 | 0000 |
| 000300000002000002 | 0001 |
| 000300000002000004 | 0001 |
| 000300000002000010 | 0001 |
| 000300000002000020 | 0001 |
| 000300000002000030 | 0001 |
| 000300000002000040 | 0001 |
| 000300000004000000 | 0010 |
| 000300000004000003 | 0010 |
| 000300000004000001 | 0010 |
| 000300000004000002 | 0011 |
| 000300000004000004 | 0011 |
| 000300000004000010 | 0011 |
| 000300000004000020 | 0011 |
| 000300000004000030 | 0011 |
| 000300000004000040 | 0011 |
| 000300000020000002 | 0111 |
| 000300000020000004 | 0111 |
| 000300000020000010 | 0111 |
| 000300000020000020 | 0111 |
| 000300000020000030 | 0111 |
| 000300000020000040 | 0111 |
| 000300000020000100 | 1000 |
| 000300000020000003 | 1000 |
| 000300000020000000 | 1000 |
| 000300000020000200 | 1001 |
| 000300000020000300 | 1001 |
| 000300000020000400 | 1001 |
| 000300000020000001 | 1001 |
| 000300000030000100 | 1011 |
| 000300000030000003 | 1011 |
| 000300000030000000 | 1011 |
| 000300000030000200 | 1100 |
| 000300000030000300 | 1100 |
| 000300000030000400 | 1100 |
| 000300000030000001 | 1100 |
| 000300000040000002 | 1101 |
| 000300000040000004 | 1101 |
| 000300000040000010 | 1101 |
| 000300000040000020 | 1101 |
| 000300000040000030 | 1101 |
| 000300000040000040 | 1101 |
| 000300000040000100 | 1110 |
| 000300000040000003 | 1110 |
| 000300000040000000 | 1110 |
| 000300000040000200 | 1111 |
| 000300000040000300 | 1111 |
| 000300000040000400 | 1111 |
| 000300000040000001 | 1111 |
| 000300000003000000 | 0001 |
| 000300000003000003 | 0001 |
| 000300000003000001 | 0001 |
| 000300000200000002 | 0000 |
| 000300000200000004 | 0000 |
| 000300000200000010 | 0000 |
| 000300000200000020 | 0000 |
| 000300000200000030 | 0000 |
| 000300000200000040 | 0000 |

TABLE 3-continued

| Sequence of Code Symbols | x' |
|---|---|
| 000300000200000100 | 0001 |
| 000300000200000003 | 0001 |
| 000300000200000000 | 0001 |
| 000300000200000200 | 0010 |
| 000300000200000300 | 0010 |
| 000300000200000400 | 0010 |
| 000300000200000001 | 0010 |
| 000300000200001000 | 0011 |
| 000300000200003000 | 0011 |
| 000300000200002000 | 0100 |
| 000300000200004000 | 0100 |
| 000300000400000002 | 1010 |
| 000300000400000004 | 1010 |
| 000300000400000010 | 1010 |
| 000300000400000020 | 1010 |
| 000300000400000030 | 1010 |
| 000300000400000040 | 1010 |
| 000300000400000100 | 1011 |
| 000300000400000003 | 1011 |
| 000300000400000000 | 1011 |
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1100 |
| 000400000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |
| 000400000040000030 | 1101 |
| 000400000040000040 | 1101 |
| 000400000040000100 | 1110 |
| 000400000040000003 | 1110 |
| 000400000040000000 | 1110 |
| 000400000040000200 | 1111 |
| 000400000040000300 | 1111 |
| 000400000040000400 | 1111 |

TABLE 3-continued

| Sequence of Code Symbols | x' |
|---|---|
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0001 |
| 000400000200000003 | 0001 |
| 000400000200000000 | 0001 |
| 000400000200000200 | 0010 |
| 000400000200000300 | 0010 |
| 000400000200000400 | 0010 |
| 000400000200000001 | 0010 |
| 000400000200001000 | 0011 |
| 000400000200003000 | 0011 |
| 000400000200002000 | 0100 |
| 000400000200004000 | 0100 |
| 000400000400000002 | 1010 |
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |
| 000100000002000000 | 0000 |
| 000100000002000003 | 0000 |
| 000100000002000001 | 0000 |
| 000100000002000002 | 0001 |
| 000100000002000004 | 0001 |
| 000100000002000010 | 0001 |
| 000100000002000020 | 0001 |
| 000100000002000030 | 0001 |
| 000100000002000040 | 0001 |
| 000100000004000000 | 0010 |
| 000100000004000003 | 0010 |
| 000100000004000001 | 0010 |
| 000100000004000002 | 0011 |
| 000100000004000004 | 0011 |
| 000100000004000010 | 0011 |
| 000100000004000020 | 0011 |
| 000100000004000030 | 0011 |
| 000100000004000040 | 0011 |
| 000100000020000002 | 0111 |
| 000100000020000004 | 0111 |
| 000100000020000010 | 0111 |
| 000100000020000020 | 0111 |
| 000100000020000030 | 0111 |
| 000100000020000040 | 0111 |
| 000100000020000100 | 1000 |
| 000100000020000003 | 1000 |
| 000100000020000000 | 1000 |
| 000100000020000200 | 1001 |
| 000100000020000300 | 1001 |
| 000100000020000400 | 1001 |
| 000100000020000001 | 1001 |
| 000100000030000100 | 1011 |
| 000100000030000003 | 1011 |
| 000100000030000000 | 1011 |
| 000100000030000200 | 1100 |
| 000100000030000300 | 1100 |
| 000100000030000400 | 1100 |
| 000100000030000001 | 1100 |
| 000100000040000002 | 1101 |
| 000100000040000004 | 1101 |

TABLE 3-continued

| Sequence of Code Symbols | x' |
|---|---|
| 000100000040000010 | 1101 |
| 000100000040000020 | 1101 |
| 000100000040000030 | 1101 |
| 000100000040000040 | 1101 |
| 000100000040000100 | 1110 |
| 000100000040000003 | 1110 |
| 000100000040000000 | 1110 |
| 000100000040000200 | 1111 |
| 000100000040000300 | 1111 |
| 000100000040000400 | 1111 |
| 000100000040000001 | 1111 |
| 000100000003000000 | 0001 |
| 000100000003000003 | 0001 |
| 000100000003000001 | 0001 |
| 000100000200000002 | 0000 |
| 000100000200000004 | 0000 |
| 000100000200000010 | 0000 |
| 000100000200000020 | 0000 |
| 000100000200000030 | 0000 |
| 000100000200000040 | 0000 |
| 000100000200000100 | 0001 |
| 000100000200000003 | 0001 |
| 000100000200000000 | 0001 |
| 000100000200000200 | 0010 |
| 000100000200000300 | 0010 |
| 000100000200000400 | 0010 |
| 000100000200000001 | 0010 |
| 000100000200001000 | 0011 |
| 000100000200003000 | 0011 |
| 000100000200002000 | 0100 |
| 000100000200004000 | 0100 |
| 000100000400000002 | 1010 |
| 000100000400000004 | 1010 |
| 000100000400000010 | 1010 |
| 000100000400000020 | 1010 |
| 000100000400000030 | 1010 |
| 000100000400000040 | 1010 |
| 000100000400000100 | 1011 |
| 000100000400000003 | 1011 |
| 000100000400000000 | 1011 |
| 000100000400000200 | 1100 |
| 000100000400000330 | 1100 |
| 000100000400000400 | 1100 |
| 000100000400000001 | 1100 |
| 000100000400001000 | 1101 |
| 000100000400003000 | 1101 |
| 000020000002000000 | 0000 |
| 000020000002000003 | 0000 |
| 000020000002000001 | 0000 |
| 000020000002000002 | 0001 |
| 000020000002000004 | 0001 |
| 000020000002000010 | 0001 |
| 000020000002000020 | 0001 |
| 000020000002000030 | 0001 |
| 000020000002000040 | 0001 |
| 000020000004000000 | 0010 |
| 000020000004000003 | 0010 |
| 000020000004000001 | 0010 |
| 000020000004000002 | 0011 |
| 000020000004000004 | 0011 |
| 000020000004000010 | 0011 |
| 000020000004000020 | 0011 |
| 000020000004000030 | 0011 |
| 000020000004000040 | 0011 |
| 000020000020000002 | 0111 |
| 000020000020000004 | 0111 |
| 000020000020000010 | 0111 |
| 000020000020000020 | 0111 |
| 000020000020000030 | 0111 |
| 000020000020000040 | 0111 |
| 000020000020000100 | 1000 |
| 000020000020000003 | 1000 |
| 000020000020000000 | 1000 |
| 000020000020000200 | 1001 |
| 000020000020000300 | 1001 |
| 000020000020000400 | 1001 |

TABLE 3-continued

| Sequence of Code Symbols | x' |
|---|---|
| 000020000020000001 | 1001 |
| 000020000030000100 | 1011 |
| 000020000030000003 | 1011 |
| 000020000030000000 | 1011 |
| 000020000030000200 | 1100 |
| 000020000030000300 | 1100 |
| 000020000030000400 | 1100 |
| 000020000030000001 | 1100 |
| 000020000040000002 | 1101 |
| 000020000040000004 | 1101 |
| 000020000040000010 | 1101 |
| 000020000040000020 | 1101 |
| 000020000040000030 | 1101 |
| 000020000040000040 | 1101 |
| 000020000040000100 | 1110 |
| 000020000040000003 | 1110 |
| 000020000040000000 | 1110 |
| 000020000040000200 | 1111 |
| 000020000040000300 | 1111 |
| 000020000040000400 | 1111 |
| 000020000040000001 | 1111 |
| 000020000003000000 | 0001 |
| 000020000003000003 | 0001 |
| 000020000003000001 | 0001 |
| 000020000200000002 | 0000 |
| 000020000200000004 | 0000 |
| 000020000200000010 | 0000 |
| 000020000200000020 | 0000 |
| 000020000200000030 | 0000 |
| 000020000200000040 | 0000 |
| 000020000200000100 | 0001 |
| 000020000200000003 | 0001 |
| 000020000200000000 | 0001 |
| 000020000200000200 | 0010 |
| 000020000200000300 | 0010 |
| 000020000200000400 | 0010 |
| 000020000200000001 | 0010 |
| 000020000200001000 | 0011 |
| 000020000200003000 | 0011 |
| 000020000200002000 | 0100 |
| 000020000200004000 | 0100 |
| 000020000400000002 | 1010 |
| 000020000400000004 | 1010 |
| 000020000400000010 | 1010 |
| 000020000400000020 | 1010 |
| 000020000400000030 | 1010 |
| 000020000400000040 | 1010 |
| 000020000400000100 | 1011 |
| 000020000400000003 | 1011 |
| 000020000400000000 | 1011 |
| 000020000400000200 | 1100 |
| 000020000400000300 | 1100 |
| 000020000400000400 | 1100 |
| 000020000400000001 | 1100 |
| 000020000400001000 | 1101 |
| 000020000400003000 | 1101 |
| 000300000002000000 | 0000 |
| 000300000002000003 | 0000 |
| 000300000002000001 | 0000 |
| 000300000002000002 | 0001 |
| 000300000002000004 | 0001 |
| 000300000002000010 | 0001 |
| 000300000002000020 | 0001 |
| 000300000002000030 | 0001 |
| 000300000002000040 | 0001 |
| 000300000004000000 | 0010 |
| 000300000004000003 | 0010 |
| 000300000004000001 | 0010 |
| 000300000004000002 | 0011 |
| 000300000004000004 | 0011 |
| 000300000004000010 | 0011 |
| 000300000004000020 | 0011 |
| 000300000004000030 | 0011 |
| 000300000004000040 | 0011 |
| 000300000020000002 | 0111 |
| 000300000020000004 | 0111 |

TABLE 3-continued

| Sequence of Code Symbols | x' |
|---|---|
| 000300000020000010 | 0111 |
| 000300000020000020 | 0111 |
| 000300000020000030 | 0111 |
| 000300000020000040 | 0111 |
| 000300000020000100 | 1000 |
| 000300000020000003 | 1000 |
| 000300000020000000 | 1000 |
| 000300000020000200 | 1001 |
| 000300000020000300 | 1001 |
| 000300000020000400 | 1001 |
| 000300000020000001 | 1001 |
| 000300000030000100 | 1011 |
| 000300000030000003 | 1011 |
| 000300000030000000 | 1011 |
| 000300000030000200 | 1100 |
| 000300000030000300 | 1100 |
| 000300000030000400 | 1100 |
| 000300000030000001 | 1100 |
| 000300000040000002 | 1101 |
| 000300000040000004 | 1101 |
| 000300000040000010 | 1101 |
| 000300000040000020 | 1101 |
| 000300000040000030 | 1101 |
| 000300000040000040 | 1101 |
| 000300000040000100 | 1110 |
| 000300000040000003 | 1110 |
| 000300000040000000 | 1110 |
| 000300000040000200 | 1111 |
| 000300000040000300 | 1111 |
| 000300000040000400 | 1111 |
| 000300000040000001 | 1111 |
| 000300000003000000 | 0001 |
| 000300000003000003 | 0001 |
| 000300000003000001 | 0001 |
| 000300000200000002 | 0000 |
| 000300000200000004 | 0000 |
| 000300000200000010 | 0000 |
| 000300000200000020 | 0000 |
| 000300000200000030 | 0000 |
| 000300000200000040 | 0000 |
| 000300000200000100 | 0001 |
| 000300000200000003 | 0001 |
| 000300000200000000 | 0001 |
| 000300000200000200 | 0010 |
| 000300000200000300 | 0010 |
| 000300000200000400 | 0010 |
| 000300000200000001 | 0010 |
| 000300000200001000 | 0011 |
| 000300000200003000 | 0011 |
| 000300000200002000 | 0100 |
| 000300000200004000 | 0100 |
| 000300000400000002 | 1010 |
| 000300000400000004 | 1010 |
| 000300000400000010 | 1010 |
| 000300000400000020 | 1010 |
| 000300000400000030 | 1010 |
| 000300000400000040 | 1010 |
| 000300000400000100 | 1011 |
| 000300000400000003 | 1011 |
| 000300000400000000 | 1011 |
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 000040000002000000 | 0000 |
| 000040000002000003 | 0000 |
| 000040000002000001 | 0000 |
| 000040000002000002 | 0001 |
| 000040000002000004 | 0001 |
| 000040000002000010 | 0001 |
| 000040000002000020 | 0001 |
| 000040000002000030 | 0001 |
| 000040000002000040 | 0001 |
| 000040000004000000 | 0010 |

TABLE 3-continued

| Sequence of Code Symbols | x' |
|---|---|
| 000040000004000003 | 0010 |
| 000040000004000001 | 0010 |
| 000040000004000002 | 0011 |
| 000040000004000004 | 0011 |
| 000040000004000010 | 0011 |
| 000040000004000020 | 0011 |
| 000040000004000030 | 0011 |
| 000040000004000040 | 0011 |
| 000040000020000002 | 0111 |
| 000040000020000004 | 0111 |
| 000040000020000010 | 0111 |
| 000040000020000020 | 0111 |
| 000040000020000030 | 0111 |
| 000040000020000040 | 0111 |
| 000040000020000100 | 1000 |
| 000040000020000003 | 1000 |
| 000040000020000000 | 1000 |
| 000040000020000200 | 1001 |
| 000040000020000300 | 1001 |
| 000040000020000400 | 1001 |
| 000040000020000001 | 1001 |
| 000040000030000100 | 1011 |
| 000040000030000003 | 1011 |
| 000040000030000000 | 1011 |
| 000040000030000200 | 1100 |
| 000040000030000300 | 1100 |
| 000040000030000400 | 1100 |
| 000040000030000001 | 1100 |
| 000040000040000002 | 1101 |
| 000040000040000004 | 1101 |
| 000040000040000010 | 1101 |
| 000040000040000020 | 1101 |
| 000040000040000030 | 1101 |
| 000040000040000040 | 1101 |
| 000040000040000100 | 1110 |
| 000040000040000003 | 1110 |
| 000040000040000000 | 1110 |
| 000040000040000200 | 1111 |
| 000040000040000300 | 1111 |
| 000040000040000400 | 1111 |
| 000040000040000001 | 1111 |
| 000040000003000000 | 0001 |
| 000040000003000003 | 0001 |
| 000040000003000001 | 0001 |
| 000040000200000002 | 0000 |
| 000040000200000004 | 0000 |
| 000040000200000010 | 0000 |
| 000040000200000020 | 0000 |
| 000040000200000030 | 0000 |
| 000040000200000040 | 0000 |
| 000040000200000100 | 0001 |
| 000040000200000003 | 0001 |
| 000040000200000000 | 0001 |
| 000040000200000200 | 0010 |
| 000040000200000300 | 0010 |
| 000040000200000400 | 0010 |
| 000040000200000001 | 0010 |
| 000040000200001000 | 0011 |
| 000040000200003000 | 0011 |
| 000040000200002000 | 0011 |
| 000040000200004000 | 0100 |
| 000040000400000002 | 1010 |
| 000040000400000004 | 1010 |
| 000040000400000010 | 1010 |
| 000040000400000020 | 1010 |
| 000040000400000030 | 1010 |
| 000040000400000040 | 1010 |
| 000040000400000100 | 1011 |
| 000040000400000003 | 1011 |
| 000040000400000000 | 1011 |
| 000040000400000200 | 1100 |
| 000040900400000300 | 1100 |
| 000040000400000400 | 1100 |
| 000040000400000001 | 1100 |
| 000040000400001000 | 1101 |
| 000040000400003000 | 1101 |

TABLE 3-continued

| Sequence of Code Symbols | x' |
|---|---|
| 0001000000002000000 | 0000 |
| 0001000000002000003 | 0000 |
| 0001000000002000001 | 0000 |
| 0001000000002000002 | 0001 |
| 0001000000002000004 | 0001 |
| 0001000000002000010 | 0001 |
| 0001000000002000020 | 0001 |
| 0001000000002000030 | 0001 |
| 0001000000002000040 | 0001 |
| 0001000000004000000 | 0010 |
| 0001000000004000003 | 0010 |
| 0001000000004000001 | 0010 |
| 0001000000004000002 | 0011 |
| 0000100000004000004 | 0011 |
| 0001000000004000010 | 0011 |
| 0001000000004000020 | 0011 |
| 0001000000004000030 | 0011 |
| 0001000000004000040 | 0011 |
| 0001000000020000002 | 0011 |
| 0001000000020000004 | 0111 |
| 0001000000020000010 | 0111 |
| 0001000000020000020 | 0111 |
| 0001000000020000030 | 0111 |
| 0001000000020000040 | 0111 |
| 0001000000020000100 | 1000 |
| 0001000000020000003 | 1000 |
| 0001000000020000000 | 1000 |
| 0001000000020000200 | 1001 |
| 0001000000020000300 | 1001 |
| 0001000000020000400 | 1001 |
| 0001000000020000001 | 1001 |
| 0001000000030000100 | 1011 |
| 0001000000030000003 | 1011 |
| 0001000000030000000 | 1011 |
| 0001000000030000200 | 1100 |
| 0001000000030000300 | 1100 |
| 0001000000030000400 | 1100 |
| 0001000000030000001 | 1100 |
| 0001000000040000002 | 1101 |
| 0001000000040000004 | 1101 |
| 0001000000040000010 | 1101 |
| 0001000000040000020 | 1101 |
| 0001000000040000030 | 1101 |
| 0001000000040000040 | 1101 |
| 0001000000040000100 | 1110 |
| 0001000000040000003 | 1110 |
| 0001000000040000000 | 1110 |
| 0001000000040000200 | 1111 |
| 0001000000040000300 | 1111 |
| 0001000000040000400 | 1111 |
| 0001000000040000001 | 1111 |
| 0001000000003000000 | 0001 |
| 0001000000003000003 | 0001 |
| 0001000000003000001 | 0001 |
| 0001000000200000002 | 0000 |
| 0001000000200000004 | 0000 |
| 0001000000200000010 | 0000 |
| 0001000000200000020 | 0000 |
| 0001000000200000030 | 0000 |
| 0001000000200000040 | 0000 |
| 0001000000200000100 | 0001 |
| 0001000000200000003 | 0001 |
| 0001000000200000000 | 0001 |
| 0001000000200000200 | 0010 |
| 0001000000200000300 | 0010 |
| 0001000000200000400 | 0010 |
| 0001000000200000001 | 0010 |
| 0001000000200001000 | 0011 |
| 0001000000200003000 | 0011 |
| 0001000000200002000 | 0100 |
| 0001000000200004000 | 0100 |
| 0001000000400000002 | 1010 |
| 0001000000400000004 | 1010 |
| 0001000000400000010 | 1010 |
| 0001000000400000020 | 1010 |
| 0001000000400000030 | 1010 |

TABLE 3-continued

| Sequence of Code Symbols | x' |
|---|---|
| 0001000000400000040 | 1010 |
| 0001000000400000100 | 1011 |
| 0001000000400000003 | 1011 |
| 0001000000400000000 | 1011 |
| 0001000000400000200 | 1100 |
| 0001000000400000300 | 1100 |
| 0001000000400000400 | 1100 |
| 0001000000400000001 | 1100 |
| 0001000000400001000 | 1101 |
| 0001000000400003000 | 1101 |
| 0000100000002000000 | 0000 |
| 0000100000002000003 | 0000 |
| 0000100000002000001 | 0000 |
| 0000100000002000002 | 0001 |
| 0000100000002000004 | 0001 |
| 0000100000002000010 | 0001 |
| 0000100000002000020 | 0001 |
| 0000100000002000030 | 0001 |
| 0000100000002000040 | 0001 |
| 0000100000004000000 | 0010 |
| 0000100000004000003 | 0010 |
| 0000100000004000001 | 0010 |
| 0000100000004000002 | 0011 |
| 0000100000004000004 | 0011 |
| 0000100000004000010 | 0011 |
| 0000100000004000020 | 0011 |
| 0000100000004000030 | 0011 |
| 0000100000004000040 | 0011 |
| 0000100000020000002 | 0111 |
| 0000100000020000004 | 0111 |
| 0000100000020000010 | 0111 |
| 0000100000020000020 | 0111 |
| 0000100000020000030 | 0111 |
| 0000100000020000040 | 0111 |
| 0000100000020000100 | 1000 |
| 0000100000020000003 | 1000 |
| 0000100000020000000 | 1000 |
| 0000100000020000200 | 1001 |
| 0000100000020000300 | 1001 |
| 0000100000020000400 | 1001 |
| 0000100000020000001 | 1001 |
| 0000100000030000100 | 1011 |
| 0000100000030000003 | 1011 |
| 0000100000030000000 | 1011 |
| 0000100000030000200 | 1100 |
| 0000100000030000300 | 1100 |
| 0000100000030000400 | 1100 |
| 0000100000030000001 | 1100 |
| 0000100000040000002 | 1101 |
| 0000100000040000004 | 1101 |
| 0000100000040000010 | 1101 |
| 0000100000040000020 | 1101 |
| 0000100000040000030 | 1101 |
| 0000100000040000040 | 1101 |
| 0000100000040000100 | 1101 |
| 0000100000040000003 | 1110 |
| 0000100000040000000 | 1110 |
| 0000100000040000200 | 1111 |
| 0000100000040000300 | 1111 |
| 0000100000040000400 | 1111 |
| 0000100000040000001 | 1111 |
| 0000100000003000000 | 0001 |
| 0000100000003000003 | 0001 |
| 0000100000003000001 | 0001 |
| 0002000000002000000 | 0000 |
| 0002000000002000003 | 0000 |
| 0002000000002000001 | 0000 |
| 0002000000002000002 | 0001 |
| 0002000000002000004 | 0001 |
| 0002000000002000010 | 0001 |
| 0002000000002000020 | 0001 |
| 0002000000002000030 | 0001 |
| 0002000000002000040 | 0001 |
| 0002000000004000000 | 0010 |
| 0002000000004000003 | 0010 |
| 0002000000004000001 | 0010 |

TABLE 3-continued

| Sequence of Code Symbols | x' |
|---|---|
| 0002000000004000002 | 0011 |
| 0002000000004000004 | 0011 |
| 0002000000004000010 | 0011 |
| 0002000000004000020 | 0011 |
| 0002000000004000030 | 0011 |
| 0002000000004000040 | 0011 |
| 0002000000020000002 | 0111 |
| 0002000000020000004 | 0111 |
| 0002000000020000010 | 0111 |
| 0002000000020000020 | 0111 |
| 0002000000020000030 | 0111 |
| 0002000000020000040 | 0111 |
| 0002000000020000100 | 1000 |
| 0002000000020000003 | 1000 |
| 0002000000020000000 | 1000 |
| 0002000000020000200 | 1001 |
| 0002000000020000300 | 1001 |
| 0002000000020000400 | 1001 |
| 0002000000020000001 | 1001 |
| 0002000000030000100 | 1011 |
| 0002000000030000003 | 1011 |
| 0002000000030000000 | 1011 |
| 0002000000030000200 | 1100 |
| 0002000000030000300 | 1100 |
| 0002000000030000400 | 1100 |
| 0002000000030000001 | 1100 |
| 0002000000040000002 | 1101 |
| 0002000000040000004 | 1101 |
| 0002000000040000010 | 1101 |
| 0002000000040000020 | 1101 |
| 0002000000040000030 | 1101 |
| 0002000000040000040 | 1101 |
| 0002000000040000100 | 1110 |
| 0002000000040000003 | 1110 |
| 0002000000040000000 | 1110 |
| 0002000000040000200 | 1111 |
| 0002000000040000300 | 1111 |
| 0002000000040000400 | 1111 |
| 0002000000040000001 | 1111 |
| 0002000000003000000 | 0001 |
| 0002000000003000003 | 0001 |
| 0002000000003000001 | 0001 |
| 0002000000200000002 | 0000 |
| 0002000000200000004 | 0000 |
| 0002000000200000010 | 0000 |
| 0002000000200000020 | 0000 |
| 0002000000200000030 | 0000 |
| 0002000000200000040 | 0000 |
| 0002000000200000100 | 0001 |
| 0002000000200000003 | 0001 |
| 0002000000200000000 | 0001 |
| 0002000000200000200 | 0010 |
| 0002000000200000300 | 0010 |
| 0002000000200000400 | 0010 |
| 0002000000200000001 | 0010 |
| 0002000000200001000 | 0011 |
| 0002000000200003000 | 0011 |
| 0002000000200002000 | 0100 |
| 0002000000200004000 | 0100 |
| 0002000000400000002 | 1010 |
| 0002000000400000004 | 1010 |
| 0002000000400000010 | 1010 |
| 0002000000400000020 | 1010 |
| 0002000000400000030 | 1010 |
| 0002000000400000040 | 1010 |
| 0002000000400000100 | 1011 |
| 0002000000400000003 | 1011 |
| 0002000000400000000 | 1011 |
| 0002000000400000200 | 1100 |
| 0002000000400000300 | 1100 |
| 0002000000400000400 | 1100 |
| 0002000000400000001 | 1100 |
| 0002000000400001000 | 1101 |
| 0002000000400003000 | 1001 |
| 0000100000200000002 | 0000 |
| 0000100000200000004 | 0000 |

TABLE 3-continued

| Sequence of Code Symbols | x' |
|---|---|
| 0000100000200000010 | 0000 |
| 0000100000200000020 | 0000 |
| 0000100000200000030 | 0000 |
| 0000100000200000040 | 0000 |
| 0000100000200000100 | 0001 |
| 0000100000200000003 | 0001 |
| 0000100000200000000 | 0001 |
| 0000100000200000200 | 0010 |
| 0000100000200000300 | 0010 |
| 0000100000200000400 | 0010 |
| 0000100000200000001 | 0010 |
| 0000100000200001000 | 0011 |
| 0000100000200003000 | 0011 |
| 0000100000200002000 | 0100 |
| 0000100000200004000 | 0100 |
| 0000100000400000002 | 1010 |
| 0000100000400000004 | 1010 |
| 0000100000400000010 | 1010 |
| 0000100000400000020 | 1010 |
| 0000100000400000030 | 1010 |
| 0000100000400000040 | 1010 |
| 0000100000400000100 | 1011 |
| 0000100000400000003 | 1011 |
| 0000100000400000000 | 1011 |
| 0000100000400000200 | 1100 |
| 0000100000400000300 | 1100 |
| 0000100000400000400 | 1100 |
| 0000100000400000001 | 1100 |
| 0000100000400001000 | 1101 |
| 0000100000400003000 | 1101 |
| 0000300000002000000 | 0000 |
| 0000300000002000003 | 0000 |
| 0000300000002000001 | 0000 |
| 0000300000002000002 | 0001 |
| 0000300000002000004 | 0001 |
| 0000300000002000010 | 0001 |
| 0000300000002000020 | 0001 |
| 0000300000002000030 | 0001 |
| 0000300000002000040 | 0001 |
| 0000300000004000000 | 0010 |
| 0000300000004000003 | 0010 |
| 0000300000004000001 | 0010 |
| 0000300000004000002 | 0011 |
| 0000300000004000004 | 0011 |
| 0000300000004000010 | 0011 |
| 0000300000004000020 | 0011 |
| 0000300000004000030 | 0011 |
| 0000300000004000040 | 0011 |
| 0000300000020000002 | 0111 |
| 0000300000020000004 | 0111 |
| 0000300000020000010 | 0111 |
| 0000300000020000020 | 0111 |
| 0000300000020000030 | 0111 |
| 0000300000020000040 | 0111 |
| 0000300000020000100 | 1000 |
| 0000300000020000003 | 1000 |
| 0000300000020000000 | 1000 |
| 0000300000020000200 | 1001 |
| 0000300000020000300 | 1001 |
| 0000300000020000400 | 1001 |
| 0000300000020000001 | 1001 |
| 0000300000030000100 | 1011 |
| 0000300000030000003 | 1011 |
| 0000300000030000000 | 1011 |
| 0000300000030000200 | 1100 |
| 0000300000030000300 | 1100 |
| 0000300000030000400 | 1100 |
| 0000300000030000001 | 1100 |
| 0000300000040000002 | 1101 |
| 0000300000040000004 | 1101 |
| 0000300000040000010 | 1101 |
| 0000300000040000020 | 1101 |
| 0000300000040000030 | 1101 |
| 0000300000040000040 | 1101 |
| 0000300000040000100 | 1110 |
| 0000300000040000003 | 1110 |

TABLE 3-continued

| Sequence of Code Symbols | x' |
|---|---|
| 000300000040000000 | 1110 |
| 000300000040000200 | 1111 |
| 000300000040000300 | 1111 |
| 000300000040000400 | 1111 |
| 000300000040000001 | 1111 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1110 |
| 000400000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |
| 000400000040000030 | 1101 |
| 000400000040000040 | 1101 |
| 000400000040000100 | 1110 |
| 000400000040000003 | 1110 |
| 000400000040000000 | 1110 |
| 000400000040000200 | 1111 |
| 000400000040000300 | 1111 |
| 000400000040000400 | 1111 |
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0001 |
| 000400000200000003 | 0001 |
| 000400000200000000 | 0001 |
| 000400000200000200 | 0010 |
| 000400000200000300 | 0010 |
| 000400000200000400 | 0010 |
| 000400000200000001 | 0010 |
| 000400000200001000 | 0011 |
| 000400000200003000 | 0011 |
| 000400000200002000 | 0100 |
| 000400000200004000 | 0100 |
| 000400000400000002 | 1010 |
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |
| 000300000003000000 | 0001 |
| 000300000003000003 | 0001 |
| 000300000003000001 | 0001 |
| 000300000200000002 | 0000 |
| 000300000200000004 | 0000 |
| 000300000200000010 | 0000 |
| 000300000200000020 | 0000 |
| 000300000200000030 | 0000 |
| 000300000200000040 | 0000 |
| 000300000200000100 | 0001 |
| 000300000200000003 | 0001 |
| 000300000200000000 | 0001 |
| 000300000200000200 | 0010 |
| 000300000200000300 | 0010 |
| 000300000200000400 | 0010 |
| 000300000200000001 | 0010 |
| 000300000200001000 | 0011 |
| 000300000200003000 | 0011 |
| 000300000200002000 | 0100 |
| 000300000200004000 | 0100 |
| 000300000400000002 | 1010 |
| 000300000400000004 | 1010 |
| 000300000400000010 | 1010 |
| 000300000400000020 | 1010 |
| 000300000400000030 | 1010 |
| 000300000400000040 | 1010 |
| 000300000400000100 | 1011 |
| 000300000400000003 | 1011 |
| 000300000400000000 | 1011 |
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 400000000020000002 | 0010 |
| 400000000020000004 | 0010 |
| 400000000020000010 | 0010 |
| 400000000020000020 | 0010 |
| 400000000020000030 | 0010 |
| 400000000020000040 | 0010 |
| 400000000020000100 | 0011 |
| 400000000020000003 | 0011 |
| 400000000020000000 | 0011 |
| 400000000020000200 | 0100 |
| 400000000020000300 | 0100 |
| 400000000020000400 | 0100 |
| 400000000020000001 | 0100 |
| 400000000040000002 | 1010 |
| 400000000040000004 | 1010 |
| 400000000040000010 | 1010 |
| 400000000040000020 | 1010 |
| 400000000040000030 | 1010 |
| 400000000040000040 | 1010 |
| 400000000040000100 | 1011 |
| 400000000040000003 | 1011 |
| 400000000040000000 | 1100 |
| 400000000040000200 | 1100 |
| 400000000040000300 | 1100 |
| 400000000040000400 | 1100 |
| 400000000040000001 | 1100 |

TABLE 3-continued

| Sequence of Code Symbols | x' |
|---|---|
| 400000000200000002 | 0010 |
| 400000000200000004 | 0010 |
| 400000000200000010 | 0010 |
| 400000000200000020 | 0010 |
| 400000000200000030 | 0010 |
| 400000000200000040 | 0010 |
| 400000000200000100 | 0011 |
| 400000000200000003 | 0011 |
| 400000000200000000 | 0011 |
| 400000000200000200 | 0100 |
| 400000000200000300 | 0100 |
| 400000000200000400 | 0100 |
| 400000000200000001 | 0100 |
| 400000000200001000 | 0101 |
| 400000000200003000 | 0101 |
| 400000000200002000 | 0110 |
| 400000000200004000 | 0110 |
| 400000000400000002 | 1001 |
| 400000000400000004 | 1001 |
| 400000000400000010 | 1001 |
| 400000000400000020 | 1001 |
| 400000000400000030 | 1001 |
| 400000000400000040 | 1001 |
| 400000000400000100 | 1010 |
| 400000000400000003 | 1010 |
| 400000000400000000 | 1010 |
| 400000000400000200 | 1011 |
| 400000000400600300 | 1011 |
| 400000000400000400 | 1011 |
| 400000000400000001 | 1011 |
| 400000000400001000 | 1100 |
| 400000000400003000 | 1100 |
| 400000000400002000 | 1101 |
| 400000000400004000 | 1101 |
| 400000000030000100 | 1110 |
| 400000000030000003 | 1110 |
| 400000000030000000 | 1110 |
| 400000000030000200 | 1111 |
| 400000000030000300 | 1111 |
| 400000000030000400 | 1111 |
| 400000000030000001 | 1111 |
| 200004000003000000 | 1100 |
| 200004000003000003 | 1100 |
| 200004000003000001 | 1100 |
| 200004000003000002 | 1101 |
| 200004000003000004 | 1101 |
| 200004000003000010 | 1101 |
| 200004000003000020 | 1101 |
| 200004000003000030 | 1101 |
| 200004000003000040 | 1101 |
| 200004000002000000 | 0000 |
| 200004000002000003 | 0000 |
| 200004000002000001 | 0000 |
| 200004000002000002 | 0001 |
| 200004000002000004 | 0001 |
| 200004000002000010 | 0001 |
| 200004000002000020 | 0001 |
| 200004000002000030 | 0001 |
| 200004000002000040 | 0001 |
| 200004000004000000 | 0010 |
| 200004000004000003 | 0010 |
| 200004000004000001 | 0010 |
| 200004000004000002 | 0011 |
| 200004000004000004 | 0011 |
| 200004000004000010 | 0011 |
| 200004000004000020 | 0011 |
| 200004000004000030 | 0011 |
| 200004000004000040 | 0011 |
| 200004000020000002 | 0111 |
| 200004000020000004 | 0111 |
| 200004000020000010 | 0111 |
| 200004000020000020 | 0111 |
| 200004000020000030 | 0111 |
| 200004000020000040 | 0111 |
| 200004000020000100 | 1000 |
| 200004000020000003 | 1000 |

TABLE 3-continued

| Sequence of Code Symbols | x' |
|---|---|
| 200004000020000000 | 1000 |
| 200004000020000200 | 1001 |
| 200004000020000300 | 1001 |
| 200004000020000400 | 1001 |
| 200004000020000001 | 1001 |
| 200004000030000100 | 1011 |
| 200004000030000003 | 1011 |
| 200004000030000000 | 1011 |
| 200004000030000200 | 1100 |
| 200004000030000300 | 1100 |
| 200004000030000400 | 1100 |
| 200004000030000001 | 1100 |
| 200004000040000002 | 1100 |
| 200004000040000004 | 1101 |
| 200004000040000010 | 1101 |
| 200004000040000020 | 1101 |
| 200004000040000030 | 1101 |
| 200004000040000040 | 1101 |
| 200004000040000100 | 1110 |
| 200004000040000003 | 1110 |
| 200004000040000000 | 1110 |
| 200004000040000200 | 1111 |
| 200004000040000300 | 1111 |
| 200004000040000400 | 1111 |
| 200004000040000001 | 1111 |
| 300001000003000000 | 1100 |
| 300001000003000003 | 1100 |
| 300001000003000001 | 1100 |
| 300001000003000002 | 1101 |
| 300001000003000004 | 1101 |
| 300001000003000010 | 1101 |
| 300001000003000020 | 1101 |
| 300001000003000030 | 1101 |
| 300001000003000040 | 1101 |
| 300001000002000000 | 0000 |
| 300001000002000003 | 0000 |
| 300001000002000001 | 0000 |
| 300001000002000002 | 0001 |
| 300001000002000004 | 0001 |
| 300001000002000010 | 0001 |
| 300001000002000020 | 0001 |
| 300001000002000030 | 0001 |
| 300001000002000040 | 0001 |
| 300001000004000000 | 0010 |
| 300001000004000003 | 0010 |
| 300001000004000001 | 0010 |
| 300001000004000002 | 0011 |
| 300001000004000004 | 0011 |
| 300001000004000010 | 0011 |
| 300001000004000020 | 0011 |
| 300001000004000030 | 0011 |
| 300001000004000040 | 0011 |
| 300001000020000002 | 0111 |
| 300001000020000004 | 0111 |
| 300001000020000010 | 0111 |
| 300001000020000020 | 0111 |
| 300001000020000030 | 0111 |
| 300001000020000040 | 0111 |
| 300001000020000100 | 1000 |
| 300001000020000003 | 1000 |
| 300001000020000000 | 1000 |
| 300001000020000200 | 1001 |
| 300001000020000300 | 1001 |
| 300001000020000400 | 1001 |
| 300001000020000001 | 1001 |
| 300001000030000100 | 1011 |
| 300001000030000003 | 1011 |
| 300001000030000000 | 1011 |
| 300001000030000200 | 1100 |
| 300001000030000300 | 1100 |
| 300001000030000400 | 1100 |
| 300001000030000001 | 1100 |
| 300001000040000002 | 1101 |
| 300001000040000004 | 1101 |
| 300001000040000010 | 1101 |
| 300001000040000020 | 1101 |

TABLE 3-continued

| Sequence of Code Symbols | x' |
|---|---|
| 300001000040000030 | 1101 |
| 300001000040000040 | 1101 |
| 300001000040000100 | 1110 |
| 300001000040000003 | 1110 |
| 300001000040000000 | 1110 |
| 300001000040000200 | 1111 |
| 300001000040000300 | 1111 |
| 300001000040000400 | 1111 |
| 300001000040000001 | 1111 |
| 300000000020000002 | 0010 |
| 300000000020000004 | 0010 |
| 300000000020000010 | 0010 |
| 300000000020000020 | 0010 |
| 300000000020000030 | 0010 |
| 300000000020000040 | 0010 |
| 300000000020000100 | 0011 |
| 300000000020000003 | 0011 |
| 300000000020000000 | 0011 |
| 300000000020000200 | 0100 |
| 300000000020000300 | 0100 |
| 300000000020000400 | 0100 |
| 300000000020000001 | 0100 |
| 300000000040000002 | 1010 |
| 300000000040000004 | 1010 |
| 300000000040000010 | 1010 |
| 300000000040000020 | 1010 |
| 300000000040000030 | 1010 |
| 300000000040000040 | 1010 |
| 300000000040000100 | 1011 |
| 300000000040000003 | 1011 |
| 300000000040000000 | 1011 |
| 300000000040000200 | 1100 |
| 300000000040000300 | 1100 |
| 300000000040000400 | 1100 |
| 300000000040000001 | 1100 |
| 300000000200000002 | 0010 |
| 300000000200000004 | 0010 |
| 300000000200000010 | 0010 |
| 300000000200000020 | 0010 |
| 300000000200000030 | 0010 |
| 300000000200000040 | 0010 |
| 300000000200000100 | 0011 |
| 300000000200000003 | 0011 |
| 300000000200000000 | 0011 |
| 300000000200000200 | 0100 |
| 300000000200000300 | 0100 |
| 300000000200000400 | 0100 |
| 300000000200000001 | 0100 |
| 300000000200001000 | 0101 |
| 300000000200003000 | 0101 |
| 300000000200002000 | 0110 |
| 300000000200004000 | 0110 |
| 300000000400000002 | 1001 |
| 300000000400000004 | 1001 |
| 300000000400000010 | 1001 |
| 300000000400000020 | 1001 |
| 300000000400000030 | 1001 |
| 300000000400000040 | 1001 |
| 300000000400000100 | 1010 |
| 300000000400000003 | 1010 |
| 300000000400000000 | 1010 |
| 300000000400000200 | 1011 |
| 300000000400000300 | 1011 |
| 300000000400000400 | 1011 |
| 300000000400000001 | 1011 |
| 300000000400001000 | 1100 |
| 300000000400003000 | 1100 |
| 300000000400002000 | 1101 |
| 300000000400004000 | 1101 |
| 300000000030000100 | 1110 |
| 300000000030000003 | 1110 |
| 300000000030000000 | 1110 |
| 300000000030000200 | 1111 |
| 300000000030000300 | 1111 |
| 300000000030000400 | 1111 |
| 300000000030000001 | 1111 |

TABLE 3-continued

| Sequence of Code Symbols | x' |
|---|---|
| 200003000003000000 | 1100 |
| 200003000003000003 | 1100 |
| 200003000003000001 | 1100 |
| 200003000003000002 | 1101 |
| 200003000003000004 | 1101 |
| 200003000003000010 | 1101 |
| 200003000003000020 | 1101 |
| 200003000003000030 | 1101 |
| 200003000003000040 | 1101 |
| 200003000002000000 | 0000 |
| 200003000002000003 | 0000 |
| 200003000002000001 | 0000 |
| 200003000002000002 | 0001 |
| 200003000002000004 | 0001 |
| 200003000002000010 | 0001 |
| 200003000002000020 | 0001 |
| 200003000002000030 | 0001 |
| 200003000002000040 | 000A |
| 200003000004000000 | 0010 |
| 200003000004000003 | 0010 |
| 200003000004000001 | 0010 |
| 200003000004000002 | 0011 |
| 200003000004000004 | 0011 |
| 200003000004000010 | 0011 |
| 200003000004000020 | 0011 |
| 200003000004000030 | 0011 |
| 200003000004000040 | 0011 |
| 200003000020000002 | 0111 |
| 200003000020000004 | 0111 |
| 200003000020000010 | 0111 |
| 200003000020000020 | 0111 |
| 200003000020000030 | 0111 |
| 200003000020000040 | 0111 |
| 200003000020000100 | 1000 |
| 200003000020000003 | 1000 |
| 200003000020000000 | 1000 |
| 200003000020000200 | 1001 |
| 200003000020000300 | 1001 |
| 200003000020000400 | 1001 |
| 200003000020000001 | 1001 |
| 200003000030000100 | 1011 |
| 200003000030000003 | 1011 |
| 200003000030000000 | 1011 |
| 200003000030000200 | 1100 |
| 200003000030000300 | 1100 |
| 200003000030000400 | 1100 |
| 200003000030000001 | 1100 |
| 200003000040000002 | 1101 |
| 200003000040000004 | 1101 |
| 200003000040000010 | 1101 |
| 200003000040000020 | 1101 |
| 200003000040000030 | 1101 |
| 200003000040000040 | 1101 |
| 200003000040000100 | 1110 |
| 200003000040000003 | 1110 |
| 200003000040000000 | 1110 |
| 200003000040000200 | 1111 |
| 200003000040000300 | 1111 |
| 200003000040000400 | 1111 |
| 200003000040000001 | 1111 |
| 300002000003000000 | 1100 |
| 300002000003000003 | 1100 |
| 300002000003000001 | 1100 |
| 300002000003000002 | 1101 |
| 300002000003000004 | 1101 |
| 300002000003000010 | 1101 |
| 300002000003000020 | 1101 |
| 300002000003000030 | 1101 |
| 300002000003000040 | 1101 |
| 300002000002000000 | 0000 |
| 300002000002000003 | 0000 |
| 300002000002000001 | 0000 |
| 300002000002000002 | 0001 |
| 300002000002000004 | 0001 |
| 300002000002000010 | 0001 |
| 300002000002000020 | 0001 |

TABLE 3-continued

| Sequence of Code Symbols | x' |
|---|---|
| 300002000002000030 | 0001 |
| 300002000002000040 | 0001 |
| 300002000004000000 | 0010 |
| 300002000004000003 | 0010 |
| 300002000004000001 | 0010 |
| 300002000004000002 | 0011 |
| 300002000004000004 | 0011 |
| 300002000004000010 | 0011 |
| 300002000004000020 | 0011 |
| 300002000004000030 | 0011 |
| 300002000004000040 | 0011 |
| 300002000020000002 | 0111 |
| 300002000020000004 | 0111 |
| 300002000020000010 | 0111 |
| 300002000020000020 | 0111 |
| 300002000020000030 | 0111 |
| 300002000020000040 | 0111 |
| 300002000020000100 | 1000 |
| 300002000020000003 | 1000 |
| 300002000020000000 | 1000 |
| 300002000020000200 | 1001 |
| 300002000020000300 | 1001 |
| 300002000020000400 | 1001 |
| 300002000020000001 | 1001 |
| 300002000030000100 | 1011 |
| 300002000030000003 | 1011 |
| 300002000030000000 | 1011 |
| 300002000030000200 | 1100 |
| 300002000030000300 | 1100 |
| 300002000030000400 | 1100 |
| 300002000030000001 | 1100 |
| 300002000040000002 | 1101 |
| 300002000040000004 | 1101 |
| 300002000040000010 | 1101 |
| 300002000040000020 | 1101 |
| 300002000040000030 | 1101 |
| 300002000040000040 | 1101 |
| 300002000040000100 | 1110 |
| 300002000040000003 | 1110 |
| 300002000040000000 | 1110 |
| 300002000040000200 | 1111 |
| 300002000040000300 | 1111 |
| 300002000040000400 | 1111 |
| 300002000040000001 | 1111 |
| 200000000020000002 | 0010 |
| 200000000020000004 | 0010 |
| 200000000020000010 | 0010 |
| 200000000020000020 | 0010 |
| 200000000020000030 | 0010 |
| 200000000020000040 | 0010 |
| 200000000020000100 | 0011 |
| 200000000020000003 | 0011 |
| 200000000020000000 | 0011 |
| 200000000020000200 | 0100 |
| 200000000020000300 | 0100 |
| 200000000020000400 | 0100 |
| 200000000020000001 | 0100 |
| 200000000040000002 | 1010 |
| 200000000040000004 | 1010 |
| 200000000040000010 | 1010 |
| 200000000040000020 | 1010 |
| 200000000040000030 | 1010 |
| 200000000040000040 | 1010 |
| 20000A000040000100 | 1011 |
| 200000000040000003 | 1011 |
| 200000000040000000 | 1011 |
| 200000000040000200 | 1100 |
| 200000000040000300 | 1100 |
| 200000000040000400 | 1100 |
| 200000000040000001 | 1100 |
| 200000000200000002 | 0010 |
| 200000000200000004 | 0010 |
| 200000000200000030 | 0010 |
| 200000000200000020 | 0010 |
| 200000000200000030 | 0010 |
| 200000000200000040 | 0010 |

TABLE 3-continued

| Sequence of Code Symbols | x' |
|---|---|
| 200000000200000100 | 0011 |
| 200000000200000003 | 0011 |
| 200000000200000000 | 0011 |
| 200000000200000200 | 0100 |
| 200000000200000300 | 0100 |
| 200000000200000400 | 0100 |
| 200000000200000001 | 0100 |
| 200000000200001000 | 0101 |
| 200000000200003000 | 0101 |
| 200000000200002000 | 0110 |
| 200000000200004000 | 0110 |
| 200000000400000002 | 1001 |
| 200000000400000004 | 1001 |
| 200000000400000010 | 1001 |
| 200000000400000020 | 1001 |
| 200000000400000030 | 1001 |
| 200000000400000040 | 1001 |
| 200000000400000100 | 1010 |
| 200000000400000003 | 1010 |
| 200000000400000000 | 1010 |
| 200000000400000200 | 1011 |
| 200000000400000300 | 1011 |
| 200000000400000400 | 1011 |
| 200000000400000001 | 1011 |
| 200000000400001000 | 1100 |
| 200000000400003000 | 1100 |
| 200000000400002000 | 1101 |
| 200000000400004000 | 1101 |
| 200000000030000100 | 1110 |
| 200000000030000003 | 1110 |
| 200000000030000000 | 1110 |
| 200000000030000200 | 1111 |
| 200000000030000300 | 1111 |
| 200000000030000400 | 1111 |
| 200000000030000001 | 1111 |
| 200002000003000000 | 1100 |
| 200002000003000003 | 1100 |
| 200002000003000001 | 1100 |
| 200002000003000002 | 1101 |
| 200002000003000004 | 1101 |
| 200002000003000010 | 1101 |
| 200002000003000020 | 1101 |
| 200002000003000030 | 1101 |
| 200002000003000040 | 1101 |
| 200002000002000000 | 0000 |
| 200002000002000003 | 0000 |
| 200002000002000001 | 0000 |
| 200002000002000002 | 0001 |
| 200002000002000004 | 0001 |
| 200002000002000010 | 0001 |
| 200002000002000020 | 0001 |
| 200002000002000030 | 0001 |
| 200002000002000040 | 0001 |
| 200002000004000000 | 0010 |
| 200002000004000003 | 0010 |
| 200002000004000001 | 0010 |
| 200002000004000002 | 0011 |
| 200002000004000004 | 0011 |
| 200002000004000010 | 0011 |
| 200002000004000020 | 0011 |
| 200002000004000030 | 0011 |
| 200002000004000040 | 0011 |
| 200002000020000002 | 0111 |
| 200002000020000004 | 0111 |
| 200002000020000010 | 0111 |
| 200002000020000020 | 0111 |
| 200002000020000030 | 0111 |
| 200002000020000040 | 0111 |
| 200002000020000100 | 1000 |
| 200002000020000003 | 1000 |
| 200002000020000000 | 1000 |
| 200002000020000200 | 1001 |
| 200002000020000300 | 1001 |
| 200002000020000400 | 1001 |
| 200002000020000001 | 1001 |
| 200002000030000100 | 1011 |

TABLE 3-continued

| Sequence of Code Symbols | x' |
|---|---|
| 200002000030000003 | 1011 |
| 200002000030000000 | 1011 |
| 200002000030000200 | 1100 |
| 200002000030000300 | 1100 |
| 200002000030000400 | 1100 |
| 200002000030000001 | 1100 |
| 200002000040000002 | 1101 |
| 200002000040000004 | 1101 |
| 200002000040000010 | 1101 |
| 200002000040000020 | 1101 |
| 200002000040006030 | 1101 |
| 200002000040000040 | 1101 |
| 200002000040000100 | 1110 |
| 200002000040000003 | 1110 |
| 200002000040000000 | 1110 |
| 200002000040000200 | 1111 |
| 200002000040000300 | 1111 |
| 200002000040000400 | 1111 |
| 200002000040000001 | 1111 |
| 300003000003000000 | 1100 |
| 300003000003000003 | 1100 |
| 300003000003000001 | 1100 |
| 300003000003000002 | 1101 |
| 300003000003000004 | 1101 |
| 300003000003000010 | 1101 |
| 300003000003000020 | 1101 |
| 300003000003000030 | 1101 |
| 300003000003000040 | 1101 |
| 300003000002000000 | 0000 |
| 300003000002000003 | 0000 |
| 300003000002000001 | 0000 |
| 300003000002000002 | 0001 |
| 300003000002000004 | 0001 |
| 300003000002000010 | 0001 |
| 300003000002000020 | 0001 |
| 300003000002000030 | 0001 |
| 300003000002000040 | 0001 |
| 300003000004000000 | 0010 |
| 300003000004000003 | 0010 |
| 300003000004000001 | 0010 |
| 300003000004000002 | 0011 |
| 300003000004000004 | 0011 |
| 300003000004000010 | 0011 |
| 300003000004000020 | 0011 |
| 300003000004000030 | 0011 |
| 300003000004000040 | 0011 |
| 300003000020000002 | 0111 |
| 300003000020000004 | 0111 |
| 300003000020000010 | 0111 |
| 300003000020000020 | 0111 |
| 300003000020000030 | 0111 |
| 300003000020000040 | 0111 |
| 300003000020000100 | 1000 |
| 300003000020000003 | 1000 |
| 300003000020000000 | 1000 |
| 300003000020000200 | 1001 |
| 300003000020000300 | 1001 |
| 300003000020000400 | 1001 |
| 300003000020000001 | 1001 |
| 300003000030000100 | 1011 |
| 300003000030000003 | 1011 |
| 300003000030000000 | 1011 |
| 300003000030000200 | 1100 |
| 300003000030000300 | 1100 |
| 300003000030000400 | 1100 |
| 300003000030000001 | 1100 |
| 300003000040000002 | 1101 |
| 300003000040000004 | 1101 |
| 300003000040000010 | 1101 |
| 300003000040000020 | 1101 |
| 300003000040000030 | 1101 |
| 300003000040000040 | 1101 |
| 300003000040000100 | 1110 |
| 300003000040000003 | 1110 |
| 300003000040000000 | 1110 |
| 300003000040000200 | 1111 |

TABLE 3-continued

| Sequence of Code Symbols | x' |
|---|---|
| 300003000040000300 | 1111 |
| 300003000040000400 | 1111 |
| 300003000040000001 | 1111 |
| 100000000020000002 | 0010 |
| 100000000020000004 | 0010 |
| 100000000020000010 | 0010 |
| 100000000020000020 | 0010 |
| 100000000020000030 | 0010 |
| 100000000020000040 | 0010 |
| 100000000020000100 | 0011 |
| 100000000020000003 | 0011 |
| 100000000020000000 | 0011 |
| 100000000020000200 | 0100 |
| 100000000020000300 | 0100 |
| 100000000020000400 | 0100 |
| 100000000020000001 | 0100 |
| 100000000040000002 | 1010 |
| 100000000040000004 | 1010 |
| 100000000040000010 | 1010 |
| 100000000040000020 | 1010 |
| 100000000040000030 | 1010 |
| 100000000040000040 | 1010 |
| 100000000040000100 | 1011 |
| 100000000040000003 | 1011 |
| 100000000040000000 | 1011 |
| 100000000040000200 | 1100 |
| 100000000040000300 | 1100 |
| 100000000040000400 | 1100 |
| 100000000040000001 | 1100 |
| 100000000200000002 | 0010 |
| 100000000200000004 | 0010 |
| 100000000200000010 | 0010 |
| 100000000200000020 | 0010 |
| 100000000200000030 | 0010 |
| 100000000200000040 | 0010 |
| 100000000200000100 | 0011 |
| 100000000200000003 | 0011 |
| 100000000200000000 | 0011 |
| 100000000200000200 | 0100 |
| 100000000200000300 | 0100 |
| 100000000200000400 | 0100 |
| 100000000200000001 | 0100 |
| 100000000200001000 | 0101 |
| 100000000200003000 | 0101 |
| 100000000200002000 | 0110 |
| 100000000200004000 | 0110 |
| 100000000400000002 | 1001 |
| 100000000400000004 | 1001 |
| 100000000400000010 | 1001 |
| 100000000400000020 | 1001 |
| 100000000400000030 | 1001 |
| 100000000400000040 | 1001 |
| 100000000400000100 | 1010 |
| 100000000400000003 | 1010 |
| 100000000400000000 | 1010 |
| 100000000400000200 | 1011 |
| 100000000400000300 | 1011 |
| 100000000400000400 | 1011 |
| 100000000400000001 | 1011 |
| 100000000400001000 | 1100 |
| 100000000400003000 | 1100 |
| 100000000400002000 | 1101 |
| 100000000400004000 | 1101 |
| 100000000030000100 | 1110 |
| 100000000030000003 | 1110 |
| 100000000030000000 | 1110 |
| 100000000030000200 | 1111 |
| 100000000030000300 | 1111 |
| 100000000030000400 | 1111 |
| 100000000030000001 | 1111 |
| 200001000003000000 | 1100 |
| 200001000003000003 | 1100 |
| 200001000003000001 | 1101 |
| 200001000003000002 | 1100 |
| 200001000003000004 | 1101 |
| 200001000003000010 | 1101 |

TABLE 3-continued

| Sequence of Code Symbols | x' |
|---|---|
| 200001000003000020 | 1101 |
| 200001000003000030 | 1101 |
| 200001000003000040 | 1101 |
| 200001000002000000 | 0000 |
| 200001000002000003 | 0000 |
| 200001000002000001 | 0000 |
| 200001000002000002 | 0001 |
| 200001000002000004 | 0001 |
| 200001000002000010 | 0001 |
| 200001000002000020 | 0001 |
| 200001000002000030 | 0001 |
| 200001000002000040 | 0001 |
| 200001000004000000 | 0010 |
| 200001000004000003 | 0010 |
| 200001000004000001 | 0010 |
| 200001000004000002 | 0011 |
| 200001000004000004 | 0011 |
| 200001000004000010 | 0011 |
| 200001000004000020 | 0011 |
| 200001000004000030 | 0011 |
| 200001000004000040 | 0011 |
| 200001000020000002 | 0111 |
| 200001000020000004 | 0111 |
| 200001000020000010 | 0111 |
| 200001000020000020 | 0111 |
| 200001000020000030 | 0111 |
| 200001000020000040 | 0111 |
| 200001000020000100 | 1000 |
| 200001000020000003 | 1000 |
| 200001000020000000 | 1000 |
| 200001000020000200 | 1001 |
| 200001000020000300 | 1001 |
| 200001000020000400 | 1001 |
| 200001000020000001 | 1001 |
| 200001000030000100 | 1011 |
| 200001000030000003 | 1011 |
| 200001000030000000 | 1011 |
| 200001000030000200 | 1100 |
| 200001000030000300 | 1100 |
| 200001000030000400 | 1100 |
| 200001000030000001 | 1100 |
| 200001000040000002 | 1101 |
| 200001000040000004 | 1101 |
| 200001000040000010 | 1101 |
| 200001000040000020 | 1101 |
| 200001000040000030 | 1101 |
| 200001000040000040 | 1101 |
| 200001000040000100 | 1110 |
| 200001000040000003 | 1110 |
| 200001000040000000 | 1110 |
| 200001000040000200 | 1111 |
| 200001000040000300 | 1111 |
| 200001000040000400 | 1111 |
| 200001000040000001 | 1111 |
| 300004000003000000 | 1100 |
| 300004000003000003 | 1100 |
| 300004000003000003 | 1100 |
| 300004000003000002 | 1101 |
| 300004000003000004 | 1101 |
| 300004000003000010 | 1101 |
| 300004000003000020 | 1101 |
| 300004000003000030 | 1101 |
| 300004000003000040 | 1101 |
| 300004000002000000 | 0000 |
| 300004000002000003 | 0000 |
| 300004000002000001 | 0000 |
| 300004000002000002 | 0001 |
| 300004000002000004 | 0001 |
| 300004000002000010 | 0001 |
| 300004000002000020 | 0001 |
| 300004000002000030 | 0001 |
| 300004000002000040 | 0001 |
| 300004000004000000 | 0010 |
| 300004000004000003 | 0010 |
| 300004000004000001 | 0010 |
| 300004000004000002 | 0011 |

TABLE 3-continued

| Sequence of Code Symbols | x' |
|---|---|
| 300004000004000004 | 0011 |
| 300004000004000010 | 0011 |
| 300004000004000020 | 0011 |
| 300004000004000030 | 0011 |
| 300004000004000040 | 0011 |
| 300004000020000002 | 0111 |
| 300004000020000004 | 0111 |
| 300004000020000010 | 0111 |
| 300004000020000020 | 0111 |
| 300004000020000030 | 0111 |
| 300004000020000040 | 0111 |
| 300004000020000100 | 1000 |
| 300004000020000003 | 1006 |
| 300004000020000000 | 1000 |
| 300004000020000200 | 1001 |
| 300004000020000300 | 1001 |
| 300004000020000400 | 1001 |
| 300004000020000001 | 1001 |
| 300004000030000100 | 1011 |
| 300004000030000003 | 1011 |
| 300004000030000000 | 1011 |
| 300004000030000200 | 1100 |
| 300004000030000300 | 1100 |
| 300004000030000400 | 1100 |
| 300004000030000001 | 1100 |
| 300004000040000002 | 1101 |
| 300004000040000004 | 1101 |
| 300004000040000010 | 1101 |
| 300004000040000020 | 1101 |
| 300004000040000030 | 1101 |
| 300004000040000040 | 1101 |
| 300004000040000100 | 1110 |
| 300004000040000003 | 1110 |
| 300004000040000000 | 1110 |
| 300004000040000200 | 1111 |
| 300004000040000300 | 1111 |
| 300004000040000400 | 1111 |
| 300004000040000001 | 1111 |
| 040000000020000002 | 0010 |
| 043000000020000004 | 0010 |
| 040000000020000010 | 0010 |
| 040000000020000020 | 0010 |
| 040000000020000030 | 0010 |
| 040000000020000040 | 0010 |
| 040000000020000100 | 0011 |
| 040000000020000003 | 0011 |
| 040000000020000000 | 0011 |
| 040000000020000200 | 0100 |
| 040000000020000300 | 0100 |
| 040000000020000400 | 0100 |
| 040000000020000001 | 0100 |
| 040000000040000002 | 1010 |
| 040000000040000004 | 1010 |
| 040000000040000010 | 1010 |
| 040000000040000020 | 1010 |
| 040000000040000030 | 1010 |
| 040000000040000040 | 1010 |
| 040000000040000100 | 1011 |
| 040000000040000003 | 1011 |
| 040000000040000000 | 1011 |
| 040000000040000200 | 1100 |
| 040000000040000300 | 1100 |
| 040000000040000400 | 1100 |
| 040000000040000001 | 1100 |
| 040000000200000002 | 0010 |
| 040000000200000004 | 0010 |
| 040000000200000010 | 0010 |
| 040000000200000020 | 0010 |
| 040000000200000030 | 0010 |
| 040000000200000040 | 0010 |
| 040000000200000100 | 0011 |
| 040000000200000003 | 0011 |
| 040000000200000000 | 0011 |
| 040000000200000200 | 0100 |
| 040000000200000300 | 0100 |
| 040000000200000400 | 0100 |

TABLE 3-continued

| Sequence of Code Symbols | x' |
|---|---|
| 040000000200000001 | 0100 |
| 040000000200001000 | 0101 |
| 040000000200003000 | 0101 |
| 040000000200002000 | 0110 |
| 040000000200004000 | 0110 |
| 040000000400000002 | 1001 |
| 040000000400000004 | 1001 |
| 040000000400000010 | 1001 |
| 040000000400000020 | 1001 |
| 040000000400000030 | 1001 |
| 040000000400000040 | 1001 |
| 040000000400000100 | 1010 |
| 040000000400000003 | 1010 |
| 040000000400000000 | 1010 |
| 040000000400000200 | 1011 |
| 040000000400000300 | 1011 |
| 040000000400000400 | 1011 |
| 040000000400000001 | 1011 |
| 040000000400001000 | 1100 |
| 040000000400003000 | 1100 |
| 040000000400002000 | 1101 |
| 040000000400004000 | 1101 |
| 040000000030000100 | 1110 |
| 040000000030000003 | 1110 |
| 040000000030000000 | 1110 |
| 040000000030000200 | 1111 |
| 040000000030000300 | 1111 |
| 040000000030000400 | 1111 |
| 040000000030000001 | 1111 |
| 100004000003000000 | 1100 |
| 100004000003000003 | 1100 |
| 100004000003000001 | 1100 |
| 100004000003000002 | 1101 |
| 100004000003000004 | 1101 |
| 100004000003000010 | 1101 |
| 100004000003000020 | 1101 |
| 100004000003000030 | 1101 |
| 100004000003000040 | 1101 |
| 100004000002000000 | 0000 |
| 100004000002000003 | 0000 |
| 100004000002000001 | 0000 |
| 100004000002000002 | 0001 |
| 100004000002000004 | 0001 |
| 100004000002000010 | 0001 |
| 100004000002000020 | 0001 |
| 100004000002000030 | 0001 |
| 100004000002000040 | 0001 |
| 100004000004000000 | 0010 |
| 100004000004000003 | 0010 |
| 100004000004000001 | 0010 |
| 100004000004000002 | 0011 |
| 100004000004000004 | 0011 |
| 100004000004000010 | 0011 |
| 100004000004000020 | 0011 |
| 100004000004000030 | 0011 |
| 100004000004000040 | 0011 |
| 100004000020000002 | 0111 |
| 100004000020000004 | 0111 |
| 100004000020000030 | 0111 |
| 100004000020000020 | 0111 |
| 100004000020000030 | 0111 |
| 100004000020000040 | 0111 |
| 100004000020000100 | 1000 |
| 100004000020000003 | 1000 |
| 100004000020000000 | 1000 |
| 100004000020000200 | 1001 |
| 100004000020000300 | 1001 |
| 100004000020000400 | 1001 |
| 100004000020000001 | 1001 |
| 100004000030000100 | 1011 |
| 100004000030000003 | 1011 |
| 100004000030000000 | 1011 |
| 100004000030000200 | 1100 |
| 100004000030000300 | 1100 |
| 100004000030000400 | 1100 |
| 100004000030000001 | 1100 |

TABLE 3-continued

| Sequence of Code Symbols | x' |
|---|---|
| 100004000040000002 | 1101 |
| 100004000040000004 | 1101 |
| 100004000040000010 | 1101 |
| 100004000040000020 | 1101 |
| 100004000040000030 | 1101 |
| 100004000040000040 | 1101 |
| 100004000040000100 | 1110 |
| 100004000040000003 | 1110 |
| 100004000040000000 | 1110 |
| 100004000040000200 | 1111 |
| 100004000040000300 | 1111 |
| 100004000040000400 | 1111 |
| 100004000040000001 | 1111 |
| 400001000003000000 | 1100 |
| 400001000003000003 | 1100 |
| 400001000003000001 | 1100 |
| 400001000003000002 | 1101 |
| 400001000003000004 | 1101 |
| 400001000003000010 | 1101 |
| 400001000003000020 | 1101 |
| 400001000003000030 | 1101 |
| 400001000003000040 | 1101 |
| 400001000002000000 | 0000 |
| 400001000002000003 | 0000 |
| 400001000002000001 | 0000 |
| 400001000002000002 | 0001 |
| 400001000002000004 | 0001 |
| 400001000002000010 | 0001 |
| 400001000002000020 | 0001 |
| 400001000002000030 | 0001 |
| 400001000002000040 | 0001 |
| 400001000004000000 | 0010 |
| 400001000004000003 | 0010 |
| 400001000004000001 | 0010 |
| 400001000004000002 | 0011 |
| 400001000004000004 | 0011 |
| 400001000004000010 | 0011 |
| 400001000004000020 | 0011 |
| 430001000004000030 | 0011 |
| 400001000004000040 | 0011 |
| 400001000020000002 | 0111 |
| 400001000020000004 | 0111 |
| 400001000020000010 | 0111 |
| 400001000020000020 | 0111 |
| 400001000020000030 | 0111 |
| 400001000020000040 | 0111 |
| 400001000020000100 | 1000 |
| 400001000020000003 | 1000 |
| 400001000020000000 | 1000 |
| 400001000020000200 | 1001 |
| 400001000020000300 | 1001 |
| 400001000020000400 | 1001 |
| 400001000020000001 | 1001 |
| 400001000030000100 | 1011 |
| 400001000030000003 | 1011 |
| 400001000030000000 | 1011 |
| 400001000030000200 | 1100 |
| 400001000030000300 | 1100 |
| 400001000030000400 | 1100 |
| 400001000030000001 | 1100 |
| 400001000040000002 | 1101 |
| 400001000040000004 | 1101 |
| 400001000040000010 | 1101 |
| 400001000040000020 | 1101 |
| 400001000040000030 | 1101 |
| 400001000040000040 | 1101 |
| 400001000040000100 | 1110 |
| 400001000040000003 | 1110 |
| 400001000040000000 | 1110 |
| 400001000040000200 | 1111 |
| 400001000040000300 | 1111 |
| 400001000040000400 | 1111 |
| 400001000040000001 | 1111 |
| 030000000020000002 | 0010 |
| 030000000020000004 | 0010 |
| 030000000020000010 | 0010 |

TABLE 3-continued

| Sequence of Code Symbols | x' |
|---|---|
| 030000000020000020 | 0010 |
| 030000000020000030 | 0010 |
| 030000000020000040 | 0010 |
| 030000000020000100 | 0011 |
| 030000000020000003 | 0011 |
| 030000000020000000 | 0011 |
| 030000000020000200 | 0100 |
| 030000000020000300 | 0100 |
| 030000000020000400 | 0100 |
| 030000000020000001 | 0100 |
| 030000000040000002 | 1010 |
| 030000000040000004 | 1010 |
| 030000000040000010 | 1010 |
| 030000000040000020 | 1010 |
| 030000000040000030 | 1010 |
| 030000000040000040 | 1010 |
| 030000000040000100 | 1011 |
| 030000000040000003 | 1011 |
| 030000000040000000 | 1011 |
| 030000000040000200 | 1100 |
| 030000000040000300 | 1100 |
| 030000000040000400 | 1100 |
| 030000000040000001 | 1100 |
| 030000000200000002 | 0010 |
| 030000000200000004 | 0010 |
| 030000000200000010 | 0010 |
| 030000000200000020 | 0010 |
| 030000000200000030 | 0010 |
| 030000000200000040 | 0010 |
| 030000000200000100 | 0011 |
| 030000000200000003 | 0011 |
| 030000000200000000 | 0011 |
| 030000000200000200 | 0100 |
| 030000000200000300 | 0100 |
| 030000000200000400 | 0100 |
| 030000000200000001 | 0100 |
| 030000000200001000 | 0101 |
| 030000000200003000 | 0101 |
| 030000000200002000 | 0110 |
| 030000000200004000 | 0110 |
| 030000000400000002 | 1001 |
| 030000000400000004 | 1001 |
| 030000000400000010 | 1001 |
| 030000000400000020 | 1001 |
| 030000000400000030 | 1001 |
| 030000000400000040 | 1001 |
| 030000000400000100 | 1010 |
| 030000000400000003 | 1010 |
| 030000000400000000 | 1010 |
| 030000000400000200 | 1011 |
| 030000000400000300 | 1011 |
| 030000000400000400 | 1011 |
| 030000000400000001 | 1011 |
| 030000000400001000 | 1100 |
| 030000000400003000 | 1100 |
| 030000000400002000 | 1101 |
| 030000000400004000 | 1101 |
| 030000000030000100 | 1110 |
| 030000000030000003 | 1110 |
| 030000000030000000 | 1110 |
| 030000000030000200 | 1111 |
| 030000000030000300 | 1111 |
| 030000000030000400 | 1111 |
| 030000000030000001 | 1111 |
| 100001000003000000 | 1100 |
| 100001000003000003 | 1100 |
| 100001000003000001 | 1100 |
| 100001000003000002 | 1101 |
| 100001000003000004 | 1101 |
| 100001000003000010 | 1101 |
| 100001000003000020 | 1101 |
| 100001000003000030 | 1101 |
| 100001000003000040 | 1101 |
| 100001000002000000 | 0000 |
| 100001000002000003 | 0000 |
| 100001000002000001 | 0000 |

TABLE 3-continued

| Sequence of Code Symbols | x' |
|---|---|
| 100001000002000002 | 0001 |
| 100001000002000004 | 0001 |
| 100001000002000010 | 0001 |
| 100001000002000020 | 0001 |
| 100001000002000030 | 0001 |
| 100001000002000040 | 0001 |
| 100001000004000000 | 0010 |
| 100001000004000003 | 0010 |
| 100001000004000001 | 0010 |
| 100001000004000002 | 0011 |
| 100001000004000004 | 0011 |
| 100001000004000010 | 0011 |
| 10000100&004000020 | 0011 |
| 100001000004000030 | 0011 |
| 100001000004000040 | 0011 |
| 100001000020000002 | 0111 |
| 100001000020000004 | 0111 |
| 100001000020000010 | 0111 |
| 100001000020000020 | 0111 |
| 100001000020000030 | 0111 |
| 100001000020000040 | 0111 |
| 100001000020000100 | 1000 |
| 100001000020000003 | 1000 |
| 100001000020000000 | 1000 |
| 100001000020000200 | 1001 |
| 100001000020000300 | 1001 |
| 100001000020000400 | 1001 |
| 100001000020000001 | 1001 |
| 100001000030000100 | 1011 |
| 100001000030000003 | 1011 |
| 100001000030000000 | 1011 |
| 100001000030000200 | 1100 |
| 100001000030000300 | 1100 |
| 100001000030000400 | 1100 |
| 100001000030000001 | 1100 |
| 100001000040000002 | 1101 |
| 100001000040000004 | 1101 |
| 100001000040000010 | 1101 |
| 100001000040000020 | 1101 |
| 100001000040000030 | 1101 |
| 100001000040000040 | 1101 |
| 100001000040000100 | 1110 |
| 100001000040000003 | 1110 |
| 100001000040000000 | 1110 |
| 100001000040000200 | 1111 |
| 100001000040000300 | 1111 |
| 100001000040000400 | 1111 |
| 100001000040000001 | 1111 |
| 400002000003000000 | 1100 |
| 400002000003000003 | 1100 |
| 400002000003000001 | 1100 |
| 400002000003000002 | 1101 |
| 400002000003000004 | 1101 |
| 400002000003000010 | 1101 |
| 400002000003000020 | 1101 |
| 400002000003000030 | 1101 |
| 400002000003000040 | 1101 |
| 400002000002000000 | 0000 |
| 400002000002000003 | 0000 |
| 400002000002000001 | 0000 |
| 400002000002000002 | 0001 |
| 400002000002000004 | 0001 |
| 400002000002000010 | 0001 |
| 400002000002000020 | 0001 |
| 400002000002000030 | 0001 |
| 400002000002000040 | 0001 |
| 400002000004000000 | 0010 |
| 400002000004000003 | 0010 |
| 400002000004000001 | 0010 |
| 400002000004000002 | 0011 |
| 400002000004000004 | 0011 |
| 400002000004000010 | 0011 |
| 400002000004000020 | 0011 |
| 400002000004000030 | 0011 |
| 400002000004000040 | 0011 |
| 400002000020000002 | 0111 |

TABLE 3-continued

| Sequence of Code Symbols | x' |
|---|---|
| 400002000020000004 | 0111 |
| 400002000020000010 | 0111 |
| 400002000020000020 | 0111 |
| 400002000020000030 | 0111 |
| 400002000020000040 | 0111 |
| 400002000020000100 | 1000 |
| 400002000020000003 | 1000 |
| 400002000020000000 | 1000 |
| 400002000020000200 | 1001 |
| 400002000020000300 | 1001 |
| 400002000020000400 | 1001 |
| 400002000020000001 | 1001 |
| 400002000030000100 | 1011 |
| 400002000030000003 | 1011 |
| 400002000030000000 | 1011 |
| 400002000030000200 | 1100 |
| 400002000030000300 | 1100 |
| 400002000030000400 | 1100 |
| 400002000030000001 | 1100 |
| 400002000040000002 | 1101 |
| 400002000040000004 | 1101 |
| 400002000040000010 | 1101 |
| 400002000040000020 | 1101 |
| 400002000040000030 | 1101 |
| 400002000040000040 | 1101 |
| 400002000040000100 | 1110 |
| 400002000040000003 | 1110 |
| 400002000040000000 | 1110 |
| 400002000040000200 | 1111 |
| 400002000040000300 | 1111 |
| 400002000040000400 | 1111 |
| 400002000040000001 | 1111 |
| 020000000020000002 | 0010 |
| 020000000020000004 | 0010 |
| 020000000020000010 | 0010 |
| 020000000020000020 | 0010 |
| 020000000020000030 | 0010 |
| 020000000020000040 | 0010 |
| 020000000020000100 | 0011 |
| 020000000020000003 | 0011 |
| 020000000020000000 | 0011 |
| 020000000020000200 | 0100 |
| 020000000020000300 | 0100 |
| 020000000020000400 | 0100 |
| 020000000020000001 | 0100 |
| 020000000040000002 | 1010 |
| 020000000040000004 | 1010 |
| 020000000040000010 | 1010 |
| 020000000040000020 | 1010 |
| 020000000040000030 | 1010 |
| 020000000040000040 | 1010 |
| 020000000040000100 | 1011 |
| 020000000040000003 | 1011 |
| 020000000040000000 | 1011 |
| 020000000040000200 | 1100 |
| 020000000040000300 | 1100 |
| 020000000040000400 | 1100 |
| 020000000040000001 | 1100 |
| 020000000200000002 | 0010 |
| 020000000200000004 | 0010 |
| 020000000200000010 | 0010 |
| 020000000200000020 | 0010 |
| 020000000200000030 | 0010 |
| 020000000200000040 | 0010 |
| 020000000200000100 | 0011 |
| 020000000200000003 | 0011 |
| 020000000200000000 | 0011 |
| 020000000200000200 | 0100 |
| 020000000200000300 | 0100 |
| 020000000200000400 | 0100 |
| 020000000200000001 | 0100 |
| 020000000200001000 | 0101 |
| 020000000200003000 | 0101 |
| 020000000200002000 | 0110 |
| 020000000200004000 | 0110 |
| 020000000400000002 | 1001 |

TABLE 3-continued

| Sequence of Code Symbols | x' |
|---|---|
| 020000000400000004 | 1001 |
| 020000000400000010 | 1001 |
| 020000000400000020 | 1001 |
| 020000000400000030 | 1001 |
| 020000000400000040 | 1001 |
| 020000000400000100 | 1010 |
| 020000000400000003 | 1010 |
| 020000000400000000 | 1010 |
| 020000000400000200 | 1011 |
| 020000000400000300 | 1011 |
| 020000000400000400 | 1011 |
| 020000000400000001 | 1011 |
| 020000000400001000 | 1100 |
| 020000000400003000 | 1100 |
| 020000000400002000 | 1101 |
| 020000000400004000 | 1101 |
| 020000000030000100 | 1110 |
| 020000000030000003 | 1110 |
| 020000000030000000 | 1110 |
| 020000000030000200 | 1111 |
| 020000000030000300 | 1111 |
| 020000000030000400 | 1111 |
| 020000000030000001 | 1111 |
| 100003000003000000 | 1100 |
| 100003000003000003 | 1100 |
| 100003000003000001 | 1100 |
| 100003000003000002 | 1101 |
| 100003000003000004 | 1101 |
| 100003000003000010 | 1101 |
| 100003000003000020 | 1101 |
| 100003000003000030 | 1101 |
| 100003000003000040 | 1101 |
| 100003000002000000 | 0000 |
| 100003000002000003 | 0000 |
| 100003000002000001 | 0000 |
| 100003000002000002 | 0001 |
| 100003000002000004 | 0001 |
| 100003000002000010 | 0001 |
| 100003000002000020 | 0001 |
| 100003000002000030 | 0001 |
| 100003000002000040 | 0001 |
| 100003000004000000 | 0010 |
| 100003000004000003 | 0010 |
| 100003000004000001 | 0010 |
| 100003000004000002 | 0011 |
| 100003000004000004 | 0011 |
| 100003000004000010 | 0011 |
| 100003000004000020 | 0011 |
| 100003000004000030 | 0011 |
| 100003000004000040 | 0011 |
| 100003000020000002 | 0111 |
| 100003000020000004 | 0111 |
| 100003000020000010 | 0111 |
| 100003000020000020 | 0111 |
| 100003000020000030 | 0111 |
| 100003000020000040 | 0111 |
| 100003000020000100 | 1000 |
| 100003000020000003 | 1000 |
| 100003000020000000 | 1000 |
| 100003000020000200 | 1001 |
| 100003000020000300 | 1001 |
| 100003000020000400 | 1001 |
| 100003000020000001 | 1001 |
| 100003000030000100 | 1011 |
| 100003000030000003 | 1011 |
| 100003000030000000 | 1011 |
| 100003000030000200 | 1100 |
| 100003000030000300 | 1100 |
| 100003000030000400 | 1100 |
| 100003000030000001 | 1100 |
| 100003000040000002 | 1101 |
| 100003000040000004 | 1101 |
| 100003000040000010 | 1101 |
| 100003000040000020 | 1101 |
| 100003000040000030 | 1101 |
| 100003000040000040 | 1101 |

TABLE 3-continued

| Sequence of Code Symbols | x' |
|---|---|
| 100003000040000100 | 1110 |
| 100003000040000003 | 1110 |
| 100003000040000000 | 1110 |
| 100003000040000200 | 1111 |
| 100003000040000300 | 1111 |
| 100003000040000400 | 1111 |
| 100003000040000001 | 1111 |
| 400003000003000000 | 1100 |
| 400003000003000003 | 1100 |
| 400003000003000001 | 1100 |
| 400003000003000002 | 1101 |
| 400003000003000004 | 1101 |
| 400003000003000010 | 1101 |
| 400003000003000020 | 1101 |
| 400003000003000030 | 1101 |
| 400003000003000040 | 1101 |
| 400003000002000000 | 0000 |
| 400003000002000003 | 0000 |
| 400003000002000001 | 0000 |
| 400003000002000002 | 0001 |
| 400003000002000004 | 0001 |
| 400003000002000010 | 0001 |
| 400003000002000020 | 0001 |
| 400003000002000030 | 0001 |
| 400003000002000040 | 0001 |
| 400003000004000000 | 0010 |
| 400003000004000003 | 0010 |
| 400003000004000001 | 0010 |
| 400003000004000002 | 0011 |
| 400003000004000004 | 0011 |
| 400003000004000010 | 0011 |
| 400003000004000020 | 0011 |
| 400003000004000030 | 0011 |
| 400003000004000040 | 0011 |
| 400003000020000002 | 0111 |
| 400003000020000004 | 0111 |
| 400003000020000010 | 0111 |
| 400003000020000020 | 0111 |
| 400003000020000030 | 0111 |
| 400003000020000040 | 0111 |
| 400003000020000100 | 1000 |
| 400003000020000003 | 1000 |
| 400003000020000000 | 1000 |
| 400003000020000200 | 1001 |
| 400003000020000300 | 1001 |
| 400003000020000400 | 1001 |
| 400003000020000001 | 1001 |
| 400003000030000100 | 1011 |
| 400003000030000003 | 1011 |
| 400003000030000000 | 1011 |
| 400003000030000200 | 1100 |
| 400003000030000300 | 1100 |
| 400003000030000400 | 1100 |
| 400003000030000001 | 1100 |
| 400003000040000002 | 1101 |
| 400003000040000004 | 1101 |
| 400003000040000010 | 1101 |
| 400003000040000020 | 1101 |
| 400003000040000030 | 1101 |
| 400003000040000040 | 1101 |
| 400003000040000100 | 1110 |
| 400003000040000003 | 1110 |
| 400003000040000000 | 1110 |
| 400003000040000200 | 1111 |
| 400003000040000300 | 1111 |
| 400003000040000400 | 1111 |
| 400003000040000001 | 1111 |
| 010000000020000002 | 0010 |
| 010000000020000004 | 0010 |
| 010000000020000010 | 0010 |
| 010000000020000020 | 0010 |
| 010000000020000030 | 0010 |
| 010000000020000040 | 0010 |
| 010000000020000100 | 0011 |
| 010000000020000003 | 0011 |
| 010000000020000000 | 0011 |

TABLE 3-continued

| Sequence of Code Symbols | x' |
|---|---|
| 010000000020000200 | 0100 |
| 010000000020000300 | 0100 |
| 010000000020000400 | 0100 |
| 010000000020000001 | 0100 |
| 010000000040000002 | 1010 |
| 010000000040000004 | 1010 |
| 010000000040000010 | 1010 |
| 010000000040000020 | 1010 |
| 010000000040000030 | 1010 |
| 010000000040000040 | 1010 |
| 010000000040000100 | 1011 |
| 010000000040000003 | 1011 |
| 010000000040000000 | 1011 |
| 010000000040000200 | 1100 |
| 010000000040000300 | 1100 |
| 010000000040000400 | 1100 |
| 010000000040000001 | 1100 |
| 010000000200000002 | 0010 |
| 010000000200000004 | 0010 |
| 010000000200000010 | 0010 |
| 010000000200000020 | 0010 |
| 010000000200000030 | 0010 |
| 010000000200000040 | 0010 |
| 010000000200000100 | 0011 |
| 010000000200000003 | 0011 |
| 010000000200000000 | 0011 |
| 010000000200000200 | 0100 |
| 010000000200000300 | 0100 |
| 010000000200000400 | 0100 |
| 010000000200000001 | 0100 |
| 010000000200001000 | 0101 |
| 010000000200003000 | 0101 |
| 010000000200002000 | 0110 |
| 010000000200004000 | 0110 |
| 010000000400000002 | 1001 |
| 010000000400000004 | 1001 |
| 010000000400000010 | 1001 |
| 010000000400000020 | 1001 |
| 010000000400000030 | 0011 |
| 010000000400000040 | 1100 |
| 010000000400000100 | 1010 |
| 010000100400000003 | 1010 |
| 010000000400000000 | 1010 |
| 010000000400000200 | 1011 |
| 010000000400000300 | 1011 |
| 010000000400000400 | 1011 |
| 010000000400000001 | 1011 |
| 010000000400001000 | 1100 |
| 010000000400003000 | 1100 |
| 010000000400002000 | 1101 |
| 010000000400004000 | 1101 |
| 010000000030000100 | 1110 |
| 010000000030000003 | 1110 |
| 010000000030000000 | 1110 |
| 010000000030000200 | 1111 |
| 010000000030000300 | 1111 |
| 010000000030000400 | 1111 |
| 010000000030000001 | 1111 |
| 100002000003000000 | 1100 |
| 100002000003000003 | 1100 |
| 100002000003000001 | 1100 |
| 100002000003000002 | 1101 |
| 100002000003000004 | 1101 |
| 100002000003000010 | 1101 |
| 100002000003000020 | 1101 |
| 100002000003000030 | 1101 |
| 100002000003000040 | 1101 |
| 100002000002000000 | 0000 |
| 100002000002000003 | 0000 |
| 100002000002000001 | 0000 |
| 100002000002000002 | 0001 |
| 100002000002000004 | 0001 |
| 100002000002000010 | 0001 |
| 100002000002000020 | 0001 |
| 100002000002000030 | 0001 |
| 100002000002000040 | 0001 |

TABLE 3-continued

| Sequence of Code Symbols | x' |
|---|---|
| 100002000004000000 | 0010 |
| 100002000004000003 | 0010 |
| 100002000004000001 | 0010 |
| 100002000004000002 | 0011 |
| 100002000004000004 | 0011 |
| 100002000004000010 | 0011 |
| 100002000004000020 | 0011 |
| 100002000004000030 | 0011 |
| 100002000004000040 | 0011 |
| 100002000020000002 | 0111 |
| 100002000020000004 | 0111 |
| 100002000020000010 | 0111 |
| 100002000020000020 | 0111 |
| 100002000020000030 | 0111 |
| 100002000020000040 | 0111 |
| 100002000020000100 | 1000 |
| 100002000020000003 | 1000 |
| 100002000020000000 | 1000 |
| 100002000020000200 | 1001 |
| 100002000020000300 | 1001 |
| 100002000020000400 | 1001 |
| 100002000020000001 | 1001 |
| 100002000030000100 | 1011 |
| 100002000030000003 | 1011 |
| 100002000030000000 | 1011 |
| 100002000030000200 | 1100 |
| 100002000030000300 | 1100 |
| 100002000030000400 | 1100 |
| 100002000030000001 | 1100 |
| 100002000040000002 | 1101 |
| 100002000040000004 | 1101 |
| 100002000040000010 | 1101 |
| 100002000040000020 | 1101 |
| 100002000040000030 | 1101 |
| 100002000040000040 | 1101 |
| 100002000040000100 | 1110 |
| 100002000040000003 | 1110 |
| 100002000040000000 | 1110 |
| 100002000040000200 | 1111 |
| 100002000040000300 | 1111 |
| 100002000040000400 | 1111 |
| 100002000040000001 | 1111 |
| 400004000003000000 | 1100 |
| 400004000003000003 | 1100 |
| 400004000003000001 | 1100 |
| 400004000003000002 | 1101 |
| 400004000003000004 | 1101 |
| 400004000003000010 | 1101 |
| 400004000003000020 | 1101 |
| 400004000003000030 | 1101 |
| 400004000003000040 | 1101 |
| 400004000002000000 | 0000 |
| 400004000002000003 | 0000 |
| 400004000002000001 | 0000 |
| 400004000002000002 | 0001 |
| 400004000002000004 | 0001 |
| 400004000002000010 | 0001 |
| 400004000002000020 | 0001 |
| 400004000002000030 | 0001 |
| 400004000002000040 | 0001 |
| 400004000004000000 | 0010 |
| 400004000004000003 | 0010 |
| 400004000004000001 | 0010 |
| 400004000004000002 | 0011 |
| 400004000004000004 | 0011 |
| 400004000004000010 | 0011 |
| 400004000004000020 | 0011 |
| 400004000004000030 | 0011 |
| 400004000004000040 | 0011 |
| 400004000020000002 | 0111 |
| 400004000020000004 | 0111 |
| 400004000020000010 | 0111 |
| 400004000020000020 | 0111 |
| 400004000020000030 | 0111 |
| 400004000020000040 | 0111 |
| 400004000020000100 | 1000 |

TABLE 3-continued

| Sequence of Code Symbols | x' |
|---|---|
| 400004000020000003 | 1000 |
| 400004000020000000 | 1000 |
| 400004000020000200 | 1001 |
| 400004000020000300 | 1001 |
| 400004000020000400 | 1001 |
| 400004000020000001 | 1001 |
| 400004000030000100 | 1011 |
| 400004000030000003 | 1011 |
| 400004000030000000 | 1011 |
| 400004000030000200 | 1100 |
| 400004000030000300 | 1100 |
| 400004000030000400 | 1100 |
| 400004000030000001 | 1100 |
| 400004000040000002 | 1101 |
| 400004000040000004 | 1101 |
| 400004000040000010 | 1101 |
| 400004000040000020 | 1101 |
| 400004000040000030 | 1101 |
| 400004000040000040 | 1101 |
| 400004000040000100 | 1110 |
| 400004000040000003 | 1110 |
| 400004000040000000 | 1110 |
| 400004000040000200 | 1111 |
| 400004000040000300 | 1111 |
| 400004000040000400 | 1111 |
| 400004000040000001 | 1111 |
| 000030000003000000 | 0001 |
| 000030000003000003 | 0001 |
| 000030000003000001 | 0001 |
| 000030000200000002 | 0000 |
| 000030000200000004 | 0000 |
| 000030000200000010 | 0000 |
| 000030000200000020 | 0000 |
| 000030000200000030 | 0000 |
| 000030000200000040 | 0000 |
| 000030000200000100 | 0001 |
| 000030000200000003 | 0001 |
| 000030000200000000 | 0001 |
| 000030000200000200 | 0010 |
| 000030000200000300 | 0010 |
| 000030000200000400 | 0010 |
| 000030000200000001 | 0010 |
| 000030000200001000 | 0011 |
| 000030000200003000 | 0011 |
| 000030000200002000 | 0100 |
| 000030000200004000 | 0100 |
| 000030000400000002 | 1010 |
| 000030000400000004 | 1010 |
| 000030000400000010 | 1010 |
| 000030000400000020 | 1010 |
| 000030000400000030 | 1010 |
| 000030000400000040 | 1010 |
| 000030000400000100 | 1011 |
| 000030000400000003 | 1011 |
| 000030000400000000 | 1011 |
| 000030000400000200 | 1100 |
| 000030000400000300 | 1100 |
| 000030000400000400 | 1100 |
| 000030000400000001 | 1100 |
| 000030000400001000 | 1101 |
| 000030000400003000 | 1101 |
| 000010000002000000 | 0000 |
| 000010000002000003 | 0000 |
| 000010000002000001 | 0000 |
| 000010000002000002 | 0001 |
| 000010000002000004 | 0001 |
| 000010000002000010 | 0001 |
| 000010000002000020 | 0001 |
| 000010000002000030 | 0001 |
| 000010000002000040 | 0001 |
| 000010000004000000 | 0010 |
| 000010000004000003 | 0010 |
| 000010000004000001 | 0010 |
| 000010000004000002 | 0011 |
| 000010000004000004 | 0011 |
| 000010000004000010 | 0011 |

TABLE 3-continued

| Sequence of Code Symbols | x' |
|---|---|
| 00001000004000020 | 0011 |
| 00001000004000030 | 0011 |
| 00001000004000040 | 0011 |
| 00001000020000002 | 0111 |
| 00001000020000004 | 0111 |
| 00001000020000010 | 0111 |
| 00001000020000020 | 0111 |
| 00001000020000030 | 0111 |
| 00001000020000040 | 0111 |
| 00001000020000100 | 1000 |
| 00001000020000003 | 1000 |
| 00001000020000000 | 1000 |
| 00001000020000200 | 1001 |
| 00001000020000300 | 1001 |
| 00001000020000400 | 1001 |
| 00001000020000001 | 1001 |
| 00001000030000100 | 1011 |
| 00001000030000003 | 1011 |
| 00001000030000000 | 1011 |
| 00001000030000200 | 1100 |
| 00001000030000300 | 1100 |
| 00001000030000400 | 1100 |
| 00001000030000001 | 1100 |
| 00001000040000002 | 1101 |
| 00001000040000004 | 1101 |
| 00001000040000010 | 1101 |
| 00001000040000020 | 1101 |
| 00001000040000030 | 1101 |
| 00001000040000040 | 1101 |
| 00001000040000100 | 1110 |
| 00001000040000003 | 1110 |
| 00001000040000000 | 1110 |
| 00001000040000200 | 1111 |
| 00001000040000300 | 1111 |
| 00001000040000400 | 1111 |
| 00001000040000001 | 1111 |
| 00001000003000000 | 0001 |
| 00001000003000003 | 0001 |
| 00001000003000001 | 0001 |
| 00001000200000002 | 0000 |
| 00001000200000004 | 0000 |
| 00001000200000010 | 0000 |
| 00001000200000020 | 0000 |
| 00001000200000030 | 0000 |
| 00001000200000040 | 0000 |
| 00001000200000100 | 0001 |
| 00001000200000003 | 0001 |
| 00001000200000000 | 0001 |
| 00001000200000200 | 0010 |
| 00001000200000300 | 0010 |
| 00001000200000400 | 0010 |
| 00001000200000001 | 0010 |
| 00001000200001000 | 0011 |
| 00001000200003000 | 0011 |
| 00001000200002000 | 0100 |
| 00001000200004000 | 0100 |
| 00001000400000002 | 1010 |
| 00001000400000004 | 1010 |
| 00001000400000010 | 1010 |
| 00001000400000020 | 1010 |
| 00001000400000030 | 1010 |
| 00001000400000040 | 1010 |
| 00001000400000100 | 1011 |
| 00001000400000003 | 1011 |
| 00001000400000000 | 1011 |
| 00001000400000200 | 1100 |
| 00001000400000300 | 1100 |
| 00001000400000400 | 1100 |
| 00001000400000001 | 1100 |
| 00001000400001000 | 1101 |
| 00001000400003000 | 1101 |
| 00003000002000000 | 0000 |
| 00003000002000003 | 0000 |
| 00003000002000001 | 0000 |
| 00003000002000002 | 0001 |
| 00003000002000004 | 0001 |

TABLE 3-continued

| Sequence of Code Symbols | x' |
|---|---|
| 00003000002000010 | 0001 |
| 00003000002000020 | 0001 |
| 00003000002000030 | 0001 |
| 00003000002000040 | 0001 |
| 00003000004000000 | 0010 |
| 00003000004000003 | 0010 |
| 00003000004000001 | 0010 |
| 00003000004000002 | 0011 |
| 00003000004000004 | 0011 |
| 00003000004000010 | 0011 |
| 00003000004000020 | 0011 |
| 00003000004000030 | 0011 |
| 00003000004000040 | 0011 |
| 00003000020000002 | 0111 |
| 00003000020000004 | 0111 |
| 00003000020000010 | 0111 |
| 00003000020000020 | 0111 |
| 00003000020000030 | 0111 |
| 00003000020000040 | 0111 |
| 00003000020000100 | 1000 |
| 00003000020000003 | 1000 |
| 00003000020000000 | 1000 |
| 00003000020000200 | 1001 |
| 00003000020000300 | 1001 |
| 00003000020000400 | 1001 |
| 00003000020000001 | 1001 |
| 00003000030000100 | 1011 |
| 00003000030000003 | 1011 |
| 00003000030000000 | 1011 |
| 00003000030000200 | 1100 |
| 00003000030000300 | 1100 |
| 00003000030000400 | 1100 |
| 00003000030000001 | 1100 |
| 00003000040000002 | 1101 |
| 00003000040000004 | 1101 |
| 00003000040000010 | 1101 |
| 00003000040000020 | 1101 |
| 00003000040000030 | 1101 |
| 00003000040000040 | 1101 |
| 00003000040000100 | 1110 |
| 00003000040000003 | 1110 |
| 00003000040000000 | 1110 |
| 00003000040000200 | 1111 |
| 00003000040000300 | 1111 |
| 00003000040000400 | 1111 |
| 00003000040000001 | 1111 |
| 04000000020000002 | 0010 |
| 04000000020000004 | 0010 |
| 04000000020000010 | 0010 |
| 04000000020000020 | 0010 |
| 04000000020000030 | 0010 |
| 04000000020000040 | 0010 |
| 04000000020000100 | 0011 |
| 04000000020000003 | 0011 |
| 04000000020000000 | 0011 |
| 04000000020000200 | 0100 |
| 04000000020000300 | 0100 |
| 04000000020000400 | 0100 |
| 04000000020000001 | 0100 |
| 04000000040000002 | 1010 |
| 04000000040000004 | 1010 |
| 04000000040000010 | 1010 |
| 04000000040000020 | 1010 |
| 04000000040000030 | 1010 |
| 04000000040000040 | 1010 |
| 04000000040000100 | 1011 |
| 04000000040000003 | 1011 |
| 04000000040000000 | 1011 |
| 04000000040000200 | 1100 |
| 04000000040000300 | 1100 |
| 04000000040000400 | 1100 |
| 04000000040000001 | 1100 |
| 04000000200000002 | 0010 |
| 04000000200000004 | 0010 |
| 04000000200000010 | 0010 |
| 04000000200000020 | 0010 |

TABLE 3-continued

| Sequence of Code Symbols | x' |
|---|---|
| 040000000200000030 | 0010 |
| 040000000200000040 | 0010 |
| 040000000200000100 | 0011 |
| 040000000200000003 | 0011 |
| 040000000200000000 | 0011 |
| 040000000200000200 | 0100 |
| 040000000200000300 | 0100 |
| 040000000200000400 | 0100 |
| 040000000200000001 | 0100 |
| 040000000200001000 | 0101 |
| 040000000200003000 | 0101 |
| 040000000200002000 | 0110 |
| 040000000200004000 | 0110 |
| 040000000400000002 | 1001 |
| 040000000400000004 | 1001 |
| 040000000400000010 | 1001 |
| 040000000400000020 | 1001 |
| 040000000400000030 | 1001 |
| 040000000400000040 | 1001 |
| 040000000400000100 | 1010 |
| 040000000400000003 | 1010 |
| 040000000400000000 | 1010 |
| 040000000400000200 | 1011 |
| 040000000400000300 | 1011 |
| 040000000400000400 | 1011 |
| 040000000400000001 | 1011 |
| 040000000400001000 | 1100 |
| 040000000400003000 | 1100 |
| 040000000400002000 | 1101 |
| 040000000400004000 | 1101 |
| 040000000030000100 | 1110 |
| 040000000030000003 | 1110 |
| 040000000030000000 | 1110 |
| 040000000030000200 | 1111 |
| 040000000030000300 | 1111 |
| 040000000030000400 | 1111 |
| 040000000030000001 | 1111 |
| 000003000003000000 | 1100 |
| 000003000003000003 | 1100 |
| 000003000003000001 | 1100 |
| 000003000003000002 | 1101 |
| 000003000003000004 | 1101 |
| 000003000003000010 | 1101 |
| 000003000003000020 | 1101 |
| 000003000003000030 | 1101 |
| 000003000003000040 | 1101 |
| 000003000002000000 | 0000 |
| 000003000002000003 | 0000 |
| 000003000002000001 | 0000 |
| 000003000002000002 | 0001 |
| 000003000002000004 | 0001 |
| 000003000002000010 | 0001 |
| 000003000002000020 | 0001 |
| 000003000002000030 | 0001 |
| 000003000002000040 | 0001 |
| 000003000004000000 | 0010 |
| 000003000004000003 | 0010 |
| 000003000004000001 | 0010 |
| 000003000004000002 | 0011 |
| 000003000004000004 | 0011 |
| 000003000004000010 | 0011 |
| 000003000004000020 | 0011 |
| 000003000004000030 | 0011 |
| 000003000004000040 | 0011 |
| 000003000020000002 | 0111 |
| 000003000020000004 | 0111 |
| 000003000020000010 | 0111 |
| 000003000020000020 | 0111 |
| 000003000020000030 | 0111 |
| 000003000020000040 | 0111 |
| 000003000020000100 | 1000 |
| 000003000020000003 | 1000 |
| 000003000020000000 | 1000 |
| 000003000020000200 | 1001 |
| 000003000020000300 | 1001 |
| 000003000020000400 | 1001 |

TABLE 3-continued

| Sequence of Code Symbols | x' |
|---|---|
| 000003000020000001 | 1001 |
| 000003000030000100 | 1011 |
| 000003000030000003 | 1011 |
| 000003000030000000 | 1011 |
| 000003000030000200 | 1100 |
| 000003000030000300 | 1100 |
| 000003000030000400 | 1100 |
| 000003000030000001 | 1100 |
| 000003000040000002 | 1101 |
| 000003000040000004 | 1101 |
| 000003000040000010 | 1101 |
| 000003000040000020 | 1101 |
| 000003000040000030 | 1101 |
| 000003000040000040 | 1101 |
| 000003000040000100 | 1110 |
| 000003000040000003 | 1110 |
| 000003000040000000 | 1110 |
| 000003000040000200 | 1111 |
| 000003000040000300 | 1111 |
| 000003000040000400 | 1111 |
| 000003000040000001 | 1111 |
| 000001000003000000 | 1100 |
| 000001000003000003 | 1100 |
| 000001000003000001 | 1100 |
| 000001000003000002 | 1101 |
| 000001000003000004 | 1101 |
| 000001000003000010 | 1101 |
| 000001000003000020 | 1101 |
| 000001000003000030 | 1101 |
| 000001000003000040 | 1101 |
| 000001000002000000 | 0000 |
| 000001000002000003 | 0000 |
| 000001000002000001 | 0000 |
| 000001000002000002 | 0001 |
| 000001000002000004 | 0001 |
| 000001000002000010 | 0001 |
| 000001000002000020 | 0001 |
| 000001000002000030 | 0001 |
| 000001000002000040 | 0001 |
| 000001000004000000 | 0010 |
| 000001000004000003 | 0010 |
| 000001000004000001 | 0010 |
| 000001000004000002 | 0011 |
| 000001000004000004 | 0011 |
| 000001000004000010 | 0011 |
| 000001000004000020 | 0011 |
| 000001000004000030 | 0011 |
| 000001000004000040 | 0011 |
| 000001000020000002 | 0111 |
| 000001000020000004 | 0111 |
| 000001000020000010 | 0111 |
| 000001000020000020 | 0111 |
| 000001000020000030 | 0111 |
| 000001000020000040 | 0111 |
| 000001000020000100 | 1000 |
| 000001000020000003 | 1000 |
| 000001000020000000 | 1000 |
| 000001000020000200 | 1001 |
| 000001000020000300 | 1001 |
| 000001000020000400 | 1001 |
| 000001000020000001 | 1001 |
| 000001000030000100 | 1011 |
| 000001000030000003 | 1011 |
| 000001000030000000 | 1011 |
| 000001000030000200 | 1100 |
| 000001000030000300 | 1100 |
| 000001000030000400 | 1100 |
| 000001000030000001 | 1100 |
| 000001000040000002 | 1101 |
| 000001000040000004 | 1101 |
| 000001000040000010 | 1101 |
| 000001000040000020 | 1101 |
| 000001000040000030 | 1101 |
| 000001000040000040 | 1101 |
| 000001000040000100 | 1110 |
| 000001000040000003 | 1110 |

TABLE 3-continued

| Sequence of Code Symbols | x' |
|---|---|
| 000001000040000000 | 1110 |
| 000001000040000200 | 1111 |
| 000001000040000300 | 1111 |
| 000001000040000400 | 1111 |
| 000001000040000001 | 1111 |
| 030000000020000002 | 0010 |
| 030000000020000004 | 0010 |
| 030000000020000010 | 0010 |
| 030000000020000020 | 0010 |
| 030000000020000030 | 0010 |
| 030000000020000040 | 0010 |
| 030000000020000100 | 0011 |
| 030000000020000003 | 0011 |
| 030000000020000000 | 0011 |
| 030000000020000200 | 0100 |
| 030000000020000300 | 0100 |
| 030000000020000400 | 0100 |
| 030000000020000001 | 0100 |
| 030000000040000002 | 1010 |
| 030000000040000004 | 1010 |
| 030000000040000010 | 1010 |
| 030000000040000020 | 1010 |
| 030000000040000030 | 1010 |
| 030000000040000040 | 1010 |
| 030000000040000100 | 1011 |
| 030000000040000003 | 1011 |
| 030000000040000000 | 1011 |
| 030000000040000200 | 1100 |
| 030000000040000300 | 1100 |
| 030000000040000400 | 1100 |
| 030000000040000001 | 1100 |
| 030000000200000002 | 0010 |
| 030000000200000004 | 0010 |
| 030000000200000010 | 0010 |
| 030000000200000020 | 0010 |
| 030000000200000030 | 0010 |
| 030000000200000040 | 0010 |
| 030000000200000100 | 0011 |
| 030000000200000003 | 0011 |
| 030000000200000000 | 0011 |
| 030000000200000200 | 0100 |
| 030000000200000300 | 0100 |
| 030000000200000400 | 0100 |
| 030000000200000001 | 0100 |
| 030000000200001000 | 0101 |
| 030000000200003000 | 0101 |
| 030000000200002000 | 0110 |
| 030000000200004000 | 0110 |
| 030000000400000002 | 1001 |
| 030000000400000004 | 1001 |
| 030000000400000010 | 1001 |
| 030000000400000020 | 1001 |
| 030000000400000030 | 1001 |
| 030000000400000040 | 1001 |
| 030000000400000100 | 1010 |
| 030000000400000003 | 1010 |
| 030000000400000000 | 1010 |
| 030000000400000200 | 1011 |
| 030000000400000300 | 1011 |
| 030000000400000400 | 1011 |
| 030000000400000001 | 1011 |
| 030000000400001000 | 1100 |
| 030000000400003000 | 1100 |
| 030000000400002000 | 1101 |
| 030000000400004000 | 1101 |
| 030000000030000100 | 1110 |
| 030000000030000003 | 1110 |
| 030000000030000000 | 1110 |
| 030000000030000200 | 1111 |
| 030000000030000300 | 1111 |
| 030000000030000400 | 1111 |
| 030000000030000001 | 1111 |
| 000002000003000000 | 1100 |
| 000002000003000003 | 1100 |
| 000002000003000001 | 1100 |
| 000002000003000002 | 1101 |

TABLE 3-continued

| Sequence of Code Symbols | x' |
|---|---|
| 000002000003000004 | 1101 |
| 000002000003000010 | 1101 |
| 000002000003000020 | 1101 |
| 000002000003000030 | 1101 |
| 000002000003000040 | 1101 |
| 000002000002000000 | 0000 |
| 000002000002000003 | 0000 |
| 000002000002000001 | 0000 |
| 000002000002000002 | 0001 |
| 000002000002000004 | 0001 |
| 000002000002000010 | 0001 |
| 000002000002000020 | 0001 |
| 000002000002000030 | 0001 |
| 000002000002000040 | 0001 |
| 000002000004000000 | 0010 |
| 000002000004000003 | 0010 |
| 000002000004000001 | 0010 |
| 000002000004000002 | 0011 |
| 000002000004000004 | 0011 |
| 000002000004000010 | 0011 |
| 000002000004000020 | 0011 |
| 000002000004000030 | 0011 |
| 000002000004000040 | 0011 |
| 000002000020000002 | 0111 |
| 000002000020000004 | 0111 |
| 000002000020000010 | 0111 |
| 000002000020000020 | 0111 |
| 000002000020000030 | 0111 |
| 000002000020000040 | 0111 |
| 000002000020000100 | 1000 |
| 000002000020000003 | 1000 |
| 000002000020000000 | 1000 |
| 000002000020000200 | 1001 |
| 000002000020000300 | 1001 |
| 000002000020000400 | 1001 |
| 000002000020000001 | 1001 |
| 000002000030000100 | 1011 |
| 000002000030000003 | 1011 |
| 000002000030000000 | 1011 |
| 000002000030000200 | 1100 |
| 000002000030000300 | 1100 |
| 000002000030000400 | 1100 |
| 000002000030000001 | 1100 |
| 000002000040000002 | 1101 |
| 000002000040000004 | 1101 |
| 000002000040000010 | 1101 |
| 000002000040000020 | 1101 |
| 000002000040000030 | 1101 |
| 000002000040000040 | 1101 |
| 000002000040000100 | 1110 |
| 000002000040000003 | 1110 |
| 000002000040000000 | 1110 |
| 000002000040000200 | 1110 |
| 000002000040000300 | 1111 |
| 000002000040000400 | 1111 |
| 000002000040000001 | 1111 |
| 000004000003000000 | 1100 |
| 000004000003000003 | 1100 |
| 000004000003000001 | 1100 |
| 000004000003000002 | 1101 |
| 000004000003000004 | 1101 |
| 000004000003000010 | 1101 |
| 000004000003000020 | 1101 |
| 000004000003000030 | 1101 |
| 000004000003000040 | 1101 |
| 000004000002000000 | 0000 |
| 000004000002000003 | 0000 |
| 000004000002000001 | 0000 |
| 000004000002000002 | 0001 |
| 000004000002000004 | 0001 |
| 000004000002000010 | 0001 |
| 000004000002000020 | 0001 |
| 000004000002000030 | 0001 |
| 000004000002000040 | 0001 |
| 000004000004000000 | 0010 |
| 000004000004000003 | 0010 |

TABLE 3-continued

| Sequence of Code Symbols | x' |
|---|---|
| 00000400000400001 | 0010 |
| 00000400000400002 | 0011 |
| 00000400000400004 | 0011 |
| 00000400000400010 | 0011 |
| 00000400000400020 | 0011 |
| 00000400000400030 | 0011 |
| 00000400000400040 | 0011 |
| 00000400002000002 | 0111 |
| 00000400002000004 | 0111 |
| 00100400002000010 | 0111 |
| 00000400002000020 | 0111 |
| 00000400002000030 | 0111 |
| 00000400002000040 | 0111 |
| 00000400002000100 | 1000 |
| 00000400002000003 | 1000 |
| 00000400002000000 | 1000 |
| 00000400002000200 | 1001 |
| 00000400002000300 | 1001 |
| 00000400002000400 | 1001 |
| 00000400002000001 | 1001 |
| 00000400003000300 | 1011 |
| 00000400003000003 | 1011 |
| 00000400003000000 | 1011 |
| 00000400003000200 | 1100 |
| 00000400003000300 | 1100 |
| 00000400003000400 | 1100 |
| 00000400003000001 | 1100 |
| 00000400004000002 | 1101 |
| 00000400004000004 | 1101 |
| 00000400004000010 | 1101 |
| 00000400004000020 | 1101 |
| 00000400004000030 | 1101 |
| 00000400004000040 | 1101 |
| 00000400004000100 | 1110 |
| 00000400004000003 | 1110 |
| 00000400004000000 | 1110 |
| 00000400004000200 | 1111 |
| 00000400004000300 | 1111 |
| 00000400004000400 | 1111 |
| 00000400004000001 | 1111 |
| 02000000002000002 | 0010 |
| 02000000002000004 | 0010 |
| 02000000002000010 | 0010 |
| 02000000002000020 | 0010 |
| 02000000002000030 | 0010 |
| 02000000002000040 | 0010 |
| 02000000002000100 | 0011 |
| 02000000002000003 | 0011 |
| 02000000002000000 | 0011 |
| 02000000002000200 | 0100 |
| 02000000002000300 | 0100 |
| 02000000002000400 | 0100 |
| 02000000002000001 | 0100 |
| 02000000004000002 | 1010 |
| 02000000004000004 | 1010 |
| 02000000004000010 | 1010 |
| 02000000004000020 | 1010 |
| 02000000004000030 | 1010 |
| 02000000004000040 | 1010 |
| 02000000004000100 | 1011 |
| 02000000004000003 | 1011 |
| 02000000004000000 | 1011 |
| 02000000004000200 | 1100 |
| 02000000004000300 | 1100 |
| 02000000004000400 | 1100 |
| 02000000004000001 | 1100 |
| 02000000020000002 | 0010 |
| 02000000020000004 | 0010 |
| 02000000020000010 | 0010 |
| 02000000020000020 | 0010 |
| 02000000020000030 | 0010 |
| 02000000020000040 | 0010 |
| 02000000020000100 | 0011 |
| 02000000020000003 | 0011 |
| 02000000020000000 | 0011 |
| 02000000020000200 | 0100 |

TABLE 3-continued

| Sequence of Code Symbols | x' |
|---|---|
| 02000000020000300 | 0100 |
| 02000000020000400 | 0100 |
| 02000000020000001 | 0100 |
| 02000000020001000 | 0101 |
| 02000000020003000 | 0101 |
| 02000000020002000 | 0110 |
| 02000000020004000 | 0110 |
| 02000000040000002 | 1001 |
| 02000000040000004 | 1001 |
| 02000000040000010 | 1001 |
| 02000000040000020 | 1001 |
| 02000000040000030 | 1001 |
| 02000000040000040 | 1001 |
| 02000000040000100 | 1010 |
| 02000000040000003 | 1010 |
| 02000000040000000 | 1010 |
| 02000000040000200 | 1011 |
| 02000000040000300 | 1011 |
| 02000000040000400 | 1011 |
| 02000000040000001 | 1011 |
| 02000000040001000 | 1100 |
| 02000000040003000 | 1100 |
| 02000000040002000 | 1101 |
| 02000000040004000 | 1101 |
| 02000000003000100 | 1110 |
| 02000000003000003 | 1110 |
| 02000000003000000 | 1110 |
| 02000000003000200 | 1111 |
| 02000000003000300 | 1111 |
| 02000000003000400 | 1111 |
| 02000000003000001 | 1111 |
| 00020000000200000 | 0000 |
| 00020000000200003 | 0000 |
| 00020000000200001 | 0000 |
| 00020000000200002 | 0001 |
| 00020000000200004 | 0001 |
| 00020000000200010 | 0001 |
| 00020000000200020 | 0001 |
| 00020000000200030 | 0001 |
| 00020000000200040 | 0001 |
| 00020000000400000 | 0010 |
| 00020000000400003 | 0010 |
| 00020000000400001 | 0010 |
| 00020000000400002 | 0011 |
| 00020000000400004 | 0011 |
| 00020000000400010 | 0011 |
| 00020000000400020 | 0011 |
| 00020000000400030 | 0011 |
| 00020000000400040 | 0011 |
| 00020000002000002 | 0111 |
| 00020000002000004 | 0111 |
| 00020000002000010 | 0111 |
| 00020000002000020 | 0111 |
| 00020000002000030 | 0111 |
| 00020000002000040 | 0111 |
| 00020000002000100 | 1000 |
| 00020000002000003 | 1000 |
| 00020000002000000 | 1000 |
| 00020000002000200 | 1001 |
| 00020000002000300 | 1001 |
| 00020000003000400 | 1001 |
| 00020000003000001 | 1001 |
| 00020000003000100 | 1011 |
| 00020000003000003 | 1011 |
| 00020000003000000 | 1011 |
| 00020000003000200 | 1100 |
| 00020000003000300 | 1100 |
| 00020000003000400 | 1100 |
| 00020000003000001 | 1100 |
| 00020000004000002 | 1101 |
| 00020000004000004 | 1101 |
| 00020000004000010 | 1101 |
| 00020000004000020 | 1101 |
| 00020000004000030 | 1101 |
| 00020000004000040 | 1101 |
| 00020000004000100 | 1110 |

TABLE 3-continued

| Sequence of Code Symbols | x' |
|---|---|
| 0002000000040000003 | 1110 |
| 0002000000040000000 | 1110 |
| 0002000000040000200 | 1111 |
| 0002000000040000300 | 1111 |
| 0002000000040000400 | 1111 |
| 0002000000040000001 | 1111 |
| 0002000000003000000 | 0001 |
| 0002000000003000003 | 0001 |
| 0002000000003000001 | 0001 |
| 0002000000200000002 | 0000 |
| 0002000000200000004 | 0000 |
| 0002000000200000010 | 0000 |
| 0002000000200000020 | 0000 |
| 0002000000200000030 | 0000 |
| 0002000000200000040 | 0000 |
| 0002000000200000100 | 0001 |
| 0002000000200000003 | 0001 |
| 0002000000200000000 | 0001 |
| 0002000000200000200 | 0010 |
| 0002000000200000300 | 0010 |
| 0002000000200000400 | 0010 |
| 0002000000200000001 | 0010 |
| 0002000000200001000 | 0011 |
| 0002000000200003000 | 0011 |
| 0002000000200002000 | 0100 |
| 0002000000200004000 | 0100 |
| 0002000000400000002 | 1010 |
| 0002000000400000004 | 1010 |
| 0002000000400000010 | 1010 |
| 0002000000400000020 | 1010 |
| 0002000000400000030 | 1010 |
| 0002000000400000040 | 1010 |
| 0002000000400000100 | 1011 |
| 0002000000400000003 | 1011 |
| 0002000000400000000 | 1011 |
| 0002000000400000200 | 1100 |
| 0002000000400000300 | 1100 |
| 0002000000400000400 | 1100 |
| 0002000000400000001 | 1100 |
| 0002000000400001000 | 1101 |
| 0002000000400003000 | 1101 |
| 0100000000020000002 | 0010 |
| 0100000000020000004 | 0010 |
| 0100000000020000010 | 0010 |
| 0100000000020000020 | 0010 |
| 0100000000020000030 | 0010 |
| 0100000000020000040 | 0010 |
| 0100000000020000100 | 0011 |
| 0100000000020000003 | 0011 |
| 0100000000020000000 | 0011 |
| 0100000000020000200 | 0100 |
| 0100000000020000300 | 0100 |
| 0100000000020000400 | 0100 |
| 0100000000020000001 | 0100 |
| 0100000000040000002 | 1010 |
| 0100000000040000004 | 1010 |
| 0100000000040000010 | 1010 |
| 0100000000040000020 | 1010 |
| 0100000000040000030 | 1010 |
| 0100000000040000040 | 1010 |
| 0100000000040000100 | 1011 |
| 0100000000040000003 | 1011 |
| 0100000000040000000 | 1011 |
| 0100000000040000200 | 1100 |
| 0100000000040000300 | 1100 |
| 0100000000040000400 | 1100 |
| 0100000000040000001 | 1100 |
| 0100000000200000002 | 0010 |
| 0100000000200000004 | 0010 |
| 0100000000200000010 | 0010 |
| 0100000000200000020 | 0010 |
| 0100000000200000030 | 0010 |
| 0100000000200000040 | 0010 |
| 0100000000200000100 | 0011 |
| 0100000000200000003 | 0011 |
| 0100000000200000000 | 0011 |

TABLE 3-continued

| Sequence of Code Symbols | x' |
|---|---|
| 0100000000200000200 | 0100 |
| 0100000000200000300 | 0100 |
| 0100000000200000400 | 0100 |
| 0100000000200000001 | 0100 |
| 0100000000200001000 | 0101 |
| 0100000000200003000 | 0101 |
| 0100000000200002000 | 0110 |
| 0100000000200004000 | 0110 |
| 0100000000400000002 | 1001 |
| 0100000000400000004 | 1001 |
| 0100000000400000010 | 1001 |
| 0100000000400000020 | 1001 |
| 0100000000400000030 | 1001 |
| 0100000000400000040 | 1001 |
| 0100000000400000100 | 1010 |
| 0100000000400000003 | 1010 |
| 0100000000400000000 | 1010 |
| 0100000000400000200 | 1011 |
| 0100000000400000300 | 1011 |
| 0100000000400000400 | 1011 |
| 0100000000400000001 | 1011 |
| 0100000000400001000 | 1100 |
| 0100000000400003000 | 1100 |
| 0100000000400002000 | 1101 |
| 0100000000400004000 | 1101 |
| 0100000000030000100 | 1110 |
| 0100000000030000003 | 1110 |
| 0100000000030000000 | 1110 |
| 0100000000030000200 | 1111 |
| 0100000000030000300 | 1111 |
| 0100000000030000400 | 1111 |
| 0100000000030000001 | 1111 |
| 0004000000002000000 | 0000 |
| 0004000000002000003 | 0000 |
| 0004000000002000001 | 0000 |
| 0004000000002000002 | 0001 |
| 0004000000002000004 | 0001 |
| 0004000000002000010 | 0001 |
| 0004000000002000020 | 0001 |
| 0004000000002000030 | 0001 |
| 0004000000002000040 | 0001 |
| 0004000000004000000 | 0010 |
| 0004000000004000003 | 0010 |
| 0004000000004000001 | 0010 |
| 0004000000004000002 | 0011 |
| 0004000000004000004 | 0011 |
| 0004000000004000010 | 0011 |
| 0004000000004000020 | 0011 |
| 0004000000004000030 | 0011 |
| 0004000000004000040 | 0011 |
| 0004000000020000002 | 0111 |
| 0004000000020000004 | 0111 |
| 0004000000020000010 | 0111 |
| 0004000000020000020 | 0111 |
| 0004000000020000030 | 0111 |
| 0004000000020000040 | 0111 |
| 0004000000020000100 | 1000 |
| 0004000000020000003 | 1000 |
| 0004000000020000000 | 1000 |
| 0004000000020000200 | 1001 |
| 0004000000020000300 | 1001 |
| 0004000000020000400 | 1001 |
| 0004000000020000001 | 1001 |
| 0004000000030000100 | 1011 |
| 0004000000030000003 | 1011 |
| 0004000000030000000 | 1011 |
| 0004000000030000200 | 1100 |
| 0004000000030000300 | 1100 |
| 0004000000030000400 | 1100 |
| 0004000000030000001 | 1100 |
| 0004000000040000002 | 1101 |
| 0004000000040000004 | 1101 |
| 0004000000040000010 | 1101 |
| 0004000000040000020 | 1101 |
| 0004000000040000030 | 1101 |
| 0004000000040000040 | 1101 |

TABLE 3-continued

| Sequence of Code Symbols | x' |
|---|---|
| 000400000040000100 | 1110 |
| 000400000040000003 | 1110 |
| 000400000040000000 | 1110 |
| 000400000040000200 | 1111 |
| 000400000040000300 | 1111 |
| 000400000040000400 | 1111 |
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0001 |
| 000400000200000003 | 0001 |
| 000400000200000000 | 0001 |
| 000400000200000200 | 0010 |
| 000400000200000300 | 0010 |
| 000400000200000400 | 0010 |
| 000400000200000001 | 0010 |
| 000400000200001000 | 0011 |
| 000400000200003000 | 0011 |
| 000400000200002000 | 0100 |
| 000400000200004000 | 0100 |
| 000400000400000002 | 1010 |
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |

7. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following Claims and their equivalents.

What is claimed is:

1. A method for encoding a series of binary input data bits x into an M=5 run-length limited (4,11) code having a rate R=4/6, to produce a series of code symbols y, the method comprising the steps of receiving at a 22-state encoder an input data bit set $x_i \ldots x_{i+3}$ to be encoded into the M=5 run-length limited (4,11) code, and generating in said encoder a code symbol set $y_i \ldots y_{i+5}$ based on said input data bit set $x_i \ldots x_{i+3}$ according to the following 22-state mapping table:

-continued

| INPUT | OUTPUT | NEXT STATE |
|---|---|---|
| | STATE 0 | |
| 0 | 000000 | 7 |
| 1 | 000000 | 8 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000003 | 0 |
| 13 | 000003 | 1 |
| 14 | 000001 | 0 |
| 15 | 000001 | 1 |
| | STATE 1 | |
| 0 | 000002 | 0 |
| 1 | 000002 | 1 |
| 2 | 000004 | 0 |
| 3 | 000004 | 1 |
| 4 | 000010 | 1 |
| 5 | 000010 | 2 |
| 6 | 000010 | 3 |
| 7 | 000020 | 1 |
| 8 | 000020 | 2 |
| 9 | 000020 | 3 |
| 10 | 000030 | 1 |
| 11 | 000030 | 2 |
| 12 | 000030 | 3 |
| 13 | 000040 | 1 |
| 14 | 000040 | 2 |
| 15 | 000040 | 3 |
| | STATE 2 | |
| 0 | 000100 | 5 |
| 1 | 000003 | 0 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000000 | 6 |
| 13 | 000100 | 1 |
| 14 | 000100 | 2 |
| 15 | 000100 | 3 |
| | STATE 3 | |
| 0 | 000200 | 1 |
| 1 | 000200 | 2 |
| 2 | 000200 | 3 |
| 3 | 000200 | 4 |
| 4 | 000200 | 5 |
| 5 | 000300 | 1 |
| 6 | 000300 | 2 |
| 7 | 000300 | 3 |
| 8 | 000300 | 4 |
| 9 | 000300 | 5 |
| 10 | 000400 | 1 |
| 11 | 000400 | 2 |
| 12 | 000400 | 3 |
| 13 | 000400 | 4 |
| 14 | 000001 | 0 |
| 15 | 000001 | 1 |
| | STATE 4 | |
| 0 | 001000 | 17 |
| 1 | 001000 | 18 |
| 2 | 001000 | 19 |
| 3 | 001000 | 20 |
| 4 | 001000 | 21 |
| 5 | 001000 | 4 |
| 6 | 001000 | 5 |
| 7 | 001000 | 7 |
| 8 | 003000 | 17 |

-continued

| INPUT | OUTPUT | NEXT STATE |
|---|---|---|
| 9 | 003000 | 18 |
| 10 | 003000 | 19 |
| 11 | 003000 | 20 |
| 12 | 003000 | 21 |
| 13 | 003000 | 4 |
| 14 | 003000 | 5 |
| 15 | 003000 | 7 |
| | STATE 5 | |
| 0 | 002000 | 17 |
| 1 | 002000 | 18 |
| 2 | 002000 | 19 |
| 3 | 002000 | 20 |
| 4 | 002000 | 21 |
| 5 | 002000 | 4 |
| 6 | 002000 | 5 |
| 7 | 002000 | 7 |
| 8 | 004000 | 17 |
| 9 | 004000 | 18 |
| 10 | 004000 | 19 |
| 11 | 004000 | 20 |
| 12 | 004000 | 21 |
| 13 | 004000 | 4 |
| 14 | 004000 | 5 |
| 15 | 004000 | 7 |
| | STATE 6 | |
| 0 | 000100 | 5 |
| 1 | 000100 | 4 |
| 2 | 000200 | 1 |
| 3 | 000200 | 2 |
| 4 | 000200 | 3 |
| 5 | 000300 | 1 |
| 6 | 000300 | 2 |
| 7 | 000300 | 3 |
| 8 | 000300 | 4 |
| 9 | 000400 | 1 |
| 10 | 000400 | 2 |
| 11 | 000400 | 3 |
| 12 | 000400 | 4 |
| 13 | 000100 | 1 |
| 14 | 000100 | 2 |
| 15 | 000100 | 3 |
| | STATE 7 | |
| 0 | 000100 | 5 |
| 1 | 000100 | 4 |
| 2 | 000020 | 1 |
| 3 | 000020 | 2 |
| 4 | 000020 | 3 |
| 5 | 000300 | 1 |
| 6 | 000300 | 2 |
| 7 | 000300 | 3 |
| 8 | 000300 | 4 |
| 9 | 000300 | 5 |
| 10 | 000040 | 1 |
| 11 | 000040 | 2 |
| 12 | 000040 | 3 |
| 13 | 000100 | 1 |
| 14 | 000100 | 2 |
| 15 | 000100 | 3 |
| | STATE 8 | |
| 0 | 000010 | 1 |
| 1 | 000010 | 2 |
| 2 | 000200 | 1 |
| 3 | 000200 | 2 |
| 4 | 000200 | 3 |
| 5 | 000200 | 4 |
| 6 | 000200 | 5 |
| 7 | 000010 | 3 |
| 8 | 000030 | 1 |
| 9 | 000400 | 1 |
| 10 | 000400 | 2 |
| 11 | 000400 | 3 |
| 12 | 000400 | 4 |
| 13 | 000400 | 5 |
| 14 | 000030 | 2 |

-continued

| INPUT | OUTPUT | NEXT STATE |
|---|---|---|
| 15 | 000030 | 3 |
| | STATE 9 | |
| 0 | 400000 | 7 |
| 1 | 400000 | 8 |
| 2 | 400000 | 9 |
| 3 | 400000 | 10 |
| 4 | 400000 | 11 |
| 5 | 400000 | 12 |
| 6 | 400000 | 13 |
| 7 | 400000 | 14 |
| 8 | 400000 | 15 |
| 9 | 400000 | 16 |
| 10 | 400000 | 4 |
| 11 | 400000 | 5 |
| 12 | 200004 | 0 |
| 13 | 200004 | 1 |
| 14 | 300001 | 0 |
| 15 | 300001 | 1 |
| | STATE 10 | |
| 0 | 300000 | 7 |
| 1 | 300000 | 8 |
| 2 | 300000 | 9 |
| 3 | 300000 | 10 |
| 4 | 300000 | 11 |
| 5 | 300000 | 12 |
| 6 | 300000 | 13 |
| 7 | 300000 | 14 |
| 8 | 300000 | 15 |
| 9 | 300000 | 16 |
| 10 | 300000 | 4 |
| 11 | 300000 | 5 |
| 12 | 200003 | 0 |
| 13 | 200003 | 1 |
| 14 | 300002 | 0 |
| 15 | 300002 | 1 |
| | STATE 11 | |
| 0 | 200000 | 7 |
| 1 | 200000 | 8 |
| 2 | 200000 | 9 |
| 3 | 200000 | 10 |
| 4 | 200000 | 11 |
| 5 | 200000 | 12 |
| 6 | 200000 | 13 |
| 7 | 200000 | 14 |
| 8 | 200000 | 15 |
| 9 | 200000 | 16 |
| 10 | 200000 | 4 |
| 11 | 200000 | 5 |
| 12 | 200002 | 0 |
| 13 | 200002 | 1 |
| 14 | 300003 | 0 |
| 15 | 300003 | 1 |
| | STATE 12 | |
| 0 | 100000 | 7 |
| 1 | 100000 | 8 |
| 2 | 100000 | 9 |
| 3 | 100000 | 10 |
| 4 | 100000 | 11 |
| 5 | 100000 | 12 |
| 6 | 100000 | 13 |
| 7 | 100000 | 14 |
| 8 | 100000 | 15 |
| 9 | 100000 | 16 |
| 10 | 100000 | 4 |
| 11 | 100000 | 5 |
| 12 | 200001 | 0 |
| 13 | 200001 | 1 |
| 14 | 300004 | 0 |
| 15 | 300004 | 1 |
| | STATE 13 | |
| 0 | 040000 | 7 |
| 1 | 040000 | 8 |
| 2 | 040000 | 9 |

-continued

| INPUT | OUTPUT | NEXT STATE |
|---|---|---|
| 3 | 040000 | 10 |
| 4 | 040000 | 11 |
| 5 | 040000 | 12 |
| 6 | 040000 | 13 |
| 7 | 040000 | 14 |
| 8 | 040000 | 15 |
| 9 | 040000 | 16 |
| 10 | 040000 | 4 |
| 11 | 040000 | 5 |
| 12 | 100004 | 0 |
| 13 | 100004 | 1 |
| 14 | 400001 | 0 |
| 15 | 400001 | 1 |
| | STATE 14 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |
| 10 | 030000 | 4 |
| 11 | 030000 | 5 |
| 12 | 100001 | 0 |
| 13 | 100001 | 1 |
| 14 | 400002 | 0 |
| 15 | 400002 | 1 |
| | STATE 15 | |
| 0 | 020000 | 7 |
| 1 | 020000 | 8 |
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 100003 | 0 |
| 13 | 100003 | 1 |
| 14 | 400003 | 0 |
| 15 | 400003 | 1 |
| | STATE 16 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |
| 8 | 010000 | 15 |
| 9 | 010000 | 16 |
| 10 | 010000 | 4 |
| 11 | 010000 | 5 |
| 12 | 100002 | 0 |
| 13 | 100002 | 1 |
| 14 | 400004 | 0 |
| 15 | 400004 | 1 |
| | STATE 17 | |
| 0 | 000030 | 2 |
| 1 | 000030 | 3 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |

-continued

| INPUT | OUTPUT | NEXT STATE |
|---|---|---|
| 9 | 000000 | 16 |
| 10 | 000000 | 4 |
| 11 | 000000 | 5 |
| 12 | 000010 | 1 |
| 13 | 000010 | 2 |
| 14 | 000010 | 3 |
| 15 | 000030 | 1 |
| | STATE 18 | |
| 0 | 040000 | 7 |
| 1 | 040000 | 8 |
| 2 | 040000 | 9 |
| 3 | 040000 | 10 |
| 4 | 040000 | 11 |
| 5 | 040000 | 12 |
| 6 | 040000 | 13 |
| 7 | 040000 | 14 |
| 8 | 040000 | 15 |
| 9 | 040000 | 16 |
| 10 | 040000 | 4 |
| 11 | 040000 | 5 |
| 12 | 000003 | 0 |
| 13 | 000003 | 1 |
| 14 | 000001 | 0 |
| 15 | 000001 | 1 |
| | STATE 19 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |
| 10 | 030000 | 4 |
| 11 | 030000 | 5 |
| 12 | 000002 | 0 |
| 13 | 000002 | 1 |
| 14 | 000004 | 0 |
| 15 | 000004 | 1 |
| | STATE 20 | |
| 0 | 020000 | 7 |
| 1 | 020000 | 8 |
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 000200 | 1 |
| 13 | 000200 | 2 |
| 14 | 000200 | 3 |
| 15 | 000200 | 4 |
| | STATE 21 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |
| 8 | 010000 | 15 |
| 9 | 010000 | 16 |
| 10 | 010000 | 4 |
| 11 | 010000 | 5 |
| 12 | 000400 | 1 |
| 13 | 000400 | 2 |
| 14 | 000400 | 3 |

-continued

| INPUT | OUTPUT | NEXT STATE |
|---|---|---|
| 15 | 000400 | 4 |

wherein said code symbol set $y_i \ldots y_{i+5}$ is generated based on the input data bit set $x_i \ldots x_{i+3}$ and the current state of said 22-state encoder when said data bit set $x_i \ldots x_{i+3}$ is received.

2. A method for encoding a series of binary input data bits x into an M-ary run-length limited (4,11) code having a rate R=4/6 to produce a series of code symbols y, each code symbol being at one of M levels, where M>2 and each pair of non-zero code symbols having a minimum of four and a maximum of eleven zeroes therebetween, the method comprising the steps of receiving at a 22-state encoder an input data bit set $x_i \ldots x_{i+3}$ to be encoded into the M-ary run-length limited (4,11) code, and generating in said encoder a code symbol set $y_i \ldots y_{i+5}$ based on said input data bit set $x_i \ldots x_{i+3}$ according to the following mapping table:

| INPUT | OUTPUT | NEXT STATE |
|---|---|---|
| | STATE 0 | |
| 0 | 000000 | 7 |
| 1 | 000000 | 8 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000003 | 0 |
| 13 | 000003 | 1 |
| 14 | 000001 | 0 |
| 15 | 000001 | 1 |
| | STATE 1 | |
| 0 | 000002 | 0 |
| 1 | 000002 | 1 |
| 2 | 000004 | 0 |
| 3 | 000004 | 1 |
| 4 | 000010 | 1 |
| 5 | 000010 | 2 |
| 6 | 000010 | 3 |
| 7 | 000020 | 1 |
| 8 | 000020 | 2 |
| 9 | 000020 | 3 |
| 10 | 000030 | 1 |
| 11 | 000030 | 2 |
| 12 | 000030 | 3 |
| 13 | 000040 | 1 |
| 14 | 000040 | 2 |
| 15 | 000040 | 3 |
| | STATE 2 | |
| 0 | 000100 | 5 |
| 1 | 000003 | 0 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000000 | 6 |
| 13 | 000100 | 1 |
| 14 | 000100 | 2 |
| 15 | 000100 | 3 |
| | STATE 3 | |
| 0 | 000200 | 1 |
| 1 | 000200 | 2 |
| 2 | 000200 | 3 |
| 3 | 000200 | 4 |
| 4 | 000200 | 5 |
| 5 | 000300 | 1 |
| 6 | 000300 | 2 |
| 7 | 000300 | 3 |
| 8 | 000300 | 4 |
| 9 | 000300 | 5 |
| 10 | 000400 | 1 |
| 11 | 000400 | 2 |
| 12 | 000400 | 3 |
| 13 | 000400 | 4 |
| 14 | 000001 | 0 |
| 15 | 000001 | 1 |
| | STATE 4 | |
| 0 | 001000 | 17 |
| 1 | 001000 | 18 |
| 2 | 001000 | 19 |
| 3 | 001000 | 20 |
| 4 | 001000 | 21 |
| 5 | 001000 | 4 |
| 6 | 001000 | 5 |
| 7 | 001000 | 7 |
| 8 | 003000 | 17 |
| 9 | 003000 | 18 |
| 10 | 003000 | 19 |
| 11 | 003000 | 20 |
| 12 | 003000 | 21 |
| 13 | 003000 | 4 |
| 14 | 003000 | 5 |
| 15 | 003000 | 7 |
| | STATE 5 | |
| 0 | 002000 | 17 |
| 1 | 002000 | 18 |
| 2 | 002000 | 19 |
| 3 | 002000 | 20 |
| 4 | 002000 | 21 |
| 5 | 002000 | 4 |
| 6 | 002000 | 5 |
| 7 | 002000 | 7 |
| 8 | 004000 | 17 |
| 9 | 004000 | 18 |
| 10 | 004000 | 19 |
| 11 | 004000 | 20 |
| 12 | 004000 | 21 |
| 13 | 004000 | 4 |
| 14 | 004000 | 5 |
| 15 | 004000 | 7 |
| | STATE 6 | |
| 0 | 000100 | 5 |
| 1 | 000100 | 4 |
| 2 | 000200 | 1 |
| 3 | 000200 | 2 |
| 4 | 000200 | 3 |
| 5 | 000300 | 1 |
| 6 | 000300 | 2 |
| 7 | 000300 | 3 |
| 8 | 000300 | 4 |
| 9 | 000400 | 1 |
| 10 | 000400 | 2 |
| 11 | 000400 | 3 |
| 12 | 000400 | 4 |
| 13 | 000100 | 1 |
| 14 | 000100 | 2 |
| 15 | 000100 | 3 |
| | STATE 7 | |
| 0 | 000100 | 5 |
| 1 | 000100 | 4 |

-continued

| INPUT | OUTPUT | NEXT STATE |
|---|---|---|
| 2 | 000020 | 1 |
| 3 | 000020 | 2 |
| 4 | 000020 | 3 |
| 5 | 000300 | 1 |
| 6 | 000300 | 2 |
| 7 | 000300 | 3 |
| 8 | 000300 | 4 |
| 9 | 000300 | 5 |
| 10 | 000040 | 1 |
| 11 | 000040 | 2 |
| 12 | 000040 | 3 |
| 13 | 000100 | 1 |
| 14 | 000100 | 2 |
| 15 | 000100 | 3 |
| | STATE 8 | |
| 0 | 000010 | 1 |
| 1 | 000010 | 2 |
| 2 | 000200 | 1 |
| 3 | 000200 | 2 |
| 4 | 000200 | 3 |
| 5 | 000200 | 4 |
| 6 | 000200 | 5 |
| 7 | 000010 | 3 |
| 8 | 000030 | 1 |
| 9 | 000400 | 1 |
| 10 | 000400 | 2 |
| 11 | 000400 | 3 |
| 12 | 000400 | 4 |
| 13 | 000400 | 5 |
| 14 | 000030 | 2 |
| 15 | 000030 | 3 |
| | STATE 9 | |
| 0 | 400000 | 7 |
| 1 | 400000 | 8 |
| 2 | 400000 | 9 |
| 3 | 400000 | 10 |
| 4 | 400000 | 11 |
| 5 | 400000 | 12 |
| 6 | 400000 | 13 |
| 7 | 400000 | 14 |
| 8 | 400000 | 15 |
| 9 | 400000 | 16 |
| 10 | 400000 | 4 |
| 11 | 400000 | 5 |
| 12 | 200004 | 0 |
| 13 | 200004 | 1 |
| 14 | 300001 | 0 |
| 15 | 300001 | 1 |
| | STATE 10 | |
| 0 | 300000 | 7 |
| 1 | 300000 | 8 |
| 2 | 300000 | 9 |
| 3 | 300000 | 10 |
| 4 | 300000 | 11 |
| 5 | 300000 | 12 |
| 6 | 300000 | 13 |
| 7 | 300000 | 14 |
| 8 | 300000 | 15 |
| 9 | 300000 | 16 |
| 10 | 300000 | 4 |
| 11 | 300000 | 5 |
| 12 | 200003 | 0 |
| 13 | 200003 | 1 |
| 14 | 300002 | 0 |
| 15 | 300002 | 1 |
| | STATE 11 | |
| 0 | 200000 | 7 |
| 1 | 200000 | 8 |
| 2 | 200000 | 9 |
| 3 | 200000 | 10 |
| 4 | 200000 | 11 |
| 5 | 200000 | 12 |
| 6 | 200000 | 13 |
| 7 | 200000 | 14 |

-continued

| INPUT | OUTPUT | NEXT STATE |
|---|---|---|
| 8 | 200000 | 15 |
| 9 | 200000 | 16 |
| 10 | 200000 | 4 |
| 11 | 200000 | 5 |
| 12 | 200002 | 0 |
| 13 | 200002 | 1 |
| 14 | 300003 | 0 |
| 15 | 300003 | 1 |
| | STATE 12 | |
| 0 | 100000 | 7 |
| 1 | 100000 | 8 |
| 2 | 100000 | 9 |
| 3 | 100000 | 10 |
| 4 | 100000 | 11 |
| 5 | 100000 | 12 |
| 6 | 100000 | 13 |
| 7 | 100000 | 14 |
| 8 | 100000 | 15 |
| 9 | 100000 | 16 |
| 10 | 100000 | 4 |
| 11 | 100000 | 5 |
| 12 | 200001 | 0 |
| 13 | 200001 | 1 |
| 14 | 300004 | 0 |
| 15 | 300004 | 1 |
| | STATE 13 | |
| 0 | 040000 | 7 |
| 1 | 040000 | 8 |
| 2 | 040000 | 9 |
| 3 | 040000 | 10 |
| 4 | 040000 | 11 |
| 5 | 040000 | 12 |
| 6 | 040000 | 13 |
| 7 | 040000 | 14 |
| 8 | 040000 | 15 |
| 9 | 040000 | 16 |
| 10 | 040000 | 4 |
| 11 | 040000 | 5 |
| 12 | 100004 | 0 |
| 13 | 100004 | 1 |
| 14 | 400001 | 0 |
| 15 | 400001 | 1 |
| | STATE 14 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |
| 10 | 030000 | 4 |
| 11 | 030000 | 5 |
| 12 | 100001 | 0 |
| 13 | 100001 | 1 |
| 14 | 400002 | 0 |
| 15 | 400002 | 1 |
| | STATE 15 | |
| 0 | 020000 | 7 |
| 1 | 020000 | 8 |
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 100003 | 0 |
| 13 | 100003 | 1 |

-continued

| INPUT | OUTPUT | NEXT STATE |
|---|---|---|
| 14 | 400003 | 0 |
| 15 | 400003 | 1 |
| | STATE 16 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |
| 8 | 010000 | 15 |
| 9 | 010000 | 16 |
| 10 | 010000 | 4 |
| 11 | 010000 | 5 |
| 12 | 100002 | 0 |
| 13 | 100002 | 1 |
| 14 | 400004 | 0 |
| 15 | 400004 | 1 |
| | STATE 17 | |
| 0 | 000030 | 2 |
| 1 | 000030 | 3 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000010 | 1 |
| 13 | 000010 | 2 |
| 14 | 000010 | 3 |
| 15 | 000030 | 1 |
| | STATE 18 | |
| 0 | 040000 | 7 |
| 1 | 040000 | 8 |
| 2 | 040000 | 9 |
| 3 | 040000 | 10 |
| 4 | 040000 | 11 |
| 5 | 040000 | 12 |
| 6 | 040000 | 13 |
| 7 | 040000 | 14 |
| 8 | 040000 | 15 |
| 9 | 040000 | 16 |
| 10 | 040000 | 4 |
| 11 | 040000 | 5 |
| 12 | 000003 | 0 |
| 13 | 000003 | 1 |
| 14 | 000001 | 0 |
| 15 | 000001 | 1 |
| | STATE 19 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |
| 10 | 030000 | 4 |
| 11 | 030000 | 5 |
| 12 | 000002 | 0 |
| 13 | 000002 | 1 |
| 14 | 000004 | 0 |
| 15 | 000004 | 1 |
| | STATE 20 | |
| 0 | 020000 | 7 |
| 1 | 020000 | 8 |

-continued

| INPUT | OUTPUT | NEXT STATE |
|---|---|---|
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 000200 | 1 |
| 13 | 000200 | 2 |
| 14 | 000200 | 3 |
| 15 | 000200 | 4 |
| | STATE 21 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |
| 8 | 010000 | 15 |
| 9 | 010000 | 16 |
| 10 | 010000 | 4 |
| 11 | 010000 | 5 |
| 12 | 000400 | 1 |
| 13 | 000400 | 2 |
| 14 | 000400 | 3 |
| 15 | 000400 | 4 |

wherein a code symbol set $y_i \ldots y_{i+5}$ is generated based on the input data bit set $x_i \ldots x_{i+3}$ and the current state of said 22-state encoder when said data bit set $x_i \ldots x_{i+3}$ is received.

3. A method for converting binary input data bits into a series of waveform amplitudes each amplitude being at one of M=5 levels, the method comprising the steps of:

encoding the binary input data bits into an M=5 (4,11) code having a rate R=4/6 to produce a series of code symbols, each code symbol being at one of M levels, and each pair of non-zero code symbols having a minimum of four and a maximum of eleven zeroes therebetween, said encoding step comprising the step of generating a code symbol set $y_i \ldots y_{i+5}$ for each input data bit set $x_i \ldots x_{i+3}$ according to the following mapping table:

| INPUT | OUTPUT | NEXT STATE |
|---|---|---|
| | STATE 0 | |
| 0 | 0 0 0 0 0 0 | 7 |
| 1 | 0 0 0 0 0 0 | 8 |
| 2 | 0 0 0 0 0 0 | 9 |
| 3 | 0 0 0 0 0 0 | 10 |
| 4 | 0 0 0 0 0 0 | 11 |
| 5 | 0 0 0 0 0 0 | 12 |
| 6 | 0 0 0 0 0 0 | 13 |
| 7 | 0 0 0 0 0 0 | 14 |
| 8 | 0 0 0 0 0 0 | 15 |
| 9 | 0 0 0 0 0 0 | 16 |
| 10 | 0 0 0 0 0 0 | 4 |
| 11 | 0 0 0 0 0 0 | 5 |
| 12 | 0 0 0 0 0 3 | 0 |
| 13 | 0 0 0 0 0 3 | 1 |
| 14 | 0 0 0 0 0 1 | 0 |
| 15 | 0 0 0 0 0 1 | 1 |
| | STATE 1 | |
| 0 | 0 0 0 0 0 2 | 0 |

-continued

| INPUT | OUTPUT | NEXT STATE |
|---|---|---|
| 1 | 000002 | 1 |
| 2 | 000004 | 0 |
| 3 | 000004 | 1 |
| 4 | 000010 | 1 |
| 5 | 000010 | 2 |
| 6 | 000010 | 3 |
| 7 | 000020 | 1 |
| 8 | 000020 | 2 |
| 9 | 000020 | 3 |
| 10 | 000030 | 1 |
| 11 | 000030 | 2 |
| 12 | 000030 | 3 |
| 13 | 000040 | 1 |
| 14 | 000040 | 2 |
| 15 | 000040 | 3 |
| | STATE 2 | |
| 0 | 000100 | 5 |
| 1 | 000003 | 0 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000000 | 6 |
| 13 | 000100 | 1 |
| 14 | 000100 | 2 |
| 15 | 000100 | 3 |
| | STATE 3 | |
| 0 | 000200 | 1 |
| 1 | 000200 | 2 |
| 2 | 000200 | 3 |
| 3 | 000200 | 4 |
| 4 | 000200 | 5 |
| 5 | 000300 | 1 |
| 6 | 000300 | 2 |
| 7 | 000300 | 3 |
| 8 | 000300 | 4 |
| 9 | 000300 | 5 |
| 10 | 000400 | 1 |
| 11 | 000400 | 2 |
| 12 | 000400 | 3 |
| 13 | 000400 | 4 |
| 14 | 000001 | 0 |
| 15 | 000001 | 1 |
| | STATE 4 | |
| 0 | 001000 | 17 |
| 1 | 001000 | 18 |
| 2 | 001000 | 19 |
| 3 | 001000 | 20 |
| 4 | 001000 | 21 |
| 5 | 001000 | 4 |
| 6 | 001000 | 5 |
| 7 | 001000 | 7 |
| 8 | 003000 | 17 |
| 9 | 003000 | 18 |
| 10 | 003000 | 19 |
| 11 | 003000 | 20 |
| 12 | 003000 | 21 |
| 13 | 003000 | 4 |
| 14 | 003000 | 5 |
| 15 | 003000 | 7 |
| | STATE 5 | |
| 0 | 002000 | 17 |
| 1 | 002000 | 18 |
| 2 | 002000 | 19 |
| 3 | 002000 | 20 |
| 4 | 002000 | 21 |
| 5 | 002000 | 4 |
| 6 | 002000 | 5 |

-continued

| INPUT | OUTPUT | NEXT STATE |
|---|---|---|
| 7 | 002000 | 7 |
| 8 | 004000 | 17 |
| 9 | 004000 | 18 |
| 10 | 004000 | 19 |
| 11 | 004000 | 20 |
| 12 | 004000 | 21 |
| 13 | 004000 | 4 |
| 14 | 004000 | 5 |
| 15 | 004000 | 7 |
| | STATE 6 | |
| 0 | 000100 | 5 |
| 1 | 000100 | 4 |
| 2 | 000200 | 1 |
| 3 | 000200 | 2 |
| 4 | 000200 | 3 |
| 5 | 000300 | 1 |
| 6 | 000300 | 2 |
| 7 | 000300 | 3 |
| 8 | 000300 | 4 |
| 9 | 000400 | 1 |
| 10 | 000400 | 2 |
| 11 | 000400 | 3 |
| 12 | 000400 | 4 |
| 13 | 000100 | 1 |
| 14 | 000100 | 2 |
| 15 | 000100 | 3 |
| | STATE 7 | |
| 0 | 000100 | 5 |
| 1 | 000100 | 4 |
| 2 | 000020 | 1 |
| 3 | 000020 | 2 |
| 4 | 000020 | 3 |
| 5 | 000300 | 1 |
| 6 | 000300 | 2 |
| 7 | 000300 | 3 |
| 8 | 000300 | 4 |
| 9 | 000300 | 5 |
| 10 | 000040 | 1 |
| 11 | 000040 | 2 |
| 12 | 000040 | 3 |
| 13 | 000100 | 1 |
| 14 | 000100 | 2 |
| 15 | 000100 | 3 |
| | STATE 8 | |
| 0 | 000010 | 1 |
| 1 | 000010 | 2 |
| 2 | 000200 | 1 |
| 3 | 000200 | 2 |
| 4 | 000200 | 3 |
| 5 | 000200 | 4 |
| 6 | 000200 | 5 |
| 7 | 000010 | 3 |
| 8 | 000030 | 1 |
| 9 | 000400 | 1 |
| 10 | 000400 | 2 |
| 11 | 000400 | 3 |
| 12 | 000400 | 4 |
| 13 | 000400 | 5 |
| 14 | 000030 | 2 |
| 15 | 000030 | 3 |
| | STATE 9 | |
| 0 | 400000 | 7 |
| 1 | 400000 | 8 |
| 2 | 400000 | 9 |
| 3 | 400000 | 10 |
| 4 | 400000 | 11 |
| 5 | 400000 | 12 |
| 6 | 400000 | 13 |
| 7 | 400000 | 14 |
| 8 | 400000 | 15 |
| 9 | 400000 | 16 |
| 10 | 400000 | 4 |
| 11 | 400000 | 5 |
| 12 | 200004 | 0 |

-continued

| INPUT | OUTPUT | NEXT STATE |
|---|---|---|
| 13 | 2 0 0 0 0 4 | 1 |
| 14 | 3 0 0 0 0 1 | 0 |
| 15 | 3 0 0 0 0 1 | 1 |
| | STATE 10 | |
| 0 | 3 0 0 0 0 0 | 7 |
| 1 | 3 0 0 0 0 0 | 8 |
| 2 | 3 0 0 0 0 0 | 9 |
| 3 | 3 0 0 0 0 0 | 10 |
| 4 | 3 0 0 0 0 0 | 11 |
| 5 | 3 0 0 0 0 0 | 12 |
| 6 | 3 0 0 0 0 0 | 13 |
| 7 | 3 0 0 0 0 0 | 14 |
| 8 | 3 0 0 0 0 0 | 15 |
| 9 | 3 0 0 0 0 0 | 16 |
| 10 | 3 0 0 0 0 0 | 4 |
| 11 | 3 0 0 0 0 0 | 5 |
| 12 | 2 0 0 0 0 3 | 0 |
| 13 | 2 0 0 0 0 3 | 1 |
| 14 | 3 0 0 0 0 2 | 0 |
| 15 | 3 0 0 0 0 2 | 1 |
| | STATE 11 | |
| 0 | 2 0 0 0 0 0 | 7 |
| 1 | 2 0 0 0 0 0 | 8 |
| 2 | 2 0 0 0 0 0 | 9 |
| 3 | 2 0 0 0 0 0 | 10 |
| 4 | 2 0 0 0 0 0 | 11 |
| 5 | 2 0 0 0 0 0 | 12 |
| 6 | 2 0 0 0 0 0 | 13 |
| 7 | 2 0 0 0 0 0 | 14 |
| 8 | 2 0 0 0 0 0 | 15 |
| 9 | 2 0 0 0 0 0 | 16 |
| 10 | 2 0 0 0 0 0 | 4 |
| 11 | 2 0 0 0 0 0 | 5 |
| 12 | 2 0 0 0 0 2 | 0 |
| 13 | 2 0 0 0 0 2 | 1 |
| 14 | 3 0 0 0 0 3 | 0 |
| 15 | 3 0 0 0 0 3 | 1 |
| | STATE 12 | |
| 0 | 1 0 0 0 0 0 | 7 |
| 1 | 1 0 0 0 0 0 | 8 |
| 2 | 1 0 0 0 0 0 | 9 |
| 3 | 1 0 0 0 0 0 | 10 |
| 4 | 1 0 0 0 0 0 | 11 |
| 5 | 1 0 0 0 0 0 | 12 |
| 6 | 1 0 0 0 0 0 | 13 |
| 7 | 1 0 0 0 0 0 | 14 |
| 8 | 1 0 0 0 0 0 | 15 |
| 9 | 1 0 0 0 0 0 | 16 |
| 10 | 1 0 0 0 0 0 | 4 |
| 11 | 1 0 0 0 0 0 | 5 |
| 12 | 2 0 0 0 0 1 | 0 |
| 13 | 2 0 0 0 0 1 | 1 |
| 14 | 3 0 0 0 0 4 | 0 |
| 15 | 3 0 0 0 0 4 | 1 |
| | STATE 13 | |
| 0 | 040000 | 7 |
| 1 | 0 4 0 0 0 0 | 8 |
| 2 | 0 4 0 0 0 0 | 9 |
| 3 | 0 4 0 0 0 0 | 10 |
| 4 | 0 4 0 0 0 0 | 11 |
| 5 | 0 4 0 0 0 0 | 12 |
| 6 | 0 4 0 0 0 0 | 13 |
| 7 | 0 4 0 0 0 0 | 14 |
| 8 | 0 4 0 0 0 0 | 15 |
| 9 | 0 4 0 0 0 0 | 16 |
| 10 | 0 4 0 0 0 0 | 4 |
| 11 | 0 4 0 0 0 0 | 5 |
| 12 | 1 0 0 0 0 4 | 0 |
| 13 | 1 0 0 0 0 4 | 1 |
| 14 | 4 0 0 0 0 1 | 0 |
| 15 | 4 0 0 0 0 1 | 1 |
| | STATE 14 | |
| 0 | 0 3 0 0 0 0 | 7 |

-continued

| INPUT | OUTPUT | NEXT STATE |
|---|---|---|
| 1 | 0 3 0 0 0 0 | 8 |
| 2 | 0 3 0 0 0 0 | 9 |
| 3 | 0 3 0 0 0 0 | 10 |
| 4 | 0 3 0 0 0 0 | 11 |
| 5 | 0 3 0 0 0 0 | 12 |
| 6 | 0 3 0 0 0 0 | 13 |
| 7 | 0 3 0 0 0 0 | 14 |
| 8 | 0 3 0 0 0 0 | 15 |
| 9 | 0 3 0 0 0 0 | 16 |
| 10 | 0 3 0 0 0 0 | 4 |
| 11 | 0 3 0 0 0 0 | 5 |
| 12 | 1 0 0 0 0 1 | 0 |
| 13 | 1 0 0 0 0 1 | 1 |
| 14 | 4 0 0 0 0 2 | 0 |
| 15 | 4 0 0 0 0 2 | 1 |
| | STATE 15 | |
| 0 | 0 2 0 0 0 0 | 7 |
| 1 | 0 2 0 0 0 0 | 8 |
| 2 | 0 2 0 0 0 0 | 9 |
| 3 | 0 2 0 0 0 0 | 10 |
| 4 | 0 2 0 0 0 0 | 11 |
| 5 | 0 2 0 0 0 0 | 12 |
| 6 | 0 2 0 0 0 0 | 13 |
| 7 | 0 2 0 0 0 0 | 14 |
| 8 | 0 2 0 0 0 0 | 15 |
| 9 | 0 2 0 0 0 0 | 16 |
| 10 | 0 2 0 0 0 0 | 4 |
| 11 | 0 2 0 0 0 0 | 5 |
| 12 | 1 0 0 0 0 3 | 0 |
| 13 | 1 0 0 0 0 3 | 1 |
| 14 | 4 0 0 0 0 3 | 0 |
| 15 | 4 0 0 0 0 3 | 1 |
| | STATE 16 | |
| 0 | 0 1 0 0 0 0 | 7 |
| 1 | 0 1 0 0 0 0 | 8 |
| 2 | 0 1 0 0 0 0 | 9 |
| 3 | 0 1 0 0 0 0 | 10 |
| 4 | 0 1 0 0 0 0 | 11 |
| 5 | 0 1 0 0 0 0 | 12 |
| 6 | 0 1 0 0 0 0 | 13 |
| 7 | 0 1 0 0 0 0 | 14 |
| 8 | 0 1 0 0 0 0 | 15 |
| 9 | 0 1 0 0 0 0 | 16 |
| 10 | 0 1 0 0 0 0 | 4 |
| 11 | 0 1 0 0 0 0 | 5 |
| 12 | 1 0 0 0 0 2 | 0 |
| 13 | 1 0 0 0 0 2 | 1 |
| 14 | 4 0 0 0 0 4 | 0 |
| 15 | 4 0 0 0 0 4 | 1 |
| | STATE 17 | |
| 0 | 0 0 0 0 3 0 | 2 |
| 1 | 0 0 0 0 3 0 | 3 |
| 2 | 0 0 0 0 0 0 | 9 |
| 3 | 0 0 0 0 0 0 | 10 |
| 4 | 0 0 0 0 0 0 | 11 |
| 5 | 0 0 0 0 0 0 | 12 |
| 6 | 0 0 0 0 0 0 | 13 |
| 7 | 0 0 0 0 0 0 | 14 |
| 8 | 0 0 0 0 0 0 | 15 |
| 9 | 0 0 0 0 0 0 | 16 |
| 10 | 0 0 0 0 0 0 | 4 |
| 11 | 0 0 0 0 0 0 | 5 |
| 12 | 0 0 0 0 1 0 | 1 |
| 13 | 0 0 0 0 1 0 | 2 |
| 14 | 0 0 0 0 1 0 | 3 |
| 15 | 0 0 0 0 3 0 | 1 |
| | STATE 18 | |
| 0 | 0 4 0 0 0 0 | 7 |
| 1 | 0 4 0 0 0 0 | 8 |
| 2 | 0 4 0 0 0 0 | 9 |
| 3 | 0 4 0 0 0 0 | 10 |
| 4 | 0 4 0 0 0 0 | 11 |
| 5 | 0 4 0 0 0 0 | 12 |
| 6 | 0 4 0 0 0 0 | 13 |

-continued

| INPUT | OUTPUT | NEXT STATE |
|---|---|---|
| 7 | 040000 | 14 |
| 8 | 040000 | 15 |
| 9 | 040000 | 16 |
| 10 | 040000 | 4 |
| 11 | 040000 | 5 |
| 12 | 000003 | 0 |
| 13 | 000003 | 1 |
| 14 | 000001 | 0 |
| 15 | 000001 | 1 |
| | STATE 19 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |
| 10 | 030000 | 4 |
| 11 | 030000 | 5 |
| 12 | 000002 | 0 |
| 13 | 000002 | 1 |
| 14 | 000004 | 0 |
| 15 | 000004 | 1 |
| | STATE 20 | |
| 0 | 020000 | 7 |
| 1 | 020000 | 8 |
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 000200 | 1 |
| 13 | 000200 | 2 |
| 14 | 000200 | 3 |
| 15 | 000200 | 4 |
| | STATE 21 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |
| 8 | 010000 | 15 |
| 9 | 010000 | 16 |
| 10 | 010000 | 4 |
| 11 | 010000 | 5 |
| 12 | 000400 | 1 |
| 13 | 000400 | 2 |
| 14 | 000400 | 3 |
| 15 | 000400 | 4 |

wherein said code symbol set $y_i \ldots y_{i+5}$ is generated based on the input data bit set $x_i \ldots x_{i+3}$ and the current state of said 22-state encoder when said data bit set $x_i \ldots x_{i+3}$ is received; and generating in a waveform encoder waveform signal amplitudes based on said code symbols, wherein each said waveform signal amplitude is generated by modulo five addition of a current code symbol with a previous waveform signal amplitude.

4. In a data storage system having storage media capable of storing data at multiple levels, a method for converting binary input data bits into a series of waveform amplitudes each amplitude being at one of M=5 levels and storing the waveform amplitudes on the storage medium, the method comprising the steps of:

encoding the binary input data bits into an M=5 (4,11) code having a rate R=4/6 to produce a series of code symbols, each code symbol being at one of M levels, and each pair of non-zero code symbols having a minimum of four and a maximum of eleven zeroes therebetween, comprising the step of generating a code symbol set $y_i \ldots y_{i+5}$ for each input data bit set $x_i \ldots x_{i+3}$ according to the following mapping table:

| INPUT | OUTPUT | NEXT STATE |
|---|---|---|
| | STATE 0 | |
| 0 | 000000 | 7 |
| 1 | 000000 | 8 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000003 | 0 |
| 13 | 000003 | 1 |
| 14 | 000001 | 0 |
| 15 | 000001 | 1 |
| | STATE 1 | |
| 0 | 000002 | 0 |
| 1 | 000002 | 1 |
| 2 | 000004 | 0 |
| 3 | 000004 | 1 |
| 4 | 000010 | 1 |
| 5 | 000010 | 2 |
| 6 | 000010 | 3 |
| 7 | 000020 | 1 |
| 8 | 000020 | 2 |
| 9 | 000020 | 3 |
| 10 | 000030 | 1 |
| 11 | 000030 | 2 |
| 12 | 000030 | 3 |
| 13 | 000040 | 1 |
| 14 | 000040 | 2 |
| 15 | 000040 | 3 |
| | STATE 2 | |
| 0 | 000100 | 5 |
| 1 | 000003 | 0 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000000 | 6 |
| 13 | 000100 | 1 |
| 14 | 000100 | 2 |
| 15 | 000100 | 3 |
| | STATE 3 | |
| 0 | 000200 | 1 |
| 1 | 000200 | 2 |
| 2 | 000200 | 3 |
| 3 | 000200 | 4 |
| 4 | 000200 | 5 |
| 5 | 000300 | 1 |
| 6 | 000300 | 2 |
| 7 | 000300 | 3 |

-continued

| INPUT | OUTPUT | NEXT STATE |
|---|---|---|
| 8 | 000300 | 4 |
| 9 | 000300 | 5 |
| 10 | 000400 | 1 |
| 11 | 000400 | 2 |
| 12 | 000400 | 3 |
| 13 | 000400 | 4 |
| 14 | 000001 | 0 |
| 15 | 000001 | 1 |
| | STATE 4 | |
| 0 | 001000 | 17 |
| 1 | 001000 | 18 |
| 2 | 001000 | 19 |
| 3 | 001000 | 20 |
| 4 | 001000 | 21 |
| 5 | 001000 | 4 |
| 6 | 001000 | 5 |
| 7 | 001000 | 7 |
| 8 | 003000 | 17 |
| 9 | 003000 | 18 |
| 10 | 003000 | 19 |
| 11 | 003000 | 20 |
| 12 | 003000 | 21 |
| 13 | 003000 | 4 |
| 14 | 003000 | 5 |
| 15 | 003000 | 7 |
| | STATE 5 | |
| 0 | 000200 | 17 |
| 1 | 002000 | 18 |
| 2 | 002000 | 19 |
| 3 | 002000 | 20 |
| 4 | 002000 | 21 |
| 5 | 002000 | 4 |
| 6 | 002000 | 5 |
| 7 | 002000 | 7 |
| 8 | 004000 | 17 |
| 9 | 004000 | 18 |
| 10 | 004000 | 19 |
| 11 | 004000 | 20 |
| 12 | 004000 | 21 |
| 13 | 004000 | 4 |
| 14 | 004000 | 5 |
| 15 | 004000 | 7 |
| | STATE 6 | |
| 0 | 000100 | 5 |
| 1 | 000100 | 4 |
| 2 | 000200 | 1 |
| 3 | 000200 | 2 |
| 4 | 000200 | 3 |
| 5 | 000300 | 1 |
| 6 | 000300 | 2 |
| 7 | 000300 | 3 |
| 8 | 000300 | 4 |
| 9 | 000400 | 1 |
| 10 | 000400 | 2 |
| 11 | 000400 | 3 |
| 12 | 000400 | 4 |
| 13 | 000100 | 1 |
| 14 | 000100 | 2 |
| 15 | 000100 | 3 |
| | STATE 7 | |
| 0 | 000100 | 5 |
| 1 | 000100 | 4 |
| 2 | 000020 | 1 |
| 3 | 000020 | 2 |
| 4 | 000020 | 3 |
| 5 | 000300 | 1 |
| 6 | 000300 | 2 |
| 7 | 000300 | 3 |
| 8 | 000300 | 4 |
| 9 | 000300 | 5 |
| 10 | 000040 | 1 |
| 11 | 000040 | 2 |
| 12 | 000040 | 3 |
| 13 | 000100 | 1 |

-continued

| INPUT | OUTPUT | NEXT STATE |
|---|---|---|
| 14 | 000100 | 2 |
| 15 | 000100 | 3 |
| | STATE 8 | |
| 0 | 000010 | 1 |
| 1 | 000010 | 2 |
| 2 | 000200 | 1 |
| 3 | 000200 | 2 |
| 4 | 000200 | 3 |
| 5 | 000200 | 4 |
| 6 | 000200 | 5 |
| 7 | 000010 | 3 |
| 8 | 000030 | 1 |
| 9 | 000400 | 1 |
| 10 | 000400 | 2 |
| 11 | 000400 | 3 |
| 12 | 000400 | 4 |
| 13 | 000400 | 5 |
| 14 | 000030 | 2 |
| 15 | 000030 | 3 |
| | STATE 9 | |
| 0 | 400000 | 7 |
| 1 | 400000 | 8 |
| 2 | 400000 | 9 |
| 3 | 400000 | 10 |
| 4 | 400000 | 11 |
| 5 | 400000 | 12 |
| 6 | 400000 | 13 |
| 7 | 400000 | 14 |
| 8 | 400000 | 15 |
| 9 | 400000 | 16 |
| 10 | 400000 | 4 |
| 11 | 400000 | 5 |
| 12 | 200004 | 0 |
| 13 | 200004 | 1 |
| 14 | 300001 | 0 |
| 15 | 300001 | 1 |
| | STATE 10 | |
| 0 | 300000 | 7 |
| 1 | 300000 | 8 |
| 2 | 300000 | 9 |
| 3 | 300000 | 10 |
| 4 | 300000 | 11 |
| 5 | 300000 | 12 |
| 6 | 300000 | 13 |
| 7 | 300000 | 14 |
| 8 | 300000 | 15 |
| 9 | 300000 | 16 |
| 10 | 300000 | 4 |
| 11 | 300000 | 5 |
| 12 | 200003 | 0 |
| 13 | 200003 | 1 |
| 14 | 300002 | 0 |
| 15 | 300002 | 1 |
| | STATE 11 | |
| 0 | 200000 | 7 |
| 1 | 200000 | 8 |
| 2 | 200000 | 9 |
| 3 | 200000 | 10 |
| 4 | 200000 | 11 |
| 5 | 200000 | 12 |
| 6 | 200000 | 13 |
| 7 | 200000 | 14 |
| 8 | 200000 | 15 |
| 9 | 200000 | 16 |
| 10 | 200000 | 4 |
| 11 | 200000 | 5 |
| 12 | 200002 | 0 |
| 13 | 200002 | 1 |
| 14 | 300003 | 0 |
| 15 | 300003 | 1 |
| | STATE 12 | |
| 0 | 100000 | 7 |
| 1 | 100000 | 8 |

-continued

| INPUT | OUTPUT | NEXT STATE |
|---|---|---|
| 2 | 100000 | 9 |
| 3 | 100000 | 10 |
| 4 | 100000 | 11 |
| 5 | 100000 | 12 |
| 6 | 100000 | 13 |
| 7 | 100000 | 14 |
| 8 | 100000 | 15 |
| 9 | 100000 | 16 |
| 10 | 100000 | 4 |
| 11 | 100000 | 5 |
| 12 | 200001 | 0 |
| 13 | 200001 | 1 |
| 14 | 300004 | 0 |
| 15 | 300004 | 1 |
| | STATE 13 | |
| 0 | 040000 | 7 |
| 1 | 040000 | 8 |
| 2 | 040000 | 9 |
| 3 | 040000 | 10 |
| 4 | 040000 | 11 |
| 5 | 040000 | 12 |
| 6 | 040000 | 13 |
| 7 | 040000 | 14 |
| 8 | 040000 | 15 |
| 9 | 040000 | 16 |
| 10 | 040000 | 4 |
| 11 | 040000 | 5 |
| 12 | 100004 | 0 |
| 13 | 100004 | 1 |
| 14 | 400001 | 0 |
| 15 | 400001 | 1 |
| | STATE 14 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |
| 10 | 030000 | 4 |
| 11 | 030000 | 5 |
| 12 | 100001 | 0 |
| 13 | 100001 | 1 |
| 14 | 400002 | 0 |
| 15 | 400002 | 1 |
| | STATE 15 | |
| 0 | 020000 | 7 |
| 1 | 020000 | 8 |
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 100003 | 0 |
| 13 | 100003 | 1 |
| 14 | 400003 | 0 |
| 15 | 400003 | 1 |
| | STATE 16 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |

-continued

| INPUT | OUTPUT | NEXT STATE |
|---|---|---|
| 8 | 010000 | 15 |
| 9 | 010000 | 16 |
| 10 | 010000 | 4 |
| 11 | 010000 | 5 |
| 12 | 100002 | 0 |
| 13 | 100002 | 1 |
| 14 | 400004 | 0 |
| 15 | 400004 | 1 |
| | STATE 17 | |
| 0 | 000030 | 2 |
| 1 | 000030 | 3 |
| 2 | 000000 | 9 |
| 3 | 000000 | 10 |
| 4 | 000000 | 11 |
| 5 | 000000 | 12 |
| 6 | 000000 | 13 |
| 7 | 000000 | 14 |
| 8 | 000000 | 15 |
| 9 | 000000 | 16 |
| 10 | 000000 | 4 |
| 11 | 000000 | 5 |
| 12 | 000010 | 1 |
| 13 | 000010 | 2 |
| 14 | 000010 | 3 |
| 15 | 000030 | 1 |
| | STATE 18 | |
| 0 | 040000 | 7 |
| 1 | 040000 | 8 |
| 2 | 040000 | 9 |
| 3 | 040000 | 10 |
| 4 | 040000 | 11 |
| 5 | 040000 | 12 |
| 6 | 040000 | 13 |
| 7 | 040000 | 14 |
| 8 | 040000 | 15 |
| 9 | 040000 | 16 |
| 10 | 040000 | 4 |
| 11 | 040000 | 5 |
| 12 | 000003 | 0 |
| 13 | 000003 | 1 |
| 14 | 000001 | 0 |
| 15 | 000001 | 1 |
| | STATE 19 | |
| 0 | 030000 | 7 |
| 1 | 030000 | 8 |
| 2 | 030000 | 9 |
| 3 | 030000 | 10 |
| 4 | 030000 | 11 |
| 5 | 030000 | 12 |
| 6 | 030000 | 13 |
| 7 | 030000 | 14 |
| 8 | 030000 | 15 |
| 9 | 030000 | 16 |
| 10 | 030000 | 4 |
| 11 | 030000 | 5 |
| 12 | 000002 | 0 |
| 13 | 000002 | 1 |
| 14 | 000004 | 0 |
| 15 | 000004 | 1 |
| | STATE 20 | |
| 0 | 020000 | 7 |
| 1 | 020000 | 8 |
| 2 | 020000 | 9 |
| 3 | 020000 | 10 |
| 4 | 020000 | 11 |
| 5 | 020000 | 12 |
| 6 | 020000 | 13 |
| 7 | 020000 | 14 |
| 8 | 020000 | 15 |
| 9 | 020000 | 16 |
| 10 | 020000 | 4 |
| 11 | 020000 | 5 |
| 12 | 000200 | 1 |
| 13 | 000200 | 2 |

-continued

| INPUT | OUTPUT | NEXT STATE |
|---|---|---|
| 14 | 000200 | 3 |
| 15 | 000200 | 4 |
| | STATE 21 | |
| 0 | 010000 | 7 |
| 1 | 010000 | 8 |
| 2 | 010000 | 9 |
| 3 | 010000 | 10 |
| 4 | 010000 | 11 |
| 5 | 010000 | 12 |
| 6 | 010000 | 13 |
| 7 | 010000 | 14 |
| 8 | 010000 | 15 |
| 9 | 010000 | 16 |
| 10 | 010000 | 4 |
| 11 | 010000 | 5 |
| 12 | 000400 | 1 |
| 13 | 000400 | 2 |
| 14 | 000400 | 3 |
| 15 | 000400 | 4 |

wherein said code symbol set $y_i \ldots y_{i+5}$ is generated based on the input data bit set $x_i \ldots x_{i+3}$ and the current state of said 22-state encoder when said data bit set $x_i \ldots x_{i+3}$ is received;

generating in a waveform encoder waveform signal amplitudes based on said code symbols, wherein each said waveform signal amplitude is generated by modulo five addition of a current code symbol with a previous waveform signal amplitude; and modulating a write signal with said waveform signal amplitudes to write a series of features to the storage medium, each feature being at a level corresponding to a waveform signal amplitude.

5. The method according to claim 4, wherein said waveform signal amplitudes modulate a write laser and wherein said modulated write laser writes features onto the storage medium.

6. The method according to claim 4, further comprising the steps of:

reading the storage medium to recover output waveform signal amplitudes;

converting said output waveform signal amplitudes into output code symbols, wherein each output code symbol is at one of five levels; and decoding said output code symbols to obtain output data bits, wherein said output data bits correspond to the digital input data.

7. The method of claim 6, wherein said step of decoding comprises the steps of:

identifying with a sliding window a sequence of code symbols that represents a given code symbol set; and in a table comprising a number of entries corresponding to a number of possible unique sequences of code symbols, each entry identified by one of said possible unique sequences of code symbols, and wherein each entry identifies an output data bit set that is a decoded data bit set for the code symbol set represented by the sequence of code symbols that identifies that entry, looking up with said identified sequence of code symbols the output data bit for said given code symbol.

8. The method according to claim 7, wherein said lookup table provides an output bit set x' for each sequence of code symbols y' according to the following table:

| Sequence of Code Symbols | x' |
|---|---|
| xxxxxx000100002000 | 0000 |
| xxxxxx000110000000 | 0000 |
| xxxxxx000100001000 | 0001 |
| xxxxxx000100003000 | 0001 |
| 000000000020000002 | 0010 |
| 000000000020000004 | 0010 |
| 000000000020000010 | 0010 |
| 000000000020000020 | 0010 |
| 000000000020000030 | 0010 |
| 000000000020000040 | 0010 |
| 000000000020000100 | 0011 |
| 000000000020000003 | 0011 |
| 000000000020000000 | 0011 |
| 000000000020000200 | 0100 |
| 000000000020000300 | 0100 |
| 000000000020000400 | 0100 |
| 000000000020000001 | 0100 |
| xxxxxx000300000002 | 0101 |
| xxxxxx000300000004 | 0101 |
| xxxxxx000300000010 | 0101 |
| xxxxxx000300000020 | 0101 |
| xxxxxx000300000030 | 0101 |
| xxxxxx000300000040 | 0101 |
| xxxxxx000300000100 | 0110 |
| xxxxxx000300000003 | 0110 |
| xxxxxx000300000000 | 0110 |
| xxxxxx000300000200 | 0111 |
| xxxxxx000300000300 | 0111 |
| xxxxxx000300000400 | 0111 |
| xxxxxx000300000001 | 0111 |
| xxxxxx000300001000 | 1000 |
| xxxxxx000300003000 | 1000 |
| xxxxxx000300002000 | 1001 |
| xxxxxx000300004000 | 1001 |
| 000000000040000002 | 1010 |
| 000000000040000004 | 1010 |
| 000000000040000010 | 1010 |
| 000000000040000030 | 1010 |
| 000000000040000030 | 1010 |
| 000000000040000040 | 1010 |
| 000000000040000100 | 1011 |
| 000000000040000003 | 1011 |
| 000000000040000000 | 1011 |
| 000000000040000200 | 1100 |
| 000000000040000300 | 1100 |
| 000000000040000400 | 1100 |
| 000000000040000001 | 1100 |
| xxxxxx000100000000 | 1101 |
| xxxxxx000100000000 | 1101 |
| xxxxxx000100000000 | 1101 |
| xxxxxx000100000000 | 1101 |
| xxxxxx000100000000 | 1101 |
| xxxxxx000100000000 | 1101 |
| xxxxxx000100000000 | 1110 |
| xxxxxx000100000000 | 1110 |
| xxxxxx000100000000 | 1110 |
| xxxxxx000100000000 | 1111 |
| xxxxxx000100000000 | 1111 |
| xxxxxx000100000000 | 1111 |
| xxxxxx000100000000 | 1111 |
| xxxxxx000000000000 | 0000 |
| xxxxxx000000000000 | 0000 |
| xxxxxx000000000000 | 0000 |
| xxxxxx000000000000 | 0000 |
| xxxxxx000000000000 | 0000 |
| xxxxxx000000000000 | 0000 |
| xxxxxx000000000000 | 0000 |
| xxxxxx000000000000 | 0000 |
| xxxxxx000000000000 | 0000 |
| 000000000200000002 | 0010 |
| 000000000200000004 | 0010 |
| 000000000200000010 | 0010 |
| 000000000200000020 | 0010 |
| 000000000200000030 | 0010 |
| 000000000200000040 | 0010 |
| 000000000200000100 | 0011 |
| 000000000200000003 | 0011 |
| 000000000200000000 | 0011 |

-continued

| Sequence of Code Symbols | x' |
|---|---|
| 000000000200000200 | 0100 |
| 000000000200000300 | 0100 |
| 000000000200000400 | 0100 |
| 000000000200000001 | 0100 |
| 000000000200001000 | 0101 |
| 000000000200003000 | 0101 |
| 000000000200002000 | 0110 |
| 000000000200004000 | 0110 |
| xxxxxx000010000200 | 0111 |
| xxxxxx000010000300 | 0111 |
| xxxxxx000010000400 | 0111 |
| xxxxxx000010000001 | 0111 |
| xxxxxx000030000002 | 1000 |
| xxxxxx000030000004 | 1000 |
| xxxxxx000030000010 | 1000 |
| xxxxxx000030000020 | 1000 |
| xxxxxx000030000030 | 1000 |
| xxxxxx000030000040 | 1000 |
| 000000000400000002 | 1001 |
| 000000000400000004 | 1001 |
| 000000000400000010 | 1001 |
| 000000000400000020 | 1001 |
| 000000000400000030 | 1001 |
| 000000000400000040 | 1001 |
| 000000000400000100 | 1010 |
| 000000000400000003 | 1010 |
| 000000000400000000 | 1010 |
| 000000000400000200 | 1011 |
| 000000000400000300 | 1011 |
| 000000000400000400 | 1011 |
| 000000000400000001 | 1011 |
| 000000000400001000 | 1100 |
| 000000000400003000 | 1100 |
| 000000000400002000 | 1101 |
| 000000000400004000 | 1101 |
| 000000000030000100 | 1110 |
| 000000000030000003 | 1110 |
| 000000000030000000 | 1110 |
| 000000000030000200 | 1111 |
| 000000000030000300 | 1111 |
| 000000000030000400 | 1111 |
| 000000000030000001 | 1111 |
| xxxxx4000000000100 | 0000 |
| xxxxx4000000000020 | 0000 |
| xxxxx4000000000300 | 0000 |
| xxxxx4000000000040 | 0000 |
| xxxxx4000000000010 | 0001 |
| xxxxx4000000000200 | 0001 |
| xxxxx4000000000030 | 0001 |
| xxxxx4000000000400 | 0001 |
| xxxxx4000000000000 | 0010 |
| xxxxx4000000000004 | 0010 |
| xxxxx4000000000001 | 0010 |
| xxxxx4000000000000 | 0011 |
| xxxxx4000000000003 | 0011 |
| xxxxx4000000000002 | 0011 |
| xxxxx4000000000000 | 0100 |
| xxxxx4000000000002 | 0100 |
| xxxxx4000000000003 | 0100 |
| xxxxx4000000000000 | 0101 |
| xxxxxx400000200001 | 0101 |
| xxxxxx400000300004 | 0101 |
| xxxxxx400000040000 | 0110 |
| xxxxxx400000100004 | 0110 |
| xxxxxx400000400001 | 0110 |
| xxxxxx400000030000 | 0111 |
| xxxxxx400000100001 | 0111 |
| xxxxxx400000400002 | 0111 |
| xxxxxx400000020000 | 1000 |
| xxxxxx400000100003 | 1000 |
| xxxxxx400000400003 | 1000 |
| xxxxxx400000010000 | 1001 |
| xxxxxx400000100002 | 1001 |
| xxxxxx400000400004 | 1001 |
| xxxxxx400000001000 | 1010 |
| xxxxxx400000003000 | 1010 |
| xxxxxx400000002000 | 1011 |
| xxxxxx400000004000 | 1011 |

-continued

| Sequence of Code Symbols | x' |
|---|---|
| xxxxxx200004000000 | 1100 |
| xxxxxx200004000003 | 1100 |
| xxxxxx200004000001 | 1100 |
| xxxxxx200004000002 | 1101 |
| xxxxxx200004000004 | 1101 |
| xxxxxx200004000010 | 1101 |
| xxxxxx200004000020 | 1101 |
| xxxxxx200004000030 | 1101 |
| xxxxxx200004000040 | 1101 |
| xxxxxx300001000000 | 1110 |
| xxxxxx300001000003 | 1101 |
| xxxxxx300001000001 | 1110 |
| xxxxxx300001000002 | 1111 |
| xxxxxx300001000004 | 1111 |
| xxxxxx300001000010 | 1111 |
| xxxxxx300001000020 | 1111 |
| xxxxxx300001000030 | 1111 |
| xxxxxx300001000040 | 1111 |
| xxxxxx300000000100 | 0000 |
| xxxxxx300000000020 | 0000 |
| xxxxxx300000000300 | 0000 |
| xxxxxx300000000040 | 0000 |
| xxxxxx300000000010 | 0001 |
| xxxxxx300000000200 | 0001 |
| xxxxxx300000000030 | 0001 |
| xxxxxx300000000400 | 0001 |
| xxxxxx300000400000 | 0010 |
| xxxxxx300000200004 | 0010 |
| xxxxxx300000300001 | 0010 |
| xxxxxx300000300000 | 0011 |
| xxxxxx300000200003 | 0011 |
| xxxxxx300000300002 | 0011 |
| xxxxxx300000200000 | 0100 |
| xxxxxx300000200002 | 0100 |
| xxxxxx300000300003 | 0100 |
| xxxxxx300000100000 | 0101 |
| xxxxxx300000200001 | 0101 |
| xxxxxx300000300004 | 0101 |
| xxxxxx300000040000 | 0110 |
| xxxxxx300000100004 | 0110 |
| xxxxxx300000400001 | 0110 |
| xxxxxx300000030000 | 0111 |
| xxxxxx300000100001 | 0111 |
| xxxxxx300000400002 | 0111 |
| xxxxxx300000020000 | 1000 |
| xxxxxx300000100003 | 1000 |
| xxxxxx300000400003 | 1000 |
| xxxxxx300000010000 | 1001 |
| xxxxxx300000100002 | 1001 |
| xxxxxx300000400004 | 1001 |
| xxxxxx300000001000 | 1010 |
| xxxxxx300000003000 | 1010 |
| xxxxxx300000002000 | 1011 |
| xxxxxx300000004000 | 1011 |
| xxxxxx200000300000 | 1100 |
| xxxxxx200000300003 | 1100 |
| xxxxxx200000300001 | 1100 |
| xxxxxx200000300002 | 1101 |
| xxxxxx200000300004 | 1101 |
| xxxxxx200000300010 | 1101 |
| xxxxxx200000300020 | 1101 |
| xxxxxx200000300030 | 1101 |
| xxxxxx200000300040 | 1101 |
| xxxxxx300000200000 | 1110 |
| xxxxxx300000200003 | 1110 |
| xxxxxx300000200001 | 1110 |
| xxxxxx300000200002 | 1111 |
| xxxxxx300000200004 | 1111 |
| xxxxxx300000200010 | 1111 |
| xxxxxx300000200020 | 1111 |
| xxxxxx300000200030 | 1111 |
| xxxxxx300000200040 | 1111 |
| xxxxxx200000000100 | 0000 |
| xxxxxx200000000020 | 0000 |
| xxxxxx200000000300 | 0000 |
| xxxxxx200000000040 | 0000 |
| xxxxxx200000000010 | 0001 |
| xxxxxx200000000200 | 0001 |

-continued

| Sequence of Code Symbols | x' |
|---|---|
| xxxxxx200000000030 | 0001 |
| xxxxxx200000000400 | 0001 |
| xxxxxx200000400000 | 0010 |
| xxxxxx200000200004 | 0010 |
| xxxxxx200000300001 | 0010 |
| xxxxxx200000300000 | 0011 |
| xxxxxx200000200003 | 0011 |
| xxxxxx200000300002 | 0011 |
| xxxxxx200000200000 | 0100 |
| xxxxxx200000200002 | 0100 |
| xxxxxx200000300003 | 0100 |
| xxxxxx200000100000 | 0101 |
| xxxxxx200000200001 | 0101 |
| xxxxxx200000300004 | 0101 |
| xxxxxx200000040000 | 0110 |
| xxxxxx200000100004 | 0110 |
| xxxxxx200000400001 | 0110 |
| xxxxxx200000030000 | 0111 |
| xxxxxx200000100001 | 0111 |
| xxxxxx200000400002 | 0111 |
| xxxxxx200000020000 | 1000 |
| xxxxxx200000100003 | 1000 |
| xxxxxx200000400003 | 1000 |
| xxxxxx200000010000 | 1001 |
| xxxxxx200000100002 | 1001 |
| xxxxxx200000400004 | 1001 |
| xxxxxx200000001000 | 1010 |
| xxxxxx200000003000 | 1010 |
| xxxxxx200000002000 | 1011 |
| xxxxxx200000004000 | 1011 |
| xxxxxx200002000000 | 1100 |
| xxxxxx200002000003 | 1100 |
| xxxxxx200002000001 | 1100 |
| xxxxxx200002000002 | 1101 |
| xxxxxx200002000004 | 1101 |
| xxxxxx200002000010 | 1101 |
| xxxxxx200002000020 | 1101 |
| xxxxxx200002000030 | 1101 |
| xxxxxx200002000040 | 1101 |
| xxxxxx200003000000 | 1110 |
| xxxxxx200003000003 | 1110 |
| xxxxxx300003000001 | 1110 |
| xxxxxx300003000002 | 1111 |
| xxxxxx300003000004 | 1111 |
| xxxxxx000003000010 | 1111 |
| xxxxxx300003000020 | 1111 |
| xxxxxx300003000030 | 1111 |
| xxxxxx300003000040 | 1111 |
| xxxxxx100000000100 | 0000 |
| xxxxxx100000000020 | 0000 |
| xxxxxx100000000300 | 0000 |
| xxxxxx100000000040 | 0000 |
| xxxxxx100000000010 | 0001 |
| xxxxxx100000000200 | 0001 |
| xxxxxx100000000030 | 0001 |
| xxxxxx100000000400 | 0001 |
| xxxxxx100000400000 | 0010 |
| xxxxxx100000200004 | 0010 |
| xxxxxx100000300001 | 0010 |
| xxxxxx100000300000 | 0011 |
| xxxxxx100000200003 | 0011 |
| xxxxxx100000300002 | 0011 |
| xxxxxx100000200000 | 0100 |
| xxxxxx100000200002 | 0100 |
| xxxxxx100000300003 | 0100 |
| xxxxxx100000100000 | 0101 |
| xxxxxx100000200001 | 0101 |
| xxxxxx100000300004 | 0101 |
| xxxxxx100000040000 | 0110 |
| xxxxxx100000100004 | 0110 |
| xxxxxx100000400001 | 0110 |
| xxxxxx100000030000 | 0111 |
| xxxxxx100000100001 | 0111 |
| xxxxxx100000400002 | 0111 |
| xxxxxx100000200000 | 1000 |
| xxxxxx100000100003 | 1000 |
| xxxxxx100000400003 | 1000 |
| xxxxxx100000010000 | 1001 |

-continued

| Sequence of Code Symbols | x' |
|---|---|
| xxxxxx100000100002 | 1001 |
| xxxxxx100000400004 | 1001 |
| xxxxxx100000001000 | 1010 |
| xxxxxx100000003000 | 1010 |
| xxxxxx100000002000 | 1011 |
| xxxxxx100000004000 | 1011 |
| xxxxxx200001000000 | 1100 |
| xxxxxx200001000003 | 1100 |
| xxxxxx200001000001 | 1100 |
| xxxxxx200001000002 | 1101 |
| xxxxxx200001000004 | 1101 |
| xxxxxx200001000010 | 1101 |
| xxxxxx200001000020 | 1101 |
| xxxxxx200001000030 | 1101 |
| xxxxxx200001000040 | 1101 |
| xxxxxx300004000000 | 1110 |
| xxxxxx300004000003 | 1110 |
| xxxxxx300004000001 | 1110 |
| xxxxxx300004000002 | 1111 |
| xxxxxx300004000004 | 1111 |
| xxxxxx300004000010 | 1111 |
| xxxxxx300004000020 | 1111 |
| xxxxxx300004000030 | 1111 |
| xxxxxx300004000040 | 1111 |
| xxxxxx040000000100 | 0000 |
| xxxxxx040000000020 | 0000 |
| xxxxxx040000000300 | 0000 |
| xxxxxx040000000040 | 0000 |
| xxxxxx040000000010 | 0001 |
| xxxxxx040000000200 | 0001 |
| xxxxxx040000000030 | 0001 |
| xxxxxx040000000400 | 0001 |
| xxxxxx040000400000 | 0010 |
| xxxxx0400000200004 | 0010 |
| xxxxx0400000300001 | 0010 |
| xxxxx0400000300000 | 0011 |
| xxxxx0400000200003 | 0011 |
| xxxxx0400000300002 | 0011 |
| xxxxx0400000200000 | 0100 |
| xxxxx0400000200002 | 0100 |
| xxxxx0400000300003 | 0100 |
| xxxxx0400000100000 | 0101 |
| xxxxx0400000200001 | 0101 |
| xxxxx0400000300004 | 0101 |
| xxxxx0400000040000 | 0110 |
| xxxxx0400000100004 | 0110 |
| xxxxx0400000400001 | 0110 |
| xxxxx0400000030000 | 0111 |
| xxxxx0400000100001 | 0111 |
| xxxxx0400000400002 | 0111 |
| xxxxx0400000020000 | 1000 |
| xxxxx0400000100003 | 1000 |
| xxxxx0400000400003 | 1000 |
| xxxxx0400000010000 | 1001 |
| xxxxx0400000100002 | 1001 |
| xxxxx0400000400004 | 1001 |
| xxxxx0400000001000 | 1010 |
| xxxxx0400000003000 | 1010 |
| xxxxx0400000002000 | 1011 |
| xxxxx0400000004000 | 1011 |
| xxxxx1000004000000 | 1100 |
| xxxxx1000004000003 | 1100 |
| xxxxx1000004000001 | 1100 |
| xxxxx1000004000002 | 1101 |
| xxxxx1000004000004 | 1101 |
| xxxxx1000004000010 | 1101 |
| xxxxx1000004000020 | 1101 |
| xxxxx1000004000030 | 1101 |
| xxxxx1000004000040 | 1101 |
| xxxxx4000001000000 | 1110 |
| xxxxx4000001000003 | 1110 |
| xxxxx4000001000001 | 1110 |
| xxxxx4000001000002 | 1111 |
| xxxxx4000001000004 | 1111 |
| xxxxx4000001000010 | 1111 |
| xxxxx4000001000020 | 1111 |
| xxxxx4000001000030 | 1111 |
| xxxxx4000001000040 | 1111 |

-continued

| Sequence of Code Symbols | x' |
|---|---|
| xxxxx0300000000100 | 0000 |
| xxxxx0300000000020 | 0000 |
| xxxxx0300000000300 | 0000 |
| xxxxx0300000000040 | 0000 |
| xxxxx0300000000010 | 0001 |
| xxxxx0300000000200 | 0001 |
| xxxxx0300000000030 | 0001 |
| xxxxx0300000000400 | 0001 |
| xxxxx0300000400000 | 0010 |
| xxxxx0300000200004 | 0010 |
| xxxxx0300000300001 | 0010 |
| xxxxx0300000300000 | 0011 |
| xxxxx0300000200003 | 0011 |
| xxxxx0300000300002 | 0011 |
| xxxxx0300000200000 | 0100 |
| xxxxx0300000200002 | 0100 |
| xxxxx0300000300003 | 0100 |
| xxxxx0300000100000 | 0101 |
| xxxxx0300000200001 | 0101 |
| xxxxx0300000300004 | 0101 |
| xxxxx0300000040000 | 0110 |
| xxxxx0300000100004 | 0110 |
| xxxxx0300000400001 | 0110 |
| xxxxx0300000030000 | 0111 |
| xxxxxx030000100001 | 0111 |
| xxxxxx030000400002 | 0111 |
| xxxxxx030000020000 | 1000 |
| xxxxxx030000100003 | 1000 |
| xxxxxx030000400003 | 1000 |
| xxxxxx030000010000 | 1001 |
| xxxxxx030000100002 | 1001 |
| xxxxxx030000400004 | 1001 |
| xxxxxx030000001000 | 1010 |
| xxxxxx030000003000 | 1010 |
| xxxxxx030000002000 | 1011 |
| xxxxxx030000004000 | 1011 |
| xxxxxx100000100000 | 1100 |
| xxxxxx100000100003 | 1100 |
| xxxxxx100000100001 | 1100 |
| xxxxxx100000100002 | 1101 |
| xxxxxx100000100004 | 1101 |
| xxxxxx100000100010 | 1101 |
| xxxxxx100000100020 | 1101 |
| xxxxxx100000100030 | 1101 |
| xxxxxx100000100040 | 1101 |
| xxxxxx400000200000 | 1110 |
| xxxxxx400000200003 | 1110 |
| xxxxxx400000200001 | 1110 |
| xxxxxx400000200002 | 1111 |
| xxxxxx400000200004 | 1111 |
| xxxxxx400000200010 | 1111 |
| xxxxxx400000200020 | 1111 |
| xxxxxx400000200030 | 1111 |
| xxxxxx400000200040 | 1111 |
| xxxxxx020000000100 | 0000 |
| xxxxxx020000000020 | 0000 |
| xxxxxx020000000300 | 0000 |
| xxxxxx020000000040 | 0000 |
| xxxxxx020000000010 | 0001 |
| xxxxxx020000000200 | 0001 |
| xxxxxx020000000030 | 0001 |
| xxxxxx020000000400 | 0001 |
| xxxxxx020000400000 | 0010 |
| xxxxxx020000200004 | 0010 |
| xxxxxx020000300001 | 0010 |
| xxxxxx020000300000 | 0011 |
| xxxxxx020000200003 | 0011 |
| xxxxxx020000300002 | 0011 |
| xxxxxx020000200000 | 0100 |
| xxxxxx020000200002 | 0100 |
| xxxxxx020000300003 | 0100 |
| xxxxxx020000100000 | 0101 |
| xxxxxx020000200001 | 0101 |
| xxxxxx020000300004 | 0101 |
| xxxxxx020000040000 | 0110 |
| xxxxxx020000100004 | 0110 |
| xxxxxx020000400001 | 0110 |
| xxxxxx020000030000 | 0111 |

-continued

| Sequence of Code Symbols | x' |
|---|---|
| xxxxxx020000100001 | 0111 |
| xxxxxx020000400002 | 0111 |
| xxxxxx020000020000 | 1000 |
| xxxxxx020000100003 | 1000 |
| xxxxxx020000400003 | 1000 |
| xxxxxx020000010000 | 1001 |
| xxxxxx020000100002 | 1001 |
| xxxxxx020000400004 | 1001 |
| xxxxxx020000001000 | 1010 |
| xxxxxx020000003000 | 1010 |
| xxxxxx020000002000 | 1011 |
| xxxxxx020000004000 | 1011 |
| xxxxxx100003000000 | 1100 |
| xxxxxx100003000003 | 1100 |
| xxxxxx100003000001 | 1100 |
| xxxxx1000030000002 | 1101 |
| xxxxx1000030000004 | 1101 |
| xxxxx1000030000010 | 1101 |
| xxxxx1000030000020 | 1101 |
| xxxxx1000030000030 | 1101 |
| xxxxx1000030000040 | 1101 |
| xxxxx4000030000000 | 1110 |
| xxxxx4000030000003 | 1110 |
| xxxxx4000030000001 | 1110 |
| xxxxx4000030000002 | 1111 |
| xxxxx4000030000004 | 1111 |
| xxxxx4000030000010 | 1111 |
| xxxxx4000030000020 | 1111 |
| xxxxx4000030000030 | 1111 |
| xxxxx4000030000040 | 1111 |
| xxxxx0100000000100 | 0000 |
| xxxxx0100000000020 | 0000 |
| xxxxx0100000000300 | 0000 |
| xxxxx0100000000040 | 0000 |
| xxxxx0100000000010 | 0001 |
| xxxxx0100000000200 | 0001 |
| xxxxx0100000000030 | 0001 |
| xxxxx0100000000400 | 0001 |
| xxxxx0100000400000 | 0010 |
| xxxxx0100000200004 | 0010 |
| xxxxx0100000300001 | 0010 |
| xxxxx0100000300000 | 0011 |
| xxxxx0100000200003 | 0011 |
| xxxxx0100000300002 | 0011 |
| xxxxx0100000200000 | 0100 |
| xxxxx0100000200002 | 0100 |
| xxxxx0100000300003 | 0100 |
| xxxxx0100000100000 | 0101 |
| xxxxx0100000200001 | 0101 |
| xxxxx0100000300004 | 0101 |
| xxxxx0100000040000 | 0110 |
| xxxxx0100000100004 | 0110 |
| xxxxx0100000400001 | 0110 |
| xxxxx0100000030000 | 0111 |
| xxxxx0100000100001 | 0111 |
| xxxxx0100000400002 | 0111 |
| xxxxx0100000020000 | 1000 |
| xxxxx0100000100003 | 1000 |
| xxxxx0100000400003 | 1000 |
| xxxxx0100000010000 | 1001 |
| xxxxx0100000100002 | 1001 |
| xxxxx0100000400004 | 1001 |
| xxxxx0100000001000 | 1010 |
| xxxxx0100000003000 | 1010 |
| xxxxx0100000002000 | 1011 |
| xxxxx0100000004000 | 1011 |
| xxxxx1000020000000 | 1100 |
| xxxxx1000020000003 | 1100 |
| xxxxx1000020000001 | 1100 |
| xxxxx1000020000002 | 1101 |
| xxxxx1000020000000 | 1101 |
| xxxxx1000020000010 | 1101 |
| xxxxx1000020000020 | 1101 |
| xxxxx1000020000030 | 1101 |
| xxxxx1000020000040 | 1101 |
| xxxxx4000040000000 | 1110 |
| xxxxx4000040000003 | 1110 |
| xxxxx4000040000001 | 1110 |

-continued

| Sequence of Code Symbols | x' |
|---|---|
| xxxxx4000040000002 | 1111 |
| xxxxx4000040000004 | 1111 |
| xxxxx4000040000010 | 1111 |
| xxxxx4000040000020 | 1111 |
| xxxxx4000040000030 | 1111 |
| xxxxx4000040000040 | 1111 |
| xxxxxx001000000030 | 0000 |
| xxxxxx001000000000 | 0000 |
| xxxxxx001000000010 | 0000 |
| xxxxxx001000040000 | 0001 |
| xxxxxx001000000003 | 0001 |
| xxxxxx001000000001 | 0001 |
| xxxxxx001000030000 | 0010 |
| xxxxxx001000000002 | 0010 |
| xxxxxx001000000004 | 0010 |
| xxxxxx001000020000 | 0011 |
| xxxxxx001000000200 | 0011 |
| xxxxxx001000010000 | 0100 |
| xxxxxx001000000400 | 0100 |
| xxxxxx001000001000 | 0101 |
| xxxxxx001000003000 | 0101 |
| xxxxxx001000002000 | 0110 |
| xxxxxx001000004000 | 0110 |
| xxxxxx001000000100 | 0111 |
| xxxxxx001000000020 | 0111 |
| xxxxxx001000000300 | 0111 |
| xxxxxx001000000040 | 0111 |
| xxxxxx003000000030 | 1000 |
| xxxxxx003000000000 | 1000 |
| xxxxxx003000000010 | 1000 |
| xxxxxx003000040000 | 1001 |
| xxxxxx003000000003 | 1001 |
| xxxxxx003000000001 | 1001 |
| xxxxxx003000030000 | 1010 |
| xxxxxx003000000002 | 1010 |
| xxxxxx003000000004 | 1010 |
| xxxxxx003000020000 | 1011 |
| xxxxxx003000000200 | 1011 |
| xxxxxx003000010000 | 1100 |
| xxxxxx003000000400 | 1100 |
| xxxxxx003000001000 | 1101 |
| xxxxxx003000003000 | 1101 |
| xxxxxx003000002000 | 1110 |
| xxxxxx003000004000 | 1110 |
| xxxxxx003000000100 | 1111 |
| xxxxxx003000000020 | 1111 |
| xxxxxx003000000300 | 1111 |
| xxxxxx003000000040 | 1111 |
| xxxxxx002000000030 | 0000 |
| xxxxxx002000000000 | 0000 |
| xxxxxx002000000010 | 0000 |
| xxxxxx002000040000 | 0001 |
| xxxxxx002000000003 | 0001 |
| xxxxxx002000000001 | 0001 |
| xxxxxx002000030000 | 0010 |
| xxxxxx002000000002 | 0010 |
| xxxxxx002000000004 | 0010 |
| xxxxxx002000020000 | 0011 |
| xxxxxx002000000200 | 0011 |
| xxxxxx002000010000 | 0100 |
| xxxxxx002000000400 | 0100 |
| xxxxxx002000001000 | 0101 |
| xxxxxx002000003000 | 0101 |
| xxxxxx002000002000 | 0110 |
| xxxxxx002000004000 | 0110 |
| xxxxxx002000000100 | 0111 |
| xxxxxx002000000020 | 0111 |
| xxxxxx002000000300 | 0111 |
| xxxxxx002000000040 | 0111 |
| xxxxxx004000000030 | 1000 |
| xxxxxx004000000000 | 1000 |
| xxxxxx004000000010 | 1000 |
| xxxxxx004000040000 | 1001 |
| xxxxxx004000000003 | 1001 |
| xxxxxx004000000001 | 1001 |
| xxxxxx004000030000 | 1010 |
| xxxxxx004000000002 | 1010 |
| xxxxxx004000000004 | 1010 |

-continued

| Sequence of Code Symbols | x' |
|---|---|
| xxxxxx004000020000 | 1011 |
| xxxxxx004000000200 | 1011 |
| xxxxxx004000010000 | 1100 |
| xxxxxx004000000400 | 1100 |
| xxxxxx004000001000 | 1101 |
| xxxxxx004000003000 | 1101 |
| xxxxxx004000002000 | 1110 |
| xxxxxx004000004000 | 1110 |
| xxxxxx004000000100 | 1111 |
| xxxxxx004000000020 | 1111 |
| xxxxxx004000000300 | 1111 |
| xxxxxx004000000040 | 1111 |
| xxxxxx000000000100 | 0000 |
| xxxxxx000000000020 | 0000 |
| xxxxxx000000000300 | 0000 |
| xxxxxx000000000040 | 0000 |
| xxxxxx000000000010 | 0001 |
| xxxxxx000000000200 | 0001 |
| xxxxxx000000000030 | 0001 |
| xxxxxx000000000400 | 0001 |
| xxxxxx000000400000 | 0010 |
| xxxxxx000000200004 | 0010 |
| xxxxxx000000300001 | 0010 |
| xxxxxx000000300000 | 0011 |
| xxxxxx000000200003 | 0011 |
| xxxxxx000000300002 | 0011 |
| xxxxxx000000200000 | 0100 |
| xxxxxx000000200002 | 0100 |
| xxxxxx000000300003 | 0100 |
| xxxxxx000000100000 | 0101 |
| xxxxxx000000200001 | 0101 |
| xxxxxx000000300004 | 0101 |
| xxxxxx000000040000 | 0110 |
| xxxxxx000000100004 | 0110 |
| xxxxxx000000400001 | 0110 |
| xxxxxx000000030000 | 0111 |
| xxxxxx000000100001 | 0111 |
| xxxxxx000000400002 | 0111 |
| xxxxxx000000200000 | 1000 |
| xxxxxx000000100003 | 1000 |
| xxxxxx000000400003 | 1000 |
| xxxxxx000000010000 | 1001 |
| xxxxxx000000100002 | 1001 |
| xxxxxx000000400004 | 1001 |
| xxxxxx000000001000 | 1010 |
| xxxxxx000000003000 | 1010 |
| xxxxxx000000002000 | 1011 |
| xxxxxx000000004000 | 1011 |
| 000003000003000000 | 1100 |
| 000003000003000003 | 1100 |
| 000003000003000001 | 1100 |
| 000003000003000002 | 1101 |
| 000003000003000004 | 1101 |
| 000003000003000010 | 1101 |
| 000003000003000020 | 1101 |
| 000003000003000030 | 1101 |
| 000003000003000040 | 1101 |
| xxxxxx000001000000 | 1110 |
| xxxxxx000001000003 | 1110 |
| xxxxxx000001000001 | 1110 |
| xxxxxx000001000002 | 1111 |
| xxxxxx000001000004 | 1111 |
| xxxxxx000001000010 | 1111 |
| xxxxxx000001000020 | 1111 |
| xxxxxx000001000030 | 1111 |
| xxxxxx000001000040 | 1111 |
| 000003000002000000 | 0000 |
| 000003000002000003 | 0000 |
| 000003000002000001 | 0000 |
| 000003000002000002 | 0001 |
| 000003000002000004 | 0001 |
| 000003000002000010 | 0001 |
| 000003000002000020 | 0001 |
| 000003000002000030 | 0001 |
| 000003000002000040 | 0001 |
| 000003000004000000 | 0010 |
| 000003000004000003 | 0010 |
| 000003000004000001 | 0010 |

-continued

| Sequence of Code Symbols | x' |
|---|---|
| 000003000004000002 | 0011 |
| 000003000004000004 | 0011 |
| 000003000004000010 | 0011 |
| 000003000004000020 | 0011 |
| 000003000004000030 | 0011 |
| 000003000004000040 | 0011 |
| 000003000020000002 | 0111 |
| 000003000020000004 | 0111 |
| 000003000020000010 | 0111 |
| 000003000020000020 | 0111 |
| 000003000020000030 | 0111 |
| 000003000020000040 | 0111 |
| 000003000020000100 | 1000 |
| 000003000020000003 | 1000 |
| 000003000020000000 | 1000 |
| 000003000020000200 | 1001 |
| 000003000020000300 | 1001 |
| 000003000020000400 | 1001 |
| 000003000020000001 | 1001 |
| 000003000030000100 | 1011 |
| 000003000030000003 | 1011 |
| 000003000030000000 | 1011 |
| 000003000030000200 | 1100 |
| 000003000030000300 | 1100 |
| 000003000030000400 | 1100 |
| 000003000030000001 | 1100 |
| 000003000040000002 | 1101 |
| 000003000040000004 | 1101 |
| 000003000040000010 | 1101 |
| 000003000040000020 | 1101 |
| 000003000040000030 | 1101 |
| 000003000040000040 | 1101 |
| 000003000040000100 | 1110 |
| 000003000040000003 | 1110 |
| 000003000040000000 | 1110 |
| 000003000040000200 | 1111 |
| 000003000040000300 | 1111 |
| 000003000040000400 | 1111 |
| 000003000040000001 | 1111 |
| 000001000003000000 | 1100 |
| 000001000003000003 | 1100 |
| 000001000003000001 | 1100 |
| 000001000003000002 | 1101 |
| 000001000003000004 | 1101 |
| 000001000003000010 | 1101 |
| 000001000003000020 | 1101 |
| 000001000003000030 | 1101 |
| 000001000003000040 | 1101 |
| 000001000002000000 | 0000 |
| 000001000002000003 | 0000 |
| 000001000002000001 | 0000 |
| 000001000002000002 | 0001 |
| 000001000002000004 | 0001 |
| 000001000002000010 | 0001 |
| 000001000002000020 | 0001 |
| 000001000002000030 | 0001 |
| 000001000002000040 | 0001 |
| 000001000004000000 | 0010 |
| 000001000004000003 | 0010 |
| 000001000004000001 | 0010 |
| 000001000004000002 | 0011 |
| 000001000004000004 | 0011 |
| 000001000004000010 | 0011 |
| 000001000004000020 | 0011 |
| 000001000004000030 | 0011 |
| 000001000004000040 | 0011 |
| 000001000002000002 | 0111 |
| 000001000002000004 | 0111 |
| 000001000002000010 | 0111 |
| 000001000002000020 | 0111 |
| 000001000002000030 | 0111 |
| 000001000002000040 | 0111 |
| 000001000002000100 | 1000 |
| 000001000002000003 | 1000 |
| 000001000002000000 | 1000 |
| 000001000002000200 | 1001 |
| 000001000002000300 | 1001 |
| 000001000002000400 | 1001 |

-continued

| Sequence of Code Symbols | x' |
|---|---|
| 000001000002000001 | 1001 |
| 000001000003000100 | 1011 |
| 000001000003000003 | 1011 |
| 000001000003000000 | 1011 |
| 000001000003000200 | 1100 |
| 000001000003000300 | 1100 |
| 000001000003000400 | 1100 |
| 000001000003000001 | 1100 |
| 000001000004000002 | 1101 |
| 000001000004000004 | 1101 |
| 000001000004000010 | 1101 |
| 000001000004000020 | 1101 |
| 000001000004000030 | 1101 |
| 000001000004000040 | 1101 |
| 000001000004000100 | 1110 |
| 000001000004000003 | 1110 |
| 000001000004000000 | 1110 |
| 000001000004000200 | 1111 |
| 000001000004000300 | 1111 |
| 000001000004000400 | 1111 |
| 000001000004000001 | 1111 |
| 000002000003000000 | 1100 |
| 000002000003000003 | 1100 |
| 000002000003000001 | 1100 |
| 000002000003000002 | 1101 |
| 000002000003000004 | 1101 |
| 000002000003000010 | 1101 |
| 000002000003000020 | 1101 |
| 000002000003000030 | 1101 |
| 000002000003000040 | 1101 |
| 000002000002000000 | 0000 |
| 000002000002000003 | 0000 |
| 000002000002000001 | 0000 |
| 000002000002000002 | 0001 |
| 000002000002000004 | 0001 |
| 000002000002000010 | 0001 |
| 000002000002000020 | 0001 |
| 000002000002000030 | 0001 |
| 000002000002000040 | 0001 |
| 000002000004000000 | 0010 |
| 000002000004000003 | 0010 |
| 000002000004000001 | 0010 |
| 000002000004000002 | 0011 |
| 000002000004000004 | 0011 |
| 000002000004000010 | 0011 |
| 000002000004000020 | 0011 |
| 000002000004000030 | 0011 |
| 000002000004000040 | 0011 |
| 0000020000020000002 | 0111 |
| 000002000020000004 | 0111 |
| 000002000020000010 | 0111 |
| 000002000020000020 | 0111 |
| 000002000020000030 | 0111 |
| 000002000020000040 | 0111 |
| 000002000020000100 | 1000 |
| 000002000020000003 | 1000 |
| 000002000020000000 | 1000 |
| 000002000020000200 | 1001 |
| 000002000020000300 | 1001 |
| 000002000020000400 | 1001 |
| 000002000020000001 | 1001 |
| 000002000030000100 | 1011 |
| 000002000030000003 | 1011 |
| 000002000030000000 | 1011 |
| 000002000030000200 | 1100 |
| 000002000030000300 | 1100 |
| 000002000030000400 | 1100 |
| 000002000030000001 | 1100 |
| 000002000030000002 | 1101 |
| 000002000030000004 | 1101 |
| 000002000030000010 | 1101 |
| 000002000030000020 | 1101 |
| 000002000030000030 | 1101 |
| 000002000030000040 | 1101 |
| 000002000030000100 | 1110 |
| 000002000030000003 | 1110 |
| 000002000030000000 | 1110 |
| 000002000030000200 | 1111 |

-continued

| Sequence of Code Symbols | x' |
|---|---|
| 000002000030000300 | 1111 |
| 000002000030000400 | 1111 |
| 000002000030000001 | 1111 |
| 000004000003000000 | 1100 |
| 000004000003000003 | 1100 |
| 000004000003000001 | 1100 |
| 000004000003000002 | 1101 |
| 000004000003000004 | 1101 |
| 000004000003000010 | 1101 |
| 000004000003000020 | 1101 |
| 000004000003000030 | 1101 |
| 000004000003000040 | 1101 |
| 0000040000020000000 | 0000 |
| 000004000002000003 | 0000 |
| 000004000002000001 | 0000 |
| 000004000002000002 | 0001 |
| 000004000002000004 | 0001 |
| 000004000002000010 | 0001 |
| 000004000002000020 | 0001 |
| 000004000002000030 | 0001 |
| 000004000002000040 | 0001 |
| 000004000004000000 | 0010 |
| 000004000004000003 | 0010 |
| 000004000004000001 | 0010 |
| 000004000004000002 | 0011 |
| 000004000004000004 | 0011 |
| 000004000004000010 | 0011 |
| 000004000004000020 | 0011 |
| 000004000004000030 | 0011 |
| 000004000004000040 | 0011 |
| 000004000020000002 | 0111 |
| 000004000020000004 | 0111 |
| 000004000020000010 | 0111 |
| 000004000020000020 | 0111 |
| 000004000020000030 | 0111 |
| 000004000020000040 | 0111 |
| 000004000020000100 | 1000 |
| 000004000020000003 | 1000 |
| 000004000020000000 | 1000 |
| 000004000020000200 | 1001 |
| 000004000020000300 | 1001 |
| 000004000020000400 | 1001 |
| 000004000020000001 | 1001 |
| 000004000030000100 | 1011 |
| 000004000030000003 | 1011 |
| 000004000030000000 | 1011 |
| 000004000030000200 | 1100 |
| 000004000030000300 | 1100 |
| 000004000030000400 | 1100 |
| 000004000030000001 | 1100 |
| 000004000040000002 | 1101 |
| 000004000040000004 | 1101 |
| 000004000040000010 | 1101 |
| 000004000040000020 | 1101 |
| 000004000040000030 | 1101 |
| 000004000040000040 | 1101 |
| 000004000040000100 | 1110 |
| 000004000040000003 | 1110 |
| 000004000040000000 | 1110 |
| 000004000040000200 | 1111 |
| 000004000040000300 | 1111 |
| 000004000040000400 | 1111 |
| 000004000040000001 | 1111 |
| 000010000002000000 | 0000 |
| 000010000002000003 | 0000 |
| 000010000002000001 | 0000 |
| 000010000002000002 | 0001 |
| 000010000002000004 | 0001 |
| 000010000002000010 | 0001 |
| 000010000002000020 | 0001 |
| 000010000002000030 | 0001 |
| 000010000002000040 | 0001 |
| 000010000004000000 | 0010 |
| 000010000004000003 | 0010 |
| 000010000004000001 | 0010 |
| 000010000004000002 | 0011 |
| 000010000004000004 | 0011 |
| 000010000004000010 | 0011 |

-continued

| Sequence of Code Symbols | x' |
|---|---|
| 000010000004000020 | 0011 |
| 000010000004000030 | 0011 |
| 000010000004000040 | 0011 |
| 000010000020000002 | 0111 |
| 000010000020000004 | 0111 |
| 000010000020000010 | 0111 |
| 000010000020000020 | 0111 |
| 000010000020000030 | 0111 |
| 000010000020000040 | 0111 |
| 000010000020000100 | 1000 |
| 000010000020000003 | 1000 |
| 000010000020000000 | 1000 |
| 000010000020000200 | 1001 |
| 000010000020000300 | 1001 |
| 000010000020000400 | 1001 |
| 000010000020000001 | 1001 |
| 000010000030000100 | 1011 |
| 000010000030000003 | 1011 |
| 000010000030000000 | 1011 |
| 000010000030000200 | 1100 |
| 000010000030000300 | 1100 |
| 000010000030000400 | 1100 |
| 000010000030000001 | 1100 |
| 000010000040000002 | 1101 |
| 000010000040000004 | 1101 |
| 000010000040000010 | 1101 |
| 000010000040000020 | 1101 |
| 000010000040000030 | 1101 |
| 000010000040000040 | 1101 |
| 000010000040000100 | 1110 |
| 000010000040000003 | 1110 |
| 000010000040000000 | 1110 |
| 000010000040000200 | 1111 |
| 000010000040000300 | 1111 |
| 000010000040000400 | 1111 |
| 000010000003000001 | 1111 |
| 000010000003000000 | 0001 |
| 000010000003000003 | 0001 |
| 000010000003000001 | 0001 |
| 000010000200000002 | 0000 |
| 000010000200000004 | 0000 |
| 000010000200000010 | 0000 |
| 000010000200000020 | 0000 |
| 000010000200000030 | 0000 |
| 000010000200000040 | 0000 |
| 000010000200000100 | 0001 |
| 000010000200000003 | 0001 |
| 000010000200000000 | 0001 |
| 000010000200000200 | 0010 |
| 000010000200000300 | 0010 |
| 000010000200000400 | 0010 |
| 000010000200000001 | 0010 |
| 000010000200001000 | 0011 |
| 000010000200003000 | 0011 |
| 000010000200002000 | 0100 |
| 000010000200004000 | 0100 |
| 000010000400000002 | 1010 |
| 000010000400000004 | 1010 |
| 000010000400000010 | 1010 |
| 000010000400000020 | 1010 |
| 000010000400000030 | 1010 |
| 000010000400000040 | 1010 |
| 000010000400000100 | 1011 |
| 000010000400000003 | 1011 |
| 000010000400000000 | 1011 |
| 000010000400000200 | 1100 |
| 000010000400000300 | 1100 |
| 000010000400000400 | 1100 |
| 000010000400000001 | 1100 |
| 000010000400001000 | 1101 |
| 000010000400003000 | 1101 |
| 000010000002000000 | 0000 |
| 000010000002000003 | 0000 |
| 000010000002000001 | 0000 |
| 000010000002000002 | 0001 |
| 000010000002000004 | 0001 |
| 000010000002000010 | 0001 |
| 000010000002000020 | 0001 |

| Sequence of Code Symbols | x' |
|---|---|
| 000010000002000030 | 0001 |
| 000010000002000040 | 0001 |
| 000010000004000000 | 0010 |
| 000010000004000003 | 0010 |
| 000010000004000001 | 0010 |
| 000010000004000002 | 0011 |
| 000010000004000004 | 0011 |
| 000010000004000010 | 0011 |
| 000010000004000020 | 0011 |
| 000010000004000030 | 0011 |
| 000010000004000040 | 0011 |
| 000010000020000002 | 0111 |
| 000010000020000004 | 0111 |
| 000010000020000010 | 0111 |
| 000010000020000020 | 0111 |
| 000010000020000030 | 0111 |
| 000010000020000040 | 0111 |
| 000010000020000100 | 1000 |
| 000010000020000003 | 1000 |
| 000010000020000000 | 1000 |
| 000010000020000200 | 1101 |
| 000020000020000300 | 1001 |
| 000020000020000400 | 1001 |
| 000020000020000001 | 1001 |
| 000020000030000100 | 1011 |
| 000020000030000003 | 1011 |
| 000020000030000000 | 1011 |
| 000020000030000200 | 1100 |
| 000020000030000300 | 1100 |
| 000020000030000400 | 1100 |
| 000020000030000001 | 1100 |
| 000020000040000002 | 1101 |
| 000020000040000004 | 1101 |
| 000020000040000010 | 1101 |
| 000020000040000020 | 1101 |
| 000020000040000030 | 1101 |
| 000020000040000040 | 1101 |
| 000020000040000100 | 1110 |
| 000020000040000003 | 1110 |
| 000020000040000000 | 1110 |
| 000020000040000200 | 1111 |
| 000020000040000300 | 1111 |
| 000020000040000400 | 1111 |
| 000020000040000001 | 1111 |
| 000020000003000000 | 0001 |
| 000020000003000003 | 0001 |
| 000020000003000001 | 0001 |
| 000020000020000002 | 0000 |
| 000020000020000004 | 0000 |
| 000020000020000010 | 0000 |
| 000020000020000020 | 0000 |
| 000020000020000030 | 0000 |
| 000020000020000040 | 0000 |
| 000020000020000100 | 0001 |
| 000020000020000003 | 0001 |
| 000020000020000000 | 0001 |
| 000020000020000200 | 0010 |
| 000020000020000300 | 0010 |
| 000020000020000400 | 0010 |
| 000020000020000001 | 0010 |
| 000020000020001000 | 0011 |
| 000020000020003000 | 0011 |
| 000020000020002000 | 0100 |
| 000020000020004000 | 0100 |
| 000020000040000002 | 1010 |
| 000020000040000004 | 1010 |
| 000020000040000010 | 1010 |
| 000020000040000020 | 1010 |
| 000020000040000030 | 1010 |
| 000020000040000040 | 1010 |
| 000020000040000100 | 1011 |
| 000020000040000003 | 1011 |
| 000020000040000000 | 1011 |
| 000020000040000200 | 1100 |
| 000020000040000300 | 1100 |
| 000020000040000400 | 1100 |
| 000020000040000001 | 1100 |
| 000020000040001000 | 1101 |

| Sequence of Code Symbols | x' |
|---|---|
| 000020000040003000 | 1101 |
| 000030000002000000 | 0000 |
| 000030000002000003 | 0000 |
| 000030000002000001 | 0000 |
| 000030000002000002 | 0001 |
| 000030000002000004 | 0001 |
| 000030000002000010 | 0001 |
| 000030000002000020 | 0001 |
| 000030000002000030 | 0001 |
| 000030000002000040 | 0001 |
| 000030000004000000 | 0010 |
| 000030000004000003 | 0010 |
| 000030000004000001 | 0010 |
| 000030000004000002 | 0011 |
| 000030000004000004 | 0011 |
| 000030000004000004 | 0011 |
| 000030000004000010 | 0011 |
| 000030000004000020 | 0011 |
| 000030000004000030 | 0011 |
| 000030000004000040 | 0011 |
| 000030000020000002 | 0111 |
| 000030000020000004 | 0111 |
| 000030000020000010 | 0111 |
| 000030000020000020 | 0111 |
| 000030000020000030 | 0111 |
| 000030000020000040 | 0111 |
| 000030000020000100 | 1000 |
| 000030000020000003 | 1000 |
| 000030000020000000 | 1000 |
| 000030000020000200 | 1001 |
| 000030000020000300 | 1001 |
| 000030000020000400 | 1001 |
| 000030000020000001 | 1001 |
| 000030000030000100 | 1011 |
| 000030000030000003 | 1011 |
| 000030000030000000 | 1011 |
| 000030000030000200 | 1100 |
| 000030000030000300 | 1100 |
| 000030000030000400 | 1100 |
| 000030000030000001 | 1100 |
| 000030000040000002 | 1101 |
| 000030000040000004 | 1101 |
| 000030000040000010 | 1101 |
| 000030000040000020 | 1101 |
| 000030000040000030 | 1101 |
| 000030000040000040 | 1101 |
| 000030000040000100 | 1110 |
| 000030000040000003 | 1110 |
| 000030000040000000 | 1110 |
| 000030000040000200 | 1111 |
| 000030000040000300 | 1111 |
| 000030000040000400 | 1111 |
| 000030000040000001 | 1111 |
| 000030000003000000 | 0001 |
| 000030000003000003 | 0001 |
| 000030000003000001 | 0001 |
| 000030000200000002 | 0000 |
| 000030000200000004 | 0000 |
| 000030000200000010 | 0000 |
| 000030000200000020 | 0000 |
| 000030000200000030 | 0000 |
| 000030000200000040 | 0000 |
| 000030000200000100 | 0001 |
| 000030000200000003 | 0001 |
| 000030000200000000 | 0001 |
| 000030000200000200 | 0010 |
| 000030000200000300 | 0010 |
| 000030000200000400 | 0010 |
| 000030000200000001 | 0010 |
| 000030000200001000 | 0011 |
| 000030000200003000 | 0011 |
| 000030000200002000 | 0100 |
| 000030000200004000 | 0100 |
| 000030000400000002 | 1010 |
| 000030000400000004 | 1010 |
| 000030000400000010 | 1010 |
| 000030000400000020 | 1010 |
| 000030000400000030 | 1010 |

-continued

| Sequence of Code Symbols | x' |
|---|---|
| 000030000400000040 | 1010 |
| 000030000400000100 | 1011 |
| 000030000400000003 | 1011 |
| 000030000400000000 | 1011 |
| 000040000200000200 | 0010 |
| 000040000200000300 | 0010 |
| 000040000200000400 | 0010 |
| 000040000200000001 | 0010 |
| 000040000200001000 | 0011 |
| 000040000200003000 | 0011 |
| 000040000200002000 | 0100 |
| 000040000200004000 | 0100 |
| 000040000400000002 | 1010 |
| 000040000400000004 | 1010 |
| 000040000400000010 | 1010 |
| 000040000400000020 | 1010 |
| 000040000400000030 | 1010 |
| 000040000400000040 | 1010 |
| 000040000400000100 | 1011 |
| 000040000400000003 | 1011 |
| 000040000400000000 | 1011 |
| 000040000400000200 | 1100 |
| 000040000400000300 | 1100 |
| 000040000400000400 | 1100 |
| 000040000400000001 | 1100 |
| 000040000400001000 | 1101 |
| 000040000400003000 | 1101 |
| 000003000030000000 | 1100 |
| 000003000030000003 | 1100 |
| 000003000030000001 | 1100 |
| 000003000030000002 | 1101 |
| 000003000030000004 | 1101 |
| 000003000030000010 | 1101 |
| 000003000030000020 | 1101 |
| 000003000030000030 | 1101 |
| 000003000030000040 | 1101 |
| 000000002000000002 | 0010 |
| 000000002000000004 | 0010 |
| 000000002000000010 | 0010 |
| 000000002000000020 | 0010 |
| 000000002000000030 | 0010 |
| 000000002000000040 | 0010 |
| 000000002000000100 | 0011 |
| 000000002000000003 | 0011 |
| 000000002000000000 | 0011 |
| 000000002000000200 | 0100 |
| 000000002000000300 | 0100 |
| 000000002000000400 | 0100 |
| 000000002000000001 | 0100 |
| 000000004000000002 | 1001 |
| 000000004000000004 | 1001 |
| 000000004000000010 | 1001 |
| 000000004000000020 | 1001 |
| 000000004000000030 | 1001 |
| 000000004000000040 | 1001 |
| 000000004000000100 | 1010 |
| 000000004000000003 | 1010 |
| 000000004000000000 | 1010 |
| 000000004000000200 | 1011 |
| 000000004000000300 | 1011 |
| 000000004000000400 | 1011 |
| 000000004000000001 | 1011 |
| 000000004000001000 | 1100 |
| 000000004000003000 | 1100 |
| 000100000002000000 | 0000 |
| 000100000002000003 | 0000 |
| 000100000002000001 | 0000 |
| 000100000002000002 | 0001 |
| 000100000002000004 | 0001 |
| 000100000002000010 | 0001 |
| 000100000002000020 | 0001 |
| 000100000002000030 | 0001 |
| 000100000002000040 | 0001 |
| 000100000004000000 | 0010 |
| 000100000004000003 | 0010 |
| 000100000004000001 | 0010 |
| 000100000004000002 | 0011 |
| 000100000004000004 | 0011 |

-continued

| Sequence of Code Symbols | x' |
|---|---|
| 000100000004000010 | 0011 |
| 000100000004000020 | 0011 |
| 000100000004000030 | 0011 |
| 000100000004000040 | 0011 |
| 000100000020000002 | 0111 |
| 000100000020000004 | 0111 |
| 000100000020000010 | 0111 |
| 000100000020000020 | 0111 |
| 000100000020000030 | 0111 |
| 000100000020000040 | 0111 |
| 000100000020000100 | 1000 |
| 000100000020000003 | 1000 |
| 000100000020000000 | 1000 |
| 000100000020000200 | 1001 |
| 000100000020000300 | 1001 |
| 000100000020000400 | 1001 |
| 000100000020000001 | 1001 |
| 000100000030000100 | 1011 |
| 000100000030000003 | 1011 |
| 000100000030000000 | 1011 |
| 000100000030000200 | 1100 |
| 000100000030000300 | 1100 |
| 000100000030000400 | 1100 |
| 000100000030000001 | 1100 |
| 000100000040000002 | 1101 |
| 000100000040000004 | 1101 |
| 000100000040000010 | 1101 |
| 000100000040000020 | 1101 |
| 000100000040000030 | 1101 |
| 000100000040000040 | 1101 |
| 000100000040000100 | 1110 |
| 000100000040000003 | 1110 |
| 000100000040000000 | 1110 |
| 000100000040000200 | 1111 |
| 000100000040000300 | 1111 |
| 000100000040000400 | 1111 |
| 000100000040000001 | 1111 |
| 000100000003000000 | 0001 |
| 000100000003000003 | 0001 |
| 000100000003000001 | 0001 |
| 000100000200000002 | 0000 |
| 000100000200000004 | 0000 |
| 000100000200000010 | 0000 |
| 000100000200000020 | 0000 |
| 000100000200000030 | 0000 |
| 000100000200000040 | 0000 |
| 000100000200000100 | 0001 |
| 000100000200000003 | 0001 |
| 000100000200000000 | 0001 |
| 000100000200000200 | 0010 |
| 000100000200000300 | 0010 |
| 000100000200000400 | 0010 |
| 000100000200000001 | 0010 |
| 000100000200001000 | 0011 |
| 000100000200003000 | 0011 |
| 000100000200002000 | 0100 |
| 000100000200004000 | 0100 |
| 000100000400000002 | 1010 |
| 000100000400000004 | 1010 |
| 000100000400000010 | 1010 |
| 000100000400000020 | 1010 |
| 000100000400000030 | 1010 |
| 000100000400000040 | 1010 |
| 000100000400000100 | 1011 |
| 000100000400000003 | 1011 |
| 000100000400000000 | 1011 |
| 000100000400000200 | 1100 |
| 000100000400000300 | 1100 |
| 000100000400000400 | 1100 |
| 000100000400000001 | 1100 |
| 000100000400001000 | 1101 |
| 000100000400003000 | 1101 |
| 000200000002000000 | 0000 |
| 000200000002000003 | 0000 |
| 000200000002000001 | 0000 |
| 000200000002000002 | 0001 |
| 000200000002000004 | 0001 |
| 000200000002000010 | 0001 |

-continued

| Sequence of Code Symbols | x' |
|---|---|
| 00020000002000020 | 0001 |
| 00020000002000030 | 0001 |
| 00020000002000040 | 0001 |
| 00020000004000000 | 0010 |
| 00020000004000003 | 0010 |
| 00020000004000001 | 0010 |
| 00020000004000002 | 0011 |
| 00020000004000004 | 0011 |
| 00020000004000010 | 0011 |
| 00020000004000020 | 0011 |
| 00020000004000030 | 0011 |
| 00020000004000040 | 0011 |
| 00020000020000002 | 0111 |
| 00020000020000004 | 0111 |
| 00020000020000010 | 0111 |
| 00020000020000020 | 0111 |
| 00020000020000030 | 0111 |
| 00020000020000040 | 0111 |
| 00020000020000100 | 1000 |
| 00020000020000003 | 1000 |
| 00020000020000000 | 1000 |
| 00020000020000200 | 1001 |
| 00020000020000300 | 1001 |
| 00020000020000400 | 1001 |
| 00020000020000001 | 1001 |
| 00020000030000100 | 1011 |
| 00020000030000003 | 1011 |
| 00020000030000000 | 1011 |
| 00020000030000200 | 1100 |
| 00020000030000300 | 1100 |
| 00020000030000400 | 1100 |
| 00020000030000001 | 1100 |
| 00020000040000002 | 1101 |
| 00020000040000004 | 1101 |
| 00020000040000010 | 1101 |
| 00020000040000020 | 1101 |
| 00020000040000030 | 1101 |
| 00020000040000040 | 1101 |
| 00020000040000100 | 1110 |
| 00020000040000003 | 1110 |
| 00020000040000000 | 1110 |
| 00020000040000200 | 1111 |
| 00020000040000300 | 1111 |
| 00020000040000400 | 1111 |
| 00020000040000001 | 1111 |
| 00020000003000000 | 0001 |
| 00020000003000003 | 0001 |
| 00020000003000001 | 0001 |
| 00020000003000002 | 0000 |
| 00020000003000004 | 0000 |
| 00020000003000010 | 0000 |
| 00020000003000020 | 0000 |
| 00020000003000030 | 0000 |
| 00020000003000040 | 0000 |
| 00020000003000100 | 0001 |
| 00020000200000003 | 0001 |
| 00020000200000000 | 0001 |
| 00020000200000200 | 0010 |
| 00020000200000300 | 0010 |
| 00020000200000400 | 0010 |
| 00020000200000001 | 0010 |
| 00020000200001000 | 0011 |
| 00020000200003000 | 0011 |
| 00020000200004000 | 0100 |
| 00020000400000002 | 1010 |
| 00020000400000004 | 1010 |
| 00020000400000010 | 1010 |
| 00020000400000020 | 1010 |
| 00020000400000030 | 1010 |
| 00020000400000040 | 1010 |
| 00020000400000100 | 1011 |
| 00020000400000003 | 1011 |
| 00020000400000000 | 1011 |
| 00020000400000200 | 1100 |
| 00020000400000300 | 1100 |
| 00020000400000400 | 1100 |
| 00020000400000001 | 1100 |
| 00020000400001000 | 1101 |

-continued

| Sequence of Code Symbols | x' |
|---|---|
| 00020000400003000 | 1101 |
| 00030000002000000 | 0000 |
| 00030000002000003 | 0000 |
| 00030000002000001 | 0000 |
| 00030000002000002 | 0001 |
| 00030000002000004 | 0001 |
| 00030000002000010 | 0001 |
| 00030000002000020 | 0001 |
| 00030000002000030 | 0001 |
| 00030000002000040 | 0001 |
| 00030000004000000 | 0010 |
| 00030000004000003 | 0010 |
| 00030000004000001 | 0010 |
| 00030000004000002 | 0011 |
| 00030000004000004 | 0011 |
| 00030000004000010 | 0011 |
| 00030000004000020 | 0011 |
| 00030000004000030 | 0011 |
| 00030000004000040 | 0011 |
| 00030000004000002 | 0111 |
| 00030000020000004 | 0111 |
| 00030000020000010 | 0111 |
| 00030000020000020 | 0111 |
| 00030000020000030 | 0111 |
| 00030000020000040 | 0111 |
| 00030000020000100 | 1000 |
| 00030000020000003 | 1000 |
| 00030000020000000 | 1000 |
| 00030000020000200 | 1001 |
| 00030000020000300 | 1001 |
| 00030000020000400 | 1001 |
| 00030000020000001 | 1001 |
| 00030000030000100 | 1011 |
| 00030000030000003 | 1011 |
| 00030000030000000 | 1011 |
| 00030000030000200 | 1100 |
| 00030000030000300 | 1100 |
| 00030000030000400 | 1100 |
| 00030000030000001 | 1100 |
| 00030000040000002 | 1101 |
| 00030000040000004 | 1101 |
| 00030000040000010 | 1101 |
| 00030000040000020 | 1101 |
| 00030000040000030 | 1101 |
| 00030000040000040 | 1101 |
| 00030000040000100 | 1110 |
| 00030000040000003 | 1110 |
| 00030000040000000 | 1110 |
| 00030000040000200 | 1111 |
| 00030000040000300 | 1111 |
| 00030000040000400 | 1111 |
| 00030000040000001 | 1111 |
| 00030000003000003 | 0001 |
| 00030000003000003 | 0001 |
| 00030000003000001 | 0001 |
| 00030000200000002 | 0000 |
| 00030000200000004 | 0000 |
| 00030000200000010 | 0000 |
| 00030000200000020 | 0000 |
| 00030000200000030 | 0000 |
| 00030000200000040 | 0000 |
| 00030000200000100 | 0001 |
| 00030000200000003 | 0001 |
| 00030000200000000 | 0001 |
| 00030000200000200 | 0010 |
| 00030000200000300 | 0010 |
| 00030000200000400 | 0010 |
| 00030000200000001 | 0010 |
| 00030000200001000 | 0011 |
| 00030000200003000 | 0011 |
| 00030000200002000 | 0100 |
| 00030000200000000 | 0100 |
| 00030000400000002 | 1010 |
| 00030000400000004 | 1010 |
| 00030000400000010 | 1010 |
| 00030000400000020 | 1010 |
| 00030000400000030 | 1010 |
| 00030000400000040 | 1010 |

-continued

| Sequence of Code Symbols | x' |
|---|---|
| 000300000400000100 | 1011 |
| 000300000400000003 | 1011 |
| 000300000400000000 | 1011 |
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 000300000002000000 | 0000 |
| 000300000002000003 | 0000 |
| 000300000002000001 | 0000 |
| 000300000002000002 | 0001 |
| 000300000002000004 | 0001 |
| 000300000002000010 | 0001 |
| 000300000002000020 | 0001 |
| 000300000002000030 | 0001 |
| 000300000002000040 | 0001 |
| 000300000004000000 | 0010 |
| 000300000004000003 | 0010 |
| 000300000004000001 | 0010 |
| 000300000004000002 | 0011 |
| 000300000004000004 | 0011 |
| 000300000004000010 | 0011 |
| 000300000004000020 | 0011 |
| 000300000004000030 | 0011 |
| 000300000004000040 | 0011 |
| 000300000020000002 | 0111 |
| 000300000020000004 | 0111 |
| 000300000020000010 | 0111 |
| 000300000020000020 | 0111 |
| 000300000020000030 | 0111 |
| 000300000020000040 | 0111 |
| 000300000020000100 | 1000 |
| 000300000020000003 | 1000 |
| 000300000020000000 | 1000 |
| 0004000000200002000 | 1001 |
| 000400000020000300 | 1001 |
| 000400000020000200 | 1001 |
| 000400000020000001 | 1001 |
| 000400000030000100 | 1011 |
| 000400000030000003 | 1011 |
| 000400000030000000 | 1011 |
| 000400000030000200 | 1100 |
| 000400000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |
| 000400000040000030 | 1101 |
| 000400000040000040 | 1101 |
| 000400000040000100 | 1110 |
| 000400000040000003 | 1110 |
| 000400000040000000 | 1110 |
| 000400000040000200 | 1111 |
| 000400000040000300 | 1111 |
| 000400000040000400 | 1111 |
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0001 |
| 000400000200000003 | 0001 |
| 000400000200000000 | 0001 |
| 000400000200000200 | 0010 |
| 000400000200000300 | 0010 |
| 000400000200000400 | 0010 |
| 000400000200000001 | 0010 |
| 000400000200001000 | 0011 |
| 000400000200003000 | 0011 |

-continued

| Sequence of Code Symbols | x' |
|---|---|
| 000400000200002000 | 0100 |
| 000400000200004000 | 0100 |
| 000400000400000002 | 1010 |
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |
| 000001000003000000 | 1100 |
| 000001000003000003 | 1100 |
| 000001000003000001 | 1100 |
| 000001000003000002 | 1101 |
| 000001000003000004 | 1101 |
| 000001000003000010 | 1101 |
| 000001000003000020 | 1101 |
| 000001000003000030 | 1101 |
| 000001000003000040 | 1101 |
| 000001000002000000 | 0000 |
| 000001000002000003 | 0000 |
| 000001000002000001 | 0000 |
| 000001000002000002 | 0001 |
| 000001000002000004 | 0001 |
| 000001000002000010 | 0001 |
| 000001000002000020 | 0001 |
| 000001000002000030 | 0001 |
| 000001000002000040 | 0001 |
| 000001000004000000 | 0010 |
| 000001000004000003 | 0010 |
| 000001000004000001 | 0010 |
| 000001000004000002 | 0011 |
| 000001000004000004 | 0011 |
| 000001000004000010 | 0011 |
| 000001000004000002 | 0011 |
| 000001000004000030 | 0011 |
| 000001000004000040 | 0011 |
| 000001000020000002 | 0111 |
| 000001000020000004 | 0111 |
| 000001000020000010 | 0111 |
| 000001000020000020 | 0111 |
| 000001000020000030 | 0111 |
| 000001000020000040 | 0111 |
| 000001000020000100 | 1000 |
| 000001000020000003 | 1000 |
| 000001000020000000 | 1000 |
| 000001000020000200 | 1001 |
| 000001000020000300 | 1001 |
| 000001000020000400 | 1001 |
| 000001000020000001 | 1001 |
| 000001000030000100 | 1011 |
| 000001000030000003 | 1011 |
| 000001000030000000 | 1011 |
| 000001000030000200 | 1100 |
| 000001000030000300 | 1100 |
| 000001000030000400 | 1100 |
| 000001000030000001 | 1100 |
| 000001000040000002 | 1101 |
| 000001000040000004 | 1101 |
| 000001000040000010 | 1101 |
| 000001000040000020 | 1101 |
| 000001000040000030 | 1101 |
| 000001000040000040 | 1101 |
| 000001000040000100 | 1110 |
| 000001000040000003 | 1110 |
| 000001000040000000 | 1110 |
| 000001000040000200 | 1111 |
| 000001000040000300 | 1111 |
| 000001000040000400 | 1111 |
| 000001000040000001 | 1111 |
| 001000000030000100 | 0000 |

-continued

| Sequence of Code Symbols | x' |
|---|---|
| 0010000000300000003 | 0000 |
| 001000000030000000 | 0000 |
| 001000000030000200 | 0001 |
| 001000000030000300 | 0001 |
| 001000000030000400 | 0001 |
| 001000000030000001 | 0001 |
| 001000000003000000 | 1100 |
| 001000000003000003 | 1100 |
| 001000000003000001 | 1100 |
| 001000000003000002 | 1101 |
| 001000000003000004 | 1101 |
| 001000000003000010 | 1101 |
| 001000000003000020 | 1101 |
| 001000000003000030 | 1101 |
| 001000000003000040 | 1101 |
| 001000000002000000 | 1100 |
| 001000000002000003 | 1100 |
| 001000000002000001 | 1100 |
| 001000000002000002 | 1101 |
| 001000000002000004 | 1101 |
| 001000000002000010 | 1101 |
| 001000000002000020 | 1101 |
| 001000000002000030 | 1101 |
| 001000000002000040 | 1101 |
| 001000000004000000 | 1110 |
| 001000000004000003 | 1110 |
| 001000000004000001 | 1110 |
| 001000000004000002 | 1111 |
| 001000000004000004 | 1111 |
| 001000000004000010 | 1111 |
| 001000000004000020 | 1111 |
| 001000000004000030 | 1111 |
| 001000000004000040 | 1111 |
| 001000000200000002 | 1100 |
| 001000000200000004 | 1100 |
| 001000000200000010 | 1100 |
| 001000000200000020 | 1100 |
| 001000000200000030 | 1100 |
| 001000000200000040 | 1100 |
| 001000000200000100 | 1101 |
| 001000000200000003 | 1101 |
| 001000000200000000 | 1101 |
| 001000000200000200 | 1110 |
| 001000000200000300 | 1110 |
| 001000000200000400 | 1110 |
| 001000000200000001 | 1110 |
| 001000000200001000 | 1111 |
| 001000000200003000 | 1111 |
| 001000000400000002 | 1100 |
| 001000000400000004 | 1100 |
| 001000000400000010 | 1100 |
| 001000000400000020 | 1100 |
| 001000000400000030 | 1100 |
| 001000000400000040 | 1100 |
| 001000000400000100 | 1101 |
| 001000000400000003 | 1101 |
| 001000000400000000 | 1101 |
| 001000000400000200 | 1110 |
| 001000000400000300 | 1110 |
| 001000000400000400 | 1110 |
| 001000000400000001 | 1110 |
| 001000000400001000 | 1111 |
| 001000000400003000 | 1111 |
| 001000000020000002 | 0010 |
| 001000000020000004 | 0010 |
| 001000000020000010 | 0010 |
| 001000000020000020 | 0010 |
| 001000000020000030 | 0010 |
| 001000000020000040 | 0010 |
| 001000000020000100 | 0011 |
| 001000000020000003 | 0011 |
| 001000000020000000 | 0011 |
| 001000000020000200 | 0100 |
| 001000000020000300 | 0100 |
| 001000000020000400 | 0100 |
| 001000000020000001 | 0100 |
| 001000000040000002 | 1010 |
| 001000000040000004 | 1010 |

-continued

| Sequence of Code Symbols | x' |
|---|---|
| 001000000040000010 | 1010 |
| 001000000040000020 | 1010 |
| 001000000040000030 | 1010 |
| 001000000040000040 | 1010 |
| 001000000040000100 | 1011 |
| 001000000040000003 | 1011 |
| 001000000040000000 | 1011 |
| 001000000040000200 | 1100 |
| 001000000040000300 | 1100 |
| 001000000040000400 | 1100 |
| 001000000040000001 | 1100 |
| 003000000030000100 | 0000 |
| 003000000030000003 | 0000 |
| 003000000030000000 | 0000 |
| 003000000030000200 | 0001 |
| 003000000030000300 | 0001 |
| 003000000030000400 | 0001 |
| 003000000030000001 | 1100 |
| 003000000030000002 | 1101 |
| 003000000030000004 | 1101 |
| 003000000030000010 | 1101 |
| 003000000030000020 | 1101 |
| 003000000030000030 | 1101 |
| 003000000030000040 | 1101 |
| 003000000020000000 | 1100 |
| 003000000020000003 | 1100 |
| 003000000020000001 | 1100 |
| 003000000020000002 | 1101 |
| 003000000020000004 | 1101 |
| 003000000020000010 | 1101 |
| 003000000020000020 | 1101 |
| 003000000020000030 | 1101 |
| 003000000020000040 | 1101 |
| 003000000040000000 | 1110 |
| 003000000040000003 | 1110 |
| 003000000040000001 | 1110 |
| 003000000040000002 | 1111 |
| 003000000040000004 | 1111 |
| 003000000040000010 | 1111 |
| 003000000040000020 | 1111 |
| 003000000040000030 | 1111 |
| 003000000040000040 | 1111 |
| 003000000200000002 | 1100 |
| 003000000200000004 | 1100 |
| 003000000200000010 | 1100 |
| 003000000200000020 | 1100 |
| 003000000200000030 | 1100 |
| 003000000200000040 | 1100 |
| 003000000200000100 | 1101 |
| 003000000200000003 | 1101 |
| 003000000200000000 | 1101 |
| 003000000200000200 | 1110 |
| 003000000200000300 | 1110 |
| 003000000200000400 | 1110 |
| 003000000200000001 | 1110 |
| 003000000200001000 | 1111 |
| 003000000200003000 | 1111 |
| 003000000400000002 | 1100 |
| 003000000400000004 | 1100 |
| 003000000400000010 | 1100 |
| 003000000400000020 | 1100 |
| 003000000400000030 | 1100 |
| 003000000400000040 | 1100 |
| 003000000400000100 | 1101 |
| 003000000400000003 | 1101 |
| 003000000400000000 | 1101 |
| 003000000400000200 | 1110 |
| 003000000400000300 | 1110 |
| 003000000400000400 | 1110 |
| 003000000400000001 | 1110 |
| 003000000400001000 | 1111 |
| 003000000400003000 | 1111 |
| 003000000400000002 | 0010 |
| 003000000400000004 | 0010 |
| 003000000400000010 | 0010 |
| 003000000020000020 | 0010 |
| 003000000020000030 | 0010 |
| 003000000020000040 | 0010 |

-continued

| Sequence of Code Symbols | x' |
|---|---|
| 003000000020000100 | 0011 |
| 003000000020000003 | 0011 |
| 003000000020000000 | 0011 |
| 003000000020000200 | 0100 |
| 003000000020000300 | 0100 |
| 003000000020000400 | 0100 |
| 003000000020000001 | 0100 |
| 003000000040000002 | 1010 |
| 003000000040000004 | 1010 |
| 003000000040000010 | 1010 |
| 003000000040000020 | 1010 |
| 003000000040000030 | 1010 |
| 003000000040000040 | 1010 |
| 003000000040000100 | 1011 |
| 003000000040000003 | 1011 |
| 003000000040000000 | 1011 |
| 003000000040000200 | 1100 |
| 003000000040000300 | 1100 |
| 003000000040000400 | 1100 |
| 003000000040000001 | 1100 |
| 002000000030000100 | 0000 |
| 002000000030000003 | 0000 |
| 002000000030000000 | 0000 |
| 002000000030000200 | 0001 |
| 002000000030000300 | 0001 |
| 002000000030000400 | 0001 |
| 002000000030000001 | 0001 |
| 002000000003000000 | 1100 |
| 002000000003000003 | 1100 |
| 002000000003000001 | 1100 |
| 002000000003000002 | 1101 |
| 002000000003000004 | 1101 |
| 002000000003000010 | 1101 |
| 002000000003000020 | 1101 |
| 002000000003000030 | 1101 |
| 002000000003000040 | 1101 |
| 002000000002000000 | 1100 |
| 002000000002000003 | 1100 |
| 002000000002000001 | 1100 |
| 002000000002000002 | 1101 |
| 002000000002000004 | 1101 |
| 002000000002000010 | 1101 |
| 002000000002000020 | 1101 |
| 002000000002000030 | 1101 |
| 002000000002000040 | 1101 |
| 002000000004000000 | 1110 |
| 002000000004000003 | 1110 |
| 002000000004000001 | 1110 |
| 002000000004000002 | 1111 |
| 002000000004000004 | 1111 |
| 002000000004000010 | 1111 |
| 002000000004000020 | 1111 |
| 002000000004000030 | 1111 |
| 002000000004000040 | 1111 |
| 002000000200000002 | 1100 |
| 002000000200000004 | 1100 |
| 002000000200000010 | 1100 |
| 002000000200000020 | 1100 |
| 002000000200000030 | 1100 |
| 002000000200000040 | 1100 |
| 002000000200000100 | 1101 |
| 002000000200000003 | 1101 |
| 002000000200000000 | 1101 |
| 002000000200000200 | 1110 |
| 002000000200000300 | 1110 |
| 002000000200000400 | 1110 |
| 002000000200000001 | 1110 |
| 002000000200001000 | 1111 |
| 002000000200003000 | 1111 |
| 002000000400000002 | 1100 |
| 002000000400000004 | 1100 |
| 002000000400000010 | 1100 |
| 002000000400000020 | 1100 |
| 002000000400000030 | 1100 |
| 002000000400000040 | 1101 |
| 002000000400000100 | 1101 |
| 002000000400000003 | 1101 |
| 002000000400000000 | 1101 |

-continued

| Sequence of Code Symbols | x' |
|---|---|
| 002000000400000200 | 1110 |
| 002000000400000300 | 1110 |
| 002000000400000400 | 1110 |
| 002000000400000001 | 1110 |
| 002000000400001000 | 1111 |
| 002000000400003000 | 1111 |
| 002000000020000002 | 0010 |
| 002000000020000004 | 0010 |
| 002000000020000010 | 0010 |
| 002000000020000020 | 0010 |
| 002000000020000030 | 0010 |
| 002000000020000040 | 0010 |
| 002000000020000100 | 0011 |
| 002000000020000003 | 0011 |
| 002000000020000000 | 0011 |
| 002000000020000200 | 0100 |
| 002000000020000300 | 0100 |
| 002000000020000400 | 0100 |
| 002000000020000100 | 0100 |
| 002000000040000002 | 1010 |
| 002000000040000004 | 1010 |
| 002000000040000010 | 1010 |
| 002000000040000020 | 1010 |
| 002000000040000030 | 1010 |
| 002000000040000040 | 1010 |
| 002000000040000100 | 1011 |
| 002000000040000003 | 1011 |
| 002000000040000000 | 1011 |
| 002000000040000200 | 1100 |
| 002000000040000300 | 1100 |
| 002000000040000400 | 1100 |
| 002000000040000001 | 1100 |
| 004000000030000100 | 0000 |
| 004000000030000003 | 0000 |
| 004000000030000000 | 0000 |
| 004000000030000200 | 0001 |
| 004000000030000300 | 0001 |
| 004000000030000400 | 0001 |
| 004000000030000001 | 0001 |
| 004000000003000000 | 1101 |
| 004000000003000003 | 1100 |
| 004000000003000001 | 1100 |
| 004000000003000002 | 1101 |
| 004000000003000004 | 1101 |
| 004000000003000010 | 1101 |
| 004000000003000020 | 1101 |
| 004000000003000030 | 1101 |
| 004000000003000040 | 1101 |
| 004000000002000000 | 1100 |
| 004000000002000003 | 1100 |
| 004000000002000001 | 1100 |
| 004000000002000002 | 1101 |
| 004000000002000004 | 1101 |
| 004000000002000010 | 1101 |
| 004000000002000020 | 1101 |
| 004000000002000030 | 1101 |
| 004000000002000040 | 1101 |
| 004000000004000000 | 1110 |
| 004000000004000003 | 1110 |
| 004000000004000001 | 1110 |
| 004000000004000002 | 1111 |
| 004000000004000004 | 1111 |
| 004000000004000010 | 1111 |
| 004000000004000020 | 1111 |
| 004000000004000030 | 1111 |
| 004000000004000040 | 1111 |
| 004000000200000002 | 1100 |
| 004000000200000004 | 1100 |
| 004000000200000010 | 1100 |
| 004000000200000020 | 1100 |
| 004000000200000030 | 1100 |
| 004000000200000040 | 1100 |
| 004000000200000100 | 1101 |
| 004000000200000003 | 1101 |
| 004000000200000000 | 1101 |
| 004000000200000200 | 1110 |
| 004000000200000300 | 1110 |
| 004000000200000400 | 1110 |

-continued

| Sequence of Code Symbols | x' |
|---|---|
| 004000000200000001 | 1110 |
| 004000000200001000 | 1111 |
| 004000000400003000 | 1111 |
| 004000000400000002 | 1100 |
| 004000000400000004 | 1100 |
| 004000000400000010 | 1100 |
| 004000000400000020 | 1100 |
| 004000000400000030 | 1100 |
| 004000000400000040 | 1100 |
| 004000000400000100 | 1101 |
| 004000000400000003 | 1101 |
| 004000000400000000 | 1101 |
| 004000000400000200 | 1110 |
| 004000000400000300 | 1110 |
| 004000000400000400 | 1110 |
| 004000000400000001 | 1110 |
| 004000000400001000 | 1111 |
| 004000000400003000 | 1111 |
| 004000000020000002 | 0010 |
| 004000000020000004 | 0010 |
| 004000000020000010 | 0010 |
| 004000000020000020 | 0010 |
| 004000000020000030 | 0010 |
| 004000000020000040 | 0010 |
| 004000000020000100 | 0011 |
| 004000000020000003 | 0011 |
| 004000000020000000 | 0011 |
| 004000000020000200 | 0100 |
| 004000000020000300 | 0100 |
| 004000000020000400 | 0100 |
| 004000000020000001 | 0100 |
| 004000000040000002 | 1010 |
| 004000000040000004 | 1010 |
| 004000000040000010 | 1010 |
| 004000000040000020 | 1010 |
| 004000000040000030 | 1010 |
| 004000000040000040 | 1010 |
| 004000000040000100 | 1011 |
| 004000000040000003 | 1011 |
| 004000000040000000 | 1011 |
| 004000000040000200 | 1100 |
| 004000000040000300 | 1100 |
| 004000000040000400 | 1100 |
| 004000000040000001 | 1100 |
| 000200000002000000 | 0000 |
| 000200000002000003 | 0000 |
| 000200000002000001 | 0000 |
| 000200000002000002 | 0001 |
| 000200000002000004 | 0001 |
| 000200000002000010 | 0001 |
| 000200000002000020 | 0001 |
| 000200000002000030 | 0001 |
| 000200000002000040 | 0001 |
| 000200000004000000 | 0010 |
| 000200000004000003 | 0010 |
| 000200000004000001 | 0010 |
| 000200000004000002 | 0011 |
| 000200000004000004 | 0011 |
| 000200000004000010 | 0011 |
| 000200000004000020 | 0011 |
| 000200000004000030 | 0011 |
| 000200000004000040 | 0011 |
| 000200000020000002 | 0111 |
| 000200000020000004 | 0111 |
| 000200000020000010 | 0111 |
| 000200000020000020 | 0111 |
| 000200000020000030 | 0111 |
| 000200000020000040 | 0111 |
| 000200000020000100 | 1000 |
| 000200000020000003 | 1000 |
| 000200000020000000 | 1000 |
| 000200000020000200 | 1001 |
| 000200000020000300 | 1001 |
| 000200000020000400 | 1001 |
| 000200000020000001 | 1001 |
| 000200000030000100 | 1011 |
| 000200000030000003 | 1011 |
| 000200000030000000 | 1011 |

-continued

| Sequence of Code Symbols | x' |
|---|---|
| 000200000030000200 | 1100 |
| 000200000030000300 | 1100 |
| 000200000030000400 | 1100 |
| 000200000030000001 | 1100 |
| 000200000040000002 | 1101 |
| 000200000040000004 | 1101 |
| 000200000040000010 | 1101 |
| 000200000040000020 | 1101 |
| 000200000040000030 | 1101 |
| 000200000040000040 | 1101 |
| 000200000040000100 | 1110 |
| 000200000040000003 | 1110 |
| 000200000040000000 | 1110 |
| 000200000040000200 | 1111 |
| 000200000040000300 | 1111 |
| 000200000040000400 | 1111 |
| 000200000040000001 | 1111 |
| 000200000003000000 | 0001 |
| 000200000003000003 | 0001 |
| 000200000003000001 | 0001 |
| 000200000200000002 | 0000 |
| 000200000200000004 | 0000 |
| 000200000200000010 | 0000 |
| 000200000200000020 | 0000 |
| 000200000200000030 | 0000 |
| 000200000200000040 | 0000 |
| 000200000200000100 | 0001 |
| 000200000200000003 | 0001 |
| 000200000200000000 | 0001 |
| 000200000200000200 | 0010 |
| 000200000200000300 | 0010 |
| 000200000200000400 | 0010 |
| 000200000200000001 | 0010 |
| 000200000200001000 | 0011 |
| 000200000200003000 | 0011 |
| 000200000200002000 | 0100 |
| 000200000200004000 | 0100 |
| 000200000400000002 | 1010 |
| 000200000400000004 | 1010 |
| 000200000400000010 | 1010 |
| 000200000400000020 | 1010 |
| 000200000400000030 | 1010 |
| 000200000400000040 | 1010 |
| 000200000400000100 | 1011 |
| 000200000400000003 | 1011 |
| 000200000400000000 | 1011 |
| 000200000400000200 | 1100 |
| 000200000400000300 | 1100 |
| 000200000400000400 | 1100 |
| 000200000400000001 | 1100 |
| 000200000400001000 | 1101 |
| 000200000400003000 | 1101 |
| 000300000002000000 | 0000 |
| 000300000002000003 | 0000 |
| 000300000002000001 | 0000 |
| 000300000002000002 | 0001 |
| 000300000002000004 | 0001 |
| 000300000002000010 | 0001 |
| 000300000002000020 | 0001 |
| 000300000002000030 | 0001 |
| 000300000004000040 | 0001 |
| 000300000004000000 | 0010 |
| 000300000004000003 | 0010 |
| 000300000004000001 | 0010 |
| 000300000004000002 | 0011 |
| 000300000004000004 | 0011 |
| 000300000004000010 | 0011 |
| 000300000004000020 | 0011 |
| 000300000004000030 | 0011 |
| 000300000004000040 | 0011 |
| 000300000020000002 | 0111 |
| 000300000020000004 | 0111 |
| 030000000020000010 | 0111 |
| 000300000020000020 | 0111 |
| 000300000020000030 | 0111 |
| 000300000020000040 | 0111 |
| 000300000020000100 | 1000 |
| 000300000020000003 | 1000 |

-continued

| Sequence of Code Symbols | x' |
|---|---|
| 0003000000200000030 | 1000 |
| 0003000000200000200 | 1001 |
| 0003000000200000300 | 1001 |
| 0003000000200000400 | 1001 |
| 0003000000200000001 | 1001 |
| 0003000000300000100 | 1011 |
| 0003000000300000003 | 1011 |
| 0003000000300000000 | 1011 |
| 0003000000300000200 | 1100 |
| 0003000000300000300 | 1100 |
| 0003000000300000400 | 1100 |
| 0003000000300000001 | 1100 |
| 0003000000400000002 | 1101 |
| 0003000000400000004 | 1101 |
| 0003000000400000010 | 1101 |
| 0003000000400000020 | 1101 |
| 0003000000400000030 | 1101 |
| 0003000000400000040 | 1101 |
| 0003000000400000100 | 1110 |
| 0003000000400000003 | 1110 |
| 0003000000400000000 | 1110 |
| 0003000000400000200 | 1111 |
| 0003000000400000300 | 1111 |
| 0003000000400000400 | 1111 |
| 0003000000400000001 | 1111 |
| 0003000000000300000 | 0001 |
| 0003000000000300003 | 0001 |
| 0003000000200000001 | 0001 |
| 0003000000200000002 | 0000 |
| 0003000000200000004 | 0000 |
| 0003000000200000010 | 0000 |
| 0003000000200000020 | 0000 |
| 0003000000200000030 | 0000 |
| 0003000000200000040 | 0000 |
| 0003000000200000100 | 0001 |
| 0003000000200000003 | 0001 |
| 0003000000200000000 | 0001 |
| 0003000000200000200 | 0010 |
| 0003000000200000300 | 0010 |
| 0003000000200000040 | 0010 |
| 0003000000200000001 | 0010 |
| 0003000000200001000 | 0011 |
| 0003000000200003000 | 0011 |
| 0003000000200002000 | 0100 |
| 0003000000200004000 | 0100 |
| 0003000000400000002 | 1010 |
| 0003000000400000004 | 1010 |
| 0003000000400000010 | 1010 |
| 0003000000400000020 | 1010 |
| 0003000000400000030 | 1010 |
| 0003000000400000040 | 1010 |
| 0003000000400000100 | 1011 |
| 0003000000400000003 | 1011 |
| 0003000000400000000 | 1011 |
| 0003000000400000200 | 1100 |
| 0003000000400000300 | 1100 |
| 0003000000400000400 | 1100 |
| 0003000000400000001 | 1100 |
| 0003000000400001000 | 1101 |
| 0003000000400003000 | 1101 |
| 0004000000002000000 | 0000 |
| 0004000000002000003 | 0000 |
| 0004000000002000001 | 0000 |
| 0004000000002000002 | 0001 |
| 0004000000002000004 | 0001 |
| 0004000000002000010 | 0001 |
| 0004000000002000020 | 0001 |
| 0004000000002000030 | 0001 |
| 0004000000002000040 | 0001 |
| 0004000000004000000 | 0010 |
| 0004000000004000003 | 0010 |
| 0004000000004000001 | 0010 |
| 0004000000004000002 | 0011 |
| 0004000000004000004 | 0011 |
| 0004000000004000010 | 0011 |
| 0004000000004000020 | 0011 |
| 0004000000004000030 | 0011 |
| 0004000000004000040 | 0011 |

-continued

| Sequence of Code Symbols | x' |
|---|---|
| 0004000000200000002 | 0111 |
| 0004000000200000004 | 0111 |
| 0004000000200000010 | 0111 |
| 0004000000200000020 | 0111 |
| 0004000000200000030 | 0111 |
| 0004000000200000040 | 0111 |
| 0004000000200000100 | 1000 |
| 0004000000200000003 | 1000 |
| 0004000000200000000 | 1000 |
| 0004000000200000200 | 1001 |
| 0004000000200000300 | 1001 |
| 0004000000200000400 | 1001 |
| 0004000000200000001 | 1001 |
| 0004000000200000100 | 1011 |
| 0004000000200000003 | 1011 |
| 0004000000300000000 | 1011 |
| 0004000000300000200 | 1100 |
| 0004000000300000300 | 1100 |
| 0004000000300000400 | 1100 |
| 0004000000300000001 | 1100 |
| 0004000000400000002 | 1101 |
| 0004000000400000004 | 1101 |
| 0004000000400000001 | 1101 |
| 0004000000400000020 | 1101 |
| 0004000000400000030 | 1101 |
| 0004000000400000040 | 1101 |
| 0004000000400000100 | 1110 |
| 0004000000400000003 | 1110 |
| 0004000000400000000 | 1110 |
| 0004000000400000200 | 1111 |
| 0004000000400000300 | 1111 |
| 0004000000400000400 | 1111 |
| 0004000000400000001 | 1111 |
| 0004000000003000000 | 0001 |
| 0004000000003000003 | 0001 |
| 0004000000003000001 | 0001 |
| 0004000000200000002 | 0000 |
| 0004000000200000004 | 0000 |
| 0004000000200000010 | 0000 |
| 0004000000200000020 | 0000 |
| 0004000000200000030 | 0000 |
| 0004000000200000040 | 0000 |
| 0004000000200000100 | 0001 |
| 0004000000200000003 | 0001 |
| 0004000000200000000 | 0001 |
| 0004000000200000200 | 0010 |
| 0004000000200000300 | 0010 |
| 0004000000200000400 | 0010 |
| 0004000000200000001 | 0010 |
| 0004000000200001000 | 0011 |
| 0004000000200003000 | 0011 |
| 0004000000200002000 | 0100 |
| 0004000000200004000 | 0100 |
| 0004000000400000002 | 1010 |
| 0004000000400000004 | 1010 |
| 0004000000400000010 | 1010 |
| 0004000000400000020 | 1010 |
| 0004000000400000030 | 1010 |
| 0004000000400000040 | 1010 |
| 0004000000400000100 | 1011 |
| 0004000000400000003 | 1011 |
| 0004000000400000000 | 1011 |
| 0004000000400000200 | 1100 |
| 0004000000400000300 | 1100 |
| 0004000000400000400 | 1100 |
| 0004000000400000001 | 1100 |
| 0004000000400001000 | 1101 |
| 0004000000400003000 | 1101 |
| 0001000000002000000 | 0000 |
| 0001000000002000003 | 0000 |
| 0001000000002000001 | 0000 |
| 0001000000002000002 | 0001 |
| 0001000000002000004 | 0001 |
| 0001000000002000010 | 0001 |
| 0001000000002000020 | 0001 |
| 0001000000002000030 | 0001 |
| 0001000000002000040 | 0001 |
| 0001000000004000004 | 0010 |

-continued

| Sequence of Code Symbols | x' |
|---|---|
| 0001000000004000003 | 0010 |
| 0001000000004000001 | 0010 |
| 0001000000004000002 | 0011 |
| 0001000000004000004 | 0011 |
| 0001000000004000010 | 0011 |
| 0001000000004000020 | 0011 |
| 0001000000004000030 | 0011 |
| 0001000000004000040 | 0011 |
| 0001000000020000002 | 0111 |
| 0001000000020000004 | 0111 |
| 0001000000020000010 | 0111 |
| 0001000000020000020 | 0111 |
| 0001000000020000030 | 0111 |
| 0001000000020000040 | 0111 |
| 0001000000020000100 | 1000 |
| 0001000000020000002 | 1000 |
| 0001000000020000000 | 1000 |
| 0001000000020000200 | 1001 |
| 0001000000020000300 | 1001 |
| 0001000000020000400 | 1001 |
| 0001000000030000001 | 1011 |
| 0001000000030000003 | 1011 |
| 0001000000030000000 | 1011 |
| 0001000000030000200 | 1100 |
| 0001000000030000300 | 1100 |
| 0001000000030000400 | 1100 |
| 0001000000030000001 | 1100 |
| 0001000000040000002 | 1101 |
| 0001000000040000004 | 1101 |
| 0001000000040000010 | 1101 |
| 0001000000040000020 | 1101 |
| 0001000000040000030 | 1101 |
| 0001000000040000040 | 1101 |
| 0001000000040000100 | 1110 |
| 0001000000040000003 | 1110 |
| 0001000000040000000 | 1110 |
| 0001000000040000200 | 1111 |
| 0001000000040000300 | 1111 |
| 0001000000040000400 | 1111 |
| 0001000000040000001 | 1111 |
| 0001000000003000000 | 0001 |
| 0001000000003000003 | 0001 |
| 0001000000003000001 | 0001 |
| 0001000000200000002 | 0000 |
| 0001000000200000004 | 0000 |
| 0001000000200000010 | 0000 |
| 0001000000200000020 | 0000 |
| 0001000000200000030 | 0000 |
| 0001000000200000040 | 0000 |
| 0001000000200000100 | 0001 |
| 0001000000200000003 | 0001 |
| 0001000000200000000 | 0001 |
| 0001000000200000200 | 0010 |
| 0001000000200000300 | 0010 |
| 0001000000200000400 | 0010 |
| 0001000000200000001 | 0010 |
| 0001000000200001000 | 0011 |
| 0001000000200003000 | 0011 |
| 0001000000200002000 | 0100 |
| 0001000000200004000 | 0100 |
| 0001000000400000002 | 1010 |
| 0001000000400000004 | 1010 |
| 0001000000400000010 | 1010 |
| 0001000000400000020 | 1010 |
| 0001000000400000030 | 1010 |
| 0001000000400000040 | 1010 |
| 0001000000400000100 | 1011 |
| 0001000000400000003 | 1011 |
| 0001000000400000000 | 1011 |
| 0001000000400000200 | 1100 |
| 0001000000400000300 | 1100 |
| 0001000000400000400 | 1100 |
| 0001000000400000001 | 1100 |
| 0001000000400001000 | 1101 |
| 0001000000400003000 | 1101 |
| 0000200000002000000 | 0000 |
| 0000200000002000003 | 0000 |
| 0000200000002000001 | 0000 |

-continued

| Sequence of Code Symbols | x' |
|---|---|
| 0000200000002000002 | 0001 |
| 0000200000002000004 | 0001 |
| 0000200000002000010 | 0001 |
| 0000200000002000020 | 0001 |
| 0000200000002000030 | 0001 |
| 0000200000002000040 | 0001 |
| 0000200000004000000 | 0010 |
| 0000200000004000003 | 0010 |
| 0000200000004000001 | 0010 |
| 0000200000004000002 | 0011 |
| 0000200000004000004 | 0011 |
| 0000200000004000010 | 0011 |
| 0000200000004000020 | 0011 |
| 0000200000004000030 | 0011 |
| 0000200000004000040 | 0011 |
| 0000200000020000002 | 0111 |
| 0000200000020000004 | 0111 |
| 0000200000020000010 | 0111 |
| 0000200000020000020 | 0111 |
| 0000200000020000030 | 0111 |
| 0000200000020000040 | 0111 |
| 0000200000020000100 | 1000 |
| 0000200000020000003 | 1000 |
| 0000200000020000000 | 1000 |
| 0000200000020000200 | 1001 |
| 0000200000020000300 | 1001 |
| 0000200000020000400 | 1001 |
| 0000200000020000001 | 1001 |
| 0000200000030000100 | 1011 |
| 0000200000030000103 | 1011 |
| 0000200000030000100 | 1011 |
| 0000200000030000200 | 1100 |
| 0000200000030000300 | 1100 |
| 0000200000030000400 | 1100 |
| 0000200000030000001 | 1100 |
| 0000200000040000002 | 1101 |
| 0000200000040000004 | 1101 |
| 0000200000040000010 | 1101 |
| 0000200000040000020 | 1101 |
| 0000200000040000030 | 1101 |
| 0000200000040000040 | 1101 |
| 0000200000040000100 | 1110 |
| 0000200000040000003 | 1110 |
| 0000200000040000000 | 1110 |
| 0000200000040000200 | 1111 |
| 0000200000040000300 | 1111 |
| 0000200000040000400 | 1111 |
| 0000200000040000001 | 1111 |
| 0000200000003000000 | 0001 |
| 0000200000003000003 | 0001 |
| 0000200000003000001 | 0001 |
| 0000200000200000002 | 0000 |
| 0000200000200000004 | 0000 |
| 0000200000200000010 | 0000 |
| 0000200000200000020 | 0000 |
| 0000200000200000030 | 0000 |
| 0000200000200000040 | 0000 |
| 0000200000200000100 | 0001 |
| 0000200000200000003 | 0001 |
| 0000200000200000000 | 0001 |
| 0000200000200000200 | 0010 |
| 0000200000200000300 | 0010 |
| 0000200000200000400 | 0010 |
| 0000200000200000001 | 0010 |
| 0000200000200001000 | 0011 |
| 0000200000200003000 | 0011 |
| 0000200000200002000 | 0100 |
| 0000200000200004000 | 0100 |
| 0000200000400000002 | 1010 |
| 0000200000400000004 | 1010 |
| 0000200000400000010 | 1010 |
| 0000200000400000020 | 1010 |
| 0000200000400000030 | 1010 |
| 0000200000400000040 | 1010 |
| 0000200000400000100 | 1011 |
| 0000200000400000003 | 1011 |
| 0000200000400000000 | 1011 |
| 0000200000400000200 | 1100 |

-continued

| Sequence of Code Symbols | x' |
|---|---|
| 000020000400000300 | 1100 |
| 000020000400000400 | 1100 |
| 000020000400000001 | 1100 |
| 000020000400001000 | 1101 |
| 000020000400003000 | 1101 |
| 000300000002000000 | 0000 |
| 000300000002000003 | 0000 |
| 000300000002000001 | 0000 |
| 000300000002000002 | 0001 |
| 000300000002000004 | 0001 |
| 000300000002000010 | 0001 |
| 000300000002000020 | 0001 |
| 000300000002000030 | 0001 |
| 000300000002000040 | 0001 |
| 000300000004000000 | 0010 |
| 000300000004000003 | 0010 |
| 000300000004000001 | 0010 |
| 000300000004000002 | 0011 |
| 000300000004000004 | 0011 |
| 000300000004000010 | 0011 |
| 000300000004000020 | 0011 |
| 000300000004000030 | 0011 |
| 000300000004000040 | 0011 |
| 000300000020000002 | 0111 |
| 000300000020000004 | 0111 |
| 000300000020000010 | 0111 |
| 000300000020000020 | 0111 |
| 000300000020000030 | 0111 |
| 000300000020000040 | 0111 |
| 000300000020000100 | 1000 |
| 000300000020000003 | 1000 |
| 000300000020000000 | 1000 |
| 000300000020000200 | 1001 |
| 000300000020000300 | 1001 |
| 000300000020000400 | 1001 |
| 000300000020000001 | 1001 |
| 000300000030000100 | 1011 |
| 000300000030000003 | 1011 |
| 000300000030000000 | 1011 |
| 000300000030000200 | 1100 |
| 000300000030000300 | 1100 |
| 000300000030000400 | 1100 |
| 000300000030000001 | 1100 |
| 000300000040000002 | 1101 |
| 000300000040000004 | 1101 |
| 000300000040000010 | 1101 |
| 000300000040000020 | 1101 |
| 000300000040000030 | 1101 |
| 000300000040000040 | 1101 |
| 000300000040000100 | 1110 |
| 000300000040000003 | 1110 |
| 000300000040000000 | 1110 |
| 000300000040000200 | 1111 |
| 000300000040000300 | 1111 |
| 000300000040000400 | 1111 |
| 000300000040000001 | 1111 |
| 000300000003000000 | 0001 |
| 000300000003000003 | 0001 |
| 000300000003000001 | 0001 |
| 000300000200000002 | 0000 |
| 000300000200000004 | 0000 |
| 000300000200000010 | 0000 |
| 000300000200000020 | 0000 |
| 000300000200000030 | 0000 |
| 000300000200000040 | 0000 |
| 000300000200000100 | 0001 |
| 000300000200000003 | 0001 |
| 000300000200000000 | 0001 |
| 000300000200000200 | 0010 |
| 000300000200000300 | 0010 |
| 000300000200000400 | 0010 |
| 000300000200000001 | 0010 |
| 000300000200001000 | 0011 |
| 000300000200003000 | 0011 |
| 000300000200002000 | 0100 |
| 000300000200004000 | 0100 |
| 000300000400000002 | 1010 |
| 000300000400000004 | 1010 |

-continued

| Sequence of Code Symbols | x' |
|---|---|
| 000300000400000010 | 1010 |
| 000300000400000020 | 1010 |
| 000300000400000030 | 1010 |
| 000300000400000040 | 1010 |
| 000300000400000100 | 1011 |
| 000300000400000003 | 1011 |
| 000300000400000000 | 1011 |
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 000040000002000000 | 0000 |
| 000040000002000003 | 0000 |
| 000040000002000001 | 0000 |
| 000040000002000002 | 0001 |
| 000040000002000004 | 0001 |
| 000040000002000010 | 0001 |
| 000040000002000020 | 0001 |
| 000040000002000030 | 0001 |
| 000040000002000040 | 0001 |
| 000040000004000000 | 0010 |
| 000040000004000003 | 0010 |
| 000040000004000001 | 0010 |
| 000040000004000002 | 0011 |
| 000040000004000004 | 0011 |
| 000040000004000010 | 0011 |
| 000040000004000020 | 0011 |
| 000040000004000030 | 0011 |
| 000040000004000040 | 0011 |
| 000040000020000002 | 0111 |
| 000040000020000004 | 0111 |
| 000040000020000010 | 0111 |
| 000040000020000020 | 0111 |
| 000040000020000030 | 0111 |
| 000040000020000040 | 0111 |
| 000040000020000100 | 1000 |
| 000040000020000003 | 1000 |
| 000040000020000000 | 1000 |
| 000040000020000200 | 1001 |
| 000040000020000300 | 1001 |
| 000040000020000400 | 1001 |
| 000040000020000001 | 1001 |
| 000040000030000100 | 1011 |
| 000040000030000003 | 1011 |
| 000040000030000000 | 1011 |
| 000040000030000200 | 1100 |
| 000040000030000300 | 1100 |
| 000040000030000400 | 1100 |
| 000040000030000001 | 1100 |
| 000040000040000002 | 1101 |
| 000040000040000004 | 1101 |
| 000040000040000010 | 1101 |
| 000040000040000020 | 1101 |
| 000040000040000030 | 1101 |
| 000040000040000040 | 1101 |
| 000040000040000100 | 1110 |
| 000040000040000003 | 1110 |
| 000040000040000000 | 1110 |
| 000040000040000200 | 1111 |
| 000040000040000300 | 1111 |
| 000040000040000400 | 1111 |
| 000040000040000001 | 1111 |
| 000040000003000000 | 0001 |
| 000040000003000003 | 0001 |
| 000040000003000001 | 0001 |
| 000040000200000002 | 0000 |
| 000040000200000004 | 0000 |
| 000040000200000010 | 0000 |
| 000040000200000020 | 0000 |
| 000040000200000030 | 0000 |
| 000040000200000040 | 0000 |
| 000040000200000100 | 0001 |
| 000040000200000003 | 0001 |
| 000040000200000000 | 0001 |
| 000040000200000200 | 0010 |
| 000040000200000300 | 0010 |

-continued

| Sequence of Code Symbols | x' |
|---|---|
| 000040000200000400 | 0010 |
| 000040000200000001 | 0010 |
| 000040000200001000 | 0011 |
| 000040000200003000 | 0011 |
| 000040000200002000 | 0100 |
| 000040000200004000 | 0100 |
| 000040000400000002 | 1010 |
| 000040000400000004 | 1010 |
| 000040000400000010 | 1010 |
| 000040000400000020 | 1010 |
| 000040000400000030 | 1010 |
| 000040000400000040 | 1010 |
| 000040000400000100 | 1011 |
| 000040000400000003 | 1011 |
| 000040000400000000 | 1011 |
| 000040000400000200 | 1100 |
| 000040000400000300 | 1100 |
| 000040000400000400 | 1100 |
| 000040000400000001 | 1100 |
| 000040000400001000 | 1101 |
| 000040000400003000 | 1101 |
| 000100000002000000 | 0000 |
| 000100000002000003 | 0000 |
| 000100000002000001 | 0000 |
| 000100000002000002 | 0001 |
| 000100000002000004 | 0001 |
| 000100000002000010 | 0001 |
| 000100000002000020 | 0001 |
| 000100000002000030 | 0001 |
| 000100000002000040 | 0001 |
| 000100000004000000 | 0010 |
| 000100000004000003 | 0010 |
| 000100000004000001 | 0010 |
| 000100000004000002 | 0011 |
| 000100000004000004 | 0011 |
| 000100000004000010 | 0011 |
| 000100000004000020 | 0011 |
| 000100000004000030 | 0011 |
| 000100000004000040 | 0011 |
| 000100000004000002 | 0111 |
| 000100000004000004 | 0111 |
| 000100000004000010 | 0111 |
| 000100000004000020 | 0111 |
| 000100000004000030 | 0111 |
| 000100000020000040 | 0111 |
| 000100000020000100 | 1000 |
| 000100000020000003 | 1000 |
| 000100000020000000 | 1000 |
| 000100000020000200 | 1001 |
| 000100000020000300 | 1001 |
| 000100000020000400 | 1001 |
| 000100000020000001 | 1001 |
| 000100000030000100 | 1011 |
| 000100000030000003 | 1011 |
| 000100000030000000 | 1011 |
| 000100000030000200 | 1100 |
| 000100000030000300 | 1100 |
| 000100000030000400 | 1100 |
| 000100000030000001 | 1100 |
| 000100000040000002 | 1101 |
| 000100000040000004 | 1101 |
| 000100000040000010 | 1101 |
| 000100000040000020 | 1101 |
| 000100000040000030 | 1101 |
| 000100000040000040 | 1101 |
| 000100000040000100 | 1110 |
| 000100000040000003 | 1110 |
| 000100000040000000 | 1110 |
| 000100000040000200 | 1111 |
| 000100000040000300 | 1111 |
| 000100000040000400 | 1111 |
| 000100000040000001 | 1111 |
| 000100000003000000 | 0001 |
| 000100000003000003 | 0001 |
| 000100000003000001 | 0001 |
| 000100000200000002 | 0000 |
| 000100000200000004 | 0000 |
| 000100000200000010 | 0000 |

-continued

| Sequence of Code Symbols | x' |
|---|---|
| 000100000200000020 | 0000 |
| 000100000200000030 | 0000 |
| 000100000200000040 | 0000 |
| 000100000200000100 | 0001 |
| 000100000200000003 | 0001 |
| 000100000200000000 | 0001 |
| 000100000200000200 | 0010 |
| 000100000200000300 | 0010 |
| 000100000200000400 | 0010 |
| 000100000200000001 | 0010 |
| 000100000200001000 | 0011 |
| 000100000200003000 | 0011 |
| 000100000200002000 | 0100 |
| 000100000200004000 | 0100 |
| 000100000400000002 | 1010 |
| 000100000400000004 | 1010 |
| 000100000400000010 | 1010 |
| 000100000400000020 | 1010 |
| 000100000400000030 | 1010 |
| 000100000400000040 | 1010 |
| 000100000400000100 | 1011 |
| 000100000400000003 | 1011 |
| 000100000400000000 | 1011 |
| 000100000400000200 | 1100 |
| 000100000400000300 | 1100 |
| 000100000400000400 | 1100 |
| 000100000400000001 | 1100 |
| 000100000400001000 | 1101 |
| 000100000400003000 | 1101 |
| 000010000002000000 | 0000 |
| 000010000002000003 | 0000 |
| 000010000002000001 | 0000 |
| 000010000002000002 | 0001 |
| 000010000002000004 | 0001 |
| 000010000002000010 | 0001 |
| 000010000002000020 | 0001 |
| 000010000002000030 | 0001 |
| 000010000002000040 | 0001 |
| 000010000004000000 | 0010 |
| 000010000004000003 | 0010 |
| 000010000004000001 | 0010 |
| 000010000004000002 | 0011 |
| 000010000004000004 | 0011 |
| 000010000004000010 | 0011 |
| 000010000004000020 | 0011 |
| 000010000004000030 | 0011 |
| 000010000004000040 | 0011 |
| 000010000020000002 | 0111 |
| 000010000020000004 | 0111 |
| 000010000020000010 | 0111 |
| 000010000020000020 | 0111 |
| 000010000020000030 | 0111 |
| 000010000020000040 | 0111 |
| 000010000020000100 | 1000 |
| 000010000020000003 | 1000 |
| 000010000020001000 | 1000 |
| 000010000020000200 | 1001 |
| 000010000020000300 | 1001 |
| 000010000020000400 | 1001 |
| 000010000020000001 | 1001 |
| 000010000030000100 | 1011 |
| 000010000030000003 | 1011 |
| 000010000030000000 | 1011 |
| 000010000030000200 | 1100 |
| 000010000030000300 | 1100 |
| 000010000030000400 | 1100 |
| 000010000030000001 | 1100 |
| 000010000040000002 | 1101 |
| 000010000040000004 | 1101 |
| 000010000040000010 | 1101 |
| 000010000040000020 | 1101 |
| 000010000040000030 | 1101 |
| 000010000040000040 | 1101 |
| 000010000040000100 | 1110 |
| 000010000040000003 | 1110 |
| 000010000040000000 | 1110 |
| 000010000040000200 | 1111 |
| 000010000040000300 | 1111 |

-continued

| Sequence of Code Symbols | x' |
|---|---|
| 000010000040000400 | 1111 |
| 000010000040000001 | 1111 |
| 000010000003000000 | 0001 |
| 000010000003000003 | 0001 |
| 000010000003000001 | 0001 |
| 000200000002000000 | 0000 |
| 000200000002000003 | 0000 |
| 000200000002000001 | 0000 |
| 000200000002000002 | 0001 |
| 000200000002000004 | 0001 |
| 000200000002000010 | 0001 |
| 000200000002000020 | 0001 |
| 000200000002000030 | 0001 |
| 000200000002000040 | 0001 |
| 000200000004000000 | 0010 |
| 000200000004000003 | 0010 |
| 000200000004000001 | 0010 |
| 000200000004000002 | 0011 |
| 000200000004000004 | 0011 |
| 000200000004000010 | 0011 |
| 000200000004000020 | 0011 |
| 000200000004000030 | 0011 |
| 000200000004000040 | 0011 |
| 000200000020000002 | 0111 |
| 000200000020000004 | 0111 |
| 000200000020000010 | 0111 |
| 000200000020000020 | 0111 |
| 000200000020000030 | 0111 |
| 000200000020000040 | 0111 |
| 000200000020000100 | 1000 |
| 000200000020000003 | 1000 |
| 000200000020000000 | 1000 |
| 000200000020000200 | 1001 |
| 000200000020000300 | 1001 |
| 000200000020000400 | 1001 |
| 000200000020000001 | 1001 |
| 000200000030000100 | 1011 |
| 000200000030000003 | 1011 |
| 000200000030000000 | 1011 |
| 000200000030000200 | 1100 |
| 000200000030000300 | 1100 |
| 000200000030000400 | 1100 |
| 000200000030000001 | 1100 |
| 000200000040000002 | 1101 |
| 000200000040000004 | 1101 |
| 000200000040000010 | 1101 |
| 000200000040000020 | 1101 |
| 000200000040000030 | 1101 |
| 000200000040000040 | 1101 |
| 000200000040000100 | 1110 |
| 000200000040000003 | 1110 |
| 000200000040000000 | 1110 |
| 000200000040000200 | 1111 |
| 000200000040000300 | 1111 |
| 000200000040000400 | 1111 |
| 000200000040000001 | 1111 |
| 000200000003000000 | 0001 |
| 000200000003000003 | 0001 |
| 000200000003000001 | 0001 |
| 000200000200000002 | 0000 |
| 000200000200000004 | 0000 |
| 000200000200000010 | 0000 |
| 000200000200000020 | 0000 |
| 000200000200000030 | 0000 |
| 000200000200000040 | 0000 |
| 000200000200000100 | 0001 |
| 000200000200000003 | 0001 |
| 000200000200000000 | 0001 |
| 000200000200000200 | 0010 |
| 000200000200000300 | 0010 |
| 000200000200000400 | 0010 |
| 000200000200000001 | 0010 |
| 000200000200001000 | 0011 |
| 000200000200003000 | 0011 |
| 000200000200002000 | 0100 |
| 000200000200004000 | 0100 |
| 000200000400000002 | 1010 |
| 000200000400000004 | 1010 |

-continued

| Sequence of Code Symbols | x' |
|---|---|
| 000200000400000010 | 1010 |
| 000200000400000020 | 1010 |
| 000200000400000030 | 1010 |
| 000200000400000040 | 1010 |
| 000200000400000100 | 1011 |
| 000200000400000003 | 1011 |
| 000200000400000000 | 1011 |
| 000200000400000200 | 1100 |
| 000200000400000300 | 1100 |
| 000200000400000400 | 1100 |
| 000200000400000001 | 1100 |
| 000200000400001000 | 1101 |
| 000200000400003000 | 1101 |
| 000010000200000002 | 0000 |
| 000010000200000004 | 0000 |
| 000010000200000010 | 0000 |
| 000010000200000020 | 0000 |
| 000010000200000030 | 0000 |
| 000010000200000040 | 0000 |
| 000010000200000100 | 0001 |
| 000010000200000003 | 0001 |
| 000010000200000000 | 0001 |
| 000010000200000200 | 0010 |
| 000010000200000300 | 0010 |
| 000010000200000400 | 0010 |
| 000010000200000001 | 0010 |
| 000010000200001000 | 0011 |
| 000010000200003000 | 0011 |
| 000010000200002000 | 0100 |
| 000010000200004000 | 0100 |
| 000010000400000002 | 1010 |
| 000010000400000004 | 1010 |
| 000010000400000010 | 1010 |
| 000010000400000020 | 1010 |
| 000010000400000030 | 1010 |
| 000010000400000040 | 1010 |
| 000010000400000100 | 1011 |
| 000010000400000003 | 1011 |
| 000010000400000000 | 1011 |
| 000010000400000200 | 1100 |
| 000010000400000300 | 1100 |
| 000010000400000400 | 1100 |
| 000010000400000001 | 1100 |
| 000010000400001000 | 1101 |
| 000010000400003000 | 1101 |
| 000030000002000000 | 0000 |
| 000030000002000003 | 0000 |
| 000030000002000001 | 0000 |
| 000030000002000002 | 0001 |
| 000030000002000004 | 0001 |
| 000030000002000010 | 0001 |
| 000030000002000020 | 0001 |
| 000030000002000030 | 0001 |
| 000030000002000040 | 0001 |
| 000030000004000000 | 0010 |
| 000030000004000003 | 0010 |
| 000030000004000001 | 0010 |
| 000030000004000002 | 0011 |
| 000030000004000004 | 0011 |
| 000030000004000001 | 0011 |
| 000030000004000020 | 0011 |
| 000030000004000030 | 0011 |
| 000030000004000040 | 0011 |
| 000030000020000002 | 0111 |
| 000030000020000004 | 0111 |
| 000030000020000010 | 0111 |
| 000030000020000020 | 0111 |
| 000030000020000030 | 0111 |
| 000030000020000040 | 0111 |
| 000030000020000100 | 1000 |
| 000030000020000003 | 1000 |
| 000030000020000000 | 1000 |
| 000030000020000200 | 1001 |
| 000030000020000300 | 1001 |
| 000030000020000400 | 1001 |
| 000030000020000001 | 1001 |
| 000030000030000100 | 1011 |
| 000030000030000003 | 1011 |

-continued

| Sequence of Code Symbols | x' |
|---|---|
| 000030000030000000 | 1011 |
| 000030000030000200 | 1100 |
| 000030000030000300 | 1100 |
| 000030000030000400 | 1100 |
| 000030000030000001 | 1100 |
| 000030000040000002 | 1101 |
| 000030000040000004 | 1101 |
| 000030000040000010 | 1101 |
| 000030000040000020 | 1101 |
| 000030000040000030 | 1101 |
| 000030000040000040 | 1101 |
| 000030000040000100 | 1110 |
| 000030000040000003 | 1110 |
| 000030000040000000 | 1110 |
| 000030000040000200 | 1111 |
| 000030000040000300 | 1111 |
| 000030000040000400 | 1111 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1100 |
| 000400000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |
| 000400000040000030 | 1101 |
| 000400000040000040 | 1101 |
| 000400000040000100 | 1110 |
| 000400000040000003 | 1110 |
| 000400000040000000 | 1110 |
| 000400000040000200 | 1111 |
| 000400000040000300 | 1111 |
| 000400000040000400 | 1111 |
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0001 |

-continued

| Sequence of Code Symbols | x' |
|---|---|
| 000400000200000003 | 0001 |
| 000400000200000000 | 0001 |
| 000400000200000200 | 0010 |
| 000400000200000300 | 0010 |
| 000400000200000400 | 0010 |
| 000400000200001000 | 0011 |
| 000400000200003000 | 0011 |
| 000400000200002000 | 0100 |
| 000400000200004000 | 0100 |
| 000400000400000002 | 1010 |
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |
| 000030000003000000 | 0001 |
| 000030000003000003 | 0001 |
| 000030000003000001 | 0001 |
| 000030000200000002 | 0000 |
| 000030000200000004 | 0000 |
| 000030000200000010 | 0000 |
| 000030000200000020 | 0000 |
| 000030000200000030 | 0000 |
| 000030000200000040 | 0000 |
| 000030000200000100 | 0001 |
| 000030000200000003 | 0001 |
| 000030000200000000 | 0001 |
| 000030000200000200 | 0010 |
| 000030000200000300 | 0010 |
| 000030000200000400 | 0010 |
| 000030000200000001 | 0010 |
| 000030000200001000 | 0011 |
| 000030000200003000 | 0011 |
| 000030000200002000 | 0100 |
| 000030000200004000 | 0100 |
| 000030000400000002 | 1010 |
| 000030000400000004 | 1010 |
| 000030000400000010 | 1010 |
| 000030000400000020 | 1010 |
| 000030000400000030 | 1010 |
| 000030000400000040 | 1010 |
| 000030000400000100 | 1011 |
| 000030000400000003 | 1011 |
| 000030000400000000 | 1011 |
| 000030000400000200 | 1100 |
| 000030000400000300 | 1100 |
| 000030000400000400 | 1100 |
| 000030000400000001 | 1100 |
| 000030000400001000 | 1101 |
| 000030000400003000 | 1101 |
| 400000000020000002 | 0010 |
| 400000000020000004 | 0010 |
| 400000000020000010 | 0010 |
| 400000000020000020 | 0010 |
| 400000000020000030 | 0010 |
| 400000000020000040 | 0010 |
| 400000000020000100 | 0011 |
| 400000000020000003 | 0011 |
| 400000000020000000 | 0011 |
| 400000000020000200 | 0100 |
| 400000000020000300 | 0100 |
| 400000000020000400 | 0100 |
| 400000000020000001 | 0100 |
| 400000000020000002 | 1010 |
| 400000000020000004 | 1010 |
| 400000000020000010 | 1010 |
| 400000000020000020 | 1010 |
| 400000000020000030 | 1010 |
| 400000000020000040 | 1010 |

-continued

| Sequence of Code Symbols | x' |
|---|---|
| 400000000020000100 | 1011 |
| 400000000020000003 | 1011 |
| 400000000020000000 | 1011 |
| 400000000020000200 | 1100 |
| 400000000020000300 | 1100 |
| 400000000020000400 | 1100 |
| 400000000020000001 | 1100 |
| 400000000200000002 | 0010 |
| 400000000200000004 | 0010 |
| 400000000200000010 | 0010 |
| 400000000200000020 | 0010 |
| 400000000200000030 | 0010 |
| 400000000200000040 | 0010 |
| 400000000200000100 | 0011 |
| 400000000200000003 | 0011 |
| 400000000200000000 | 0011 |
| 400000000200000200 | 0100 |
| 400000000200000300 | 0100 |
| 400000000200000400 | 0100 |
| 400000000200000001 | 0100 |
| 400000000200001000 | 0101 |
| 400000000200003000 | 0101 |
| 400000000200002000 | 0110 |
| 400000000200004000 | 0110 |
| 400000000400000002 | 1001 |
| 400000000400000004 | 1001 |
| 400000000400000010 | 1001 |
| 400000000400000020 | 1001 |
| 400000000400000030 | 1001 |
| 400000000400000040 | 1001 |
| 400000000400000100 | 1010 |
| 400000000400000003 | 1010 |
| 400000000400000000 | 1010 |
| 400000000400000200 | 1011 |
| 400000000400000300 | 1011 |
| 400000000400000400 | 1011 |
| 400000000400000001 | 1011 |
| 400000000400001000 | 1100 |
| 400000000400003000 | 1100 |
| 400000000400002000 | 1101 |
| 400000000400004000 | 1101 |
| 400000000030000100 | 1110 |
| 400000000030000003 | 1110 |
| 400000000030000000 | 1110 |
| 400000000030000200 | 1111 |
| 400000000030000300 | 1111 |
| 400000000030000400 | 1111 |
| 400000000030000001 | 1111 |
| 200004000003000000 | 1100 |
| 200004000003000003 | 1100 |
| 200004000003000001 | 1100 |
| 200004000003000002 | 1101 |
| 200004000003000004 | 1101 |
| 200004000003000010 | 1101 |
| 200004000003000020 | 1101 |
| 200004000003000030 | 1101 |
| 200004000003000040 | 1101 |
| 200004000002000000 | 0000 |
| 200004000002000003 | 0000 |
| 200004000002000001 | 0000 |
| 200004000002000002 | 0001 |
| 200004000002000004 | 0001 |
| 200004000002000010 | 0001 |
| 200004000002000020 | 0001 |
| 200004000002000030 | 0001 |
| 200004000002000040 | 0001 |
| 200004000004000004 | 0011 |
| 200004000004000010 | 0011 |
| 200004000004000020 | 0011 |
| 200004000004000030 | 0011 |
| 200004000004000040 | 0011 |
| 200004000020000002 | 0111 |
| 200004000020000004 | 0111 |
| 200004000020000010 | 0111 |
| 200004000020000020 | 0111 |
| 200004000020000030 | 0111 |
| 200004000020000040 | 0111 |
| 200004000020000100 | 1000 |

-continued

| Sequence of Code Symbols | x' |
|---|---|
| 200004000020000003 | 1000 |
| 200004000020000000 | 1000 |
| 200004000020000200 | 1001 |
| 200004000020000300 | 1001 |
| 200004000020000400 | 1001 |
| 200004000020000001 | 1001 |
| 200004000030000100 | 1011 |
| 200004000030000003 | 1011 |
| 200004000030000000 | 1011 |
| 200004000030000200 | 1100 |
| 200004000030000300 | 1100 |
| 200004000030000400 | 1100 |
| 200004000030000001 | 1100 |
| 200004000040000002 | 1101 |
| 200004000040000004 | 1101 |
| 200004000040000010 | 1101 |
| 200004000040000020 | 1101 |
| 200004000040000030 | 1101 |
| 200004000040000040 | 1101 |
| 200004000040000100 | 1110 |
| 200004000040000003 | 1110 |
| 200004000040000000 | 1110 |
| 200004000040000200 | 1111 |
| 200004000040000300 | 1111 |
| 200004000040000400 | 1111 |
| 200004000040000001 | 1111 |
| 300001000003000000 | 1100 |
| 300001000003000003 | 1100 |
| 300001000003000001 | 1100 |
| 300001000003000002 | 1101 |
| 300001000003000004 | 1101 |
| 300001000003000010 | 1101 |
| 300001000003000020 | 1101 |
| 300001000003000030 | 1101 |
| 300001000003000040 | 1101 |
| 300001000002000000 | 0000 |
| 300001000002000003 | 0000 |
| 300001000002000001 | 0000 |
| 300001000002000002 | 0001 |
| 300001000002000004 | 0001 |
| 300001000002000010 | 0001 |
| 300001000002000020 | 0001 |
| 300001000002000030 | 0001 |
| 300001000002000040 | 0001 |
| 300001000004000000 | 0010 |
| 300001000004000003 | 0010 |
| 300001000004000001 | 0010 |
| 300001000004000002 | 0011 |
| 300001000004000004 | 0011 |
| 300001000004000010 | 0011 |
| 300001000004000020 | 0011 |
| 300001000004000030 | 0011 |
| 300001000004000040 | 0011 |
| 300001000020000004 | 0111 |
| 300001000020000010 | 0111 |
| 300001000020000020 | 0111 |
| 300001000020000030 | 0111 |
| 300001000020000040 | 0111 |
| 300001000020000100 | 1000 |
| 300001000020000003 | 1000 |
| 300001000020000000 | 1000 |
| 300001000020000200 | 1001 |
| 300001000020000300 | 1001 |
| 300001000020000400 | 1001 |
| 300001000020000001 | 1001 |
| 300001000030000100 | 1011 |
| 300001000030000003 | 1011 |
| 300001000030000000 | 1011 |
| 300001000030000200 | 1100 |
| 300001000030000300 | 1100 |
| 300001000030000400 | 1100 |
| 300001000030000001 | 1100 |
| 300001000040000002 | 1101 |
| 300001000040000004 | 1101 |
| 300001000040000010 | 1101 |
| 300001000040000020 | 1101 |
| 300001000040000030 | 1101 |
| 300001000040000040 | 1101 |

-continued

| Sequence of Code Symbols | x' |
|---|---|
| 300001000040000100 | 1110 |
| 300001000040000003 | 1110 |
| 300001000040000000 | 1110 |
| 300001000040000200 | 1111 |
| 300001000040000300 | 1111 |
| 300001000040000400 | 1111 |
| 300001000040000001 | 1111 |
| 300000000020000002 | 0010 |
| 300000000020000004 | 0010 |
| 300000000020000010 | 0010 |
| 300000000020000020 | 0010 |
| 300000000020000030 | 0010 |
| 300000000020000040 | 0010 |
| 300000000020000100 | 0011 |
| 300000000020000003 | 0011 |
| 300000000020000000 | 0011 |
| 300000000020000200 | 0100 |
| 300000000020000300 | 0100 |
| 300000000020000400 | 0100 |
| 300000000020000001 | 0100 |
| 300000000040000002 | 1010 |
| 300000000040000004 | 1010 |
| 300000000040000010 | 1010 |
| 300000000040000020 | 1010 |
| 300000000040000030 | 1010 |
| 300000000040000040 | 1010 |
| 300000000040000100 | 1011 |
| 300000000040000003 | 1011 |
| 300000000040000000 | 1011 |
| 300000000040000200 | 1100 |
| 300000000040000300 | 1100 |
| 300000000040000400 | 1100 |
| 300000000040000001 | 1100 |
| 300000000200000002 | 0010 |
| 300000000200000004 | 0010 |
| 300000000200000010 | 0010 |
| 300000000200000020 | 0010 |
| 300000000200000030 | 0010 |
| 300000000200000040 | 0010 |
| 300000000200000100 | 0011 |
| 300000000200000003 | 0011 |
| 300000000200000000 | 0011 |
| 300000000200000200 | 0100 |
| 300000000200000300 | 0100 |
| 300000000200000400 | 0100 |
| 300000000200000001 | 0100 |
| 300000000200001000 | 0101 |
| 300000000200003000 | 0101 |
| 300000000200002000 | 0110 |
| 300000000200004000 | 0110 |
| 300000000400000002 | 1001 |
| 300000000400000004 | 1001 |
| 300000000400000010 | 1001 |
| 300000000400000020 | 1001 |
| 300000000400000030 | 1001 |
| 300000000400000040 | 1001 |
| 300000000400000100 | 1010 |
| 300000000400000003 | 1010 |
| 300000000400000000 | 1010 |
| 300000000400000200 | 1011 |
| 300000000400000300 | 1011 |
| 300000000400000400 | 1011 |
| 300000000400000001 | 1011 |
| 300000000400001000 | 1100 |
| 300000000400003000 | 1100 |
| 300000000400002000 | 1101 |
| 300000000400004000 | 1101 |
| 300000000030000100 | 1110 |
| 300000000030000003 | 1110 |
| 300000000030000000 | 1110 |
| 300000000030000200 | 1111 |
| 300000000030000300 | 1111 |
| 300000000030000400 | 1111 |
| 300000000030000001 | 1111 |
| 200003000003000000 | 1100 |
| 200003000003000003 | 1100 |
| 200003000003000001 | 1100 |
| 200003000003000002 | 1101 |

-continued

| Sequence of Code Symbols | x' |
|---|---|
| 200003000003000004 | 1101 |
| 200003000003000010 | 1101 |
| 200003000003000020 | 1101 |
| 200003000003000030 | 1101 |
| 200003000003000040 | 1101 |
| 200003000002000000 | 0000 |
| 200003000002000003 | 0000 |
| 200003000002000001 | 0000 |
| 200003000002000002 | 0001 |
| 200003000002000004 | 0001 |
| 200003000002000010 | 0001 |
| 200003000002000020 | 0001 |
| 200003000002000030 | 0001 |
| 200003000002000040 | 0001 |
| 200003000004000000 | 0010 |
| 200003000004000003 | 0010 |
| 200003000004000001 | 0010 |
| 200003000004000002 | 0011 |
| 200003000004000004 | 0011 |
| 200003000004000010 | 0011 |
| 200003000004000020 | 0011 |
| 200003000004000030 | 0011 |
| 200003000004000040 | 0011 |
| 200003000020000002 | 0111 |
| 200003000020000004 | 0111 |
| 200003000020000010 | 0111 |
| 200003000020000020 | 0111 |
| 200003000020000030 | 0111 |
| 200003000020000040 | 0111 |
| 200003000020000100 | 1000 |
| 200003000020000003 | 1000 |
| 200003000020000000 | 1000 |
| 200003000020000200 | 1001 |
| 200003000020000300 | 1001 |
| 200003000020000400 | 1001 |
| 200003000020000001 | 1001 |
| 200003000030000100 | 1011 |
| 200003000030000003 | 1011 |
| 200003000030000000 | 1011 |
| 200003000030000200 | 1100 |
| 200003000030000300 | 1100 |
| 200003000030000400 | 1100 |
| 200003000030000001 | 1100 |
| 200003000040000002 | 1101 |
| 200003000040000004 | 1101 |
| 200003000040000010 | 1101 |
| 200003000040000020 | 1101 |
| 200003000040000030 | 1101 |
| 200003000040000040 | 1101 |
| 200003000040000100 | 1110 |
| 200003000040000003 | 1110 |
| 200003000040000000 | 1110 |
| 200003000040000200 | 1111 |
| 200003000040000300 | 1111 |
| 200003000040000400 | 1111 |
| 200003000040000001 | 1111 |
| 200002000003000000 | 1100 |
| 200002000003000003 | 1100 |
| 200002000003000001 | 1100 |
| 200002000003000002 | 1101 |
| 200002000003000004 | 1101 |
| 200002000003000010 | 1101 |
| 200002000003000020 | 1101 |
| 200002000003000030 | 1101 |
| 200002000003000040 | 1101 |
| 200002000002000000 | 0000 |
| 200002000002000003 | 0000 |
| 200002000002000001 | 0000 |
| 200002000002000002 | 0001 |
| 200002000002000004 | 0001 |
| 200002000002000010 | 0001 |
| 200002000002000020 | 0001 |
| 200002000002000030 | 0001 |
| 200002000002000040 | 0001 |
| 200002000004000000 | 0010 |
| 200002000004000003 | 0010 |
| 200002000004000001 | 0010 |
| 200002000004000002 | 0011 |

-continued

| Sequence of Code Symbols | x' |
|---|---|
| 2000020000004000004 | 0011 |
| 2000020000004000010 | 0011 |
| 2000020000004000020 | 0011 |
| 2000020000004000030 | 0011 |
| 2000020000004000040 | 0011 |
| 2000020000020000002 | 0111 |
| 2000020000020000004 | 0111 |
| 2000020000020000010 | 0111 |
| 2000020000020000020 | 0111 |
| 2000020000020000030 | 0111 |
| 2000020000020000040 | 0111 |
| 2000020000020000100 | 1000 |
| 2000020000020000003 | 1000 |
| 2000020000020000000 | 1000 |
| 2000020000020000200 | 1001 |
| 2000020000020000300 | 1001 |
| 2000020000020000400 | 1001 |
| 2000020000020000001 | 1001 |
| 2000020000030000100 | 1011 |
| 2000020000030000003 | 1011 |
| 2000020000030000000 | 1011 |
| 2000020000030000200 | 1100 |
| 2000020000030000300 | 1100 |
| 2000020000030000400 | 1100 |
| 2000020000040000002 | 1101 |
| 2000020000030000004 | 1101 |
| 2000020000030000010 | 1101 |
| 2000020000030000020 | 1101 |
| 2000020000030000030 | 1101 |
| 2000020000030000040 | 1101 |
| 2000020000030000100 | 1110 |
| 2000020000030000003 | 1110 |
| 2000020000030000000 | 1110 |
| 2000020000030000200 | 1111 |
| 2000020000030000300 | 1111 |
| 2000020000030000400 | 1111 |
| 2000020000030000001 | 1111 |
| 2000000000020000002 | 0010 |
| 2000000000020000004 | 0010 |
| 2000000000020000010 | 0010 |
| 2000000000020000020 | 0010 |
| 2000000000020000030 | 0010 |
| 2000000000020000040 | 0010 |
| 2000000000020000100 | 0011 |
| 2000000000020000003 | 0011 |
| 2000000000020000000 | 0011 |
| 2000000000020000200 | 0100 |
| 2000000000020000300 | 0100 |
| 2000000000020000400 | 0100 |
| 2000000000020000001 | 0100 |
| 2000000000040000002 | 1010 |
| 2000000000040000004 | 1010 |
| 2000000000040000010 | 1010 |
| 2000000000040000020 | 1010 |
| 2000000000040000030 | 1010 |
| 2000000000040000040 | 1010 |
| 2000000000040000100 | 1011 |
| 2000000000040000003 | 1011 |
| 2000000000040000000 | 1011 |
| 2000000000040000200 | 1100 |
| 2000000000040000300 | 1100 |
| 2000000000040000400 | 1100 |
| 2000000000040000001 | 1100 |
| 2000000000200000002 | 0010 |
| 2000000000200000004 | 0010 |
| 2000000000200000010 | 0010 |
| 2000000000200000020 | 0010 |
| 2000000000200000030 | 0010 |
| 2000000000200000040 | 0010 |
| 2000000000200000100 | 0011 |
| 2000000000200000003 | 0011 |
| 2000000000200000000 | 0011 |
| 2000000000200000200 | 0100 |
| 2000000000200000300 | 0100 |
| 2000000000200000400 | 0100 |
| 2000000000200000001 | 0100 |
| 2000000000200001000 | 0101 |
| 2000000000200003000 | 0101 |

-continued

| Sequence of Code Symbols | x' |
|---|---|
| 2000000000200002000 | 0110 |
| 2000000000200004000 | 0110 |
| 2000000000400000002 | 1001 |
| 2000000000400000004 | 1001 |
| 2000000000400000010 | 1001 |
| 2000000000400000020 | 1001 |
| 2000000000400000030 | 1001 |
| 2000000000400000040 | 1001 |
| 2000000000400000100 | 1010 |
| 2000000000400000003 | 1010 |
| 2000000000400000000 | 1010 |
| 2000000000400000200 | 1011 |
| 2000000000400000300 | 1011 |
| 2000000000400000400 | 1011 |
| 2000000000400000001 | 1011 |
| 2000000000400001000 | 1100 |
| 2000000000400003000 | 1100 |
| 2000000000400002000 | 1101 |
| 2000000000400004000 | 1101 |
| 2000000000030000100 | 1110 |
| 2000000000030000003 | 1110 |
| 2000000000030000000 | 1110 |
| 2000000000030000200 | 1111 |
| 2000000000030000300 | 1111 |
| 2000000000030000400 | 1111 |
| 2000000000030000001 | 1111 |
| 3000020000003000000 | 1100 |
| 3000020000003000003 | 1100 |
| 3000020000003000001 | 1100 |
| 3000020000003000002 | 1101 |
| 3000020000003000004 | 1101 |
| 3000020000003000010 | 1101 |
| 3000020000003000020 | 1101 |
| 3000020000003000030 | 1101 |
| 3000020000003000040 | 1101 |
| 3000020000002000000 | 0000 |
| 3000020000002000003 | 0000 |
| 3000020000002000001 | 0000 |
| 3000020000002000002 | 0001 |
| 3000020000002000004 | 0001 |
| 3000020000002000010 | 0001 |
| 3000020000002000020 | 0001 |
| 3000020000002000030 | 0001 |
| 3000020000002000040 | 0001 |
| 3000020000004000000 | 0010 |
| 3000020000004000003 | 0010 |
| 3000020000004000001 | 0010 |
| 3000020000004000002 | 0011 |
| 3000020000004000004 | 0011 |
| 3000020000004000010 | 0011 |
| 3000020000004000020 | 0011 |
| 3000020000004000030 | 0011 |
| 3000020000004000040 | 0011 |
| 3000020000020000002 | 0111 |
| 3000020000020000004 | 0111 |
| 3000020000020000010 | 0111 |
| 3000020000020000020 | 0111 |
| 3000020000020000030 | 0111 |
| 3000020000020000040 | 0111 |
| 3000020000020000100 | 1000 |
| 3000020000020000003 | 1000 |
| 3000020000020000000 | 1000 |
| 3000020000020000200 | 1001 |
| 3000020000020000300 | 1001 |
| 3000020000020000400 | 1001 |
| 3000020000020000001 | 1001 |
| 3000020000030000100 | 1011 |
| 3000020000030000003 | 1011 |
| 3000020000030000000 | 1011 |
| 3000020000030000200 | 1100 |
| 3000020000030000300 | 1100 |
| 3000020000030000400 | 1100 |
| 3000020000030000001 | 1100 |
| 3000020000040000002 | 1101 |
| 3000020000040000004 | 1101 |
| 3000020000040000010 | 1101 |
| 3000020000040000020 | 1101 |
| 3000020000040000030 | 1101 |

-continued

| Sequence of Code Symbols | x' |
|---|---|
| 300002000040000040 | 1101 |
| 300002000040000100 | 1110 |
| 300002000040000003 | 1110 |
| 300002000040000000 | 1110 |
| 300002000040000200 | 1111 |
| 300002000040000300 | 1111 |
| 300002000040000400 | 1111 |
| 300002000040000001 | 1111 |
| 300003000003000000 | 1100 |
| 300003000003000003 | 1100 |
| 300003000003000001 | 1100 |
| 300003000003000002 | 1101 |
| 300003000003000004 | 1101 |
| 300003000003000010 | 1101 |
| 300003000003000020 | 1101 |
| 300003000003000030 | 1101 |
| 300003000003000040 | 1101 |
| 300003000002000000 | 0000 |
| 300003000002000003 | 0000 |
| 300003000002000001 | 0000 |
| 300003000002000002 | 0001 |
| 300003000002000004 | 0001 |
| 300003000002000010 | 0001 |
| 300003000002000020 | 0001 |
| 300003000002000030 | 0001 |
| 300003000002000040 | 0001 |
| 300003000004000000 | 0010 |
| 300003000004000003 | 0010 |
| 300003000004000001 | 0010 |
| 300003000004000002 | 0011 |
| 300003000004000004 | 0011 |
| 300003000004000010 | 0011 |
| 300003000004000020 | 0011 |
| 300003000004000030 | 0011 |
| 300003000004000040 | 0011 |
| 300003000020000002 | 0111 |
| 300003000020000004 | 0111 |
| 300003000020000010 | 0111 |
| 300003000020000020 | 0111 |
| 300003000020000030 | 0111 |
| 300003000020000040 | 0111 |
| 300003000020000100 | 1000 |
| 300003000020000003 | 1000 |
| 300003000020000000 | 1000 |
| 300003000020000200 | 1001 |
| 300003000020000300 | 1001 |
| 300003000020000400 | 1001 |
| 300003000020000001 | 1001 |
| 300003000020000100 | 1011 |
| 300003000020000003 | 1011 |
| 300003000020000000 | 1011 |
| 300003000020000200 | 1100 |
| 300003000020000300 | 1100 |
| 300003000020000400 | 1100 |
| 300003000020000001 | 1100 |
| 300003000040000002 | 1101 |
| 300003000040000004 | 1101 |
| 300003000040000010 | 1101 |
| 300003000040000020 | 1101 |
| 300003000040000030 | 1101 |
| 300003000040000040 | 1101 |
| 300003000040000100 | 1110 |
| 300003000040000003 | 1110 |
| 300003000040000000 | 1110 |
| 300003000040000200 | 1111 |
| 300003000040000300 | 1111 |
| 300003000040000400 | 1111 |
| 300003000040000001 | 1111 |
| 100000000020000002 | 0010 |
| 100000000020000004 | 0010 |
| 100000000020000010 | 0010 |
| 100000000020000020 | 0010 |
| 100000000020000030 | 0010 |
| 100000000020000040 | 0010 |
| 100000000020000100 | 0011 |
| 100000000020000003 | 0011 |
| 100000000020000000 | 0011 |
| 100000000020000200 | 0100 |

-continued

| Sequence of Code Symbols | x' |
|---|---|
| 100000000020000300 | 0100 |
| 100000000020000400 | 0100 |
| 100000000020000001 | 0100 |
| 100000000040000002 | 1010 |
| 100000000040000004 | 1010 |
| 100000000040000010 | 1010 |
| 100000000040000020 | 1010 |
| 100000000040000030 | 1010 |
| 100000000040000040 | 1010 |
| 100000000040000100 | 1011 |
| 100000000040000003 | 1011 |
| 100000000040000000 | 1011 |
| 100000000040000200 | 1100 |
| 100000000040000300 | 1100 |
| 100000000040000400 | 1100 |
| 100000000040000001 | 1100 |
| 100000000020000002 | 0010 |
| 100000000020000004 | 0010 |
| 100000000020000010 | 0010 |
| 100000000020000020 | 0010 |
| 100000000020000030 | 0010 |
| 100000000020000040 | 0010 |
| 100000000020000100 | 0011 |
| 100000000020000003 | 0011 |
| 100000000020000000 | 0011 |
| 100000000020000200 | 0100 |
| 100000000020000300 | 0100 |
| 100000000020000400 | 0100 |
| 100000000020000001 | 0100 |
| 100000000020001000 | 0101 |
| 100000000020003000 | 0101 |
| 100000000020002000 | 0110 |
| 100000000020004000 | 0110 |
| 100000000040000002 | 1001 |
| 100000000040000004 | 1001 |
| 100000000040000010 | 1001 |
| 100000000040000020 | 1001 |
| 100000000040000030 | 1001 |
| 100000000040000040 | 1001 |
| 100000000040000100 | 1010 |
| 100000000040000003 | 1010 |
| 100000000040000000 | 1010 |
| 100000000040000200 | 1011 |
| 100000000040000300 | 1011 |
| 100000000040000400 | 1011 |
| 100000000040000001 | 1011 |
| 100000000040001000 | 1100 |
| 100000000040003000 | 1100 |
| 100000000040002000 | 1101 |
| 100000000040004000 | 1101 |
| 100000000003000100 | 1110 |
| 100000000003000003 | 1110 |
| 100000000003000000 | 1110 |
| 100000000003000200 | 1111 |
| 100000000003000300 | 1111 |
| 100000000003000400 | 1111 |
| 100000000003000001 | 1111 |
| 200001000003000000 | 1100 |
| 200001000003000003 | 1100 |
| 200001000003000001 | 1100 |
| 200001000003000002 | 1101 |
| 200001000003000004 | 1101 |
| 200001000003000010 | 1101 |
| 200001000003000020 | 1101 |
| 200001000003000030 | 1101 |
| 200001000003000040 | 1101 |
| 200001000002000002 | 0000 |
| 200001000002000003 | 0000 |
| 200001000002000001 | 0000 |
| 200001000002000002 | 0001 |
| 200001000002000004 | 0001 |
| 200001000002000010 | 0001 |
| 200001000002000020 | 0001 |
| 200001000002000030 | 0001 |
| 200001000002000040 | 0001 |
| 200001000004000000 | 0010 |
| 200001000004000003 | 0010 |
| 200001000004000001 | 0010 |

-continued

| Sequence of Code Symbols | x' |
|---|---|
| 200001000004000002 | 0011 |
| 200001000004000004 | 0011 |
| 200001000004000010 | 0011 |
| 200001000004000020 | 0011 |
| 200001000004000030 | 0011 |
| 200001000004000040 | 0011 |
| 200001000020000002 | 0111 |
| 200001000020000004 | 0111 |
| 200001000020000010 | 0111 |
| 200001000020000020 | 0111 |
| 200001000020000030 | 0111 |
| 200001000020000040 | 0111 |
| 200001000020000100 | 1000 |
| 200001000020000003 | 1000 |
| 200001000020000000 | 1000 |
| 200001000020000200 | 1001 |
| 200001000020000300 | 1001 |
| 200001000020000400 | 1001 |
| 200001000020000001 | 1001 |
| 200001000030000100 | 1001 |
| 200001000030000003 | 1011 |
| 200001000030000000 | 1011 |
| 200001000030000200 | 1100 |
| 200001000030000300 | 1100 |
| 200001000030000400 | 1100 |
| 200001000030000001 | 1100 |
| 200001000040000002 | 1101 |
| 200001000040000004 | 1101 |
| 200001000040000010 | 1101 |
| 200001000040000020 | 1101 |
| 200001000040000030 | 1101 |
| 200001000040000040 | 1101 |
| 200001000040000100 | 1110 |
| 200001000040000003 | 1110 |
| 200001000040000000 | 1110 |
| 200001000040000200 | 1111 |
| 200001000040000300 | 1111 |
| 200001000040000400 | 1111 |
| 200001000040000001 | 1111 |
| 300004000003000000 | 1100 |
| 300004000003000003 | 1100 |
| 300004000003000001 | 1100 |
| 300004000003000002 | 1101 |
| 300004000003000004 | 1101 |
| 300004000003000010 | 1101 |
| 300004000003000020 | 1101 |
| 300004000003000030 | 1101 |
| 300004000003000040 | 1101 |
| 300004000002000000 | 0000 |
| 300004000002000003 | 0000 |
| 300004000002000001 | 0000 |
| 300004000002000002 | 0001 |
| 300004000002000004 | 0001 |
| 300004000002000010 | 0001 |
| 300004000002000020 | 0001 |
| 300004000002000030 | 0001 |
| 300004000002000040 | 0001 |
| 300004000004000000 | 0010 |
| 300004000004000003 | 0010 |
| 300004000004000001 | 0010 |
| 300004000004000002 | 0011 |
| 300004000004000004 | 0011 |
| 300004000004000010 | 0011 |
| 300004000004000020 | 0011 |
| 300004000004000030 | 0011 |
| 300004000004000040 | 0011 |
| 300004000002000002 | 0111 |
| 300004000002000004 | 0111 |
| 300004000002000010 | 0111 |
| 300004000002000020 | 0111 |
| 300004000002000030 | 0111 |
| 300004000002000040 | 0111 |
| 300004000002000100 | 1000 |
| 300004000002000003 | 1000 |
| 300004000002000000 | 1000 |
| 300004000002000200 | 1001 |
| 300004000002000300 | 1001 |
| 300004000002000400 | 1001 |

-continued

| Sequence of Code Symbols | x' |
|---|---|
| 300004000002000001 | 1001 |
| 300004000003000100 | 1011 |
| 300004000003000003 | 1011 |
| 300004000003000000 | 1011 |
| 300004000003000200 | 1100 |
| 300004000003000300 | 1100 |
| 300004000003000400 | 1100 |
| 300004000003000001 | 1100 |
| 300004000003000002 | 1101 |
| 300004000003000004 | 1101 |
| 300004000003000010 | 1101 |
| 300004000003000020 | 1101 |
| 300004000003000030 | 1101 |
| 300004000003000040 | 1101 |
| 300004000003000100 | 1110 |
| 300004000003000003 | 1110 |
| 300004000003000000 | 1110 |
| 300004000003000200 | 1111 |
| 300004000003000300 | 1111 |
| 300004000003000400 | 1111 |
| 300004000003000001 | 1111 |
| 040000000020000002 | 0010 |
| 040000000020000004 | 0010 |
| 040000000020000010 | 0010 |
| 040000000020000020 | 0010 |
| 040000000020000030 | 0010 |
| 040000000020000040 | 0010 |
| 040000000020000100 | 0011 |
| 040000000020000003 | 0011 |
| 040000000020000000 | 0011 |
| 040000000020000200 | 0100 |
| 040000000020000300 | 0100 |
| 040000000020000400 | 0100 |
| 040000000020000001 | 0100 |
| 040000000040000002 | 1010 |
| 040000000040000004 | 1010 |
| 040000000040000010 | 1010 |
| 040000000040000020 | 1010 |
| 040000000040000030 | 1010 |
| 040000000040000040 | 1010 |
| 040000000040000100 | 1011 |
| 040000000040000003 | 1011 |
| 040000000040000000 | 1011 |
| 040000000040000200 | 1100 |
| 040000000040000300 | 1100 |
| 040000000040000400 | 1100 |
| 040000000040000001 | 1100 |
| 040000000200000002 | 0010 |
| 040000000200000004 | 0010 |
| 040000000200000010 | 0010 |
| 040000000200000020 | 0010 |
| 040000000200000030 | 0010 |
| 040000000200000040 | 0010 |
| 040000000200000100 | 0011 |
| 040000000200000003 | 0011 |
| 040000000200000000 | 0011 |
| 040000000200000200 | 0100 |
| 040000000200000300 | 0100 |
| 040000000200000400 | 0100 |
| 040000000200000001 | 0100 |
| 040000000200001000 | 0101 |
| 040000000200003000 | 0101 |
| 040000000200002000 | 0110 |
| 040000000200004000 | 0110 |
| 040000000400000002 | 1001 |
| 040000000400000004 | 1001 |
| 040000000400000010 | 1001 |
| 040000000400000020 | 1001 |
| 040000000400000030 | 1001 |
| 040000000400000040 | 1001 |
| 040000000400000100 | 1010 |
| 040000000400000003 | 1010 |
| 040000000400000000 | 1010 |
| 040000000400000200 | 1011 |
| 040000000400000300 | 1011 |
| 040000000400000400 | 1011 |
| 040000000400000001 | 1011 |
| 040000000400001000 | 1100 |

| Sequence of Code Symbols | x' |
|---|---|
| 040000000400003000 | 1100 |
| 040000000400002000 | 1101 |
| 040000000400004000 | 1101 |
| 040000000300000100 | 1110 |
| 040000000300000003 | 1110 |
| 040000000300000000 | 1110 |
| 040000000300000200 | 1111 |
| 040000000300000300 | 1111 |
| 040000000300000400 | 1111 |
| 040000000300000001 | 1111 |
| 100004000003000000 | 1100 |
| 100004000003000003 | 1100 |
| 100004000003000001 | 1100 |
| 100004000003000002 | 1101 |
| 100004000003000004 | 1101 |
| 100004000003000010 | 1101 |
| 100004000003000020 | 1101 |
| 100004000003000030 | 1101 |
| 100004000003000040 | 1101 |
| 100004000002000000 | 0000 |
| 100004000002000003 | 0000 |
| 100004000002000001 | 0000 |
| 100004000002000002 | 0001 |
| 100004000002000004 | 0001 |
| 100004000002000010 | 0001 |
| 100004000002000020 | 0001 |
| 100004000002000030 | 0001 |
| 100004000002000040 | 0001 |
| 100004000004000000 | 0010 |
| 100004000004000003 | 0010 |
| 100004000004000001 | 0010 |
| 100004000004000002 | 0011 |
| 100004000004000004 | 0011 |
| 100004000004000010 | 0011 |
| 100004000004000020 | 0011 |
| 100004000004000030 | 0011 |
| 100004000004000040 | 0011 |
| 100004000020000002 | 0111 |
| 100004000020000004 | 0111 |
| 100004000020000010 | 0111 |
| 100004000020000020 | 0111 |
| 100004000020000030 | 0111 |
| 100004000020000040 | 0111 |
| 100004000020000100 | 1000 |
| 100004000020000003 | 1000 |
| 100004000020000000 | 1000 |
| 100004000020000200 | 1001 |
| 100004000020000300 | 1001 |
| 100004000020000400 | 1001 |
| 100004000020000001 | 1001 |
| 100004000030000100 | 1011 |
| 100004000030000003 | 1011 |
| 100004000030000000 | 1011 |
| 100004000030000200 | 1100 |
| 100004000030000300 | 1100 |
| 100004000030000400 | 1100 |
| 100004000030000001 | 1100 |
| 100004000040000002 | 1101 |
| 100004000040000004 | 1101 |
| 100004000040000010 | 1101 |
| 100004000040000020 | 1101 |
| 100004000040000030 | 1101 |
| 100004000040000040 | 1101 |
| 100004000040000100 | 1110 |
| 100004000040000003 | 1110 |
| 100004000040000000 | 1110 |
| 100004000040000200 | 1111 |
| 100004000040000300 | 1111 |
| 100004000040000400 | 1111 |
| 100004000040000001 | 1111 |
| 400001000003000000 | 1100 |
| 400001000003000003 | 1100 |
| 400001000003000001 | 1100 |
| 400001000003000002 | 1101 |
| 400001000003000004 | 1101 |
| 400001000003000010 | 1101 |
| 400001000003000020 | 1101 |
| 400001000003000030 | 1101 |

| Sequence of Code Symbols | x' |
|---|---|
| 400001000003000040 | 1101 |
| 400001000002000000 | 0000 |
| 400001000002000003 | 0000 |
| 400001000002000001 | 0000 |
| 400001000002000002 | 0001 |
| 400001000002000004 | 0001 |
| 400001000002000010 | 0001 |
| 400001000002000020 | 0001 |
| 400001000002000030 | 0001 |
| 400001000002000040 | 0001 |
| 400001000004000000 | 0010 |
| 400001000004000003 | 0010 |
| 400001000004000001 | 0010 |
| 400001000004000002 | 0011 |
| 400001000004000004 | 0011 |
| 400001000004000010 | 0011 |
| 400001000004000020 | 0011 |
| 400001000004000030 | 0011 |
| 400001000004000040 | 0011 |
| 400001000004000040 | 0011 |
| 400001000020000002 | 0111 |
| 400001000020000004 | 0111 |
| 400001000020000010 | 0111 |
| 400001000020000020 | 0111 |
| 400001000020000030 | 0111 |
| 400001000020000040 | 0111 |
| 400001000020000100 | 1000 |
| 400001000020000003 | 1000 |
| 400001000020000000 | 1000 |
| 400001000020000200 | 1001 |
| 400001000020000300 | 1001 |
| 400001000020000400 | 1001 |
| 400001000020000001 | 1001 |
| 400001000030000100 | 1011 |
| 400001000030000003 | 1011 |
| 400001000030000000 | 1011 |
| 400001000030000200 | 1100 |
| 400001000030000300 | 1100 |
| 400001000030000400 | 1100 |
| 400001000030000001 | 1100 |
| 400001000040000002 | 1101 |
| 400001000040000004 | 1101 |
| 400001000040000010 | 1101 |
| 400001000040000020 | 1101 |
| 400001000040000030 | 1101 |
| 400001000040000040 | 1101 |
| 400001000040000100 | 1110 |
| 400001000040000003 | 1110 |
| 400001000040000000 | 1110 |
| 400001000040000200 | 1111 |
| 400001000040000300 | 1111 |
| 400001000040000400 | 1111 |
| 400001000040000001 | 1111 |
| 030000000020000002 | 0010 |
| 030000000020000004 | 0010 |
| 030000000020000010 | 0010 |
| 030000000020000020 | 0010 |
| 030000000020000030 | 0010 |
| 030000000020000040 | 0010 |
| 030000000020000100 | 0011 |
| 030000000020000003 | 0011 |
| 030000000020000000 | 0011 |
| 030000000020000200 | 0100 |
| 030000000020000300 | 0100 |
| 030000000020000400 | 0100 |
| 030000000020000001 | 0100 |
| 030000000040000002 | 1010 |
| 030000000040000004 | 1010 |
| 030000000040000010 | 1010 |
| 030000000040000020 | 1010 |
| 030000000040000030 | 1010 |
| 030000000040000040 | 1010 |
| 030000000040000100 | 1011 |
| 030000000040000003 | 1011 |
| 030000000040000000 | 1011 |
| 030000000040000200 | 1100 |
| 030000000040000300 | 1100 |
| 030000000040000400 | 1100 |

-continued

| Sequence of Code Symbols | x' |
|---|---|
| 030000000040000001 | 1100 |
| 030000000200000002 | 0010 |
| 030000000200000004 | 0010 |
| 030000000200000010 | 0010 |
| 030000000200000020 | 0010 |
| 030000000200000030 | 0010 |
| 030000000200000040 | 0010 |
| 030000000200000100 | 0011 |
| 030000000200000003 | 0011 |
| 030000000200000000 | 0011 |
| 030000000200000200 | 0100 |
| 030000000200000300 | 0100 |
| 030000000200000400 | 0100 |
| 030000000200000001 | 0100 |
| 030000000200001000 | 0101 |
| 030000000200003000 | 0101 |
| 030000000200002000 | 0110 |
| 030000000200004000 | 0110 |
| 030000000400000000 | 1001 |
| 030000000400000004 | 1001 |
| 030000000400000010 | 1001 |
| 030000000400000020 | 1001 |
| 030000000400000030 | 1001 |
| 030000000400000040 | 1001 |
| 030000000400000100 | 1010 |
| 030000000400000003 | 1010 |
| 030000000400000000 | 1010 |
| 030000000400000200 | 1011 |
| 030000000400000300 | 1011 |
| 030000000400000400 | 1011 |
| 030000000400000001 | 1011 |
| 030000000400001000 | 1100 |
| 030000000400003000 | 1100 |
| 030000000400002000 | 1101 |
| 030000000400004000 | 1101 |
| 030000000030000100 | 1110 |
| 030000000030000003 | 1110 |
| 030000000030000000 | 1110 |
| 030000000030000200 | 1111 |
| 030000000030000300 | 1111 |
| 030000000030000400 | 1111 |
| 030000000030000001 | 1111 |
| 100001000003000000 | 1100 |
| 100001000003000003 | 1100 |
| 100001000003000001 | 1100 |
| 100001000003000002 | 1101 |
| 100001000003000004 | 1101 |
| 100001000003000010 | 1101 |
| 100001000003000020 | 1101 |
| 100001000003000030 | 1101 |
| 100001000003000040 | 1101 |
| 100001000002000000 | 0000 |
| 100001000002000003 | 0000 |
| 100001000002000001 | 0000 |
| 100001000002000002 | 0001 |
| 100001000002000004 | 0001 |
| 100001000002000010 | 0001 |
| 100001000002000020 | 0001 |
| 100001000002000030 | 0001 |
| 100001000002000040 | 0001 |
| 100001000004000000 | 0010 |
| 100001000004000003 | 0010 |
| 100001000004000001 | 0010 |
| 100001000004000002 | 0011 |
| 100001000004000004 | 0011 |
| 100001000004000010 | 0011 |
| 100001000004000020 | 0011 |
| 100001000004000030 | 0011 |
| 100001000004000040 | 0011 |
| 100001000020000002 | 0111 |
| 100001000020000004 | 0111 |
| 100001000020000010 | 0111 |
| 100001000020000020 | 0111 |
| 100001000020000030 | 0111 |
| 100001000020000040 | 0111 |
| 100001000020000100 | 1000 |
| 100001000020000003 | 1000 |
| 100001000020000000 | 1000 |

-continued

| Sequence of Code Symbols | x' |
|---|---|
| 100001000020000200 | 1001 |
| 100001000020000300 | 1001 |
| 100001000020000400 | 1001 |
| 100001000020000001 | 1001 |
| 100001000030000100 | 1011 |
| 100001000030000003 | 1011 |
| 100001000030000000 | 1011 |
| 100001000030000200 | 1100 |
| 100001000030000300 | 1100 |
| 100001000030000400 | 1100 |
| 100001000030000001 | 1100 |
| 100001000040000002 | 1101 |
| 100001000040000004 | 1101 |
| 100001000040000010 | 1101 |
| 100001000040000020 | 1101 |
| 100001000040000030 | 1101 |
| 100001000040000040 | 1101 |
| 100001000040000100 | 1110 |
| 100001000040000003 | 1110 |
| 100001000040000000 | 1110 |
| 100001000040000200 | 1111 |
| 100001000040000300 | 1111 |
| 100001000040000400 | 1111 |
| 100001000040000001 | 1111 |
| 400002000003000000 | 1100 |
| 400002000003000003 | 1100 |
| 400002000003000001 | 1100 |
| 400002000003000002 | 1101 |
| 400002000003000004 | 1101 |
| 400002000003000010 | 1101 |
| 400002000003000020 | 1101 |
| 400002000003000030 | 1101 |
| 400002000003000040 | 1101 |
| 400002000002000000 | 0000 |
| 400002000002000003 | 0000 |
| 400002000002000001 | 0000 |
| 400002000002000002 | 0001 |
| 400002000002000004 | 0001 |
| 400002000002000010 | 0001 |
| 400002000002000020 | 0001 |
| 400002000002000030 | 0001 |
| 400002000002000040 | 0001 |
| 400002000004000000 | 0010 |
| 400002000004000003 | 0010 |
| 400002000004000001 | 0010 |
| 400002000004000002 | 0011 |
| 400002000004000004 | 0011 |
| 400002000004000010 | 0011 |
| 400002000004000020 | 0011 |
| 400002000004000030 | 0011 |
| 400002000004000040 | 0011 |
| 400002000020000002 | 0111 |
| 400002000020000004 | 0111 |
| 400002000020000010 | 0111 |
| 400002000020000020 | 0111 |
| 400002000020000030 | 0111 |
| 400002000020000040 | 0111 |
| 400002000020000100 | 1000 |
| 400002000020000003 | 1000 |
| 400002000020000000 | 1000 |
| 400002000020000200 | 1001 |
| 400002000020000300 | 1001 |
| 400002000020000400 | 1001 |
| 400002000020000001 | 1001 |
| 400002000030000100 | 1011 |
| 400002000030000003 | 1011 |
| 400002000030000000 | 1011 |
| 400002000030000200 | 1100 |
| 400002000030000300 | 1100 |
| 400002000030000400 | 1100 |
| 400002000030000001 | 1100 |
| 400002000040000002 | 1101 |
| 400002000040000004 | 1101 |
| 400002000040000010 | 1101 |
| 400002000040000020 | 1101 |
| 400002000040000030 | 1101 |
| 400002000040000040 | 1101 |
| 400002000040000100 | 1110 |

-continued

| Sequence of Code Symbols | x' |
|---|---|
| 40000200004000003 | 1110 |
| 40000200004000200 | 1111 |
| 40000200004000300 | 1111 |
| 40000200004000400 | 1111 |
| 40000200004000001 | 1111 |
| 02000000020000002 | 0010 |
| 02000000020000004 | 0010 |
| 02000000020000010 | 0010 |
| 02000000020000020 | 0010 |
| 02000000020000030 | 0010 |
| 02000000020000040 | 0010 |
| 02000000020000100 | 0011 |
| 02000000020000003 | 0011 |
| 02000000020000000 | 0011 |
| 02000000020000200 | 0100 |
| 02000000020000300 | 0100 |
| 02000000020000400 | 0100 |
| 02000000020000001 | 0100 |
| 02000000040000002 | 1010 |
| 02000000040000004 | 1010 |
| 02000000040000010 | 1010 |
| 02000000040000020 | 1010 |
| 02000000040000030 | 1010 |
| 02000000040000040 | 1010 |
| 02000000040000100 | 1011 |
| 02000000040000003 | 1011 |
| 02000000040000000 | 1011 |
| 02000000040000200 | 1100 |
| 02000000040000300 | 1100 |
| 02000000040000400 | 1100 |
| 02000000040000001 | 1100 |
| 02000000200000002 | 0010 |
| 02000000200000004 | 0010 |
| 02000000200000010 | 0010 |
| 02000000200000020 | 0010 |
| 02000000200000030 | 0010 |
| 02000000200000040 | 0010 |
| 02000000200000100 | 0011 |
| 02000000200000003 | 0011 |
| 02000000200000000 | 0011 |
| 02000000200000200 | 0100 |
| 02000000200000300 | 0100 |
| 02000000200000400 | 0100 |
| 02000000200000001 | 0100 |
| 02000000200001000 | 0101 |
| 02000000200003000 | 0101 |
| 02000000200002000 | 0110 |
| 02000000200004000 | 0110 |
| 02000000400000002 | 1001 |
| 02000000400000004 | 1001 |
| 02000000400000010 | 1001 |
| 02000000400000020 | 1001 |
| 02000000400000030 | 1001 |
| 02000000400000040 | 1001 |
| 02000000400000100 | 1010 |
| 02000000400000003 | 1010 |
| 02000000400000000 | 1010 |
| 02000000400000200 | 1011 |
| 02000000400000300 | 1011 |
| 02000000400000400 | 1011 |
| 02000000400000001 | 1011 |
| 02000000400001000 | 1100 |
| 02000000400003000 | 1100 |
| 02000000400002000 | 1101 |
| 02000000400004000 | 1101 |
| 02000000030000100 | 1110 |
| 02000000030000003 | 1110 |
| 02000000030000000 | 1110 |
| 02000000030000200 | 1110 |
| 02000000030000300 | 1111 |
| 02000000030000400 | 1111 |
| 02000000030000001 | 1111 |
| 10000300000300000 | 1100 |
| 10000300000300002 | 1101 |
| 10000300000300004 | 1101 |
| 10000300000300010 | 1101 |
| 10000300000300020 | 1101 |
| 10000300000300030 | 1101 |

-continued

| Sequence of Code Symbols | x' |
|---|---|
| 10000300000300040 | 1101 |
| 10000300000200000 | 0000 |
| 10000300000200003 | 0000 |
| 10000300000200001 | 0000 |
| 10000300000200002 | 0001 |
| 10000300000200004 | 0001 |
| 10000300000200010 | 0001 |
| 10000300000200020 | 0001 |
| 10000300000200030 | 0001 |
| 10000300000200040 | 0001 |
| 10000300000400000 | 0010 |
| 10000300000400003 | 0010 |
| 10000300000400001 | 0010 |
| 10000300000400002 | 0011 |
| 10000300000400004 | 0011 |
| 10000300000400010 | 0011 |
| 10000300000400020 | 0011 |
| 10000300000400030 | 0011 |
| 10000300000400040 | 0011 |
| 10000300002000002 | 0111 |
| 10000300002000004 | 0111 |
| 10000300002000010 | 0111 |
| 10000300002000020 | 0111 |
| 10000300002000030 | 0111 |
| 10000300002000040 | 0111 |
| 10000300002000100 | 1000 |
| 10000300002000003 | 1000 |
| 10000300002000000 | 1000 |
| 10000300002000200 | 1001 |
| 10000300002000300 | 1001 |
| 10000300002000400 | 1001 |
| 10000300002000001 | 1001 |
| 10000300003000100 | 1011 |
| 10000300003000003 | 1011 |
| 10000300003000000 | 1011 |
| 10000300003000200 | 1100 |
| 10000300003000300 | 1100 |
| 10000300003000400 | 1100 |
| 10000300003000001 | 1100 |
| 10000300004000002 | 1101 |
| 10000300004000004 | 1101 |
| 10000300004000010 | 1101 |
| 10000300004000020 | 1101 |
| 10000300004000030 | 1101 |
| 10000300004000040 | 1101 |
| 10000300004000100 | 1110 |
| 10000300004000003 | 1110 |
| 10000300004000000 | 1110 |
| 10000300004000200 | 1111 |
| 10000300004000300 | 1111 |
| 10000300004000400 | 1111 |
| 10000300004000001 | 1111 |
| 40000300000300000 | 1100 |
| 40000300000300003 | 1100 |
| 40000300000300001 | 1100 |
| 40000300000300002 | 1101 |
| 40000300000300004 | 1101 |
| 40000300000300010 | 1101 |
| 40000300000300020 | 1101 |
| 40000300000300030 | 1101 |
| 40000300000300040 | 1101 |
| 40000300000200000 | 0000 |
| 40000300000200003 | 0000 |
| 40000300000200001 | 0000 |
| 40000300000200002 | 0001 |
| 40000300000200004 | 0001 |
| 40000300000200010 | 0001 |
| 40000300000200020 | 0001 |
| 40000300000200030 | 0001 |
| 40000300000200040 | 0001 |
| 40000300000400000 | 0010 |
| 40000300000400003 | 0010 |
| 40000300000400001 | 0010 |
| 40000300000400002 | 0011 |
| 40000300000400004 | 0011 |
| 40000300000400010 | 0011 |
| 40000300000400020 | 0011 |
| 40000300000400030 | 0011 |

-continued

| Sequence of Code Symbols | x' |
|---|---|
| 400003000004000040 | 0011 |
| 400003000020000002 | 0111 |
| 400003000020000004 | 0111 |
| 400003000020000010 | 0111 |
| 400003000020000020 | 0111 |
| 400003000020000030 | 0111 |
| 400003000020000040 | 0111 |
| 400003000020000100 | 1000 |
| 400003000020000003 | 1000 |
| 400003000020000000 | 1000 |
| 400003000020000200 | 1001 |
| 400003000020000300 | 1001 |
| 400003000020000400 | 1001 |
| 400003000020000001 | 1001 |
| 400003000030000100 | 1011 |
| 400003000030000003 | 1011 |
| 400003000030000000 | 1011 |
| 400003000030000200 | 1100 |
| 400003000030000300 | 1100 |
| 400003000030000400 | 1100 |
| 400003000030000001 | 1100 |
| 400003000040000002 | 1101 |
| 400003000040000004 | 1101 |
| 400003000040000010 | 1101 |
| 400003000040000020 | 1101 |
| 400003000040000030 | 1101 |
| 400003000040000040 | 1101 |
| 400003000040000100 | 1110 |
| 400003000040000003 | 1110 |
| 400003000040000000 | 1110 |
| 400003000040000200 | 1111 |
| 400003000040000300 | 1111 |
| 400003000040000400 | 1111 |
| 400003000040000001 | 1111 |
| 010000000020000002 | 0010 |
| 010000000020000004 | 0010 |
| 010000000020000010 | 0010 |
| 010000000020000020 | 0010 |
| 010000000020000030 | 0010 |
| 010000000020000040 | 0010 |
| 010000000020000100 | 0011 |
| 010000000020000003 | 0011 |
| 010000000020000000 | 0011 |
| 010000000020000200 | 0100 |
| 010000000020000300 | 0100 |
| 010000000020000400 | 0100 |
| 010000000020000001 | 0100 |
| 010000000040000002 | 1010 |
| 010000000040000004 | 1010 |
| 010000000040000010 | 1010 |
| 010000000040000020 | 1010 |
| 010000000040000030 | 1010 |
| 010000000040000040 | 1010 |
| 010000000040000100 | 1011 |
| 010000000040000003 | 1011 |
| 010000000040000003 | 1011 |
| 010000000040000000 | 1011 |
| 010000000040000200 | 1100 |
| 010000000040000300 | 1100 |
| 010000000040000400 | 1100 |
| 010000000040000001 | 1100 |
| 010000000200000002 | 0010 |
| 010000000200000004 | 0010 |
| 010000000200000010 | 0010 |
| 010000000200000020 | 0010 |
| 010000000200000030 | 0010 |
| 010000000200000040 | 0010 |
| 010000000200000100 | 0011 |
| 010000000200000003 | 0011 |
| 010000000200000000 | 0011 |
| 010000000200000200 | 0100 |
| 010000000200000300 | 0100 |
| 010000000200000400 | 0100 |
| 010000000200000001 | 0100 |
| 010000000200001000 | 0101 |
| 010000000200003000 | 0110 |
| 010000000200002000 | 0110 |
| 010000000200004000 | 0110 |

-continued

| Sequence of Code Symbols | x' |
|---|---|
| 010000000400000002 | 1001 |
| 010000000400000004 | 1001 |
| 010000000400000010 | 1001 |
| 010000000400000020 | 1001 |
| 010000000400000030 | 1001 |
| 010000000400000040 | 1001 |
| 010000000400000100 | 1010 |
| 010000000400000003 | 1010 |
| 010000000400000000 | 1010 |
| 010000000400000200 | 1011 |
| 010000000400000300 | 1011 |
| 010000000400000400 | 1011 |
| 010000000400000001 | 1011 |
| 010000000400001000 | 1100 |
| 010000000400003000 | 1100 |
| 010000000400002000 | 1101 |
| 010000000400004000 | 1101 |
| 010000000030000100 | 1110 |
| 010000000030000003 | 1110 |
| 010000000030000000 | 1110 |
| 010000000030000200 | 1111 |
| 010000000030000300 | 1111 |
| 010000000030000400 | 1111 |
| 010000000030000001 | 1111 |
| 100002000003000000 | 1100 |
| 100002000003000003 | 1100 |
| 100002000003000001 | 1100 |
| 100002000003000002 | 1101 |
| 100002000003000004 | 1101 |
| 100002000003000010 | 1101 |
| 100002000003000020 | 1101 |
| 100002000003000030 | 1101 |
| 100002000003000040 | 1101 |
| 100002000002000000 | 0000 |
| 100002000002000003 | 0000 |
| 100002000002000001 | 0000 |
| 100002000002000002 | 0001 |
| 100002000002000004 | 0001 |
| 100002000002000010 | 0001 |
| 100002000002000020 | 0001 |
| 100002000002000030 | 0001 |
| 100002000002000040 | 0001 |
| 100002000002000000 | 0010 |
| 100002000002000003 | 0010 |
| 100002000002000001 | 0010 |
| 100002000002000002 | 0011 |
| 100002000002000004 | 0011 |
| 100002000002000010 | 0011 |
| 100002000002000020 | 0011 |
| 100002000002000030 | 0011 |
| 100002000002000040 | 0011 |
| 100002000020000002 | 0111 |
| 100002000020000004 | 0111 |
| 100002000020000010 | 0111 |
| 100002000020000020 | 0111 |
| 100002000020000030 | 0111 |
| 100002000020000040 | 0111 |
| 100002000020000100 | 1000 |
| 100002000020000003 | 1000 |
| 100002000020000000 | 1000 |
| 100002000020000200 | 1001 |
| 100002000020000300 | 1001 |
| 100002000020000400 | 1001 |
| 100002000020000001 | 1001 |
| 100002000030000100 | 1011 |
| 100002000030000003 | 1011 |
| 100002000030000000 | 1011 |
| 100002000030000200 | 1100 |
| 100002000030000300 | 1100 |
| 100002000030000400 | 1100 |
| 100002000030000001 | 1100 |
| 100002000040000002 | 1101 |
| 100002000040000004 | 1101 |
| 100002000040000010 | 1101 |
| 100002000040000020 | 1101 |
| 100002000040000030 | 1101 |
| 100002000040000100 | 1101 |
| 100002000040000003 | 1110 |

-continued

| Sequence of Code Symbols | x' |
|---|---|
| 100002000040000000 | 1110 |
| 100002000040000200 | 1111 |
| 100002000040000300 | 1111 |
| 100002000040000400 | 1111 |
| 100002000040000001 | 1111 |
| 400004000003000000 | 1100 |
| 400004000003000003 | 1100 |
| 400004000003000001 | 1100 |
| 400004000003000002 | 1101 |
| 400004000003000004 | 1101 |
| 400004000003000010 | 1101 |
| 400004000003000020 | 1101 |
| 400004000003000030 | 1101 |
| 400004000003000040 | 1101 |
| 400004000002000000 | 0000 |
| 400004000002000003 | 0000 |
| 400004000002000001 | 0000 |
| 400004000002000002 | 0001 |
| 400004000002000004 | 0001 |
| 400004000002000010 | 0001 |
| 400004000002000020 | 0001 |
| 400004000002000030 | 0001 |
| 400004000002000040 | 0001 |
| 400004000004000000 | 0010 |
| 400004000004000003 | 0010 |
| 400004000004000001 | 001 |
| 400004000004000002 | 0011 |
| 400004000004000004 | 0011 |
| 400004000004000010 | 0011 |
| 400004000004000020 | 0011 |
| 400004000004000030 | 0011 |
| 400004000004000040 | 0011 |
| 400004000020000002 | 0111 |
| 400004000020000004 | 0111 |
| 400004000020000010 | 0111 |
| 400004000020000020 | 0111 |
| 400004000020000030 | 0111 |
| 400004000020000040 | 0111 |
| 400004000020000100 | 1000 |
| 400004000020000003 | 1000 |
| 400004000020000000 | 1000 |
| 400004000020000200 | 1001 |
| 400004000020000300 | 1001 |
| 400004000020000400 | 1001 |
| 400004000020000001 | 1001 |
| 400004000030000100 | 1011 |
| 400004000030000003 | 1011 |
| 400004000030000000 | 1011 |
| 400004000030000200 | 1100 |
| 400004000030000300 | 1100 |
| 400004000030000400 | 1100 |
| 400004000030000001 | 1100 |
| 400004000040000002 | 1101 |
| 400004000040000004 | 1101 |
| 400004000040000010 | 1101 |
| 400004000040000020 | 1101 |
| 400004000040000030 | 1101 |
| 400004000040000040 | 1101 |
| 400004000040000100 | 1110 |
| 400004000040000003 | 1110 |
| 400004000040000000 | 1110 |
| 400004000040000200 | 1111 |
| 400004000040000300 | 1111 |
| 400004000040000400 | 1111 |
| 400004000040000001 | 1111 |
| 000030000003000000 | 0001 |
| 000030000003000003 | 0001 |
| 000030000003000001 | 0001 |
| 000030000200000002 | 0000 |
| 000030000200000004 | 0000 |
| 000030000200000010 | 0000 |
| 000030000200000020 | 0000 |
| 000030000200000030 | 0000 |
| 000030000200000040 | 0000 |
| 000030000200000100 | 0001 |
| 000030000200000003 | 0001 |
| 000030000200000000 | 0001 |
| 000030000200000200 | 0010 |

-continued

| Sequence of Code Symbols | x' |
|---|---|
| 000030000200000300 | 0010 |
| 000030000200000400 | 0010 |
| 000030000200000001 | 0010 |
| 000030000200001000 | 0011 |
| 000030000200003000 | 0011 |
| 000030000200002000 | 0100 |
| 000030000200004000 | 0100 |
| 000030000400000002 | 1010 |
| 000030000400000004 | 1010 |
| 000030000400000010 | 1010 |
| 000030000400000020 | 1010 |
| 000030000400000030 | 1010 |
| 000030000400000040 | 1010 |
| 000030000400000100 | 1011 |
| 000030000400000003 | 1011 |
| 000030000400000000 | 1011 |
| 000030000400000200 | 1100 |
| 000030000400000300 | 1100 |
| 000030000400000400 | 1100 |
| 000030000400000001 | 1100 |
| 000030000400001000 | 1101 |
| 000030000400003000 | 1101 |
| 000010000002000000 | 0000 |
| 000010000002000003 | 0000 |
| 000010000002000001 | 0000 |
| 000010000002000002 | 0001 |
| 000010000002000004 | 0001 |
| 000010000002000010 | 0001 |
| 000010000002000020 | 0001 |
| 000010000002000030 | 0001 |
| 000010000002000040 | 0001 |
| 000010000004000000 | 0010 |
| 000010000004000003 | 0010 |
| 000010000004000001 | 0010 |
| 000010000004000002 | 0011 |
| 000010000004000004 | 0011 |
| 000010000004000010 | 0011 |
| 000010000004000020 | 0011 |
| 000010000004000030 | 0011 |
| 000010000004000040 | 0011 |
| 000010000020000002 | 0111 |
| 000010000020000004 | 0111 |
| 000010000020000010 | 0111 |
| 000010000020000020 | 0111 |
| 000010000020000030 | 0111 |
| 000010000020000040 | 0111 |
| 000010000020000100 | 1000 |
| 000010000020000003 | 1000 |
| 000010000020000000 | 1000 |
| 000010000020000200 | 1001 |
| 000010000020000300 | 1001 |
| 000010000020000400 | 1001 |
| 000010000020000001 | 1001 |
| 000010000030000100 | 1011 |
| 000010000030000003 | 1011 |
| 000010000030000000 | 1011 |
| 000010000030000200 | 1100 |
| 000010000030000300 | 1100 |
| 000010000030000400 | 1100 |
| 000010000030000001 | 1100 |
| 000010000040000002 | 1101 |
| 000010000040000004 | 1101 |
| 000010000040000010 | 1101 |
| 000010000040000020 | 1101 |
| 000010000040000030 | 1101 |
| 000010000040000040 | 1101 |
| 000010000040000100 | 1110 |
| 000010000040000003 | 1110 |
| 000010000040000000 | 1110 |
| 000010000040000200 | 1111 |
| 000010000040000300 | 1111 |
| 000010000040000400 | 1111 |
| 000010000040000001 | 1111 |
| 000010000003000000 | 0001 |
| 000010000003000003 | 0001 |
| 000010000003000001 | 0001 |
| 000010000200000002 | 0000 |
| 000010000200000004 | 0000 |

-continued

| Sequence of Code Symbols | x' |
|---|---|
| 000010000200000010 | 0000 |
| 000010000200000020 | 0000 |
| 000010000200000030 | 0000 |
| 000010000200000040 | 0000 |
| 000010000200000100 | 0001 |
| 000010000200000003 | 0001 |
| 000010000200000000 | 0001 |
| 000010000200000200 | 0010 |
| 000010000200000300 | 0010 |
| 000010000200000400 | 0010 |
| 000010000200000001 | 0010 |
| 000010000200001000 | 0011 |
| 000010000200003000 | 0011 |
| 000010000200002000 | 0100 |
| 000010000200004000 | 0100 |
| 000010000400000002 | 1010 |
| 000010000400000004 | 1010 |
| 000010000400000010 | 1010 |
| 000010000400000020 | 1010 |
| 000010000400000030 | 1010 |
| 000010000400000040 | 1010 |
| 000010000400000100 | 1011 |
| 000010000400000003 | 1011 |
| 000010000400000000 | 1011 |
| 000010000400000200 | 1100 |
| 000010000400000300 | 1100 |
| 000010000400000400 | 1100 |
| 000010000400000001 | 1100 |
| 000010000400001000 | 1101 |
| 000010000400003000 | 1101 |
| 000030000002000000 | 0000 |
| 000030000002000003 | 0000 |
| 000030000002000001 | 0000 |
| 000030000002000002 | 0001 |
| 000030000002000004 | 0001 |
| 000030000002000010 | 0001 |
| 000030000002000020 | 0001 |
| 000030000002000030 | 0001 |
| 000030000002000040 | 0001 |
| 000030000004000000 | 0010 |
| 000030000004000003 | 0010 |
| 000030000004000001 | 0010 |
| 000030000004000002 | 0011 |
| 000030000004000004 | 0011 |
| 000030000004000010 | 0011 |
| 000030000004000020 | 0011 |
| 000030000004000030 | 0011 |
| 000030000004000040 | 0011 |
| 000030000020000002 | 0111 |
| 000030000020000004 | 0111 |
| 000030000020000010 | 0111 |
| 000030000020000020 | 0111 |
| 000030000020000030 | 0111 |
| 000030000020000040 | 0111 |
| 000030000020000100 | 1000 |
| 000030000020000003 | 1000 |
| 000030000020000000 | 1000 |
| 000030000020000200 | 1001 |
| 000030000020000300 | 1001 |
| 000030000020000400 | 1001 |
| 000030000020000001 | 1001 |
| 000030000030000100 | 1011 |
| 000030000030000003 | 1011 |
| 000030000030000000 | 1011 |
| 000030000030000200 | 1100 |
| 000030000030000300 | 1100 |
| 000030000030000400 | 1100 |
| 000030000030000001 | 1100 |
| 000030000040000002 | 1101 |
| 000030000040000004 | 1101 |
| 000030000040000010 | 1101 |
| 000030000040000020 | 1101 |
| 000030000040000030 | 1101 |
| 000030000040000040 | 1101 |
| 000030000040000100 | 1110 |
| 000030000040000003 | 1110 |
| 000030000040000000 | 1110 |
| 000030000040000200 | 1111 |

-continued

| Sequence of Code Symbols | x' |
|---|---|
| 000030000040000300 | 1111 |
| 000030000040000400 | 1111 |
| 000030000040000001 | 1111 |
| 040000000020000002 | 0010 |
| 040000000020000004 | 0010 |
| 040000000020000010 | 0010 |
| 040000000020000020 | 0010 |
| 040000000020000030 | 0010 |
| 040000000020000040 | 0010 |
| 040000000020000100 | 0011 |
| 040000000020000003 | 0011 |
| 040000000020000000 | 0011 |
| 040000000020000200 | 0100 |
| 040000000020000300 | 0100 |
| 040000000020000400 | 0100 |
| 040000000020000001 | 0100 |
| 040000000040000002 | 1010 |
| 040000000040000004 | 1010 |
| 040000000040000010 | 1010 |
| 040000000040000020 | 1010 |
| 040000000040000030 | 1010 |
| 040000000040000040 | 1010 |
| 040000000040000100 | 1011 |
| 040000000040000003 | 1011 |
| 040000000040000000 | 1011 |
| 040000000040000200 | 1100 |
| 040000000040000300 | 1100 |
| 040000000040000400 | 1100 |
| 040000000040000001 | 1100 |
| 040000000200000002 | 0010 |
| 040000000200000004 | 0010 |
| 040000000200000010 | 0010 |
| 040000000200000020 | 0010 |
| 040000000200000030 | 0010 |
| 040000000200000040 | 0010 |
| 040000000200000100 | 0011 |
| 040000000200000003 | 0011 |
| 040000000200000000 | 0011 |
| 040000000200000200 | 0100 |
| 040000000200000300 | 0100 |
| 040000000200000400 | 0100 |
| 040000000200000001 | 0100 |
| 040000000200001000 | 0101 |
| 040000000200003000 | 0101 |
| 040000000200002000 | 0110 |
| 040000000200004000 | 0110 |
| 040000000400000002 | 1001 |
| 040000000400000004 | 1001 |
| 040000000400000010 | 1001 |
| 040000000400000020 | 1001 |
| 040000000400000030 | 1001 |
| 040000000400000040 | 1001 |
| 040000000400000100 | 1010 |
| 040000000400000003 | 1010 |
| 040000000400000000 | 1010 |
| 040000000400000200 | 1011 |
| 040000000400000300 | 1011 |
| 040000000400000400 | 1011 |
| 040000000400000001 | 1011 |
| 040000000400001000 | 1100 |
| 040000000400003000 | 1100 |
| 040000000400002000 | 1101 |
| 040000000400004000 | 1101 |
| 040000000030000100 | 1110 |
| 040000000030000003 | 1110 |
| 040000000030000000 | 1110 |
| 040000000030000200 | 1111 |
| 040000000030000300 | 1111 |
| 040000000030000400 | 1111 |
| 040000000030000001 | 1111 |
| 000000000030000000 | 1100 |
| 000000000030000003 | 1100 |
| 000000000030000001 | 1100 |
| 000000000030000002 | 1101 |
| 000000000030000004 | 1101 |
| 000000000030000010 | 1101 |
| 000000000030000020 | 1101 |
| 000000000030000030 | 1101 |

-continued

| Sequence of Code Symbols | x' |
| --- | --- |
| 000000000030000040 | 1101 |
| 000003000002000000 | 0000 |
| 000003000002000003 | 0000 |
| 000003000002000001 | 0000 |
| 000003000002000002 | 0001 |
| 000003000002000004 | 0001 |
| 000003000002000010 | 0001 |
| 000003000002000020 | 0001 |
| 000003000002000030 | 0001 |
| 000003000002000040 | 0001 |
| 000003000004000000 | 0010 |
| 000003000004000003 | 0010 |
| 000003000004000001 | 0010 |
| 000003000004000002 | 0011 |
| 000003000004000004 | 0011 |
| 000003000004000010 | 0011 |
| 000003000004000020 | 0011 |
| 000003000004000030 | 0011 |
| 000003000004000040 | 0011 |
| 000003000020000002 | 0111 |
| 000003000020000004 | 0111 |
| 000003000020000010 | 0111 |
| 000003000020000020 | 0111 |
| 000003000020000030 | 0111 |
| 000003000020000040 | 0111 |
| 000003000020000100 | 1000 |
| 000003000020000003 | 1000 |
| 000003000020000000 | 1000 |
| 000003000020000200 | 1001 |
| 000003000020000300 | 1001 |
| 000003000020000400 | 1001 |
| 000003000020000001 | 1001 |
| 000003000030000100 | 1011 |
| 000003000030000003 | 1011 |
| 000003000030000000 | 1011 |
| 000003000030000200 | 1100 |
| 000003000030000300 | 1100 |
| 000003000030000400 | 1100 |
| 000003000030000001 | 1100 |
| 000003000030000002 | 1101 |
| 000003000030000004 | 1101 |
| 000003000030000010 | 1101 |
| 000003000030000020 | 1101 |
| 000003000030000030 | 1101 |
| 000003000030000040 | 1101 |
| 000003000030000100 | 1110 |
| 000003000030000003 | 1110 |
| 000003000030000000 | 1110 |
| 000003000030000200 | 1111 |
| 000003000030000300 | 1111 |
| 000003000030000400 | 1111 |
| 000003000030000001 | 1111 |
| 000001000003000000 | 1100 |
| 000001000003000003 | 1100 |
| 000001000003000001 | 1100 |
| 000001000003000002 | 1100 |
| 000001000003000004 | 1101 |
| 000001000003000010 | 1101 |
| 000001000003000020 | 1101 |
| 000001000003000030 | 1101 |
| 000001000003000040 | 1101 |
| 000001000002000000 | 0000 |
| 000001000002000003 | 0000 |
| 000001000002000001 | 0000 |
| 000001000002000002 | 0001 |
| 000001000002000004 | 0001 |
| 000001000002000010 | 0001 |
| 000001000002000020 | 0001 |
| 000001000002000030 | 0001 |
| 000001000002000040 | 0001 |
| 000001000004000000 | 0010 |
| 000001000004000003 | 0010 |
| 000001000004000001 | 0010 |
| 000001000004000002 | 0011 |
| 000001000004000004 | 0011 |
| 000001000004000010 | 0011 |
| 000001000004000020 | 0011 |
| 000001000004000030 | 0011 |

-continued

| Sequence of Code Symbols | x' |
| --- | --- |
| 000001000004000040 | 0011 |
| 000001000020000002 | 0111 |
| 000001000020000004 | 0111 |
| 000001000020000010 | 0111 |
| 000001000020000020 | 0111 |
| 000001000020000030 | 0111 |
| 000001000020000040 | 0111 |
| 000001000020000100 | 1000 |
| 000001000020000003 | 1000 |
| 000001000020000000 | 1000 |
| 000001000020000200 | 1001 |
| 000001000020000300 | 1001 |
| 000001000020000400 | 1001 |
| 000001000020000001 | 1001 |
| 000001000030000100 | 1011 |
| 000001000030000003 | 1011 |
| 000001000030000000 | 1011 |
| 000001000030000200 | 1100 |
| 000001000030000300 | 1100 |
| 000001000030000400 | 1100 |
| 000001000030000001 | 1100 |
| 000001000040000002 | 1101 |
| 000001000040000004 | 1101 |
| 000001000040000010 | 1101 |
| 000001000040000020 | 1101 |
| 000001000040000030 | 1101 |
| 000001000040000040 | 1101 |
| 000001000040000100 | 1110 |
| 000001000040000003 | 1110 |
| 000001000040000000 | 1110 |
| 000001000040000200 | 1111 |
| 000001000040000300 | 1111 |
| 000001000040000400 | 1111 |
| 000001000040000001 | 1111 |
| 030000000020000002 | 0010 |
| 030000000020000004 | 0010 |
| 030000000020000010 | 0010 |
| 030000000020000020 | 0010 |
| 030000000020000030 | 0010 |
| 030000000020000040 | 0010 |
| 030000000020000100 | 0011 |
| 030000000020000003 | 0011 |
| 030000000020000000 | 0011 |
| 030000000020000200 | 0100 |
| 030000000020000300 | 0100 |
| 030000000020000400 | 0100 |
| 030000000020000001 | 0100 |
| 030000000040000002 | 1010 |
| 030000000040000004 | 1010 |
| 030000000040000010 | 1010 |
| 030000000040000020 | 1010 |
| 030000000040000030 | 1010 |
| 030000000040000040 | 1010 |
| 030000000040000100 | 1011 |
| 030000000040000003 | 1011 |
| 030000000040000000 | 1011 |
| 030000000040000200 | 1100 |
| 030000000040000300 | 1100 |
| 030000000040000400 | 1100 |
| 030000000040000001 | 1100 |
| 030000000200000002 | 0010 |
| 030000000200000004 | 0010 |
| 030000000200000010 | 0010 |
| 030000000200000020 | 0010 |
| 030000000200000030 | 0010 |
| 030000000200000040 | 0010 |
| 030000000200000100 | 0011 |
| 030000000200000003 | 0011 |
| 030000000200000000 | 0011 |
| 030000000200000200 | 0100 |
| 030000000200000300 | 0100 |
| 030000000200000400 | 0100 |
| 030000000200000001 | 0100 |
| 030000000200001000 | 0101 |
| 030000000200003000 | 0101 |
| 030000000200002000 | 0110 |
| 030000000200004000 | 0110 |
| 030000000400000002 | 1001 |

-continued

| Sequence of Code Symbols | x' |
|---|---|
| 030000000400000004 | 1001 |
| 030000000400000010 | 1001 |
| 030000000400000020 | 1001 |
| 030000000400000030 | 1001 |
| 030000000400000040 | 1001 |
| 030000000400000100 | 1010 |
| 030000000400000003 | 1010 |
| 030000000400000000 | 1010 |
| 030000000400000200 | 1011 |
| 030000000400000300 | 1011 |
| 030000000400000400 | 1011 |
| 030000000400000001 | 1011 |
| 030000000400001000 | 1100 |
| 030000000400003000 | 1100 |
| 030000000400002000 | 1101 |
| 030000000400004000 | 1101 |
| 030000000030000100 | 1110 |
| 030000000030000003 | 1110 |
| 030000000030000000 | 1110 |
| 030000000030000200 | 1111 |
| 030000000030000300 | 1111 |
| 030000000030000400 | 1111 |
| 030000000030000001 | 1111 |
| 000002000003000000 | 1100 |
| 000002000003000003 | 1100 |
| 000002000003000001 | 1100 |
| 000002000003000002 | 1101 |
| 000002000003000004 | 1101 |
| 000002000003000010 | 1101 |
| 000002000003000020 | 1101 |
| 000002000003000030 | 1101 |
| 000002000003000040 | 1101 |
| 000002000002000000 | 0000 |
| 000002000002000003 | 0000 |
| 000002000002000001 | 0000 |
| 000002000002000002 | 0001 |
| 000002000002000004 | 0001 |
| 000002000002000010 | 0001 |
| 000002000002000020 | 0001 |
| 000002000002000030 | 0001 |
| 000002000002000040 | 0001 |
| 000002000004000000 | 0010 |
| 000002000004000003 | 0010 |
| 000002000004000001 | 0010 |
| 000002000004000002 | 0011 |
| 000002000004000004 | 0011 |
| 000002000004000010 | 0011 |
| 000002000004000020 | 0011 |
| 000002000004000030 | 0011 |
| 000002000004000040 | 0011 |
| 000002000020000002 | 0111 |
| 000002000020000004 | 0111 |
| 000002000020000010 | 0111 |
| 000002000020000020 | 0111 |
| 000002000020000030 | 0111 |
| 000002000020000040 | 0111 |
| 000002000020000100 | 1000 |
| 000002000020000003 | 1000 |
| 000002000020000000 | 1000 |
| 000002000020000200 | 1001 |
| 000002000020000300 | 1001 |
| 000002000020000400 | 1001 |
| 000002000020000001 | 1001 |
| 000002000030000100 | 1011 |
| 000002000030000003 | 1011 |
| 000002000030000000 | 1011 |
| 000002000030000200 | 1100 |
| 000002000030000300 | 1100 |
| 000002000030000400 | 1100 |
| 000002000030000001 | 1100 |
| 000002000040000002 | 1101 |
| 000002000040000004 | 1101 |
| 000002000040000010 | 1101 |
| 000002000040000020 | 1101 |
| 000002000040000030 | 1101 |
| 000002000040000040 | 1101 |
| 000002000040000100 | 1110 |
| 000002000040000003 | 1110 |

-continued

| Sequence of Code Symbols | x' |
|---|---|
| 000002000040000000 | 1110 |
| 000002000040000200 | 1111 |
| 000002000040000300 | 1111 |
| 000002000040000400 | 1111 |
| 000002000040000001 | 1111 |
| 000004000003000000 | 1100 |
| 000004000003000003 | 1100 |
| 000004000003000001 | 1100 |
| 000004000003000002 | 1101 |
| 000004000003000004 | 1101 |
| 000004000003000010 | 1101 |
| 000004000003000020 | 1101 |
| 000004000003000030 | 1101 |
| 000004000003000040 | 1101 |
| 000004000002000000 | 0000 |
| 000004000002000003 | 0000 |
| 000004000002000001 | 0000 |
| 000004000002000002 | 0001 |
| 000004000002000004 | 0001 |
| 000004000002000010 | 0001 |
| 000004000002000020 | 0001 |
| 000004000002000030 | 0001 |
| 000004000002000040 | 0001 |
| 000004000004000000 | 0010 |
| 000004000004000003 | 0011 |
| 000004000004000001 | 0010 |
| 000004000004000002 | 0011 |
| 000004000004000004 | 0011 |
| 000004000004000010 | 0011 |
| 000004000004000020 | 0011 |
| 000004000004000030 | 0011 |
| 000004000004000040 | 0011 |
| 000004000020000002 | 0111 |
| 000004000020000004 | 0111 |
| 000004000020000010 | 0111 |
| 000004000020000020 | 0111 |
| 000004000020000030 | 0111 |
| 000004000020000040 | 0111 |
| 000004000020000100 | 1000 |
| 000004000020000003 | 1000 |
| 000004000020000000 | 1000 |
| 000004000020000200 | 1001 |
| 000004000020000300 | 1001 |
| 000004000020000400 | 1001 |
| 000004000020000001 | 1001 |
| 000004000030000100 | 1011 |
| 000004000030000003 | 1011 |
| 000004000030000000 | 1011 |
| 000004000030000200 | 1100 |
| 000004000030000300 | 1100 |
| 000004000030000400 | 1100 |
| 000004000030000001 | 1100 |
| 000004000040000002 | 1101 |
| 000004000040000004 | 1101 |
| 000004000040000010 | 1101 |
| 000004000040000020 | 1101 |
| 000004000040000030 | 1101 |
| 000004000040000040 | 1101 |
| 000004000040000100 | 1110 |
| 000004000040000003 | 1110 |
| 000004000040000000 | 1110 |
| 000004000040000200 | 1111 |
| 000004000040000300 | 1111 |
| 000004000040000400 | 1111 |
| 000004000040000001 | 1111 |
| 020000000020000002 | 0010 |
| 020000000020000004 | 0010 |
| 020000000020000010 | 0010 |
| 020000000020000020 | 0010 |
| 020000000020000030 | 0010 |
| 020000000020000040 | 0010 |
| 020000000020000100 | 0011 |
| 020000000020000003 | 0011 |
| 020000000020000000 | 0011 |
| 020000000020000200 | 0100 |
| 020000000020000300 | 0100 |
| 020000000020000400 | 0100 |
| 020000000020000001 | 0100 |

-continued

| Sequence of Code Symbols | x' |
|---|---|
| 020000000040000002 | 1010 |
| 020000000040000004 | 1010 |
| 020000000040000010 | 1010 |
| 020000000040000020 | 1010 |
| 020000000040000030 | 1010 |
| 020000000040000040 | 1010 |
| 020000000040000100 | 1011 |
| 020000000040000003 | 1011 |
| 020000000040000000 | 1011 |
| 020000000040000200 | 1100 |
| 020000000040000300 | 1100 |
| 020000000040000400 | 1100 |
| 020000000040000001 | 1100 |
| 020000000200000002 | 0010 |
| 020000000200000004 | 0010 |
| 020000000200000010 | 0010 |
| 020000000200000020 | 0010 |
| 020000000200000030 | 0010 |
| 020000000200000040 | 0010 |
| 020000000200000100 | 0011 |
| 020000000200000003 | 0011 |
| 020000000200000000 | 0011 |
| 020000000200000200 | 0100 |
| 020000000200000300 | 0100 |
| 020000000200000400 | 0100 |
| 020000000200000001 | 0100 |
| 020000000200001000 | 0101 |
| 020000000200003000 | 0101 |
| 020000000200002000 | 0110 |
| 020000000200004000 | 0110 |
| 020000000400000002 | 1001 |
| 020000000400000004 | 1001 |
| 020000000400000010 | 1001 |
| 020000000400000020 | 1001 |
| 020000000400000030 | 1001 |
| 020000000400000040 | 1001 |
| 020000000400000100 | 1010 |
| 020000000400000003 | 1010 |
| 020000000400000000 | 1010 |
| 020000000400000200 | 1011 |
| 020000000400000300 | 1011 |
| 020000000400000400 | 1011 |
| 020000000400000001 | 1011 |
| 020000000400001000 | 1100 |
| 020000000400003000 | 1100 |
| 020000000400002000 | 1101 |
| 020000000400004000 | 1101 |
| 020000000030000100 | 1110 |
| 020000000030000003 | 1110 |
| 020000000030000000 | 1110 |
| 020000000030000200 | 1111 |
| 020000000030000300 | 1111 |
| 020000000030000400 | 1111 |
| 020000000030000001 | 1111 |
| 000200000002000000 | 0000 |
| 000200000002000003 | 0000 |
| 000200000002000001 | 0000 |
| 000200000002000002 | 0001 |
| 000200000002000004 | 0001 |
| 000200000002000010 | 0001 |
| 000200000002000020 | 0001 |
| 000200000002000030 | 0001 |
| 000200000002000040 | 0001 |
| 000200000004000000 | 0010 |
| 000200000004000003 | 0010 |
| 000200000004000001 | 0010 |
| 000200000004000002 | 0011 |
| 000200000004000004 | 0011 |
| 000200000004000010 | 0011 |
| 000200000004000020 | 0011 |
| 000200000004000030 | 0011 |
| 000200000004000040 | 0011 |
| 000200000020000002 | 0111 |
| 000200000020000004 | 0111 |
| 000200000020000010 | 0111 |
| 000200000020000020 | 0111 |
| 000200000020000030 | 0111 |
| 000200000020000040 | 0111 |

-continued

| Sequence of Code Symbols | x' |
|---|---|
| 000200000020000100 | 1000 |
| 000200000020000003 | 1000 |
| 000200000020000000 | 1000 |
| 000200000020000200 | 1001 |
| 000200000020000300 | 1001 |
| 000200000020000400 | 1001 |
| 000200000020000001 | 1001 |
| 000200000030000100 | 1011 |
| 000200000030000003 | 1011 |
| 000200000030000000 | 1011 |
| 000200000030000200 | 1100 |
| 000200000030000300 | 1100 |
| 000200000030000400 | 1100 |
| 000200000030000001 | 1100 |
| 000200000040000002 | 1101 |
| 000200000040000004 | 1101 |
| 000200000040000010 | 1101 |
| 000200000040000020 | 1101 |
| 000200000040000030 | 1101 |
| 000200000040000040 | 1101 |
| 000200000040000100 | 1110 |
| 000200000040000003 | 1110 |
| 000200000040000000 | 1110 |
| 000200000040000200 | 1111 |
| 000200000040000300 | 1111 |
| 000200000040000400 | 1111 |
| 000200000040000001 | 1111 |
| 000200000003000000 | 0001 |
| 000200000003000003 | 0001 |
| 000200000003000001 | 0001 |
| 000200000200000002 | 0000 |
| 000200000200000004 | 0000 |
| 000200000200000010 | 0000 |
| 000200000200000020 | 0000 |
| 000200000200000030 | 0000 |
| 000200000200000040 | 0000 |
| 000200000200000100 | 0001 |
| 000200000200000003 | 0001 |
| 000200000200000000 | 0001 |
| 000200000200000200 | 0010 |
| 000200000200000300 | 0010 |
| 000200000200000400 | 0010 |
| 000200000200000001 | 0010 |
| 000200000200001000 | 0011 |
| 000200000200003000 | 0011 |
| 000200000200002000 | 0100 |
| 000200000200004000 | 0100 |
| 000200000400000002 | 1010 |
| 000200000400000004 | 1010 |
| 000200000400000010 | 1010 |
| 000200000400000020 | 1010 |
| 000200000400000030 | 1010 |
| 000200000400000040 | 1010 |
| 000200000400000100 | 1011 |
| 000200000400000003 | 1011 |
| 000200000400000000 | 1011 |
| 000200000400000200 | 1100 |
| 000200000400000300 | 1100 |
| 000200000400000400 | 1100 |
| 000200000400000001 | 1100 |
| 000200000400001000 | 1101 |
| 000200000400003000 | 1101 |
| 010000000020000002 | 0010 |
| 010000000020000004 | 0010 |
| 010000000020000010 | 0010 |
| 010000000020000020 | 0010 |
| 010000000020000030 | 0010 |
| 010000000020000004 | 0010 |
| 010000000020000100 | 0011 |
| 010000000020000003 | 0011 |
| 010000000020000000 | 0011 |
| 010000000020000200 | 0100 |
| 010000000020000300 | 0100 |
| 010000000020000400 | 0100 |
| 010000000020000001 | 0100 |
| 010000000040000002 | 1010 |
| 010000000040000004 | 1010 |
| 010000000040000010 | 1010 |

-continued

| Sequence of Code Symbols | x' |
|---|---|
| 010000000040000020 | 1010 |
| 010000000040000030 | 1010 |
| 010000000040000040 | 1010 |
| 010000000040000100 | 1011 |
| 010000000040000003 | 1011 |
| 010000000040000000 | 1011 |
| 010000000040000200 | 1100 |
| 010000000040000300 | 1100 |
| 010000000040000400 | 1100 |
| 010000000040000001 | 1100 |
| 010000000200000002 | 0010 |
| 010000000200000004 | 0010 |
| 010000000200000010 | 0010 |
| 010000000200000020 | 0010 |
| 010000000200000030 | 0010 |
| 010000000200000040 | 0010 |
| 010000000200000100 | 0011 |
| 010000000200000003 | 0011 |
| 010000000200000000 | 0011 |
| 010000000200000200 | 0100 |
| 010000000200000300 | 0100 |
| 010000000200000400 | 0100 |
| 010000000200000001 | 0100 |
| 010000000200001000 | 0101 |
| 010000000200003000 | 0101 |
| 010000000200002000 | 0110 |
| 010000000200004000 | 0110 |
| 010000000400000002 | 1001 |
| 010000000400000004 | 1001 |
| 010000000400000010 | 1001 |
| 010000000400000020 | 1001 |
| 010000000400000030 | 1001 |
| 010000000400000040 | 1001 |
| 010000000400000100 | 1010 |
| 010000000400000003 | 1010 |
| 010000000400000000 | 1010 |
| 010000000400000200 | 1011 |
| 010000000400000300 | 1011 |
| 010000000400000400 | 1011 |
| 010000000400000001 | 1011 |
| 010000000400001000 | 1100 |
| 010000000400003000 | 1100 |
| 010000000400002000 | 1101 |
| 010000000400004000 | 1101 |
| 010000000030000100 | 1110 |
| 010000000030000003 | 1110 |
| 010000000030000000 | 1110 |
| 010000000030000200 | 1111 |
| 010000000030000300 | 1111 |
| 010000000030000400 | 1111 |
| 010000000030000001 | 1111 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |

-continued

| Sequence of Code Symbols | x' |
|---|---|
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1100 |
| 000400000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |
| 000400000040000030 | 1101 |
| 000400000040000040 | 1101 |
| 000400000040000100 | 1110 |
| 000400000040000003 | 1110 |
| 000400000040000000 | 1110 |
| 000400000040000200 | 1111 |
| 000400000040000300 | 1111 |
| 000400000040000400 | 1111 |
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0001 |
| 000400000200000003 | 0001 |
| 000400000200000000 | 0001 |
| 000400000200000200 | 0010 |
| 000400000200000300 | 0010 |
| 000400000200000400 | 0010 |
| 000400000200000001 | 0010 |
| 000400000200001000 | 0011 |
| 000400000200003000 | 0011 |
| 000400000200002000 | 0100 |
| 000400000200004000 | 0100 |
| 000400000400000002 | 1010 |
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |

9. The method of claim 7, wherein said look-up step comprises the step of determining, using a squared euclidean distance, which table entry is identified by a sequence of code symbols.

10. A method for decoding data stored on a storage medium, wherein said stored data has been encoding using an M=5 (4,11) code, comprising the steps of:

reading the storage medium to recover output waveform signal amplitudes;

converting said output waveform signal amplitudes into output code symbols, wherein each output code symbol is at one of five levels; and decoding said output code symbols to obtain output data bits, wherein said output data bits correspond to the digital input data.

11. The method of claim 10, wherein said step of decoding comprises the steps of:

identifying with a sliding window a sequence of code symbols that represents a given code symbol set; and in a table comprising a number of entries corresponding to a number of possible unique sequences of code symbols, each entry identified by one of said possible unique sequences of code symbols, and wherein each entry identifies an output data bit set that is a decoded data bit set for the code symbol set represented by the sequence of code symbols that identifies that entry, looking up with said identified sequence of code symbols the output data bit for said given code symbol.

12. The method according to claim 11, wherein said table provides an output bit set x' for each sequence of code symbols y' according to the following table:

| Sequence of Code Symbols | x' |
|---|---|
| xxxxxx000100002000 | 0000 |
| xxxxxx000100004000 | 0000 |
| xxxxxx000100001000 | 0001 |
| xxxxxx000100003000 | 0001 |
| 000000000020000002 | 0010 |
| 000000000020000004 | 0010 |
| 000000000020000010 | 0010 |
| 000000000020000020 | 0010 |
| 000000000020000030 | 0010 |
| 000000000020000040 | 0010 |
| 000000000020000100 | 0011 |
| 000000000020000003 | 0011 |
| 000000000020000000 | 0011 |
| 000000000020000200 | 0100 |
| 000000000020000300 | 0100 |
| 000000000020000400 | 0100 |
| 000000000020000001 | 0100 |
| xxxxxx000300000002 | 0101 |
| xxxxxx000300000004 | 0101 |
| xxxxxx000300000010 | 0101 |
| xxxxxx000300000020 | 0101 |
| xxxxxx000300000030 | 0101 |
| xxxxxx000300000040 | 0101 |
| xxxxxx000300000100 | 0110 |
| xxxxxx000300000003 | 0110 |
| xxxxxx000300000000 | 0110 |
| xxxxxx000300000200 | 0111 |
| xxxxxx000300000300 | 0111 |
| xxxxxx000300000400 | 0111 |
| xxxxxx000300000001 | 0111 |
| xxxxxx000300001000 | 1000 |
| xxxxxx000300003000 | 1000 |
| xxxxxx000300002000 | 1001 |
| xxxxxx000300004000 | 1001 |
| 000000000040000002 | 1010 |
| 000000000040000004 | 1010 |
| 000000000040000010 | 1010 |
| 000000000040000020 | 1010 |
| 000000000040000030 | 1010 |
| 000000000040000040 | 1010 |
| 000000000040000100 | 1011 |
| 000000000040000003 | 1011 |
| 000000000040000000 | 1011 |
| 000000000040000200 | 1100 |
| 000000000040000300 | 1100 |
| 000000000040000400 | 1100 |
| 000000000040000001 | 1100 |
| xxxxxx000100000002 | 1101 |
| xxxxxx000100000004 | 1101 |
| xxxxxx000100000010 | 1101 |
| xxxxxx000100000020 | 1101 |
| xxxxxx000100000030 | 1101 |
| xxxxxx000100000040 | 1101 |
| xxxxxx000100000100 | 1110 |
| xxxxxx000100000003 | 1110 |
| xxxxxx000100000000 | 1110 |
| xxxxxx000100000200 | 1111 |

-continued

| Sequence of Code Symbols | x' |
|---|---|
| xxxxxx000100000300 | 1111 |
| xxxxxx000100000400 | 1111 |
| xxxxxx000100000001 | 1111 |
| xxxxxx000010000002 | 0000 |
| xxxxxx000010000004 | 0000 |
| xxxxxx000010000010 | 0000 |
| xxxxxx000010000020 | 0000 |
| xxxxxx000010000030 | 0000 |
| xxxxxx000010000040 | 0000 |
| xxxxxx000010000100 | 0001 |
| xxxxxx000010000003 | 0001 |
| xxxxxx000010000000 | 0001 |
| 000000000200000002 | 0010 |
| 000000000200000004 | 0010 |
| 000000000200000010 | 0010 |
| 000000000200000020 | 0010 |
| 000000000200000030 | 0010 |
| 000000000200000040 | 0010 |
| 000000000200000100 | 0011 |
| 000000000200000003 | 0011 |
| 000000000200000000 | 0011 |
| 000000000200000200 | 0100 |
| 000000000200000300 | 0100 |
| 000000000200000400 | 0100 |
| 000000000200000001 | 0100 |
| 000000000200001000 | 0101 |
| 000000000200003000 | 0101 |
| 000000000200002000 | 0110 |
| 000000000200004000 | 0110 |
| xxxxxx000010000200 | 0111 |
| xxxxxx000010000300 | 0111 |
| xxxxxx000010000400 | 0111 |
| xxxxxx000010000001 | 0111 |
| xxxxxx000030000002 | 1000 |
| xxxxxx000030000004 | 1000 |
| xxxxxx000030000010 | 1000 |
| xxxxxx000030000020 | 1000 |
| xxxxxx000030000030 | 1000 |
| xxxxxx000030000040 | 1000 |
| 000000000400000002 | 1001 |
| 000000000400000004 | 1001 |
| 000000000400000010 | 1001 |
| 000000000400000020 | 1001 |
| 000000000400000030 | 1001 |
| 000000000400000040 | 1001 |
| 000000000400000100 | 1010 |
| 000000000400000003 | 1010 |
| 000000000400000000 | 1010 |
| 000000000400000200 | 1011 |
| 000000000400000300 | 1011 |
| 000000000400000400 | 1011 |
| 000000000400000001 | 1011 |
| 000000000400001000 | 1100 |
| 000000000400003000 | 1100 |
| 000000000400002000 | 1101 |
| 000000000400004000 | 1101 |
| 000000000030000100 | 1110 |
| 000000000030000003 | 1110 |
| 000000000030000000 | 1110 |
| 000000000030000200 | 1111 |
| 000000000030000300 | 1111 |
| 000000000030000400 | 1111 |
| 000000000030000001 | 1111 |
| xxxxxx400000000100 | 0000 |
| xxxxxx400000000020 | 0000 |
| xxxxxx400000000300 | 0000 |
| xxxxxx400000000040 | 0000 |
| xxxxxx400000000010 | 0001 |
| xxxxxx400000000200 | 0001 |
| xxxxxx400000000030 | 0001 |
| xxxxxx400000000400 | 0001 |
| xxxxxx400000400000 | 0010 |
| xxxxxx400000200004 | 0010 |
| xxxxxx400000300001 | 0010 |
| xxxxxx400000300000 | 0011 |
| xxxxxx400000200003 | 0011 |
| xxxxxx400000300002 | 0011 |
| xxxxxx400000200000 | 0100 |

-continued

| Sequence of Code Symbols | x' |
|---|---|
| xxxxxx400000200002 | 0100 |
| xxxxxx430000300003 | 0100 |
| xxxxxx400000100000 | 0101 |
| xxxxxx400000200001 | 0101 |
| xxxxxx400000300004 | 0101 |
| xxxxxx400000040000 | 0110 |
| xxxxxx400000100004 | 0110 |
| xxxxxx400000400001 | 0110 |
| xxxxxx400000030000 | 0111 |
| xxxxxx400000100001 | 0111 |
| xxxxxx400000400002 | 0111 |
| xxxxxx400000020000 | 1000 |
| xxxxxx400000100003 | 1000 |
| xxxxxx400000400003 | 1000 |
| xxxxxx400000010000 | 1001 |
| xxxxxx400000100002 | 1001 |
| xxxxxx400000400004 | 1001 |
| xxxxxx400000001000 | 1010 |
| xxxxxx400000003000 | 1010 |
| xxxxxx400000002000 | 1011 |
| xxxxxx400000004000 | 1011 |
| xxxxxx200004000000 | 1100 |
| xxxxxx200004000003 | 1100 |
| xxxxxx200004000001 | 1100 |
| xxxxxx200004000002 | 1101 |
| xxxxxx200004000004 | 1101 |
| xxxxxx200004000010 | 1101 |
| xxxxxx200004000020 | 1101 |
| xxxxxx200004000030 | 1101 |
| xxxxxx200004000040 | 1101 |
| xxxxxx300001000000 | 1110 |
| xxxxxx300001000003 | 1110 |
| xxxxxx300001000001 | 1110 |
| xxxxxx300001000002 | 1111 |
| xxxxxx300001000004 | 1111 |
| xxxxxx300001000010 | 1111 |
| xxxxxx300001000020 | 1111 |
| xxxxxx300001000030 | 1111 |
| xxxxxx300001000040 | 1111 |
| xxxxxx300000000100 | 0000 |
| xxxxxx300000000020 | 0000 |
| xxxxxx300000000300 | 0000 |
| xxxxxx300000000040 | 0000 |
| xxxxxx300000000010 | 0001 |
| xxxxxx300000000200 | 0001 |
| xxxxxx300000000030 | 0001 |
| xxxxxx300000000400 | 0001 |
| xxxxxx300000400000 | 0010 |
| xxxxxx300000200004 | 0010 |
| xxxxxx300000300001 | 0010 |
| xxxxxx300000300000 | 0011 |
| xxxxxx300000200003 | 0011 |
| xxxxxx300000300002 | 0011 |
| xxxxxx300000200000 | 0100 |
| xxxxxx300000200002 | 0100 |
| xxxxxx300000300003 | 0100 |
| xxxxxx300000100000 | 0101 |
| xxxxxx300000200001 | 0101 |
| xxxxxx300000300004 | 0101 |
| xxxxxx300000040000 | 0110 |
| xxxxxx300000100004 | 0110 |
| xxxxxx300000400001 | 0110 |
| xxxxxx300000030000 | 0111 |
| xxxxxx300000100001 | 0111 |
| xxxxxx300000400002 | 0111 |
| xxxxxx300000020000 | 1000 |
| xxxxxx300000100003 | 1000 |
| xxxxxx300000400003 | 1000 |
| xxxxxx300000010000 | 1001 |
| xxxxxx300000100002 | 1001 |
| xxxxxx300000400004 | 1001 |
| xxxxxx300000001000 | 1010 |
| xxxxxx300000003000 | 1010 |
| xxxxxx300000002000 | 1011 |
| xxxxxx300000004000 | 1011 |
| xxxxxx200003000000 | 1100 |
| xxxxxx200003000003 | 1100 |
| xxxxxx200003000001 | 1100 |

-continued

| Sequence of Code Symbols | x' |
|---|---|
| xxxxxx200003000002 | 1101 |
| xxxxxx200003000004 | 1101 |
| xxxxxx200003000010 | 1101 |
| xxxxxx200003000020 | 1101 |
| xxxxxx200003000030 | 1101 |
| xxxxxx200003000040 | 1101 |
| xxxxxx300002000000 | 1110 |
| xxxxxx300002000003 | 1110 |
| xxxxxx300002000001 | 1110 |
| xxxxxx300002000002 | 1111 |
| xxxxxx300002000004 | 1111 |
| xxxxxx300002000010 | 1111 |
| xxxxxx300002000020 | 1111 |
| xxxxxx300002000030 | 1111 |
| xxxxxx300002000040 | 1111 |
| xxxxxx200000000100 | 0000 |
| xxxxxx200000000020 | 0000 |
| xxxxxx200000000300 | 0000 |
| xxxxxx200000000040 | 0000 |
| xxxxxx200000000010 | 0001 |
| xxxxxx200000000200 | 0001 |
| xxxxxx200000000030 | 0001 |
| xxxxxx200000000400 | 0001 |
| xxxxxx200000400000 | 0010 |
| xxxxxx200000200004 | 0010 |
| xxxxxx200000300001 | 0010 |
| xxxxxx200000300000 | 0011 |
| xxxxxx200000200003 | 0011 |
| xxxxxx200000300002 | 0011 |
| xxxxxx200000200000 | 0100 |
| xxxxxx200000200002 | 0100 |
| xxxxxx200000300003 | 0100 |
| xxxxxx200000100000 | 0101 |
| xxxxxx200000200001 | 0101 |
| xxxxxx200000300004 | 0101 |
| xxxxxx200000040000 | 0110 |
| xxxxxx200000100004 | 0110 |
| xxxxxx200000400001 | 0110 |
| xxxxxx200000030000 | 0111 |
| xxxxxx200000100001 | 0111 |
| xxxxxx200000400002 | 0111 |
| xxxxxx200000020000 | 1000 |
| xxxxxx200000100003 | 1000 |
| xxxxxx200000400003 | 1000 |
| xxxxxx200000010000 | 1001 |
| xxxxxx200000100002 | 1001 |
| xxxxxx200000400004 | 1001 |
| xxxxxx200000001000 | 1010 |
| xxxxxx200000003000 | 1010 |
| xxxxxx200000002000 | 1011 |
| xxxxxx200000004000 | 1011 |
| xxxxxx200002000000 | 1100 |
| xxxxxx200002000003 | 1100 |
| xxxxxx200002000001 | 1100 |
| xxxxxx200002000002 | 1101 |
| xxxxxx200002000004 | 1101 |
| xxxxxx200002000010 | 1101 |
| xxxxxx200002000020 | 1101 |
| xxxxxx200002000030 | 1101 |
| xxxxxx200002000040 | 1101 |
| xxxxxx300003000000 | 1110 |
| xxxxxx300003000003 | 1110 |
| xxxxxx300003000001 | 1110 |
| xxxxxx300003000002 | 1111 |
| xxxxxx300003000004 | 1111 |
| xxxxxx300003000010 | 1111 |
| xxxxxx300003000020 | 1111 |
| xxxxxx300003000030 | 1111 |
| xxxxxx300003000040 | 1111 |
| xxxxxx100000000100 | 0000 |
| xxxxxx100000000020 | 0000 |
| xxxxxx100000000300 | 0000 |
| xxxxxx100000000040 | 0000 |
| xxxxxx100000000010 | 0001 |
| xxxxxx100000000200 | 0001 |
| xxxxxx100000000030 | 0001 |
| xxxxxx100000000400 | 0001 |
| xxxxxx100000400000 | 0010 |

-continued

| Sequence of Code Symbols | x' |
|---|---|
| xxxxxx100000200004 | 0010 |
| xxxxxx100000300001 | 0010 |
| xxxxxx100000300000 | 0011 |
| xxxxxx100000200003 | 0011 |
| xxxxxx100000300002 | 0011 |
| xxxxxx100000200000 | 0100 |
| xxxxxx100000200002 | 0100 |
| xxxxxx100000300003 | 0100 |
| xxxxxx100000100000 | 0101 |
| xxxxxx100000200001 | 0101 |
| xxxxxx100000300004 | 0101 |
| xxxxxx100000040000 | 0110 |
| xxxxxx100000100004 | 0110 |
| xxxxxx100000400001 | 0110 |
| xxxxxx100000030000 | 0111 |
| xxxxxx100000100001 | 0111 |
| xxxxxx100000400002 | 0111 |
| xxxxxx100000020000 | 1000 |
| xxxxxx100000100003 | 1000 |
| xxxxxx100000400003 | 1000 |
| xxxxxx100000010000 | 1001 |
| xxxxxx100000100002 | 1001 |
| xxxxxx100000400004 | 1001 |
| xxxxxx100000001000 | 1010 |
| xxxxxx100000003000 | 1010 |
| xxxxxx100000002000 | 1011 |
| xxxxxx100000004000 | 1011 |
| xxxxxx200001000000 | 1100 |
| xxxxxx200001000003 | 1100 |
| xxxxxx200001000001 | 1100 |
| xxxxxx200001000002 | 1101 |
| xxxxxx200001000004 | 1101 |
| xxxxxx200001000010 | 1101 |
| xxxxxx200001000020 | 1101 |
| xxxxxx200001000030 | 1101 |
| xxxxxx200001000040 | 1101 |
| xxxxxx300004000000 | 1110 |
| xxxxxx300004000003 | 1110 |
| xxxxxx300004000001 | 1110 |
| xxxxxx300004000002 | 1111 |
| xxxxxx300004000004 | 1111 |
| xxxxxx300004000010 | 1111 |
| xxzxxx300004000020 | 1111 |
| xxxxxx300004000030 | 1111 |
| xxxxxx300004000040 | 1111 |
| xxxxxx040000000100 | 0000 |
| xxxxxx040000000020 | 0000 |
| xxxxxx040000000300 | 0000 |
| xxzxxx040000000040 | 0000 |
| xxxxxx040000000010 | 0001 |
| xxxxxx040000000200 | 0001 |
| xxxxxx040000000030 | 0001 |
| xxxxxx040000000400 | 0001 |
| xxxxxx040000400000 | 0010 |
| xxxxxx040000200004 | 0010 |
| xxxxxx040000300001 | 0010 |
| xxxxxx040000300000 | 0011 |
| xxxxxx040000200003 | 0011 |
| xxxxxx040000300002 | 0011 |
| xxxxxx040000200000 | 0100 |
| xxxxxx040000200002 | 0100 |
| xxxxxx040000300003 | 0100 |
| xxxxxx040000100000 | 0101 |
| xxxxxx040000200001 | 0101 |
| xxxxxx040000300004 | 0101 |
| xxxxxx040000040000 | 0110 |
| xxxxxx040000100004 | 0110 |
| xxxxxx040000400001 | 0110 |
| xxxxxx040000030000 | 0111 |
| xxxxxx040000100001 | 0111 |
| xxxxxx040000400002 | 0111 |
| xxxxxx040000020000 | 1000 |
| xxxxxx040000100003 | 1000 |
| xxxxxx040000400003 | 1000 |
| xxxxxx040000010000 | 1001 |
| xxxxxx040000100002 | 1001 |
| xxxxxx040000400004 | 1001 |
| xxxxxx040000001000 | 1010 |

-continued

| Sequence of Code Symbols | x' |
|---|---|
| xxxxxx040000003000 | 1010 |
| xxxxxx040000002000 | 1011 |
| xxxxxx040000004000 | 1011 |
| xxxxxx100004000000 | 1100 |
| xxxxxx100004000003 | 1100 |
| xxxxxx100004000001 | 1100 |
| xxxxxx100004000002 | 1101 |
| xxxxxx100004000004 | 1101 |
| xxxxxx100004000010 | 1101 |
| xxxxxx100004000020 | 1101 |
| xxxxxx100004000030 | 1101 |
| xxxxxx100004000040 | 1101 |
| xxxxxx400001000000 | 1110 |
| xxxxxx400001000003 | 1110 |
| xxxxxx400001000001 | 1110 |
| xxxxxx400001000002 | 1111 |
| xxxxxx400001000004 | 1111 |
| xxxxxx400001000010 | 1111 |
| xxxxxx400001000020 | 1111 |
| xxxxxx400001000030 | 1111 |
| xxxxxx400001000040 | 1111 |
| xxxxxx030000000100 | 0000 |
| xxxxxx030000000020 | 0000 |
| xxxxxx030000000300 | 0000 |
| xxxxxx030000000040 | 0000 |
| xxxxxx030000000010 | 0001 |
| xxxxxx030000000200 | 0001 |
| xxxxxx030000000030 | 0001 |
| xxxxxx030000000400 | 0001 |
| xxxxxx030000400000 | 0010 |
| xxxxxx030000200004 | 0010 |
| xxxxxx030000300001 | 0010 |
| xxxxxx030000300000 | 0011 |
| xxxxxx030000200003 | 0011 |
| xxxxxx030000300002 | 0011 |
| xxxxxx030000200000 | 0100 |
| xxxxxx030000200002 | 0100 |
| xxxxxx030000300003 | 0100 |
| xxxxxx030000100000 | 0101 |
| xxxxxx030000200001 | 0101 |
| xxxxxx030000300004 | 0101 |
| xxxxxx030000040000 | 0110 |
| xxxxxx030000100004 | 0110 |
| xxxxxx030000400001 | 0110 |
| xxxxxx030000030000 | 0111 |
| xxxxxx030000100001 | 0111 |
| xxxxxx030000400002 | 0111 |
| xxxxxx030000020000 | 1000 |
| xxxxxx030000100003 | 1000 |
| xxxxxx030000400003 | 1000 |
| xxxxxx030000010000 | 1001 |
| xxxxxx030000100002 | 1001 |
| xxxxxx030000400004 | 1001 |
| xxxxxx030000001000 | 1010 |
| xxxxxx030000003000 | 1010 |
| xxxxxx030000002000 | 1011 |
| xxxxxx030000004000 | 1011 |
| xxxxxx100001000000 | 1100 |
| xxxxxx100001000003 | 1100 |
| xxxxxx100001000001 | 1100 |
| xxxxxx100001000002 | 1101 |
| xxxxxx100001000004 | 1101 |
| xxxxxx100001000010 | 1101 |
| xxxxxx100001000020 | 1101 |
| xxxxxx100001000030 | 1101 |
| xxxxxx100001000040 | 1101 |
| xxxxxx400002000000 | 1110 |
| xxxxxx400002000003 | 1110 |
| xxxxxx400002000001 | 1110 |
| xxxxxx400002000002 | 1111 |
| xxxxxx400002000004 | 1111 |
| xxxxxx400002000010 | 1111 |
| xxxxxx400002000020 | 1111 |
| xxxxxx400002000030 | 1111 |
| xxxxxx400002000040 | 1111 |
| xxxxxx020000000100 | 0000 |
| xxxxxx020000000020 | 0000 |
| xxxxxx020000000300 | 0000 |

-continued

| Sequence of Code Symbols | x' |
|---|---|
| xxxxxx020000000040 | 0000 |
| xxxxxx020000000010 | 0001 |
| xxxxxx020000000200 | 0001 |
| xxxxxx020000000030 | 0001 |
| xxxxxx020000000400 | 0001 |
| xxxxxx020000400000 | 0010 |
| xxxxxx020000200004 | 0010 |
| xxxxxx020000300001 | 0010 |
| xxxxxx020000300000 | 0011 |
| xxxxxx020000200003 | 0011 |
| xxxxxx020000300002 | 0011 |
| xxxxxx020000200000 | 0100 |
| xxxxxx020000200002 | 0100 |
| xxxxxx020000300003 | 0100 |
| xxxxxx020000100000 | 0101 |
| xxxxxx020000200001 | 0101 |
| xxxxxx020000300004 | 0101 |
| xxxxxx020000040000 | 0110 |
| xxxxxx020000100004 | 0110 |
| xxxxxx020000400001 | 0110 |
| xxxxxx020000030000 | 0111 |
| xxxxxx020000100001 | 0111 |
| xxxxxx020000400002 | 0111 |
| xxxxxx020000020000 | 1000 |
| xxxxxx020000100003 | 1000 |
| xxxxxx020000400003 | 1000 |
| xxxxxx020000010000 | 1001 |
| xxxxxx020000100002 | 1001 |
| xxxxxx020000400004 | 1001 |
| xxxxxx020000001000 | 1010 |
| xxxxxx020000003000 | 1010 |
| xxxxxx020000002000 | 1011 |
| xxxxxx020000004000 | 1011 |
| xxxxxx100003000000 | 1100 |
| xxxxxx100003000003 | 1100 |
| xxxxxx100003000001 | 1100 |
| xxxxxx100003000002 | 1101 |
| xxxxxx100003000004 | 1101 |
| xxxxxx100003000010 | 1101 |
| xxxxxx100003000020 | 1101 |
| xxxxxx100003000030 | 1101 |
| xxxxxx100003000040 | 1101 |
| xxxxxx400003000000 | 1110 |
| xxxxxx400003000003 | 1110 |
| xxxxxx400003000001 | 1110 |
| xxxxxx400003000002 | 1111 |
| xxxxxx400003000004 | 1111 |
| xxxxxx400003000010 | 1111 |
| xxxxxx400003000020 | 1111 |
| xxxxxx400003000030 | 1111 |
| xxxxxx400003000040 | 1111 |
| xxxxxx010000000100 | 0000 |
| xxxxxx010000000020 | 0000 |
| xxxxxx010000000300 | 0000 |
| xxxxxx010000000040 | 0000 |
| xxxxxx010000000010 | 0001 |
| xxxxxx010000000200 | 0001 |
| xxxxxx010000000030 | 0001 |
| xxxxxx010000000400 | 0001 |
| xxxxxx010000400000 | 0010 |
| xxxxxx010000200004 | 0010 |
| xxxxxx010000300001 | 0010 |
| xxxxxx010000300000 | 0011 |
| xxxxxx010000200003 | 0011 |
| xxxxxx010000300002 | 0011 |
| xxxxxx010000200000 | 0100 |
| xxxxxx010000200002 | 0100 |
| xxxxxx010000300003 | 0100 |
| xxxxxx010000100000 | 0101 |
| xxxxxx010000200001 | 0101 |
| xxxxxx010000300004 | 0101 |
| xxxxxx010000040000 | 0110 |
| xxxxxx010000100004 | 0110 |
| xxxxxx010000400001 | 0110 |
| xxxxxx010000030000 | 0111 |
| xxxxxx010000100001 | 0111 |
| xxxxxx010000400002 | 0111 |
| xxxxxx010000020000 | 1000 |

-continued

| Sequence of Code Symbols | x' |
|---|---|
| xxxxxx010000100003 | 1000 |
| xxxxxx010000400003 | 1000 |
| xxxxxx010000010000 | 1001 |
| xxxxxx010000100002 | 1001 |
| xxxxxx010000400004 | 1001 |
| xxxxxx010000001000 | 1010 |
| xxxxxx010000003000 | 1010 |
| xxxxxx010000002000 | 1011 |
| xxxxxx010000004000 | 1011 |
| xxxxxx100002000000 | 1100 |
| xxxxxx100002000003 | 1100 |
| xxxxxx100002000001 | 1100 |
| xxxxxx100002000002 | 1101 |
| xxxxxx100002000004 | 1101 |
| xxxxxx100002000010 | 1101 |
| xxxxxx100002000020 | 1101 |
| xxxxxx100002000030 | 1101 |
| xxxxxx100002000040 | 1101 |
| xxxxxx400004000000 | 1110 |
| xxxxxx400004000003 | 1110 |
| xxxxxx400004000001 | 1110 |
| xxxxxx400004000002 | 1111 |
| xxxxxx400004000004 | 1111 |
| xxxxxx400004000010 | 1111 |
| xxxxxx400004000020 | 1111 |
| xxxxxx400004000030 | 1111 |
| xxxxxx400004000040 | 1111 |
| xxxxxx001000000030 | 0000 |
| xxxxxx001000000000 | 0000 |
| xxxxxx001000000010 | 0000 |
| xxxxxx001000040000 | 0001 |
| xxxxxx001000000003 | 0001 |
| xxxxxx001000000001 | 0001 |
| xxxxxx001000030000 | 0010 |
| xxxxxx001000000002 | 0010 |
| xxxxxx001000000004 | 0010 |
| xxxxxx001000020000 | 0011 |
| xxxxxx001000000200 | 0011 |
| xxxxxx001000010000 | 0100 |
| xxxxxx001000000400 | 0100 |
| xxxxxx001000001000 | 0101 |
| xxxxxx001000003000 | 0101 |
| xxxxxx001000002000 | 0110 |
| xxxxxx001000004000 | 0110 |
| xxxxxx001000000100 | 0111 |
| xxxxxx001000000020 | 0111 |
| xxxxxx001000000300 | 0111 |
| xxxxxx001000000040 | 0111 |
| xxxxxx003000000030 | 1000 |
| xxxxxx003000000000 | 1000 |
| xxxxxx003000000010 | 1000 |
| xxxxxx003000040000 | 1001 |
| xxxxxx003000000003 | 1001 |
| xxxxxx003000000001 | 1001 |
| xxxxxx003000030000 | 1010 |
| xxxxxx003000000002 | 1010 |
| xxxxxx003000000004 | 1010 |
| xxxxxx003000020000 | 1011 |
| xxxxxx003000000200 | 1011 |
| xxxxxx003000010000 | 1100 |
| xxxxxx003000000400 | 1100 |
| xxxxxx003000001000 | 1101 |
| xxxxxx003000003000 | 1101 |
| xxxxxx003000002000 | 1110 |
| xxxxxx003000004000 | 1110 |
| xxxxxx003000000100 | 1111 |
| xxxxxx003000000020 | 1111 |
| xxxxxx003000000300 | 1111 |
| xxxxxx003000000040 | 1111 |
| xxxxxx002000000030 | 0000 |
| xxxxxx002000000000 | 0000 |
| xxxxxx002000000010 | 0000 |
| xxxxxx002000040000 | 0001 |
| xxxxxx002000000003 | 0001 |
| xxxxxx002000000001 | 0001 |
| xxxxxx002000030000 | 0010 |
| xxxxxx002000000002 | 0010 |
| xxxxxx002000000004 | 0010 |

-continued

| Sequence of Code Symbols | x' |
|---|---|
| xxxxxx002000020000 | 0011 |
| xxxxxx002000000200 | 0011 |
| xxxxxx002000010000 | 0100 |
| xxxxxx002000000400 | 0100 |
| xxxxxx002000001000 | 0101 |
| xxxxxx002000003000 | 0101 |
| xxxxxx002000002000 | 0110 |
| xxxxxx002000004000 | 0110 |
| xxxxxx002000000100 | 0111 |
| xxxxxx002000000020 | 0111 |
| xxxxxx002000000300 | 0111 |
| xxxxxx002000000040 | 0111 |
| xxxxxx004000000030 | 1000 |
| xxxxxx004000000000 | 1000 |
| xxxxxx004000000010 | 1000 |
| xxxxxx004000040000 | 1001 |
| xxxxxx004000000003 | 1001 |
| xxxxxx004000000004 | 1001 |
| xxxxxx004000030000 | 1010 |
| xxxxxx004000000002 | 1010 |
| xxxxxx004000000004 | 1010 |
| xxxxxx004000020000 | 1011 |
| xxxxxx004000000200 | 1011 |
| xxxxxx004000010000 | 1100 |
| xxxxxx004000000400 | 1100 |
| xxxxxx004000001000 | 1101 |
| xxxxxx004000003000 | 1101 |
| xxxxxx004000002000 | 1110 |
| xxxxxx004000004000 | 1110 |
| xxxxxx004000000100 | 1111 |
| xxxxxx004000000020 | 1111 |
| xxxxxx004000000300 | 1111 |
| xxxxxx004000000040 | 1111 |
| xxxxxx000000000100 | 0000 |
| xxxxxx000000000020 | 0000 |
| xxxxxx000000000300 | 0000 |
| xxxxxx000000000040 | 0000 |
| xxxxxx000000000010 | 0001 |
| xxxxxx000000000200 | 0001 |
| xxxxxx000000000030 | 0001 |
| xxxxxx000000000400 | 0001 |
| xxxxxx000000400000 | 0010 |
| xxxxxx000000200004 | 0010 |
| xxxxxx000000300001 | 0010 |
| xxxxxx000000300000 | 0011 |
| xxxxxx000000200003 | 0011 |
| xxxxxx000000300002 | 0011 |
| xxxxxx000000200000 | 0100 |
| xxxxxx000000200002 | 0100 |
| xxxxxx000000300003 | 0100 |
| xxxxxx000000100000 | 0101 |
| xxxxxx000000200001 | 0101 |
| xxxxxx000000300004 | 0101 |
| xxxxxx000000040000 | 0110 |
| xxxxxx000000100004 | 0110 |
| xxxxxx000000400001 | 0110 |
| xxxxxx000000030000 | 0111 |
| xxxxxx000000100001 | 0111 |
| xxxxxx000000400002 | 0111 |
| xxxxxx000000020000 | 1000 |
| xxxxxx000000100003 | 1000 |
| xxxxxx000000400003 | 1000 |
| xxxxxx000000010000 | 1001 |
| xxxxxx000000100002 | 1001 |
| xxxxxx000000400004 | 1001 |
| xxxxxx000000001000 | 1010 |
| xxxxxx000000003000 | 1010 |
| xxxxxx000000002000 | 1011 |
| xxxxxx000000004000 | 1011 |
| 000003000003000000 | 1100 |
| 000003000003000003 | 1100 |
| 000003000003000001 | 1100 |
| 000003000003000002 | 1101 |
| 000003000003000004 | 1101 |
| 000003000003000010 | 1101 |
| 000003000003000020 | 1101 |
| 000003000003000030 | 1101 |
| 000003000003000040 | 1101 |

-continued

| Sequence of Code Symbols | x' |
|---|---|
| xxxxxx000001000000 | 1110 |
| xxxxxx000001000003 | 1110 |
| xxxxxx000001000001 | 1110 |
| xxxxxx000001000002 | 1111 |
| xxxxxx000001000004 | 1111 |
| xxxxxx000001000010 | 1111 |
| xxxxxx000001000020 | 1111 |
| xxxxxx000001000030 | 1111 |
| xxxxxx000001000040 | 1111 |
| 000003000002000000 | 0000 |
| 000003000002000003 | 0000 |
| 000003000002000001 | 0000 |
| 000003000002000002 | 0001 |
| 000003000002000004 | 0001 |
| 000003000002000010 | 0001 |
| 000003000002000020 | 0001 |
| 000003000002000030 | 0001 |
| 000003000002000040 | 0001 |
| 000003000004000000 | 0010 |
| 000003000004000003 | 0010 |
| 000003000004000001 | 0010 |
| 000003000004000002 | 0011 |
| 000003000004000004 | 0011 |
| 000003000004000010 | 0011 |
| 000003000004000020 | 0011 |
| 000003000004000030 | 0011 |
| 000003000004000040 | 0011 |
| 000003000020000002 | 0111 |
| 000003000020000004 | 0111 |
| 000003000020000010 | 0111 |
| 000003000020000020 | 0111 |
| 000003000020000030 | 0111 |
| 000003000020000040 | 0111 |
| 000003000020000100 | 1000 |
| 000003000020000003 | 1000 |
| 000003000020000000 | 1000 |
| 000003000020000200 | 1001 |
| 000003000020000300 | 1001 |
| 000003000020000400 | 1001 |
| 000003000020000001 | 1001 |
| 000003000030000100 | 1011 |
| 000003000030000003 | 1011 |
| 000003000030000000 | 1011 |
| 000003000030000200 | 1100 |
| 000003000030000300 | 1100 |
| 000003000030000400 | 1100 |
| 000003000030000001 | 1100 |
| 000003000040000002 | 1101 |
| 000003000040000004 | 1101 |
| 000003000040000010 | 1101 |
| 000003000040000020 | 1101 |
| 000003000040000030 | 1101 |
| 000003000040000040 | 1101 |
| 000003000040000100 | 1110 |
| 000003000040000003 | 1110 |
| 000003000040000000 | 1110 |
| 000003000040000200 | 1111 |
| 000003000040000300 | 1111 |
| 000003000040000400 | 1111 |
| 000003000040000001 | 1111 |
| 000001000003000000 | 1100 |
| 000001000003000003 | 1100 |
| 000001000003000001 | 1100 |
| 000001000003000002 | 1101 |
| 000001000003000004 | 1101 |
| 000001000003000010 | 1101 |
| 000001000003000020 | 1101 |
| 000001000003000030 | 1101 |
| 000001000003000040 | 1101 |
| 000001000002000000 | 0000 |
| 000001000002000003 | 0000 |
| 000001000002000001 | 0000 |
| 000001000002000002 | 0001 |
| 000001000002000004 | 0001 |
| 000001000002000010 | 0001 |
| 000001000002000020 | 0001 |
| 000001000002000030 | 0001 |
| 000001000002000040 | 0001 |

-continued

| Sequence of Code Symbols | x' |
|---|---|
| 000001000004000000 | 0010 |
| 000001000004000003 | 0010 |
| 000001000004000001 | 0010 |
| 000001000004000002 | 0011 |
| 000001000004000004 | 0011 |
| 000001000004000010 | 0011 |
| 000001000004000020 | 0011 |
| 000001000004000030 | 0011 |
| 000001000004000040 | 0011 |
| 000001000020000002 | 0111 |
| 000001000020000004 | 0111 |
| 000001000020000010 | 0111 |
| 000001000020000020 | 0111 |
| 000001000020000030 | 0111 |
| 000001000020000040 | 0111 |
| 000001000020000100 | 1000 |
| 000001000020000003 | 1000 |
| 000001000020000000 | 1000 |
| 000001000020000200 | 1001 |
| 000001000020000300 | 1001 |
| 000001000020000400 | 1001 |
| 000001000020000001 | 1001 |
| 000001000030000100 | 1011 |
| 000001000030000003 | 1011 |
| 000001000030000000 | 1011 |
| 000001000030000200 | 1100 |
| 000001000030000300 | 1100 |
| 000001000030000400 | 1100 |
| 000001000030000001 | 1100 |
| 000001000040000002 | 1101 |
| 000001000040000004 | 1101 |
| 000001000040000010 | 1101 |
| 000001000040000020 | 1101 |
| 000001000040000030 | 1101 |
| 000003000040000040 | 1101 |
| 000001000040000100 | 1110 |
| 000001000040000003 | 1110 |
| 000001000040000000 | 1110 |
| 000001000040000200 | 1111 |
| 000001000040000300 | 1111 |
| 000001000040000400 | 1111 |
| 000001000040000001 | 1111 |
| 000002000003000000 | 1100 |
| 000002000003000003 | 1100 |
| 000002000003000001 | 1100 |
| 000002000003000002 | 1101 |
| 000002000003000004 | 1101 |
| 000002000003000010 | 1101 |
| 000002000003000020 | 1101 |
| 000002000003000030 | 1101 |
| 000002000003000040 | 1101 |
| 000002000002000000 | 0000 |
| 000002000002000003 | 0000 |
| 000002000002000001 | 0000 |
| 000002000002000002 | 0001 |
| 000002000002000004 | 0001 |
| 000002000002000010 | 0001 |
| 000002000002000020 | 0001 |
| 000002000002000030 | 0001 |
| 000002000002000040 | 0001 |
| 000002000004000000 | 0010 |
| 000002000004000003 | 0010 |
| 000002000004000001 | 0010 |
| 000002000004000002 | 0011 |
| 000002000004000004 | 0011 |
| 000002000004000010 | 0011 |
| 000002000004000020 | 0011 |
| 000002000004000030 | 0011 |
| 000002000004000040 | 0011 |
| 000002000020000002 | 0111 |
| 000002000020000004 | 0111 |
| 000002000020000010 | 0111 |
| 000002000020000020 | 0111 |
| 000002000020000030 | 0111 |
| 000002000020000040 | 0111 |
| 000002000020000100 | 1000 |
| 000002000020000003 | 1000 |
| 000002000020000000 | 1000 |

-continued

| Sequence of Code Symbols | x' |
|---|---|
| 000002000020000200 | 1001 |
| 000002000020000300 | 1001 |
| 000002000020000400 | 1001 |
| 000002000020000001 | 1001 |
| 000002000030000100 | 1011 |
| 000002000030000003 | 1011 |
| 000002000030000000 | 1011 |
| 000002000030000200 | 1100 |
| 000002000030000300 | 1100 |
| 000002000030000400 | 1100 |
| 000002000030000001 | 1100 |
| 000002000040000002 | 1101 |
| 000002000040000004 | 1101 |
| 000002000040000010 | 1101 |
| 000002000040000020 | 1101 |
| 000002000040000030 | 1101 |
| 000002000040000040 | 1101 |
| 000002000040000100 | 1110 |
| 000002000040000003 | 1110 |
| 000002000040000000 | 1110 |
| 000002000040000200 | 1111 |
| 000002000040000300 | 1111 |
| 000002000040000400 | 1111 |
| 000002000040000001 | 1111 |
| 000004000003000000 | 1100 |
| 000004000003000003 | 1100 |
| 000004000003000001 | 1100 |
| 000004000003000002 | 1101 |
| 000004000003000004 | 1101 |
| 000004000003000010 | 1101 |
| 000004000003000020 | 1101 |
| 000004000003000030 | 3103 |
| 000004000003000040 | 1101 |
| 000004000002000000 | 0000 |
| 000004000002000003 | 0000 |
| 000004000002000001 | 0000 |
| 000004000002000002 | 0001 |
| 000004000002000004 | 0001 |
| 000004000002000010 | 0001 |
| 000004000002000020 | 0001 |
| 000004000002000030 | 0001 |
| 000004000002000040 | 0001 |
| 000004000004000000 | 0010 |
| 000004000004000003 | 0010 |
| 000004000004000001 | 0010 |
| 000004000004000002 | 0011 |
| 000004000004000004 | 0011 |
| 000004000004000010 | 0011 |
| 000004000004000020 | 0011 |
| 000004000004000030 | 0011 |
| 000004000004000040 | 0011 |
| 000004000020000002 | 0111 |
| 000004000020000004 | 0111 |
| 000004000020000010 | 0111 |
| 000004000020000020 | 0111 |
| 000004000020000030 | 0111 |
| 000004000020000040 | 0111 |
| 000004000020000100 | 1000 |
| 000004000020000003 | 1000 |
| 000004000020000000 | 1000 |
| 000004000020000200 | 1001 |
| 000004000020000300 | 1001 |
| 000004000020000400 | 1001 |
| 000004000020000001 | 1001 |
| 000004000030000100 | 1011 |
| 000004000030000003 | 1011 |
| 000004000030000000 | 1011 |
| 000004000030000200 | 1100 |
| 000004000030000300 | 1100 |
| 000004000030000400 | 1100 |
| 000004000030000001 | 1100 |
| 000004000040000002 | 1101 |
| 000004000040000004 | 1101 |
| 000004000040000010 | 1101 |
| 000004000040000020 | 1101 |
| 000004000040000030 | 1101 |
| 000004000040000040 | 1101 |
| 000004000040000100 | 1110 |

-continued

| Sequence of Code Symbols | x' |
|---|---|
| 000004000040000003 | 1110 |
| 000004000040000000 | 1110 |
| 000004000040000200 | 1111 |
| 000004000040000300 | 1111 |
| 000004000040000400 | 1111 |
| 000004000040000001 | 1111 |
| 000010000002000000 | 0000 |
| 000010000002000003 | 0000 |
| 000010000002000001 | 0000 |
| 000010000002000002 | 0001 |
| 000010000002000004 | 0001 |
| 000010000002000010 | 0001 |
| 000010000002000020 | 0001 |
| 000010000002000030 | 0001 |
| 000010000002000040 | 0001 |
| 000010000004000000 | 0010 |
| 000010000004000003 | 0010 |
| 000010000004000001 | 0010 |
| 000010000004000002 | 0011 |
| 000010000004000004 | 0011 |
| 000010000004000010 | 0011 |
| 000010000004000020 | 0011 |
| 000010000004000030 | 0011 |
| 000010000004000040 | 0011 |
| 000010000020000002 | 0111 |
| 000010000020000004 | 0111 |
| 000010000020000010 | 0111 |
| 000010000020000020 | 0111 |
| 000010000020000030 | 0111 |
| 000010000020000040 | 0111 |
| 000010000020000100 | 1000 |
| 000010000020000003 | 1000 |
| 000010000020000000 | 1000 |
| 000010000020000200 | 1001 |
| 000010000020000300 | 1001 |
| 000010000020000400 | 1001 |
| 000010000020000001 | 1001 |
| 000010000030000100 | 1011 |
| 000010000030000003 | 1011 |
| 000010000030000000 | 1011 |
| 000010000030000200 | 1100 |
| 000010000030000300 | 1100 |
| 000010000030000400 | 1100 |
| 000010000030000001 | 1100 |
| 000010000040000002 | 1101 |
| 000010000040000004 | 1101 |
| 000010000040000010 | 1101 |
| 000010000040000020 | 1101 |
| 000010000040000030 | 1101 |
| 000010000040000040 | 1101 |
| 000010000040000100 | 1110 |
| 000010000040000003 | 1110 |
| 000010000040000000 | 1110 |
| 000010000040000200 | 1111 |
| 000010000040000300 | 1111 |
| 000010000040000400 | 1111 |
| 000010000040000001 | 1111 |
| 000010000003000000 | 0001 |
| 000010000003000003 | 0001 |
| 000010000003000001 | 0001 |
| 000010000200000002 | 0000 |
| 000010000200000004 | 0000 |
| 000010000200000010 | 0000 |
| 000010000200000020 | 0000 |
| 000010000200000030 | 0000 |
| 000010000200000040 | 0000 |
| 000010000200000100 | 0001 |
| 000010000200000003 | 0001 |
| 000010000200000000 | 0001 |
| 000010000200000200 | 0010 |
| 000010000200000300 | 0010 |
| 000010000200000400 | 0010 |
| 000010000200000001 | 0010 |
| 000010000200001000 | 0011 |
| 000010000200003000 | 0011 |
| 000010000200002000 | 0100 |
| 000010000200004000 | 0100 |
| 000010000400000002 | 1010 |

-continued

| Sequence of Code Symbols | x' |
|---|---|
| 000010000400000004 | 1010 |
| 000010000400000010 | 1010 |
| 000010000400000020 | 1010 |
| 000010000400000030 | 1010 |
| 000010000400000040 | 1010 |
| 000010000400000100 | 1011 |
| 000010000400000003 | 1011 |
| 000010000400000000 | 1011 |
| 000010000400000200 | 1100 |
| 000010000400000300 | 1100 |
| 000010000400000400 | 1100 |
| 000010000400000001 | 1100 |
| 000010000400001000 | 1101 |
| 000010000400003000 | 1101 |
| 000020000002000000 | 0000 |
| 000020000002000003 | 0000 |
| 000020000002000001 | 0000 |
| 000020000002000002 | 0001 |
| 000020000002000004 | 0001 |
| 000020000002000010 | 0001 |
| 000020000002000020 | 0001 |
| 000020000002000030 | 0001 |
| 000020000002000040 | 0001 |
| 000020000004000000 | 0010 |
| 000020000004000003 | 0010 |
| 000020000004000001 | 0010 |
| 000020000004000002 | 0011 |
| 000020000004000004 | 0011 |
| 000020000004000010 | 0011 |
| 000020000004000020 | 0011 |
| 000020000004000030 | 0011 |
| 000020000004000040 | 0011 |
| 000020000020000002 | 0111 |
| 000020000020000004 | 0111 |
| 000020000020000010 | 0111 |
| 000020000020000020 | 0111 |
| 000020000020000030 | 0111 |
| 000020000020000040 | 0111 |
| 000020000020000100 | 1000 |
| 000020000020000003 | 1000 |
| 000020000020000000 | 1000 |
| 000020000020000200 | 1001 |
| 000020000020000300 | 1011 |
| 000020000020000400 | 1001 |
| 000020000020000001 | 1001 |
| 000020000030000100 | 1011 |
| 000020000030000003 | 1011 |
| 000020000030000000 | 1011 |
| 000020000030000200 | 1100 |
| 000020000030000300 | 1100 |
| 000020000030000400 | 1100 |
| 000020000030000001 | 1100 |
| 000020000040000002 | 1101 |
| 000020000040000004 | 1101 |
| 000020000040000010 | 1101 |
| 000020000040000020 | 1101 |
| 000020000040000030 | 1101 |
| 000020000040000040 | 1101 |
| 000020000040000100 | 1110 |
| 000020000040000003 | 1110 |
| 000020000040000000 | 1110 |
| 000020000040000200 | 1111 |
| 000020000040000300 | 1111 |
| 000020000040000400 | 1111 |
| 000020000040000001 | 1111 |
| 000020000003000000 | 0001 |
| 000020000003000003 | 0001 |
| 000020000003000001 | 0001 |
| 000020000200000002 | 0000 |
| 000020000200000004 | 0000 |
| 000020000200000010 | 0000 |
| 000020000200000020 | 0000 |
| 000020000200000030 | 0000 |
| 000020000200000040 | 0000 |
| 000020000200000100 | 0001 |
| 000020000200000003 | 0001 |
| 000020000200000000 | 0001 |
| 000020000200000200 | 0010 |

-continued

| Sequence of Code Symbols | x' |
|---|---|
| 000020000200000300 | 0010 |
| 000020000200000400 | 0010 |
| 000020000200000001 | 0010 |
| 000020000200001000 | 0011 |
| 000020000200003000 | 0011 |
| 000020000200002000 | 0100 |
| 000020000200004000 | 0100 |
| 000020000400000002 | 1010 |
| 000020000400000004 | 1010 |
| 000020000400000010 | 1010 |
| 000020000400000020 | 1010 |
| 000020000400000030 | 1010 |
| 000020000400000040 | 1010 |
| 000020000400000100 | 1011 |
| 000020000400000003 | 1011 |
| 000020000400000000 | 1011 |
| 000020000400000200 | 1100 |
| 000020000400000300 | 1100 |
| 000020000400000400 | 1100 |
| 000020000400000001 | 1100 |
| 000020000400001000 | 1101 |
| 000020000400003000 | 1101 |
| 000030000002000000 | 0000 |
| 000030000002000003 | 0000 |
| 000030000002000001 | 0000 |
| 000030000002000002 | 0001 |
| 000030000002000004 | 0001 |
| 000030000002000010 | 0001 |
| 000030000002000020 | 0001 |
| 000030000002000030 | 0001 |
| 000030000002000040 | 0001 |
| 000030000004000000 | 0010 |
| 000030000004000003 | 0010 |
| 000030000004000001 | 0010 |
| 000030000004000002 | 0011 |
| 000030000004000004 | 0011 |
| 000030000004000010 | 0011 |
| 000030000004000020 | 0011 |
| 000030000004000030 | 0011 |
| 000030000004000040 | 0011 |
| 000030000020000002 | 0111 |
| 000030000020000004 | 0111 |
| 000030000020000010 | 0111 |
| 000030000020000020 | 0111 |
| 000030000020000030 | 0111 |
| 000030000020000040 | 0111 |
| 000030000020000100 | 1000 |
| 000030000020000003 | 1000 |
| 000030000020000000 | 1000 |
| 000030000020000200 | 1001 |
| 000030000020000300 | 1001 |
| 000030000020000400 | 1001 |
| 000030000020000001 | 1001 |
| 000030000030000100 | 1011 |
| 000030000030000003 | 1011 |
| 000030000030000000 | 1011 |
| 000030000030000200 | 1100 |
| 000030000030000300 | 1100 |
| 000030000030000400 | 1100 |
| 000030000030000001 | 1100 |
| 000030000040000002 | 1101 |
| 000030000040000004 | 1101 |
| 000030000040000010 | 1101 |
| 000030000040000020 | 1101 |
| 000030000040000030 | 1101 |
| 000030000040000040 | 1101 |
| 000030000040000100 | 1110 |
| 000030000040000003 | 1110 |
| 000030000040000000 | 1110 |
| 000030000040000200 | 1111 |
| 000030000040000300 | 1111 |
| 000030000040000400 | 1111 |
| 000030000040000001 | 1111 |
| 000030000003000000 | 0001 |
| 000030000003000003 | 0001 |
| 000030000003000001 | 0001 |
| 000030000200000002 | 0000 |
| 000030000200000004 | 0000 |

-continued

| Sequence of Code Symbols | x' |
|---|---|
| 000030000200000010 | 0000 |
| 000030000200000020 | 0000 |
| 000030000200000030 | 0000 |
| 000030000200000040 | 0000 |
| 000030000200000100 | 0001 |
| 000030000200000003 | 0001 |
| 000030000200000000 | 0001 |
| 000030000200000200 | 0010 |
| 000030000200000300 | 0010 |
| 000030000200000400 | 0010 |
| 000030000200000001 | 0010 |
| 000030000200001000 | 0011 |
| 000030000200003000 | 0011 |
| 000030000200002000 | 0100 |
| 000030000200004000 | 0100 |
| 000030000400000002 | 1010 |
| 000030000400000004 | 1010 |
| 000030000400000010 | 1010 |
| 000030000400000020 | 1010 |
| 000030000400000030 | 1010 |
| 000030000400000040 | 1010 |
| 000030000400000100 | 1011 |
| 000030000400000003 | 1011 |
| 000030000400000000 | 1011 |
| 000040000200000200 | 0010 |
| 000040000200000300 | 0010 |
| 000040000200000400 | 0010 |
| 000040000200000001 | 0010 |
| 000040000200001000 | 0011 |
| 000040000200003000 | 0011 |
| 000040000200002000 | 0100 |
| 000040000200004000 | 0100 |
| 000040000400000002 | 1010 |
| 000040000400000004 | 1010 |
| 000040000400000010 | 1010 |
| 000040000400000020 | 1010 |
| 000040000400000030 | 1010 |
| 000040000400000040 | 1010 |
| 000040000400000100 | 1011 |
| 000040000400000003 | 1011 |
| 000040000400000000 | 1011 |
| 000040000400000200 | 1100 |
| 000040000400000300 | 1100 |
| 000040000400000400 | 1100 |
| 000040000400000001 | 1100 |
| 000040000400001000 | 1101 |
| 000040000400003000 | 1101 |
| 000003000003000000 | 1100 |
| 000003000003000003 | 1100 |
| 000003000003000001 | 1100 |
| 000003000003000002 | 1101 |
| 000003000003000004 | 1101 |
| 000003000003000010 | 1101 |
| 000003000003000020 | 1101 |
| 000003000003000030 | 1101 |
| 000003000003000040 | 1101 |
| 000000000200000002 | 0010 |
| 000000000200000004 | 0010 |
| 000000000200000010 | 0010 |
| 000000000200000020 | 0010 |
| 000000000200000030 | 0010 |
| 000000000200000040 | 0010 |
| 000000000200000100 | 0011 |
| 000000000200000003 | 0011 |
| 000000000200000000 | 0011 |
| 000000000200000200 | 0100 |
| 000000000200000300 | 0100 |
| 000000000200000400 | 0100 |
| 000000000200000001 | 0100 |
| 000000000400000002 | 1001 |
| 000000000400000004 | 1001 |
| 000000000400000010 | 1001 |
| 000000000400000020 | 1001 |
| 000000000400000030 | 1001 |
| 000000000400000040 | 1001 |
| 000000000400000100 | 1010 |
| 000000000400000003 | 1010 |
| 000000000400000000 | 1010 |

-continued

| Sequence of Code Symbols | x' |
|---|---|
| 000000000400000200 | 1011 |
| 000000000400000300 | 1011 |
| 000000000400000400 | 1011 |
| 000000000400000001 | 1011 |
| 000000000400001000 | 1100 |
| 000000000400003000 | 1100 |
| 000100000002000000 | 0000 |
| 000100000002000003 | 0000 |
| 000100000002000001 | 0000 |
| 000100000002000002 | 0001 |
| 000100000002000004 | 0001 |
| 000100000002000010 | 0001 |
| 000100000002000020 | 0001 |
| 000100000002000030 | 0001 |
| 000100000002000040 | 0001 |
| 000100000004000000 | 0010 |
| 000100000004000003 | 0010 |
| 000100000004000001 | 0010 |
| 000100000004000002 | 0011 |
| 000100000004000004 | 0011 |
| 000100000004000010 | 0011 |
| 000100000004000020 | 0011 |
| 000100000004000030 | 0011 |
| 000100000004000040 | 0011 |
| 000100000020000002 | 0111 |
| 000100000020000004 | 0111 |
| 000100000020000010 | 0111 |
| 000100000020000020 | 0111 |
| 000100000020000030 | 0111 |
| 000100000020000040 | 0111 |
| 000100000020000100 | 1000 |
| 000100000020000003 | 1000 |
| 000100000020000000 | 1000 |
| 000100000020000200 | 1001 |
| 000100000020000300 | 1001 |
| 000100000020000400 | 1001 |
| 000100000020000001 | 1001 |
| 000100000030000100 | 1011 |
| 000100000030000003 | 1011 |
| 000100000030000000 | 1011 |
| 000100000030000200 | 1100 |
| 000100000030000300 | 1100 |
| 000100000030000400 | 1100 |
| 000100000030000001 | 1100 |
| 000100000040000002 | 1101 |
| 000100000040000004 | 1101 |
| 000100000040000010 | 1101 |
| 000100000040000020 | 1101 |
| 000100000040000030 | 1101 |
| 000100000040000040 | 1101 |
| 000100000040000100 | 1110 |
| 000100000040000003 | 1110 |
| 000100000040000000 | 1110 |
| 000100000040000200 | 1111 |
| 000100000040000300 | 1111 |
| 000100000040000400 | 1111 |
| 000100000040000001 | 1111 |
| 000100000003000000 | 0001 |
| 000100000003000003 | 0001 |
| 000100000003000001 | 0001 |
| 000100000200000002 | 0000 |
| 000100000200000004 | 0000 |
| 000100000200000010 | 0000 |
| 000100000200000020 | 0000 |
| 000100000200000030 | 0000 |
| 000100000200000040 | 0000 |
| 000100000200000100 | 0001 |
| 000100000200000003 | 0001 |
| 000100000200000000 | 0001 |
| 000100000200000200 | 0010 |
| 000100000200000300 | 0010 |
| 000100000200000400 | 0010 |
| 000100000200000001 | 0010 |
| 000100000200001000 | 0011 |
| 000100000200003000 | 0011 |
| 000100000200002000 | 0100 |
| 000100000200004000 | 0100 |
| 000100000400000002 | 1010 |

-continued

| Sequence of Code Symbols | x' |
|---|---|
| 000100000400000004 | 1010 |
| 000100000400000010 | 1010 |
| 000100000400000020 | 1010 |
| 000100000400000030 | 1010 |
| 000100000400000040 | 1010 |
| 000100000400000100 | 1011 |
| 000100000400000003 | 1011 |
| 000100000400000000 | 1011 |
| 000100000400000200 | 1100 |
| 000100000400000300 | 1100 |
| 000100000400000400 | 1100 |
| 000100000400000001 | 1100 |
| 000100000400001000 | 1101 |
| 000100000400003000 | 1101 |
| 000200000002000000 | 0000 |
| 000200000002000003 | 0000 |
| 000200000002000001 | 0000 |
| 000200000002000002 | 0001 |
| 000200000002000004 | 0001 |
| 000200000002000010 | 0001 |
| 000200000002000020 | 0001 |
| 000200000002000030 | 0001 |
| 000200000002000040 | 0001 |
| 000200000004000000 | 0010 |
| 000200000004000003 | 0010 |
| 000200000004000001 | 0010 |
| 000200000004000002 | 0011 |
| 000200000004000004 | 0011 |
| 000200000004000010 | 0011 |
| 000200000004000020 | 0011 |
| 000200000004000030 | 0011 |
| 000200000004000040 | 0011 |
| 000200000020000002 | 0111 |
| 000200000020000004 | 0111 |
| 000200000020000010 | 0111 |
| 000200000020000020 | 0111 |
| 000200000020000030 | 0111 |
| 000200000020000040 | 0111 |
| 000200000020000100 | 1000 |
| 000200000020000003 | 1000 |
| 000200000020000000 | 1000 |
| 000200000020000200 | 1001 |
| 000200000020000300 | 1001 |
| 000200000020000400 | 1001 |
| 000200000020000001 | 1001 |
| 000200000030000100 | 1011 |
| 000200000030000003 | 1011 |
| 000200000030000000 | 1011 |
| 000200000030000200 | 1100 |
| 000200000030000300 | 1100 |
| 000200000030000400 | 1100 |
| 000200000030000001 | 1100 |
| 000200000040000002 | 1101 |
| 000200000040000004 | 1101 |
| 000200000040000010 | 1101 |
| 000200000040000020 | 1101 |
| 000200000040000030 | 1101 |
| 000200000040000040 | 1101 |
| 000200000040000100 | 1110 |
| 000200000040000003 | 1110 |
| 000200000040000000 | 1110 |
| 000200000040000200 | 1111 |
| 000200000040000300 | 1111 |
| 000200000040000400 | 1111 |
| 000200000040000001 | 1111 |
| 000200000003000000 | 0001 |
| 000200000003000003 | 0001 |
| 000200000003000001 | 0001 |
| 000200000200000002 | 0000 |
| 000200000200000004 | 0000 |
| 000200000200000010 | 0000 |
| 000200000200000020 | 0000 |
| 000200000200000030 | 0000 |
| 000200000200000040 | 0000 |
| 000200000200000100 | 0001 |
| 000200000200000003 | 0001 |
| 000200000200000000 | 0001 |
| 000200000200000200 | 0010 |

-continued

| Sequence of Code Symbols | x' |
|---|---|
| 0002000002000003OO | 0010 |
| 000200000200000400 | 0010 |
| 000200000200000001 | 0010 |
| 000200000200001000 | 0011 |
| 000200000200003000 | 0011 |
| 000200000200002000 | 0100 |
| 000200000200004000 | 0100 |
| 000200000400000002 | 1010 |
| 000200000400000004 | 1010 |
| 000200000400000010 | 1010 |
| 000200000400000020 | 1010 |
| 000200000400000030 | 1010 |
| 000200000400000040 | 1010 |
| 000200000400000100 | 1011 |
| 000200000400000003 | 1011 |
| 000200000400000000 | 1011 |
| 000200000400000200 | 1100 |
| 000200000400000300 | 1100 |
| 000200000400000400 | 1100 |
| 000200000400000001 | 1100 |
| 000200000400001000 | 1101 |
| 000200000400003000 | 1101 |
| 000300000002000000 | 0000 |
| 000300000002000003 | 0000 |
| 000300000002000001 | 0000 |
| 000300000002000002 | 0001 |
| 000300000002000004 | 0001 |
| 000300000002000010 | 0001 |
| 000300000002000020 | 0001 |
| 000300000002000030 | 0001 |
| 000300000002000040 | 0001 |
| 000300000004000000 | 0010 |
| 000300000004000003 | 0010 |
| 000300000004000001 | 0010 |
| 000300000004000002 | 0011 |
| 000300000004000004 | 0011 |
| 000300000004000010 | 0011 |
| 000300000004000020 | 0011 |
| 000300000004000030 | 0011 |
| 000300000004000040 | 0011 |
| 000300000020000002 | 0111 |
| 000300000020000004 | 0111 |
| 000300000020000010 | 0111 |
| 000300000020000020 | 0111 |
| 000300000020000030 | 0111 |
| 000300000020000040 | 0111 |
| 000300000020000100 | 1000 |
| 000300000020000003 | 1000 |
| 000300000020000000 | 1000 |
| 000300000020000200 | 1001 |
| 000300000020000300 | 1001 |
| 000300000020000400 | 1001 |
| 000300000020000001 | 1001 |
| 000300000030000100 | 1011 |
| 000300000030000003 | 1011 |
| 000300000030000000 | 1011 |
| 000300000030000200 | 1100 |
| 000300000030000300 | 1100 |
| 000300000030000400 | 1100 |
| 000300000030000001 | 1100 |
| 000300000040000002 | 1101 |
| 000300000040000004 | 1101 |
| 000300000040000010 | 1101 |
| 000300000040000020 | 1101 |
| 000300000040000030 | 1101 |
| 000300000040000040 | 1101 |
| 000300000040000100 | 1110 |
| 000300000040000003 | 1110 |
| 000300000040000000 | 1110 |
| 000300000040000200 | 1111 |
| 000300000040000300 | 1111 |
| 000300000040000400 | 1111 |
| 000300000040000001 | 1111 |
| 000300000003000000 | 0001 |
| 000300000003000003 | 0001 |
| 000300000003000001 | 0001 |
| 000300000200000002 | 0000 |
| 000300000200000004 | 0000 |

-continued

| Sequence of Code Symbols | x' |
|---|---|
| 000300000200000010 | 0000 |
| 000300000200000020 | 0000 |
| 000300000200000030 | 0000 |
| 000300000200000040 | 0000 |
| 000300000200000100 | 0001 |
| 000300000200000003 | 0001 |
| 000300000200000000 | 0001 |
| 000300000200000200 | 0010 |
| 000300000200000300 | 0010 |
| 000300000200000400 | 0010 |
| 000300000200000001 | 0010 |
| 000300000200001000 | 0011 |
| 000300000200003000 | 0011 |
| 000300000200002000 | 0100 |
| 000300000200004000 | 0100 |
| 000300000400000002 | 1010 |
| 000300000400000004 | 1010 |
| 000300000400000010 | 1010 |
| 000300000400000020 | 1010 |
| 000300000400000030 | 1010 |
| 000300000400000040 | 1010 |
| 000300000400000100 | 1011 |
| 000300000400000003 | 1011 |
| 000300000400000000 | 1011 |
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1100 |
| 000430000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |
| 000400000040000030 | 1101 |
| 000400000040000040 | 1101 |
| 000400000040000100 | 1110 |
| 000400000040000003 | 1110 |
| 000400000040000000 | 1110 |
| 000400000040000200 | 1111 |

-continued

| Sequence of Code Symbols | x' |
|---|---|
| 000400000040000300 | 1111 |
| 000400000040000400 | 1111 |
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0001 |
| 000400000200000003 | 0001 |
| 000400000200000000 | 0001 |
| 000400000200000200 | 0010 |
| 000400000200000300 | 0010 |
| 000400000200000400 | 0010 |
| 000400000200000001 | 0010 |
| 000400000200001000 | 0011 |
| 000400000200003000 | 0011 |
| 000400000200002000 | 0100 |
| 000400000200004000 | 0100 |
| 000400000400000002 | 1010 |
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |
| 000001000003000000 | 1100 |
| 000001000003000003 | 1100 |
| 000001000003000001 | 1100 |
| 000001000003000002 | 1101 |
| 000001000003000004 | 1101 |
| 000001000003000010 | 1101 |
| 000001000003000020 | 1101 |
| 000001000003000030 | 1101 |
| 000001000003000040 | 1101 |
| 000001000002000000 | 0000 |
| 000001000002000003 | 0000 |
| 000001000002000001 | 0000 |
| 000001000002000002 | 0001 |
| 000001000002000004 | 0001 |
| 000001000002000010 | 0001 |
| 000001000002000020 | 0001 |
| 000001000002000030 | 0001 |
| 000001000002000040 | 0001 |
| 000001000004000000 | 0010 |
| 000001000004000003 | 0010 |
| 000001000004000001 | 0010 |
| 000001000004000002 | 0011 |
| 000001000004000004 | 0011 |
| 000001000004000010 | 0011 |
| 000001000004000020 | 0011 |
| 000001000004000030 | 0011 |
| 000001000004000040 | 0011 |
| 000001000020000002 | 0111 |
| 000001000020000004 | 0111 |
| 000001000020000010 | 0111 |
| 000001000020000020 | 0111 |
| 000001000020000030 | 0111 |
| 000001000020000040 | 0111 |
| 000001000020000100 | 1000 |
| 000001000020000003 | 1000 |
| 000001000020000000 | 1000 |
| 000001000020000200 | 1001 |
| 000001000020000300 | 1001 |
| 000001000020000400 | 1001 |
| 000001000020000001 | 1001 |

-continued

| Sequence of Code Symbols | x' |
|---|---|
| 000001000030000100 | 1011 |
| 000001000030000003 | 1011 |
| 000001000030000000 | 1011 |
| 000001000030000200 | 1100 |
| 000001000030000300 | 1100 |
| 000001000030000400 | 1100 |
| 000001000030000001 | 1100 |
| 000001000040000002 | 1101 |
| 000001000040000004 | 1101 |
| 000001000040000010 | 1101 |
| 000001000040000020 | 1101 |
| 000001000040000030 | 1101 |
| 000001000040000040 | 1101 |
| 000001000040000100 | 1110 |
| 000001000040000003 | 1110 |
| 000001000040000000 | 1110 |
| 000001000040000200 | 1111 |
| 000001000040000300 | 1111 |
| 000001000040000400 | 1111 |
| 000001000040000001 | 1111 |
| 001000000030000100 | 0000 |
| 001000000030000003 | 0000 |
| 001000000030000000 | 0000 |
| 001000000030000200 | 0001 |
| 001000000030000300 | 0001 |
| 001000000030000400 | 0001 |
| 001000000030000001 | 0001 |
| 001000000003000000 | 1100 |
| 001000000003000003 | 1100 |
| 001000000003000001 | 1100 |
| 001000000003000002 | 1101 |
| 001000000003000004 | 1101 |
| 001000000003000010 | 1101 |
| 001000000003000020 | 1101 |
| 001000000003000030 | 1101 |
| 001000000003000040 | 1101 |
| 001000000002000000 | 1100 |
| 001000000002000003 | 1100 |
| 001000000002000001 | 1100 |
| 001000000002000002 | 1101 |
| 001000000002000004 | 1101 |
| 001000000002000010 | 1101 |
| 001000000002000020 | 1101 |
| 001000000002000030 | 1101 |
| 001000000002000040 | 1101 |
| 001000000004000000 | 1110 |
| 001000000004000003 | 1110 |
| 001000000004000001 | 1110 |
| 001000000004000002 | 1111 |
| 001000000004000004 | 1111 |
| 001000000004000010 | 1111 |
| 001000000004000020 | 1111 |
| 001000000004000030 | 1111 |
| 001000000004000040 | 1111 |
| 001000000200000002 | 1100 |
| 001000000200000004 | 1100 |
| 001000000200000010 | 1100 |
| 001000000200000020 | 1100 |
| 001000000200000030 | 1100 |
| 001000000200000040 | 1100 |
| 001000000200000100 | 1101 |
| 001000000200000003 | 1101 |
| 001000000200000000 | 1101 |
| 001000000200000200 | 1110 |
| 001000000200000300 | 1110 |
| 001000000200000400 | 1110 |
| 001000000200000001 | 1110 |
| 001000000200001000 | 1111 |
| 001000000200003000 | 1111 |
| 001000000400000002 | 1100 |
| 001000000400000004 | 1100 |
| 001000000400000010 | 1100 |
| 001000000400000020 | 1100 |
| 001000000400000030 | 1100 |
| 001000000400000040 | 1100 |
| 001000000400000100 | 1101 |
| 001000000400000003 | 1101 |
| 001000000400000000 | 1101 |

-continued

| Sequence of Code Symbols | x' |
|---|---|
| 00100000400000200 | 1110 |
| 00100000400000300 | 1110 |
| 00100000400000400 | 1110 |
| 00100000400000001 | 1110 |
| 00100000400001000 | 1111 |
| 00100000400003000 | 1111 |
| 00100000020000002 | 0010 |
| 00100000020000004 | 0010 |
| 00100000020000010 | 0010 |
| 00100000020000020 | 0010 |
| 00100000020000030 | 0010 |
| 00100000020000040 | 0010 |
| 00100000020000100 | 0011 |
| 00100000020000003 | 0011 |
| 00100000020000000 | 0011 |
| 00100000020000200 | 0100 |
| 00100000020000300 | 0100 |
| 00100000020000400 | 0100 |
| 00100000040000001 | 0100 |
| 00100000040000002 | 1010 |
| 00100000040000004 | 1010 |
| 00100000040000010 | 1010 |
| 00100000040000020 | 1010 |
| 00100000040000030 | 1010 |
| 00100000040000040 | 1010 |
| 00100000040000100 | 1011 |
| 00100000040000003 | 1011 |
| 00100000040000000 | 1011 |
| 00100000040000200 | 1100 |
| 00100000040000300 | 1100 |
| 00100000040000400 | 1100 |
| 00100000040000001 | 1100 |
| 00300000030000100 | 0000 |
| 00300000030000003 | 0000 |
| 00300000030000000 | 0000 |
| 00300000030000200 | 0001 |
| 00300000030000300 | 0001 |
| 00300000030000400 | 0001 |
| 00300000030000001 | 0001 |
| 00300000003000000 | 1100 |
| 00300000003000003 | 1100 |
| 00300000003000001 | 1100 |
| 00300000003000002 | 1101 |
| 00300000003000004 | 1101 |
| 00300000003000010 | 1101 |
| 00300000003000020 | 1101 |
| 00300000003000030 | 1101 |
| 00300000003000040 | 1101 |
| 00300000002000000 | 1100 |
| 00300000002000003 | 1100 |
| 00300000002000001 | 1100 |
| 00300000002000002 | 1101 |
| 00300000002000004 | 1101 |
| 00300000002000010 | 1101 |
| 00300000002000020 | 1101 |
| 00300000002000030 | 1101 |
| 00300000002000040 | 1101 |
| 00300000004000000 | 1110 |
| 00300000004000003 | 1110 |
| 00300000004000001 | 1110 |
| 00300000004000002 | 1111 |
| 00300000004000004 | 1111 |
| 00300000004000010 | 1111 |
| 00300000004000020 | 1111 |
| 00300000004000030 | 1111 |
| 00300000004000040 | 1111 |
| 00300000200000002 | 1100 |
| 00300000200000004 | 1100 |
| 00300000200000010 | 1100 |
| 00300000200000020 | 1100 |
| 00300000200000030 | 1100 |
| 00300000200000040 | 1100 |
| 00300000200000100 | 1101 |
| 00300000200000003 | 1101 |
| 00300000200000000 | 1101 |
| 00300000200000200 | 1110 |
| 00300000200000300 | 1110 |
| 00300000200000400 | 1110 |

-continued

| Sequence of Code Symbols | x' |
|---|---|
| 00300000200000001 | 1110 |
| 00300000200001000 | 1111 |
| 00300000200003000 | 1111 |
| 00300000400000002 | 1100 |
| 00300000400000004 | 1100 |
| 00300000400000010 | 1100 |
| 00300000400000020 | 1100 |
| 00300000400000030 | 1100 |
| 00300000400000040 | 1100 |
| 00300000400000100 | 1101 |
| 00300000400000003 | 1101 |
| 00300000400000000 | 1101 |
| 00300000400000200 | 1110 |
| 00300000400000300 | 1110 |
| 00300000400000400 | 1110 |
| 00300000400000001 | 1110 |
| 00300000400001000 | 1111 |
| 00300000400003000 | 1111 |
| 00300000020000002 | 0010 |
| 00300000020000004 | 0010 |
| 00300000020000010 | 0010 |
| 00300000020000020 | 0010 |
| 00300000020000030 | 0010 |
| 00300000020000040 | 0010 |
| 00300000020000100 | 0011 |
| 00300000020000003 | 0011 |
| 00300000020000000 | 0011 |
| 00300000020000200 | 0100 |
| 00300000020000300 | 0100 |
| 00300000020000400 | 0100 |
| 00300000020000001 | 0100 |
| 00300000040000002 | 1010 |
| 00300000040000004 | 1010 |
| 00300000040000010 | 1010 |
| 00300000040000020 | 1010 |
| 00300000040000030 | 1010 |
| 00300000040000040 | 1010 |
| 00300000040000100 | 1011 |
| 00300000040000003 | 1011 |
| 00300000040000000 | 1011 |
| 00300000040000200 | 1100 |
| 00300000040000300 | 1100 |
| 00300000040000400 | 1100 |
| 00300000040000001 | 1100 |
| 00200000030000100 | 0000 |
| 00200000030000003 | 0000 |
| 00200000030000000 | 0000 |
| 00200000030000200 | 0001 |
| 00200000030000300 | 0001 |
| 00200000030000400 | 0001 |
| 00200000030000001 | 0001 |
| 00200000003000000 | 1100 |
| 00200000003000003 | 1100 |
| 00200000003000001 | 1100 |
| 00200000003000002 | 1101 |
| 00200000003000004 | 1101 |
| 00200000003000010 | 1101 |
| 00200000003000020 | 1101 |
| 00200000003000030 | 1101 |
| 00200000003000040 | 1101 |
| 00200000002000000 | 1100 |
| 00200000002000003 | 1100 |
| 00200000002000001 | 1100 |
| 00200000002000002 | 1101 |
| 00200000002000004 | 1101 |
| 00200000002000010 | 1101 |
| 00200000002000020 | 1101 |
| 00200000002000030 | 1101 |
| 00200000002000040 | 1101 |
| 00200000004000000 | 1110 |
| 00200000004000003 | 1110 |
| 00200000004000001 | 1110 |
| 00200000004000002 | 1111 |
| 00200000004000004 | 1111 |
| 00200000004000010 | 1111 |
| 00200000004000020 | 1111 |
| 00200000004000030 | 1111 |
| 00200000004000040 | 1111 |

-continued

| Sequence of Code Symbols | x' |
|---|---|
| 002000000200000002 | 1100 |
| 002000000200000004 | 1100 |
| 002000000200000010 | 1100 |
| 002000000200000020 | 1100 |
| 002000000200000030 | 1100 |
| 002000000200000040 | 1100 |
| 002000000200000100 | 1101 |
| 002000000200000003 | 1101 |
| 002000000200000000 | 1101 |
| 002000000200000200 | 1110 |
| 002000000200000300 | 1110 |
| 002000000200000400 | 1110 |
| 002000000200000001 | 1110 |
| 002000000200001000 | 1111 |
| 002000000200003000 | 1111 |
| 002000000400000002 | 1100 |
| 002000000400000004 | 1100 |
| 002000000400000010 | 1100 |
| 002000000400000020 | 1100 |
| 002000000400000030 | 1100 |
| 002000000400000040 | 1100 |
| 002000000400000100 | 1101 |
| 002000000400000003 | 1101 |
| 002000000400000000 | 1101 |
| 002000000400000200 | 1110 |
| 002000000400000300 | 1110 |
| 002000000400000400 | 1110 |
| 002000000400000001 | 1110 |
| 002000000400001000 | 1111 |
| 002000000400003000 | 1111 |
| 002000000020000002 | 0010 |
| 002000000020000004 | 0010 |
| 002000000020000010 | 0010 |
| 002000000020000020 | 0010 |
| 002000000020000030 | 0010 |
| 002000000020000040 | 0010 |
| 002000000020000100 | 0011 |
| 002000000020000003 | 0011 |
| 002000000020000000 | 0011 |
| 002000000020000200 | 0100 |
| 002000000020000300 | 0100 |
| 002000000020000400 | 0100 |
| 002000000020000001 | 0100 |
| 002000000040000002 | 1010 |
| 002000000040000004 | 1010 |
| 002000000040000010 | 1010 |
| 002000000040000020 | 1010 |
| 002000000040000030 | 1010 |
| 002000000040000040 | 1010 |
| 002000000040000100 | 1011 |
| 002000000040000003 | 1011 |
| 002000000040000000 | 1011 |
| 002000000040000200 | 1100 |
| 002000000040000300 | 1100 |
| 002000000040000400 | 1100 |
| 002000000040000001 | 1100 |
| 004000000030000100 | 0000 |
| 004000000030000003 | 0000 |
| 004000000030000000 | 0000 |
| 004000000030000200 | 0001 |
| 004000000030000300 | 0001 |
| 004000000030000400 | 0001 |
| 004000000030000001 | 0001 |
| 004000000003000000 | 1100 |
| 004000000003000003 | 1100 |
| 004000000003000001 | 1100 |
| 004000000003000002 | 1101 |
| 004000000003000004 | 1101 |
| 004000000003000010 | 1101 |
| 004000000003000020 | 1101 |
| 004000000003000030 | 1301 |
| 004000000003000040 | 1101 |
| 004000000002000000 | 1100 |
| 004000000002000003 | 1100 |
| 004000000002000001 | 1100 |
| 004000000002000002 | 1101 |
| 004000000002000004 | 1101 |
| 004000000002000010 | 1101 |

-continued

| Sequence of Code Symbols | x' |
|---|---|
| 004000000002000020 | 1101 |
| 004000000002000030 | 1101 |
| 004000000002000040 | 1101 |
| 004000000004000000 | 1110 |
| 004000000004000003 | 1110 |
| 004000000004000001 | 1110 |
| 004000000004000002 | 1111 |
| 004000000004000004 | 1111 |
| 004000000004000010 | 1111 |
| 004000000004000020 | 1111 |
| 004000000004000030 | 1111 |
| 004000000004000040 | 1111 |
| 004000000200000002 | 1100 |
| 004000000200000004 | 1100 |
| 004000000200000010 | 1100 |
| 004000000200000020 | 1100 |
| 004000000200000030 | 1100 |
| 004000000200000040 | 1100 |
| 004000000200000100 | 1101 |
| 004000000200000003 | 1101 |
| 004000000200000000 | 1101 |
| 004000000200000200 | 1110 |
| 004000000200000300 | 1110 |
| 004000000200000400 | 1110 |
| 004000000200000001 | 1110 |
| 004000000200001000 | 1111 |
| 004000000200003000 | 1111 |
| 004000000400000002 | 1100 |
| 004000000400000004 | 1100 |
| 004000000400000010 | 1100 |
| 004000000400000020 | 1100 |
| 004000000400000030 | 1100 |
| 004000000400000040 | 1100 |
| 004000000400000100 | 1101 |
| 004000000400000003 | 1101 |
| 004000000400000000 | 1101 |
| 004000000400000200 | 1110 |
| 004000000400000300 | 1110 |
| 004000000400000400 | 1110 |
| 004000000400000001 | 1110 |
| 004000000400001000 | 1111 |
| 004000000400003000 | 1111 |
| 004000000020000002 | 0010 |
| 004000000020000004 | 0010 |
| 004000000020000010 | 0010 |
| 004000000020000020 | 0010 |
| 004000000020000030 | 0010 |
| 004000000020000040 | 0010 |
| 004000000020000100 | 0011 |
| 004000000020000003 | 0011 |
| 004000000020000000 | 0011 |
| 004000000020000200 | 0100 |
| 004000000020000300 | 0100 |
| 004000000020000400 | 0100 |
| 004000000020000001 | 0100 |
| 004000000040000002 | 1010 |
| 004000000040000004 | 1010 |
| 004000000040000010 | 1010 |
| 004000000040000020 | 1010 |
| 004000000040000030 | 1010 |
| 004000000040000040 | 1010 |
| 004000000040000100 | 1011 |
| 004000000040000003 | 1011 |
| 004000000040000000 | 1011 |
| 004000000040000200 | 1100 |
| 004000000040000300 | 1100 |
| 004000000040000400 | 1100 |
| 004000000040000001 | 1100 |
| 004000000002000000 | 0000 |
| 004000000002000003 | 0000 |
| 004000000002000001 | 0000 |
| 004000000002000002 | 0001 |
| 000200000002000004 | 0001 |
| 000200000002000010 | 0001 |
| 000200000002000020 | 0001 |
| 000200000002000030 | 0001 |
| 000200000002000040 | 0001 |
| 000200000004000000 | 0010 |

-continued

| Sequence of Code Symbols | x' |
|---|---|
| 0002000000004000003 | 0010 |
| 0002000000004000001 | 0010 |
| 0002000000004000002 | 0011 |
| 0002000000004000004 | 0011 |
| 0002000000004000010 | 0011 |
| 0002000000004000020 | 0011 |
| 0002000000004000030 | 0011 |
| 0002000000004000040 | 0011 |
| 0002000000020000002 | 0111 |
| 0002000000020000004 | 0111 |
| 0002000000020000010 | 0111 |
| 0002000000020000020 | 0111 |
| 0002000000020000030 | 0111 |
| 0002000000020000040 | 0111 |
| 0002000000020000100 | 1000 |
| 0002000000020000003 | 1000 |
| 0002000000020000000 | 1000 |
| 0002000000020000200 | 1001 |
| 0002000000020000300 | 1001 |
| 0002000000020000400 | 1001 |
| 0002000000020000001 | 1001 |
| 0002000000030000100 | 1011 |
| 0002000000030000003 | 1011 |
| 0002000000030000000 | 1011 |
| 0002000000030000200 | 1100 |
| 0002000000030000300 | 1100 |
| 0002000000030000400 | 1100 |
| 0002000000030000001 | 1100 |
| 0002000000040000002 | 1101 |
| 0002000000040000004 | 1101 |
| 0002000000040000010 | 1101 |
| 0002000000040000020 | 1101 |
| 0002000000040000030 | 1101 |
| 0002000000040000040 | 1101 |
| 0002000000040000100 | 1110 |
| 0002000000040000003 | 1110 |
| 0002000000040000000 | 1110 |
| 0002000000040000200 | 1111 |
| 0002000000040000300 | 1111 |
| 0002000000040000400 | 1111 |
| 0002000000040000001 | 1111 |
| 0002000000003000000 | 0001 |
| 0002000000003000003 | 0001 |
| 0002000000003000001 | 0001 |
| 0002000000200000002 | 0000 |
| 0002000000200000004 | 0000 |
| 0002000000200000010 | 0000 |
| 0002000000200000020 | 0000 |
| 0002000000200000030 | 0000 |
| 0002000000200000040 | 0000 |
| 0002000000200000100 | 0001 |
| 0002000000200000003 | 0001 |
| 0002000000200000000 | 0001 |
| 0002000000200000200 | 0010 |
| 0002000000200000300 | 0010 |
| 0002000000200000400 | 0010 |
| 0002000000200000001 | 0010 |
| 0002000000200001000 | 0011 |
| 0002000000200003000 | 0011 |
| 0002000000200002000 | 0100 |
| 0002000000200004000 | 0100 |
| 0002000000400000002 | 1010 |
| 0002000000400000004 | 1010 |
| 0002000000400000010 | 1010 |
| 0002000000400000020 | 1010 |
| 0002000000400000030 | 1010 |
| 0002000000400000040 | 1010 |
| 0002000000400000100 | 1011 |
| 0002000000400000003 | 1011 |
| 0002000000400000000 | 1011 |
| 0002000000400000200 | 1100 |
| 0002000000400000300 | 1100 |
| 0002000000400000400 | 1100 |
| 0002000000400000001 | 1101 |
| 0002000000400001000 | 1101 |
| 0002000000400003000 | 1101 |
| 0003000000002000000 | 0000 |
| 0003000000002000003 | 0000 |

-continued

| Sequence of Code Symbols | x' |
|---|---|
| 0003000000002000001 | 0000 |
| 0003000000002000002 | 0001 |
| 0003000000002000004 | 0001 |
| 0003000000002000010 | 0001 |
| 0003000000002000020 | 0001 |
| 0003000000002000030 | 0001 |
| 0003000000002000040 | 0001 |
| 0003000000004000000 | 0010 |
| 0003000000004000003 | 0010 |
| 0003000000004000001 | 0010 |
| 0003000000004000002 | 0011 |
| 0003000000004000004 | 0011 |
| 0003000000004000010 | 0011 |
| 0003000000004000020 | 0011 |
| 0003000000004000030 | 0011 |
| 0003000000004000040 | 0011 |
| 0003000000020000002 | 0111 |
| 0003000000020000004 | 0111 |
| 0003000000020000010 | 0111 |
| 0003000000020000020 | 0111 |
| 0003000000020000030 | 0111 |
| 0003000000020000040 | 0111 |
| 0003000000020000100 | 1000 |
| 0003000000020000003 | 1000 |
| 0003000000020000000 | 1000 |
| 0003000000020000200 | 1001 |
| 0003000000020000300 | 1001 |
| 0003000000020000400 | 1001 |
| 0003000000020000001 | 1001 |
| 0003000000030000100 | 1011 |
| 0003000000030000003 | 1011 |
| 0003000000030000000 | 1011 |
| 0003000000030000200 | 1100 |
| 0003000000030000300 | 1100 |
| 0003000000030000400 | 1100 |
| 0003000000030000001 | 1100 |
| 0003000000040000002 | 1101 |
| 0003000000040000004 | 1101 |
| 0003000000040000010 | 1101 |
| 0003000000040000020 | 1101 |
| 0003000000040000030 | 1101 |
| 0003000000040000040 | 1101 |
| 0003000000040000100 | 1110 |
| 0003000000040000003 | 1110 |
| 0003000000040000000 | 1110 |
| 0003000000040000200 | 1111 |
| 0003000000040000300 | 1111 |
| 0003000000040000400 | 1111 |
| 0003000000040000001 | 1111 |
| 0003000000003000000 | 0001 |
| 0003000000003000003 | 0001 |
| 0003000000003000001 | 0001 |
| 0003000000200000002 | 0000 |
| 0003000000200000004 | 0000 |
| 0003000000200000010 | 0000 |
| 0003000000200000020 | 0000 |
| 0003000000200000030 | 0000 |
| 0003000000200000040 | 0000 |
| 0003000000200000100 | 0001 |
| 0003000000200000003 | 0001 |
| 0003000000200000000 | 0001 |
| 0003000000200000200 | 0010 |
| 0003000000200000300 | 0010 |
| 0003000000200000400 | 0010 |
| 0003000000200000001 | 0010 |
| 0003000000200001000 | 0011 |
| 0003000000200003000 | 0011 |
| 0003000000200002000 | 0100 |
| 0003000000200004000 | 0100 |
| 0003000000400000002 | 1010 |
| 0003000000400000004 | 1010 |
| 0003000000400000010 | 1010 |
| 0003000000400000020 | 1010 |
| 0003000000400000030 | 1010 |
| 0003000000400000040 | 1010 |
| 0003000000400000100 | 1011 |
| 0003000000400000003 | 1011 |
| 0003000000400000000 | 1011 |

-continued

| Sequence of Code Symbols | x' |
|---|---|
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1100 |
| 000400000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |
| 000400000040000030 | 1101 |
| 000400000040000040 | 1101 |
| 000400000040000100 | 1110 |
| 000400000040000003 | 1110 |
| 000400000040000000 | 1110 |
| 000400000040000200 | 1111 |
| 000400000040000300 | 1111 |
| 000400000040000400 | 1111 |
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0003 |
| 000400000200000003 | 0001 |
| 000400000200000000 | 0001 |
| 000400000200000200 | 0010 |
| 000400000200000300 | 0010 |
| 000400000200000400 | 0010 |
| 000400000200000001 | 0010 |
| 000400000200001000 | 0011 |
| 000400000200003000 | 0011 |
| 000400000200002000 | 0100 |
| 000400000200040000 | 0100 |
| 000400000400000002 | 1010 |

-continued

| Sequence of Code Symbols | x' |
|---|---|
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |
| 000100000002000000 | 0000 |
| 000100000002000003 | 0000 |
| 000100000002000001 | 0000 |
| 000100000002000002 | 0001 |
| 000100000002000004 | 0001 |
| 000100000002000010 | 0001 |
| 000100000002000020 | 0001 |
| 000100000002000030 | 0001 |
| 000100000002000040 | 0001 |
| 000100000004000000 | 0010 |
| 000100000004000003 | 0010 |
| 000100000004000001 | 0010 |
| 000100000004000002 | 0011 |
| 000100000004000004 | 0011 |
| 000100000004000010 | 0011 |
| 000100000004000020 | 0011 |
| 000100000004000030 | 0011 |
| 000100000004000040 | 0011 |
| 000100000020000002 | 0111 |
| 000100000020000004 | 0111 |
| 000100000020000010 | 0111 |
| 000100000020000020 | 0111 |
| 000100000020000030 | 0111 |
| 000100000020000040 | 0111 |
| 000100000020000100 | 1000 |
| 000100000020000003 | 1000 |
| 000100000020000000 | 1000 |
| 000100000020000200 | 1001 |
| 000100000020000300 | 1001 |
| 000100000020000400 | 1001 |
| 000100000020000001 | 1001 |
| 000100000030000100 | 1011 |
| 000100000030000003 | 1011 |
| 000100000030000000 | 1011 |
| 000100000030000200 | 1100 |
| 000100000030000300 | 1100 |
| 000100000030000400 | 1100 |
| 000100000030000001 | 1100 |
| 000100000040000002 | 1101 |
| 000100000040000004 | 1101 |
| 000100000040000010 | 1101 |
| 000100000040000020 | 1101 |
| 000100000040000030 | 1101 |
| 000100000040000040 | 1101 |
| 000100000040000100 | 1110 |
| 000100000040000003 | 1110 |
| 000100000040000000 | 1110 |
| 000100000040000200 | 1111 |
| 000100000040000300 | 1111 |
| 000100000040000400 | 1111 |
| 000100000040000001 | 1111 |
| 000100000003000000 | 0001 |
| 000100000003000003 | 0001 |
| 000100000003000001 | 0001 |
| 000100000200000002 | 0000 |
| 000100000200000004 | 0000 |
| 000100000200000010 | 0000 |
| 000100000200000020 | 0000 |
| 000100000200000030 | 0000 |
| 000100000200000040 | 0000 |
| 000100000200000100 | 0001 |
| 000100000200000003 | 0001 |
| 000100000200000000 | 0001 |
| 000100000200000200 | 0010 |

-continued

| Sequence of Code Symbols | x' |
|---|---|
| 00010000200000300 | 0010 |
| 00010000200000400 | 0010 |
| 00010000200000001 | 0010 |
| 00010000200001000 | 0011 |
| 00010000200003000 | 0011 |
| 00010000200002000 | 0100 |
| 00010000200004000 | 0100 |
| 00010000400000002 | 1010 |
| 00010000400000004 | 1010 |
| 00010000400000010 | 1010 |
| 00010000400000020 | 1010 |
| 00010000400000030 | 1010 |
| 00010000400000040 | 1010 |
| 00010000400000100 | 1011 |
| 00010000400000003 | 1011 |
| 00010000400000000 | 1011 |
| 00010000400000200 | 1100 |
| 00010000400000300 | 1100 |
| 00010000400000400 | 1100 |
| 00010000400000001 | 1100 |
| 00010000400001000 | 1101 |
| 00010000400003000 | 1101 |
| 00002000002000000 | 0000 |
| 00002000002000003 | 0000 |
| 00002000002000003 | 0000 |
| 00002000002000002 | 0001 |
| 00002000002000004 | 0001 |
| 00002000002000010 | 0001 |
| 00002000002000020 | 0001 |
| 00002000002000030 | 0001 |
| 00002000002000040 | 0001 |
| 00002000004000000 | 0010 |
| 00002000004000003 | 0010 |
| 00002000004000001 | 0010 |
| 00002000004000002 | 0011 |
| 00002000004000004 | 0011 |
| 00002000004000010 | 0011 |
| 00002000004000020 | 0011 |
| 00002000004000030 | 0011 |
| 00002000004000040 | 0011 |
| 00002000020000002 | 0111 |
| 00002000020000004 | 0111 |
| 00002000020000010 | 0111 |
| 00002000020000020 | 0111 |
| 00002000020000030 | 0111 |
| 00002000020000040 | 0111 |
| 00002000020000100 | 1000 |
| 00002000020000003 | 1000 |
| 00002000020000000 | 1000 |
| 00002000020000200 | 1001 |
| 00002000020000300 | 1001 |
| 00002000020000400 | 1001 |
| 00002000020000001 | 1001 |
| 00002000030000100 | 1011 |
| 00002000030000003 | 1011 |
| 00002000030000000 | 1011 |
| 00002000030000200 | 1100 |
| 00002000030000300 | 1100 |
| 00002000030000400 | 1100 |
| 00002000030000001 | 1100 |
| 00002000040000002 | 1101 |
| 00002000040000004 | 1101 |
| 00002000040000010 | 1101 |
| 00002000040000020 | 1101 |
| 00002000040000030 | 1101 |
| 00002000040000040 | 1101 |
| 00002000040000100 | 1110 |
| 00002000040000003 | 1110 |
| 00002000040000000 | 1110 |
| 00002000040000200 | 1111 |
| 00002000040000300 | 1111 |
| 00002000040000400 | 1111 |
| 00002000040000001 | 1111 |
| 00002000003000000 | 0001 |
| 00002000003000003 | 0001 |
| 00002000003000001 | 0001 |
| 00002000200000002 | 0000 |
| 00002000200000004 | 0000 |

-continued

| Sequence of Code Symbols | x' |
|---|---|
| 00002000200000010 | 0000 |
| 00002000200000020 | 0000 |
| 00002000200000030 | 0000 |
| 00002000200000040 | 0000 |
| 00002000200000100 | 0001 |
| 00002000200000003 | 0001 |
| 00002000200000000 | 0001 |
| 00002000200000200 | 0010 |
| 00002000200000300 | 0010 |
| 00002000200000400 | 0010 |
| 00002000200000001 | 0010 |
| 00002000200001000 | 0011 |
| 00002000200003000 | 0011 |
| 00002000200002000 | 0100 |
| 00002000200004000 | 0100 |
| 00002000400000002 | 1010 |
| 00002000400000004 | 1010 |
| 00002000400000010 | 1010 |
| 00002000400000020 | 1010 |
| 00002000400000030 | 1010 |
| 00002000400000040 | 1010 |
| 00002000400000100 | 1011 |
| 00002000400000003 | 1011 |
| 00002000400000000 | 1011 |
| 00002000400000200 | 1100 |
| 00002000400000300 | 1100 |
| 00002000400000400 | 1100 |
| 00002000400000001 | 1100 |
| 00002000400001000 | 1101 |
| 00002000400003000 | 1101 |
| 00030000002000000 | 0000 |
| 00030000002000003 | 0000 |
| 00030000002000001 | 0000 |
| 00030000002000002 | 0001 |
| 00030000002000004 | 0001 |
| 00030000002000010 | 0001 |
| 00030000002000020 | 0001 |
| 00030000002000030 | 0001 |
| 00030000002000040 | 0001 |
| 00030000004000000 | 0010 |
| 00030000004000003 | 0010 |
| 00030000004000001 | 0010 |
| 00030000004000002 | 0011 |
| 00030000004000004 | 0011 |
| 00030000004000010 | 0011 |
| 00030000004000020 | 0011 |
| 00030000004000030 | 0011 |
| 00030000004000040 | 0011 |
| 00030000020000002 | 0111 |
| 00030000020000004 | 0111 |
| 00030000020000010 | 0111 |
| 00030000020000020 | 0111 |
| 00030000020000030 | 0111 |
| 00030000020000040 | 0111 |
| 00030000020000100 | 1000 |
| 00030000020000003 | 1000 |
| 00030000020000000 | 1000 |
| 00030000020000200 | 1001 |
| 00030000020000300 | 1001 |
| 00030000020000400 | 1001 |
| 00030000020000001 | 1001 |
| 00030000030000100 | 1011 |
| 00030000030000003 | 1011 |
| 00030000030000000 | 1011 |
| 00030000030000200 | 1100 |
| 00030000030000300 | 1100 |
| 00030000030000400 | 1100 |
| 00030000030000001 | 1100 |
| 00030000040000002 | 1101 |
| 00030000040000004 | 1101 |
| 00030000040000010 | 1101 |
| 00030000040000020 | 1101 |
| 00030000040000030 | 1101 |
| 00030000040000040 | 1101 |
| 00030000040000100 | 1110 |
| 00030000040000003 | 1110 |
| 00030000040000000 | 1110 |
| 00030000040000200 | 1111 |

-continued

| Sequence of Code Symbols | x' |
|---|---|
| 000300000040000300 | 1111 |
| 000300000040000400 | 1111 |
| 000300000040000001 | 1111 |
| 000300000003000000 | 0001 |
| 000300000003000003 | 0001 |
| 000300000003000001 | 0001 |
| 000300000200000002 | 0000 |
| 000300000200000004 | 0000 |
| 000300000200000010 | 0000 |
| 000300000200000020 | 0000 |
| 000300000200000030 | 0000 |
| 000300000200000040 | 0000 |
| 000300000200000100 | 0001 |
| 000300000200000003 | 0001 |
| 000300000200000000 | 0001 |
| 000300000200000200 | 0010 |
| 000300000200000300 | 0010 |
| 000300000200000400 | 0010 |
| 000300000200000001 | 0010 |
| 000300000200001000 | 0011 |
| 000300000200003000 | 0011 |
| 000300000200002000 | 0100 |
| 000300000200004000 | 0100 |
| 000300000400000002 | 1010 |
| 000300000400000004 | 1010 |
| 000300000400000010 | 1010 |
| 000300000400000020 | 1010 |
| 000300000400000030 | 1010 |
| 000300000400000040 | 1010 |
| 000300000400000100 | 1011 |
| 000300000400000003 | 1011 |
| 000300000400000000 | 1011 |
| 000300000400000200 | 1100 |
| 000300000400000300 | 1100 |
| 000300000400000400 | 1100 |
| 000300000400000001 | 1100 |
| 000300000400001000 | 1101 |
| 000300000400003000 | 1101 |
| 000040000002000000 | 0000 |
| 000040000002000003 | 0000 |
| 000040000002000001 | 0000 |
| 000040000002000002 | 0001 |
| 000040000002000004 | 0001 |
| 000040000002000010 | 0001 |
| 000040000002000020 | 0001 |
| 000040000002000030 | 0001 |
| 000040000002000040 | 0001 |
| 000040000004000000 | 0010 |
| 000040000004000003 | 0010 |
| 000040000004000001 | 0010 |
| 000040000004000002 | 0011 |
| 000040000004000004 | 0011 |
| 000040000004000010 | 0011 |
| 000040000004000020 | 0011 |
| 000040000004000030 | 0011 |
| 000040000004000040 | 0011 |
| 000040000020000002 | 0111 |
| 000040000020000004 | 0111 |
| 000040000020000010 | 0111 |
| 000040000020000020 | 0111 |
| 000040000020000030 | 0111 |
| 000040000020000040 | 0111 |
| 000040000020000100 | 1000 |
| 000040000020000003 | 1000 |
| 000040000020000000 | 1000 |
| 000040000020000200 | 1001 |
| 000040000020000300 | 1001 |
| 000040000020000400 | 1001 |
| 000040000020000001 | 1001 |
| 000040000030000100 | 1011 |
| 000040000030000003 | 1011 |
| 000040000030000000 | 1011 |
| 000040000030000200 | 1100 |
| 000040000030000300 | 1100 |
| 000040000030000400 | 1100 |
| 000040000030000001 | 1100 |
| 000040000040000002 | 1101 |
| 000040000040000004 | 1101 |

-continued

| Sequence of Code Symbols | x' |
|---|---|
| 000040000040000010 | 1101 |
| 000040000040000020 | 1101 |
| 000040000040000030 | 1101 |
| 000040000040000040 | 1101 |
| 000040000040000100 | 1110 |
| 000040000040000003 | 1110 |
| 000040000040000000 | 1110 |
| 000040000040000200 | 1111 |
| 000040000040000300 | 1111 |
| 000040000040000400 | 1111 |
| 000040000040000001 | 1111 |
| 000040000003000000 | 0001 |
| 000040000003000003 | 0001 |
| 000040000003000001 | 0001 |
| 000040000200000002 | 0000 |
| 000040000200000004 | 0000 |
| 000040000200000010 | 0000 |
| 000040000200000020 | 0000 |
| 000040000200000030 | 0000 |
| 000040000200000040 | 0000 |
| 000040000200000100 | 0001 |
| 000040000100000003 | 0001 |
| 000040000200000000 | 0001 |
| 000040000200000200 | 0010 |
| 000040000200000300 | 0010 |
| 000040000200000400 | 0010 |
| 000040000200000001 | 0010 |
| 000040000200001000 | 0011 |
| 000040000200003000 | 0011 |
| 000040000209002000 | 0100 |
| 000040000200004000 | 0100 |
| 000040000400000002 | 1010 |
| 000040000400000004. | 1010 |
| 000040000400000010 | 1010 |
| 000040000400000020 | 1010 |
| 000040000400000030 | 1010 |
| 000040000400000040 | 1010 |
| 000040000400000100 | 1011 |
| 000040000400000003 | 1011 |
| 000040000400000000 | 1011 |
| 000040000400000200 | 1100 |
| 000040000400000300 | 1100 |
| 000040000400000400 | 1100 |
| 000040000400000001 | 1100 |
| 000040000400001000 | 1101 |
| 000040000400003000 | 1101 |
| 000100000002000000 | 0000 |
| 000100000002000003 | 0000 |
| 000100000002000001 | 0000 |
| 000100000002000002 | 0001 |
| 000100000002000004 | 0001 |
| 000100000002000010 | 0001 |
| 000100000002000020 | 0001 |
| 000100000002000030 | 0001 |
| 000100000002000040 | 0001 |
| 000100000004000000 | 0010 |
| 000100000004000003 | 0010 |
| 000100000004000001 | 0010 |
| 000100000004000002 | 0011 |
| 000100000004000004 | 0011 |
| 000100000004000010 | 0011 |
| 000100000004000020 | 0011 |
| 000100000004000030 | 0011 |
| 000100000004000040 | 0011 |
| 000100000020000002 | 0111 |
| 000100000020000004 | 0111 |
| 000100000020000010 | 0111 |
| 000100000020000020 | 0111 |
| 000100000020000030 | 0111 |
| 000100000020000040 | 0111 |
| 000100000020000100 | 1000 |
| 000100000020000003 | 1000 |
| 000100000020000000 | 1000 |
| 000100000020000200 | 1001 |
| 000100000020000300 | 1001 |
| 000100000020000400 | 1001 |
| 000100000020000001 | 1001 |
| 000100000030000100 | 1011 |

-continued

| Sequence of Code Symbols | x' |
|---|---|
| 0001000000300000003 | 1011 |
| 0001000000300000000 | 1011 |
| 0001000000300000200 | 1100 |
| 0001000000300000300 | 1100 |
| 0001000000300000400 | 1100 |
| 0001000000300000001 | 1100 |
| 0001000000400000002 | 1101 |
| 0001000000400000004 | 1101 |
| 0001000000400000010 | 1101 |
| 0001000000400000020 | 1101 |
| 0001000000400000030 | 1101 |
| 0001000000400000040 | 1101 |
| 0001000000400000100 | 1110 |
| 0001000000400000003 | 1110 |
| 0001000000400000000 | 1110 |
| 0001000000400000200 | 1111 |
| 0001000000400000300 | 1111 |
| 0001000000400000400 | 1111 |
| 0001000000400000001 | 1111 |
| 0001000000030000000 | 0001 |
| 0001000000030000003 | 0001 |
| 0001000000030000001 | 0001 |
| 0001000002000000002 | 0000 |
| 0001000002000000004 | 0000 |
| 0001000002000000010 | 0000 |
| 0001000002000000020 | 0000 |
| 0001000002000000030 | 0000 |
| 0001000002000000040 | 0000 |
| 0001000002000000100 | 0001 |
| 0001000002000000003 | 0001 |
| 0001000002000000000 | 0001 |
| 0001000002000000200 | 0010 |
| 0001000002000000300 | 0010 |
| 0001000002000000400 | 0010 |
| 0001000002000000003 | 0010 |
| 0001000002000001000 | 0011 |
| 0003000002000003000 | 0011 |
| 0001000002000002000 | 0100 |
| 0001000002000004000 | 0100 |
| 0001000004000000002 | 1010 |
| 0001000004000000004 | 1010 |
| 0001000004000000010 | 1010 |
| 0001000004000000020 | 1010 |
| 0001000004000000030 | 1010 |
| 0001000004000000040 | 1010 |
| 0001000004000000100 | 1011 |
| 0001000004000000003 | 1011 |
| 0001000004000000000 | 1011 |
| 0001000004000000200 | 1100 |
| 0001000004000000300 | 1100 |
| 0001000004000000400 | 1100 |
| 0001000004000000001 | 1100 |
| 0001000004000001000 | 1101 |
| 0001000004000003000 | 1101 |
| 0000100000002000000 | 0000 |
| 0000100000002000003 | 0000 |
| 0000100000002000003 | 0000 |
| 0000100000002000002 | 0001 |
| 0000100000002000004 | 0001 |
| 0000100000002000010 | 0001 |
| 0000100000002000020 | 0001 |
| 0000100000002000030 | 0001 |
| 0000100000002000040 | 0001 |
| 0000100000004000000 | 0010 |
| 0000100000004000003 | 0010 |
| 0000100000004000001 | 0010 |
| 0000100000004000002 | 0011 |
| 0000100000004000004 | 0011 |
| 0000100000004000010 | 0011 |
| 0000100000004000020 | 0011 |
| 0000100000004000030 | 0011 |
| 0000100000004000040 | 0011 |
| 0000100000020000002 | 0111 |
| 0000100000020000004 | 0111 |
| 0000100000020000010 | 0111 |
| 0000100000020000020 | 0111 |
| 0000100000020000030 | 0111 |
| 0000100000020000040 | 0111 |

-continued

| Sequence of Code Symbols | x' |
|---|---|
| 0000100000020000100 | 1000 |
| 0000100000020000003 | 1000 |
| 0000100000020000000 | 1000 |
| 0000100000020000200 | 1001 |
| 0000100000020000300 | 1001 |
| 0000100000020000400 | 1001 |
| 0000100000020000001 | 1001 |
| 0000100000030000100 | 1011 |
| 0000100000030000003 | 1011 |
| 0000100000030000000 | 1011 |
| 0000100000030000200 | 1100 |
| 0000100000030000300 | 1100 |
| 0000100000030000400 | 1100 |
| 0000100000030000001 | 1100 |
| 0000100000040000002 | 1101 |
| 0000100000040000004 | 1101 |
| 0000100000040000010 | 1101 |
| 0000100000040000020 | 1101 |
| 0000100000040000030 | 1101 |
| 0000100000040000040 | 1101 |
| 0000100000040000100 | 1110 |
| 0000100000040000003 | 1110 |
| 0000100000040000000 | 1110 |
| 0000100000040000200 | 1111 |
| 0000100000040000300 | 1111 |
| 0000100000040000400 | 1111 |
| 0000100000040000001 | 1111 |
| 0000100000003000000 | 0001 |
| 0000100000003000003 | 0001 |
| 0000100000003000001 | 0001 |
| 0002000000002000000 | 0000 |
| 0002000000002000003 | 0000 |
| 0002000000002000001 | 0000 |
| 0002000000002000002 | 0001 |
| 0002000000002000004 | 0001 |
| 0002000000002000010 | 0001 |
| 0002000000002000020 | 0001 |
| 0002000000002000030 | 0001 |
| 0002000000002000040 | 0001 |
| 0002000000004000000 | 0010 |
| 0002000000004000003 | 0010 |
| 0002000000004000001 | 0010 |
| 0002000000004000002 | 0011 |
| 0002000000004000004 | 0011 |
| 0002000000004000010 | 0011 |
| 0002000000004000020 | 0011 |
| 0002003000004000030 | 0011 |
| 0002000000004000040 | 0011 |
| 0002000000020000002 | 0111 |
| 0002000000020000004 | 0111 |
| 0002000000020000010 | 0111 |
| 0002000000020000020 | 0111 |
| 0002000000020000030 | 0111 |
| 0002000000020000040 | 0111 |
| 0002000000020000100 | 1000 |
| 0002000000020000003 | 1000 |
| 0002000000020000000 | 1000 |
| 0002000000020000200 | 1001 |
| 0002000000020000300 | 1001 |
| 0002000000020000400 | 1001 |
| 0002000000020000001 | 1001 |
| 0002000000030000100 | 1011 |
| 0002000000030000003 | 1011 |
| 0002000000030000000 | 1011 |
| 0002000000030000200 | 1100 |
| 0002000000030000300 | 1100 |
| 0002000000030000400 | 1100 |
| 0002000000030000001 | 1100 |
| 0002000000040000002 | 1101 |
| 0002000000040000004 | 1101 |
| 0002000000040000010 | 1101 |
| 0002000000040000020 | 1101 |
| 0002000000040000030 | 1101 |
| 0002000000040000040 | 1101 |
| 0002000000040000100 | 1110 |
| 0002000000040000003 | 1110 |
| 0002000000040000000 | 1110 |
| 0002000000040000200 | 1111 |

-continued

| Sequence of Code Symbols | x' |
|---|---|
| 000200000040000300 | 1111 |
| 000200000040000400 | 1111 |
| 000200000040000001 | 1111 |
| 000200000003000000 | 0001 |
| 000200000003000003 | 0001 |
| 000200000003000001 | 0001 |
| 000200000200000002 | 0000 |
| 000200000200000004 | 0000 |
| 000200000200000010 | 0000 |
| 000200000200000020 | 0000 |
| 000200000200000030 | 0000 |
| 000200000200000040 | 0000 |
| 000200000200000100 | 0001 |
| 000200000200000003 | 0001 |
| 000200000200000000 | 0001 |
| 000200000200000200 | 0010 |
| 000200000200000300 | 0010 |
| 000200000200000400 | 0010 |
| 000200000200000001 | 0010 |
| 000200000200001000 | 0011 |
| 000200000200003000 | 0011 |
| 000200000200002000 | 0100 |
| 000200000200004000 | 0100 |
| 000200000400000002 | 1010 |
| 000200000400000004 | 1010 |
| 000200000400000010 | 1010 |
| 000200000400000020 | 1010 |
| 000200000400000030 | 1010 |
| 000200000400000040 | 1010 |
| 000200000400000100 | 1011 |
| 000200000400000003 | 1011 |
| 000200000400000000 | 1011 |
| 000200000400000200 | 1100 |
| 000200000400000300 | 1100 |
| 000200000400000400 | 1100 |
| 000200000400000001 | 1100 |
| 000200000400001000 | 1101 |
| 000200000400003000 | 1101 |
| 000010000200000002 | 0000 |
| 000010000200000004 | 0000 |
| 000010000200000010 | 0000 |
| 000010000200000020 | 0000 |
| 000010000200000030 | 0000 |
| 000010000200000040 | 0000 |
| 000010000200000100 | 0001 |
| 000010000200000003 | 0001 |
| 000010000200000000 | 0001 |
| 000010000200000200 | 0010 |
| 000010000200000300 | 0010 |
| 000010000200000400 | 0010 |
| 000010000200000001 | 0010 |
| 000010000200001000 | 0011 |
| 000010000200003000 | 0011 |
| 000010000200002000 | 0100 |
| 000010000200004000 | 0100 |
| 000010000400000002 | 1010 |
| 000010000400000004 | 1010 |
| 000010000400000010 | 1010 |
| 000010000400000020 | 1010 |
| 000010000400000030 | 1010 |
| 000010000400000040 | 1010 |
| 000010000400000100 | 1011 |
| 000010000400000003 | 1011 |
| 000010000400000000 | 1011 |
| 000010000400000200 | 1100 |
| 000010000400000300 | 1100 |
| 000010000400000400 | 1100 |
| 000010000400000001 | 1100 |
| 000010000400001000 | 1101 |
| 000010000400003000 | 1101 |
| 000030000002000000 | 0000 |
| 000030000002000003 | 0000 |
| 000030000002000001 | 0000 |
| 000030000002000002 | 0001 |
| 000030000002000004 | 0001 |
| 000030000002000010 | 0001 |
| 000030000002000020 | 0001 |
| 000030000002000030 | 0001 |

-continued

| Sequence of Code Symbols | x' |
|---|---|
| 000030000002000040 | 0001 |
| 000030000004000000 | 0010 |
| 000030000004000003 | 0010 |
| 000030000004000001 | 0010 |
| 000030000004000002 | 0011 |
| 000030000004000004 | 0011 |
| 000030000004000010 | 0011 |
| 000030000004000020 | 0011 |
| 000030000004000030 | 0011 |
| 000030000004000040 | 0011 |
| 000030000020000002 | 0111 |
| 000030000020000004 | 0111 |
| 000030000020000010 | 0111 |
| 000030000020000020 | 0111 |
| 000030000020000030 | 0111 |
| 000030000020000040 | 0111 |
| 000030000020000100 | 1000 |
| 000030000020000003 | 1000 |
| 000030000020000000 | 1000 |
| 000030000020000200 | 1001 |
| 000030000020000300 | 1001 |
| 000030000020000400 | 1001 |
| 000030000020000001 | 1001 |
| 000030000030000100 | 1011 |
| 000030000030000003 | 1011 |
| 000030000030000000 | 1011 |
| 000030000030000200 | 1100 |
| 000030000030000300 | 1100 |
| 000030000030000400 | 1100 |
| 000030000030000001 | 1100 |
| 000030000040000002 | 1101 |
| 000030000040000004 | 1101 |
| 000030000040000010 | 1101 |
| 000030000040000020 | 1101 |
| 000030000040000030 | 1101 |
| 000030000040000040 | 1101 |
| 000030000040000100 | 1110 |
| 000030000040000003 | 1110 |
| 000030000040000000 | 1110 |
| 000030000040000200 | 1111 |
| 000030000040000300 | 1111 |
| 000030000040000400 | 1111 |
| 000030000040000001 | 1111 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1100 |

-continued

| Sequence of Code Symbols | x' |
|---|---|
| 0004000000030000300 | 1100 |
| 0004000000030000400 | 1100 |
| 0004000000030000001 | 1100 |
| 0004000000040000002 | 1101 |
| 0004000000040000004 | 1101 |
| 0004000000040000010 | 1101 |
| 0004000000040000020 | 1101 |
| 0004000000040000030 | 1101 |
| 0004000000040000040 | 1101 |
| 0004000000040000100 | 1110 |
| 0004000000040000003 | 1110 |
| 0004000000040000000 | 1110 |
| 0004000000040000200 | 1111 |
| 0004000000040000300 | 1111 |
| 0004000000040000400 | 1111 |
| 0004000000040000001 | 1111 |
| 0004000000003000000 | 0001 |
| 0004000000003000003 | 0001 |
| 0004000000003000001 | 0001 |
| 0004000000200000002 | 0000 |
| 0004000000200000004 | 0000 |
| 0004000000200000010 | 0000 |
| 0004000000200000020 | 0000 |
| 0004000000200000030 | 0000 |
| 0004000000200000040 | 0000 |
| 0004000000200000100 | 0001 |
| 0004000000200000003 | 0001 |
| 0004000000200000000 | 0001 |
| 0004000000200000200 | 0010 |
| 0004000000200000300 | 0010 |
| 0004000000200000400 | 0010 |
| 0004000000200000001 | 0010 |
| 0004000000200001000 | 0011 |
| 0004000000200003000 | 0011 |
| 0004000000200002000 | 0100 |
| 0004000000200004000 | 0100 |
| 0004000000400000002 | 1010 |
| 0004000000400000004 | 1010 |
| 0004000000400000010 | 1010 |
| 0004000000400000020 | 1010 |
| 0004000000400000030 | 1010 |
| 0004000000400000040 | 1010 |
| 0004000000400000100 | 1011 |
| 0004000000400000003 | 1011 |
| 0004000000400000000 | 1011 |
| 0004000000400000200 | 1100 |
| 0004000000400000300 | 1100 |
| 0004000000400000400 | 1100 |
| 0004000000400000001 | 1100 |
| 0004000000400001000 | 1101 |
| 0004000000400003000 | 1101 |
| 0000300000003000000 | 0001 |
| 0000300000003000003 | 0001 |
| 0000300000003000001 | 0001 |
| 0000300000200000002 | 0000 |
| 0000300000200000004 | 0000 |
| 0000300000200000010 | 0000 |
| 0000300000200000020 | 0000 |
| 0000300000200000030 | 0000 |
| 0000300000200000040 | 0000 |
| 0000300000200000100 | 0001 |
| 0000300000200000003 | 0001 |
| 0000300000200000000 | 0001 |
| 0000300000200000200 | 0010 |
| 0000300000200000300 | 0010 |
| 0000300000200000400 | 0010 |
| 0000300000200000001 | 0010 |
| 0000300000200001000 | 0011 |
| 0000300000200003000 | 0011 |
| 0000300000200002000 | 0100 |
| 0000300000200004000 | 0100 |
| 0000300000400000002 | 1010 |
| 0000300000400000004 | 1010 |
| 0000300000400000010 | 1010 |
| 0000300000400000020 | 1010 |
| 0000300000400000030 | 1010 |
| 0000300000400000040 | 1010 |
| 0000300000400000100 | 1011 |

-continued

| Sequence of Code Symbols | x' |
|---|---|
| 0000300000400000003 | 1011 |
| 0000300000400000000 | 1011 |
| 0000300000400000200 | 1100 |
| 0000300000400000300 | 1100 |
| 0000300000400000400 | 1100 |
| 0000300000400000001 | 1100 |
| 0000300000400001000 | 1101 |
| 0000300000400003000 | 1101 |
| 4000000000020000002 | 0010 |
| 4000000000020000004 | 0010 |
| 4000000000020000030 | 0010 |
| 4000000000020000020 | 0010 |
| 4000000000020000030 | 0010 |
| 4000000000020000040 | 0010 |
| 4000000000020000100 | 0011 |
| 4000000000020000003 | 0011 |
| 4000000000020000000 | 0011 |
| 4000000000020000200 | 0100 |
| 4000000000020000300 | 0100 |
| 4000000000020000400 | 0100 |
| 4000000000020000001 | 0100 |
| 4000000000040000002 | 1010 |
| 4000000000040000004 | 1010 |
| 4000000000040000010 | 1010 |
| 4000000000040000020 | 1010 |
| 4000000000040000030 | 1010 |
| 4000000000040000040 | 1010 |
| 4000000000040000100 | 1011 |
| 4000000000040000003 | 1011 |
| 4000000000040000000 | 1011 |
| 4000000000040000200 | 1100 |
| 4000000000040000300 | 1100 |
| 4000000000040000400 | 1100 |
| 4000000000040000001 | 1100 |
| 4000000000200000002 | 0010 |
| 4000000000200000004 | 0010 |
| 4000000000200000010 | 0010 |
| 4000000000200000020 | 0010 |
| 4000000000200000030 | 0010 |
| 4000000000200000040 | 0010 |
| 4000000000200000100 | 0011 |
| 4000000000200000003 | 0011 |
| 4000000000200000000 | 0011 |
| 4000000000200000200 | 0100 |
| 4000000000200000300 | 0100 |
| 4000000000200000400 | 0100 |
| 4000000000200000001 | 0100 |
| 4000000000200001000 | 0101 |
| 4000000000200003000 | 0101 |
| 4000000000200002000 | 0110 |
| 4000000000200004000 | 0110 |
| 4000000000400000002 | 1001 |
| 4000000000400000004 | 1001 |
| 4000000000400000010 | 1001 |
| 4000000000400000020 | 1001 |
| 4000000000400000030 | 1001 |
| 4000000000400000040 | 1001 |
| 4000000000400000100 | 1010 |
| 4000000000400000003 | 1010 |
| 4000000000400000000 | 1010 |
| 4000000000400000200 | 1011 |
| 4000000000400000300 | 1011 |
| 4000000000400000400 | 1011 |
| 4000000000400000001 | 1011 |
| 4000000000400001000 | 1100 |
| 4000000000400003000 | 1100 |
| 4000000000400002000 | 1101 |
| 4000000000400004000 | 1101 |
| 4000000000030000100 | 1110 |
| 4000000000030000003 | 1110 |
| 4000000000030000000 | 1110 |
| 4000000000030000200 | 1111 |
| 4000000000030000300 | 1111 |
| 4000000000030000400 | 1111 |
| 4000000000030000001 | 1111 |
| 2000040000003000000 | 1100 |
| 2000040000003000003 | 1100 |
| 2000040000003000001 | 1100 |

-continued

| Sequence of Code Symbols | x' |
|---|---|
| 200004000003000002 | 1101 |
| 200004000003000004 | 1101 |
| 200004000003000010 | 1101 |
| 200004000003000020 | 1101 |
| 200004000003000030 | 1101 |
| 200004000003000040 | 1101 |
| 200004000002000000 | 0000 |
| 200004000002000003 | 0000 |
| 200004000002000001 | 0000 |
| 200004000002000002 | 0001 |
| 200004000002000004 | 0001 |
| 200004000002000010 | 0001 |
| 200004000002000020 | 0001 |
| 200004000002000030 | 0001 |
| 200004000002000040 | 0001 |
| 200004000004000000 | 0010 |
| 200004000004000003 | 0010 |
| 200004000004000001 | 0010 |
| 200004000004000002 | 0011 |
| 200004000004000004 | 0011 |
| 200004000004000010 | 0011 |
| 200004000004000020 | 0011 |
| 200004000004000030 | 0011 |
| 200004000004000040 | 0011 |
| 200004000020000002 | 0111 |
| 200004000020000004 | 0111 |
| 200004000020000010 | 0111 |
| 200004000020000020 | 0111 |
| 200004000020000030 | 0111 |
| 200004000020000040 | 0111 |
| 200004000020000100 | 1000 |
| 200004000020000003 | 1000 |
| 200004000020000000 | 1000 |
| 200004000020000200 | 1001 |
| 200004000020000300 | 1001 |
| 200004000020000400 | 1001 |
| 200004000020000001 | 1001 |
| 200004000030000100 | 1011 |
| 200004000030000003 | 1011 |
| 200004000030000000 | 1011 |
| 200004000030000200 | 1100 |
| 200004000030000300 | 1100 |
| 200004000030000400 | 1100 |
| 200004000030000001 | 1100 |
| 200004000040000002 | 1101 |
| 200004000040000004 | 1101 |
| 200004000040000010 | 1101 |
| 200004000040000020 | 1101 |
| 200004000040000030 | 1101 |
| 200004000040000040 | 1101 |
| 200004000040000100 | 1110 |
| 200004000040000003 | 1110 |
| 200004000040000000 | 1110 |
| 200004000040000200 | 1111 |
| 200004000040000300 | 1111 |
| 200004000040000400 | 1111 |
| 200004000040000001 | 1111 |
| 300001000003000000 | 1100 |
| 300001000003000003 | 1100 |
| 300001000003000001 | 1100 |
| 300001000003000002 | 1101 |
| 300001000003000004 | 1101 |
| 300001000003000010 | 1101 |
| 300001000003000020 | 1101 |
| 300001000003000030 | 1101 |
| 300001000003000040 | 1101 |
| 300001000002000000 | 0000 |
| 300001000002000003 | 0000 |
| 300001000002000001 | 0000 |
| 300001000002000002 | 0001 |
| 300001000002000004 | 0001 |
| 300001000002000010 | 0001 |
| 300001000002000020 | 0001 |
| 300001000002000030 | 0001 |
| 300001000002000040 | 0001 |
| 300001000004000000 | 0010 |
| 300001000004000003 | 0010 |
| 300001000004000001 | 0010 |

-continued

| Sequence of Code Symbols | x' |
|---|---|
| 300001000004000002 | 0011 |
| 300001000004000004 | 0011 |
| 300001000004000010 | 0011 |
| 300001000004000020 | 0011 |
| 300001000004000030 | 0011 |
| 300001000004000040 | 0011 |
| 300001000020000002 | 0111 |
| 300001000020000004 | 0111 |
| 300001000020000010 | 0111 |
| 300001000020000020 | 0111 |
| 300001000020000030 | 0111 |
| 300001000020000040 | 0111 |
| 300001000020000100 | 1000 |
| 300001000020000003 | 1000 |
| 300001000020000000 | 1000 |
| 300001000020000200 | 1001 |
| 300001000020000300 | 1001 |
| 300001000020000400 | 1001 |
| 300001000020000001 | 1001 |
| 300001000030000100 | 1011 |
| 300001000030000003 | 1011 |
| 300001000030000000 | 1011 |
| 300001000030000200 | 1100 |
| 300001000030000300 | 1100 |
| 300001000030000400 | 1100 |
| 300001000030000001 | 1100 |
| 300001000040000002 | 1101 |
| 300001000040000004 | 1101 |
| 300001000040000010 | 1101 |
| 300001000040000020 | 1101 |
| 300001000040000030 | 1101 |
| 300001000040000040 | 1101 |
| 300001000040000100 | 1110 |
| 300001000040000003 | 1110 |
| 300001000040000000 | 1110 |
| 300001000040000200 | 1111 |
| 300001000040000300 | 1111 |
| 300001000040000400 | 1111 |
| 300001000040000001 | 1111 |
| 300000000020000002 | 0010 |
| 300000000020000004 | 0010 |
| 300000000020000010 | 0010 |
| 300000000020000020 | 0010 |
| 300000000020000030 | 0010 |
| 300000000020000040 | 0010 |
| 300000000020000100 | 0011 |
| 300000000020000003 | 0011 |
| 300000000020000000 | 0011 |
| 300000000020000200 | 0100 |
| 300000000020000300 | 0100 |
| 300000000020000400 | 0100 |
| 300000000020000001 | 0100 |
| 300000000040000002 | 1010 |
| 300000000040000004 | 1010 |
| 300000000040000010 | 1010 |
| 300000000040000020 | 1010 |
| 300000000040000030 | 1010 |
| 300000000040000040 | 1010 |
| 300000000040000100 | 1011 |
| 300000000040000003 | 1011 |
| 300000000040000000 | 1011 |
| 300000000040000200 | 1100 |
| 300000000040000300 | 1100 |
| 300000000040000400 | 1100 |
| 300000000040000001 | 1100 |
| 300000000200000002 | 0010 |
| 300000000200000004 | 0010 |
| 300000000200000010 | 0010 |
| 300000000200000020 | 0010 |
| 300000000200000030 | 0010 |
| 300000000200000040 | 0010 |
| 300000000200000100 | 0011 |
| 300000000200000003 | 0011 |
| 300000000200000000 | 0011 |
| 300000000200000200 | 0100 |
| 300000000200000300 | 0100 |
| 300000000200000400 | 0100 |
| 300000000200000001 | 0100 |

-continued

| Sequence of Code Symbols | x' |
|---|---|
| 300000000200001000 | 0101 |
| 300000000200003000 | 0101 |
| 300000000200002000 | 0110 |
| 300000000200004000 | 0110 |
| 300000000400000002 | 1001 |
| 300000000400000004 | 1001 |
| 300000000400000010 | 1001 |
| 300000000400000020 | 1001 |
| 300000000400000030 | 1001 |
| 300000000400000040 | 1001 |
| 300000000400000100 | 1010 |
| 300000000400000003 | 1010 |
| 300000000400000000 | 1010 |
| 300000000400000200 | 1011 |
| 300000000400000300 | 1011 |
| 300000000400000400 | 1011 |
| 300000000400000001 | 1011 |
| 300000000400001000 | 1100 |
| 300000000400003000 | 1100 |
| 300000000400002000 | 1101 |
| 300000000400004000 | 1101 |
| 300000000030000100 | 1110 |
| 300000000030000003 | 1110 |
| 300000000030000000 | 1110 |
| 300000000030000200 | 1111 |
| 300000000030000300 | 1111 |
| 300000000030000400 | 1111 |
| 300000000030000001 | 1111 |
| 200003000003000000 | 1100 |
| 200003000003000003 | 1100 |
| 200003000003000001 | 1100 |
| 200003000003000002 | 1101 |
| 200003000003000004 | 1101 |
| 200003000003000010 | 1101 |
| 200003000003000020 | 1101 |
| 200003000003000030 | 1101 |
| 200003000003000040 | 1101 |
| 200003000002000000 | 0000 |
| 200003000002000003 | 0000 |
| 200003000002000001 | 0000 |
| 200003000002000002 | 0001 |
| 200003000002000004 | 0001 |
| 200003000002000010 | 0001 |
| 200003000002000020 | 0001 |
| 200003000002000030 | 0001 |
| 200003000002000040 | 0001 |
| 200003000004000000 | 0010 |
| 200003000004000003 | 0010 |
| 200003000004000001 | 0010 |
| 200003000004000002 | 0011 |
| 200003000004000004 | 0011 |
| 200003000004000010 | 0011 |
| 200003000004000020 | 0011 |
| 200003000004000030 | 0011 |
| 200003000004000040 | 0011 |
| 200003000020000002 | 0111 |
| 200003000020000004 | 0111 |
| 200003000020000010 | 0111 |
| 200003000020000020 | 0111 |
| 200003000020000030 | 0111 |
| 200003000020000040 | 0111 |
| 200003000020000100 | 1000 |
| 200003000020000003 | 1000 |
| 200003000020000000 | 1000 |
| 200003000020000200 | 1001 |
| 200003000020000300 | 1001 |
| 200003000020000400 | 1001 |
| 200003000020000001 | 1001 |
| 200003000030000100 | 1011 |
| 200003000030000003 | 1011 |
| 200003000030000000 | 1011 |
| 200003000030000200 | 1100 |
| 200003000030000300 | 1100 |
| 200003000030000400 | 1100 |
| 200003000030000001 | 1100 |
| 200003000040000002 | 1101 |
| 200003000040000004 | 1101 |
| 200003000040000010 | 1101 |

-continued

| Sequence of Code Symbols | x' |
|---|---|
| 200003000040000020 | 1101 |
| 200003000040000030 | 1101 |
| 200003000040000040 | 1101 |
| 200003000040000100 | 1110 |
| 200003000040000003 | 1110 |
| 200003000040000000 | 1110 |
| 200003000040000200 | 1111 |
| 200003000040000300 | 1111 |
| 200003000040000400 | 1111 |
| 200003000040000001 | 1111 |
| 300002000003000000 | 1100 |
| 300002000003000003 | 1100 |
| 300002000003000001 | 1100 |
| 300002000003000002 | 1101 |
| 300002000003000004 | 1101 |
| 300002000003000010 | 1101 |
| 300002000003000020 | 1101 |
| 300002000003000030 | 1101 |
| 300002000003000040 | 1101 |
| 300002000002000000 | 0000 |
| 300002000002000003 | 0000 |
| 300002000002000001 | 0000 |
| 300002000002000002 | 0001 |
| 300002000002000004 | 0001 |
| 300002000002000010 | 0001 |
| 300002000002000020 | 0001 |
| 300002000002000030 | 0001 |
| 300002000002000040 | 0001 |
| 300002000004000000 | 0010 |
| 300002000004000003 | 0010 |
| 300002000004000001 | 0010 |
| 300002000004000002 | 0011 |
| 300002000004000004 | 0011 |
| 300002000004000010 | 0011 |
| 300002000004000020 | 0011 |
| 300002000004000030 | 0011 |
| 300002000004000040 | 0011 |
| 300002000020000002 | 0111 |
| 300002000020000004 | 0111 |
| 300002000020000010 | 0111 |
| 300002000020000020 | 0111 |
| 300002000020000030 | 0111 |
| 300002000020000040 | 0111 |
| 300002000020000100 | 1000 |
| 300002000020000003 | 1000 |
| 300002000020000000 | 1000 |
| 300002000020000200 | 1001 |
| 300002000020000300 | 1001 |
| 300002000020000400 | 1001 |
| 300002000020000001 | 1001 |
| 300002000030000100 | 1011 |
| 300002000030000003 | 1011 |
| 300002000030000000 | 1011 |
| 300002000030000200 | 1100 |
| 300002000030000300 | 1100 |
| 300002000030000400 | 1100 |
| 300002000030000001 | 1100 |
| 300002000040000002 | 1101 |
| 300002000040000004 | 1101 |
| 300002000040000010 | 1101 |
| 300002000040000020 | 1101 |
| 300002000040000030 | 1101 |
| 300002000040000040 | 1101 |
| 300002000040000100 | 1110 |
| 300002000040000003 | 1110 |
| 300002000040000000 | 1110 |
| 300002000040000200 | 1111 |
| 300002000040000300 | 1111 |
| 300002000040000400 | 1111 |
| 300002000040000001 | 1111 |
| 200000000020000002 | 0010 |
| 200000000020000004 | 0010 |
| 200000000020000010 | 0010 |
| 200000000020000020 | 0010 |
| 200000000020000030 | 0010 |
| 200000000020000040 | 0010 |
| 200000000020000100 | 0011 |
| 200000000020000003 | 0011 |

-continued

| Sequence of Code Symbols | x' |
|---|---|
| 200000000020000000 | 0011 |
| 200000000020000200 | 0100 |
| 200000000020000300 | 0100 |
| 200000000020000400 | 0100 |
| 200000000020000001 | 0100 |
| 200000000040000002 | 1010 |
| 200000000040000004 | 1010 |
| 200000000040000010 | 1010 |
| 200000000040000020 | 1010 |
| 200000000040000030 | 1010 |
| 200000000040000040 | 1010 |
| 200000000040000100 | 1011 |
| 200000000040000003 | 1011 |
| 200000000040000000 | 1011 |
| 200000000040000200 | 1100 |
| 200000000040000300 | 1100 |
| 200000000040000400 | 1100 |
| 200000000040000001 | 1100 |
| 200000000200000002 | 0010 |
| 200000000200000004 | 0010 |
| 200000000200000010 | 0010 |
| 200000000200000020 | 0010 |
| 200000000200000030 | 0010 |
| 200000000200000040 | 0010 |
| 200000000200000100 | 0011 |
| 200000000200000003 | 0011 |
| 200000000200000000 | 0011 |
| 200000000200000200 | 0100 |
| 200000000200000300 | 0100 |
| 200000000200000400 | 0100 |
| 200000000200000001 | 0100 |
| 200000000200001000 | 0101 |
| 200000000200003000 | 0101 |
| 200000000200002000 | 0110 |
| 200000000200004000 | 0110 |
| 200000000400000002 | 1001 |
| 200000000400000004 | 1001 |
| 200000000400000010 | 1001 |
| 200000000400000020 | 1001 |
| 200000000400000030 | 1001 |
| 200000000400000040 | 1001 |
| 200000000400000100 | 1010 |
| 200000000400000003 | 1010 |
| 200000000400000000 | 1010 |
| 200000000400000200 | 1011 |
| 200000000400000300 | 1011 |
| 200000000400000400 | 1011 |
| 200000000400000001 | 1011 |
| 200000000400001000 | 1100 |
| 200000000400003000 | 1100 |
| 200000000400002000 | 1101 |
| 200000000400004000 | 1101 |
| 200000000300000100 | 1110 |
| 200000000300000003 | 1110 |
| 200000000300000000 | 1110 |
| 200000000300000200 | 1111 |
| 200000000300000300 | 1111 |
| 200000000300000400 | 1111 |
| 200000000300000001 | 1111 |
| 200002000030000000 | 1100 |
| 200002000030000003 | 1100 |
| 200002000030000001 | 1100 |
| 200002000030000002 | 1101 |
| 200002000030000004 | 1101 |
| 200002000030000010 | 1101 |
| 200002000030000020 | 1101 |
| 200002000030000030 | 1101 |
| 200002000030000040 | 1101 |
| 200002000020000000 | 0000 |
| 200002000020000003 | 0000 |
| 200002000020000001 | 0000 |
| 200002000020000002 | 0001 |
| 200002000020000004 | 0001 |
| 200002000020000010 | 0001 |
| 200002000020000020 | 0001 |
| 200002000020000030 | 0001 |
| 200002000020000040 | 0001 |
| 200002000040000000 | 0010 |

-continued

| Sequence of Code Symbols | x' |
|---|---|
| 200002000040000003 | 0010 |
| 200002000040000001 | 0010 |
| 200002000040000002 | 0011 |
| 200002000040000004 | 0011 |
| 200002000040000010 | Ou11 |
| 200002000040000020 | 0011 |
| 200002000040000030 | 0011 |
| 200002000040000040 | 0011 |
| 200002000200000002 | 0111 |
| 200002000200000004 | 0111 |
| 200002000200000010 | 0111 |
| 200002000200000020 | 0111 |
| 200002000200000030 | 0111 |
| 200002000200000040 | 0111 |
| 200002000200000100 | 1000 |
| 200002000200000003 | 1000 |
| 200002000200000000 | 1000 |
| 200002000200000200 | 1001 |
| 200002000200000300 | 1001 |
| 200002000200000400 | 1001 |
| 200002000200000001 | 1001 |
| 200002000300000100 | 1011 |
| 200002000300000003 | 1011 |
| 200002000300000000 | 1011 |
| 200002000300000200 | 1100 |
| 200002000300000300 | 1100 |
| 200002000300000400 | 1100 |
| 200002000300000001 | 1100 |
| 200002000400000002 | 1101 |
| 200002000400000004 | 1101 |
| 200002000040000010 | 1101 |
| 200002000040000020 | 1101 |
| 200002000040000030 | 1101 |
| 200002000040000040 | 1101 |
| 200002000040000100 | 1110 |
| 200002000040000003 | 1110 |
| 200002000040000000 | 1110 |
| 200002000040000200 | 1111 |
| 200002000040000300 | 1111 |
| 200002000040000400 | 1111 |
| 200002000040000001 | 1111 |
| 300003000003000000 | 1100 |
| 300003000003000003 | 1100 |
| 300003000003000001 | 1100 |
| 300003000003000002 | 1101 |
| 300003000003000004 | 1101 |
| 300003000003000010 | 1101 |
| 300003000003000020 | 1101 |
| 300003000003000030 | 1101 |
| 300003000003000040 | 1101 |
| 300003000002000000 | 0000 |
| 300003000002000003 | 0000 |
| 300003000002000001 | 0000 |
| 300003000002000002 | 0001 |
| 300003000002000004 | 0001 |
| 300003000002000010 | 0001 |
| 300003000002000020 | 0001 |
| 300003000002000030 | 0001 |
| 300003000002000040 | 0001 |
| 300003000004000000 | 0010 |
| 300003000004000003 | 0010 |
| 300003000004000001 | 0010 |
| 300003000004000002 | 0011 |
| 300003000004000004 | 0011 |
| 300003000004000010 | 0011 |
| 300003000004000020 | 0011 |
| 300003000004000030 | 0011 |
| 300003000004000040 | 0011 |
| 300003000020000002 | 0111 |
| 300003000020000004 | 0111 |
| 300003000020000010 | 0111 |
| 300003000020000020 | 0111 |
| 300003000020000030 | 0111 |
| 300003000020000040 | 0111 |
| 300003000020000100 | 1000 |
| 300003000020000003 | 1000 |
| 300003000020000000 | 1000 |
| 300003000020000200 | 1001 |

-continued

| Sequence of Code Symbols | x' |
|---|---|
| 300003000020000300 | 1001 |
| 300003000020000400 | 1001 |
| 300003000020000001 | 1001 |
| 300003000030000100 | 1011 |
| 300003000030000003 | 1011 |
| 300003000030000000 | 1011 |
| 300003000030000200 | 1100 |
| 300003000030000300 | 1100 |
| 300003000030000400 | 1100 |
| 300003000030000001 | 1100 |
| 300003000040000002 | 1101 |
| 300003000040000004 | 1101 |
| 300003000040000010 | 1101 |
| 300003000040000020 | 1101 |
| 300003000040000030 | 1101 |
| 300003000040000040 | 1101 |
| 300003000040000100 | 1110 |
| 300003000040000003 | 1110 |
| 300003000040000000 | 1110 |
| 300003000040000200 | 1111 |
| 300003000040000300 | 1111 |
| 300003000040000400 | 1111 |
| 300003000040000001 | 1111 |
| 100000000020000002 | 0010 |
| 100000000020000004 | 0010 |
| 100000000020000010 | 0010 |
| 100000000020000020 | 0010 |
| 100000000020000030 | 0010 |
| 100000000020000040 | 0010 |
| 100000000020000100 | 0011 |
| 100000000020000003 | 0011 |
| 100000000020000000 | 0011 |
| 100000000020000200 | 0100 |
| 100000000020000300 | 0100 |
| 100000000020000400 | 0100 |
| 100000000020000001 | 0100 |
| 100000000040000002 | 1010 |
| 100000000040000004 | 1010 |
| 100000000040000010 | 1010 |
| 100000000040000020 | 1010 |
| 100000000040000030 | 1010 |
| 100000000040000040 | 1010 |
| 100000000040000100 | 1011 |
| 100000000040000003 | 1011 |
| 100000000040000000 | 1011 |
| 100000000040000200 | 1100 |
| 100000000040000300 | 1100 |
| 100000000040000400 | 1100 |
| 100000000040000001 | 1100 |
| 100000000200000002 | 0010 |
| 100000000200000004 | 0010 |
| 100000000200000010 | 0010 |
| 100000000200000020 | 0010 |
| 100000000200000030 | 0010 |
| 100000000200000040 | 0010 |
| 100000000200000100 | 0011 |
| 100000000200000003 | 0011 |
| 100000000200000000 | 0011 |
| 100000000200000200 | 0100 |
| 100000000200000300 | 0100 |
| 100000000200000400 | 0100 |
| 100000000200000001 | 0100 |
| 100000000200001000 | 0301 |
| 100000000200003000 | 0101 |
| 100000000200002000 | 0110 |
| 100000000200004000 | 0110 |
| 100000000400000002 | 1001 |
| 100000000400000004 | 1001 |
| 100000000400000010 | 1001 |
| 100000000400000020 | 1001 |
| 100000000400000030 | 1001 |
| 100000000400000040 | 1001 |
| 100000000400000100 | 1010 |
| 100000000400000003 | 1010 |
| 100000000400000000 | 1010 |
| 100000000400000200 | 1011 |
| 100000000400000300 | 1011 |
| 100000000400000400 | 1011 |

-continued

| Sequence of Code Symbols | x' |
|---|---|
| 100000000400000001 | 1011 |
| 100000000400001000 | 1100 |
| 100000000400003000 | 1100 |
| 100000000400002000 | 1101 |
| 100000000400004000 | 1101 |
| 100000000030000100 | 1110 |
| 100000000030000003 | 1110 |
| 100000000030000000 | 1110 |
| 100000000030000200 | 1111 |
| 100000000030000300 | 1111 |
| 100000000030000400 | 1111 |
| 100000000030000001 | 1111 |
| 200001000003000000 | 1100 |
| 200001000003000003 | 1100 |
| 200001000003000001 | 1100 |
| 200001000003000002 | 1101 |
| 200001000003000004 | 1101 |
| 200001000003000010 | 1101 |
| 200001000003000020 | 1101 |
| 200001000003000030 | 1101 |
| 200001000003000040 | 1101 |
| 200001000002000000 | 0000 |
| 200001000002000003 | 0000 |
| 200001000002000001 | 0000 |
| 200001000002000002 | 0001 |
| 200001000002000004 | 0001 |
| 200001000002000010 | 0001 |
| 200001000002000020 | 0001 |
| 200001000002000030 | 0001 |
| 200001000002000040 | 0001 |
| 200001000004000000 | 0010 |
| 200001000004000003 | 0010 |
| 200001000004000001 | 0010 |
| 200001000004000002 | 0011 |
| 200001000004000004 | 0011 |
| 200001000004000010 | 0011 |
| 200001000004000020 | 0011 |
| 200001000004000030 | 0011 |
| 200001000004000040 | 0011 |
| 200001000020000002 | 0111 |
| 200001000020000004 | 0111 |
| 200001000020000010 | 0111 |
| 200001000020000020 | 0111 |
| 200001000020000030 | 0111 |
| 200001000020000040 | 0111 |
| 200001000020000100 | 1000 |
| 200001000020000003 | 1000 |
| 200001000020000000 | 1000 |
| 200001000020000200 | 1001 |
| 200001000020000300 | 1001 |
| 200001000020000400 | 1001 |
| 200001000020000001 | 1001 |
| 200001000030000100 | 1011 |
| 200001000030000003 | 1011 |
| 200001000030000000 | 1011 |
| 200001000030000200 | 1100 |
| 200001000030000300 | 1100 |
| 200001000030000400 | 1100 |
| 200001000030000001 | 1100 |
| 200001000040000002 | 1101 |
| 200001000040000004 | 1101 |
| 200001000040000010 | 1101 |
| 200001000040000020 | 1101 |
| 200001000040000030 | 1101 |
| 200001000040000040 | 1101 |
| 200001000040000100 | 1110 |
| 200001000040000003 | 1110 |
| 200001000040000000 | 1110 |
| 200001000040000200 | 1111 |
| 200001000040000300 | 1111 |
| 200001000040000400 | 1111 |
| 200001000040000001 | 1111 |
| 300004000003000000 | 1100 |
| 300004000003000003 | 1100 |
| 300004000003000001 | 1100 |
| 300004000003000002 | 1101 |
| 300004000003000004 | 1101 |
| 300004000003000010 | 1101 |

-continued

| Sequence of Code Symbols | x' |
|---|---|
| 300004000003000020 | 1101 |
| 300004000003000030 | 1101 |
| 300004000003000040 | 1101 |
| 300004000002000000 | 0000 |
| 300004000002000003 | 0000 |
| 300004000002000001 | 0000 |
| 300004000002000002 | 0001 |
| 300004000002000004 | 0001 |
| 300004000002000010 | 0001 |
| 300004000002000020 | 0001 |
| 300004000002000030 | 0001 |
| 300004000002000040 | 0001 |
| 300004000004000000 | 0010 |
| 300004000004000003 | 0010 |
| 300004000004000001 | 0010 |
| 300004000004000002 | 0011 |
| 300004000004000004 | 0011 |
| 300004000004000010 | 0011 |
| 300004000004000020 | 0011 |
| 300004000004000030 | 0011 |
| 300004000004000040 | 0011 |
| 300004000020000002 | 0111 |
| 300004000020000004 | 0111 |
| 300004000020000010 | 0111 |
| 300004000020000020 | 0111 |
| 300004000020000030 | 0111 |
| 300004000020000040 | 0111 |
| 300004000020000100 | 1000 |
| 300004000020000003 | 1000 |
| 300004000020000000 | 1000 |
| 300004000020000200 | 1001 |
| 300004000020000300 | 1001 |
| 300004000020000400 | 1001 |
| 300004000020000001 | 1001 |
| 300004000030000100 | 1011 |
| 300004000030000003 | 1011 |
| 300004000030000000 | 1011 |
| 300004000030000200 | 1100 |
| 300004000030000300 | 1100 |
| 300004000030000400 | 1100 |
| 300004000030000001 | 1100 |
| 300004000040000002 | 1101 |
| 300004000040000004 | 1101 |
| 300004000040000010 | 1101 |
| 300004000040000020 | 1101 |
| 300004000040000030 | 1101 |
| 300004000040000040 | 1101 |
| 300004000040000100 | 1110 |
| 300004000040000003 | 1110 |
| 300004000040000000 | 1110 |
| 300004000040000200 | 1111 |
| 300004000040000300 | 1111 |
| 300004000040000400 | 1111 |
| 300004000040000001 | 1111 |
| 040000000020000002 | 0010 |
| 040000000020000004 | 0010 |
| 040000000020000010 | 0010 |
| 040000000020000020 | 0010 |
| 040000000020000030 | 0010 |
| 040000000020000040 | 0010 |
| 040000000020000100 | 0011 |
| 040000000020000003 | 0011 |
| 040000000020000000 | 0011 |
| 040000000020000200 | 0100 |
| 040000000020000300 | 0100 |
| 040000000020000400 | 0100 |
| 040000000020000001 | 0100 |
| 040000000040000002 | 1010 |
| 040000000040000004 | 1010 |
| 040000000040000010 | 1010 |
| 040000000040000020 | 1010 |
| 040000000040000030 | 1010 |
| 040000000040000040 | 1010 |
| 040000000040000100 | 1011 |
| 040000000040000003 | 1011 |
| 040000000040000000 | 1011 |
| 040000000040000200 | 1100 |
| 040000000040000300 | 1100 |

-continued

| Sequence of Code Symbols | x' |
|---|---|
| 040000000040000400 | 1100 |
| 040000000040000001 | 1100 |
| 040000000200000002 | 0010 |
| 040000000200000004 | 0010 |
| 040000000200000010 | 0010 |
| 040000000200000020 | 0010 |
| 040000000200030030 | 0010 |
| 040000000200000040 | 0010 |
| 040000000200000100 | 0011 |
| 040000000200000003 | 0011 |
| 040000000200000000 | 0011 |
| 040000000200000200 | 0100 |
| 040000000200000300 | 0100 |
| 040000000200000400 | 0100 |
| 040000000200000001 | 0100 |
| 040000000200001000 | 0101 |
| 040000000200003000 | 0101 |
| 040000000200002000 | 0110 |
| 040000000200004000 | 0110 |
| 040000000400000002 | 1001 |
| 040000000400000004 | 1001 |
| 040000000400000010 | 1001 |
| 040000000400000020 | 1001 |
| 040000000400000030 | 1001 |
| 040000000400000040 | 1001 |
| 040000000400000100 | 1010 |
| 040000000400000003 | 1010 |
| 040000000400000000 | 1010 |
| 040000000400000200 | 1011 |
| 040000000400000300 | 1011 |
| 040000000400000400 | 1011 |
| 040000000400000001 | 1011 |
| 040000000400001000 | 1100 |
| 040000000400003000 | 1100 |
| 040000000400002000 | 1101 |
| 040000000400004000 | 1101 |
| 040000000030000100 | 1110 |
| 040000000030000003 | 1110 |
| 040000000030000000 | 1110 |
| 040000000030000200 | 1111 |
| 040000000030000300 | 1111 |
| 040000000030000400 | 1111 |
| 040000000030000001 | 1111 |
| 100004000003000000 | 1100 |
| 100004000003000003 | 1100 |
| 100004000003000001 | 1100 |
| 100004000003000002 | 1101 |
| 100004000003000004 | 1101 |
| 100004000003000010 | 1101 |
| 100004000003000020 | 1101 |
| 100004000003000030 | 1101 |
| 100004000003000040 | 1101 |
| 100004000002000000 | 0000 |
| 100004000002000003 | 0000 |
| 100004000002000001 | 0000 |
| 100004000002000002 | 0001 |
| 100004000002000004 | 0001 |
| 100004000002000010 | 0001 |
| 100004000002000020 | 0001 |
| 100004000002000030 | 0001 |
| 100004000002000040 | 0001 |
| 100004000004000000 | 0010 |
| 100004000004000003 | 0010 |
| 100004000004000001 | 0010 |
| 100004000004000002 | 0011 |
| 100004000004000004 | 0011 |
| 100004000004000010 | 0011 |
| 100004000004000020 | 0011 |
| 100004000004000030 | 0011 |
| 100004000004000040 | 0011 |
| 100004000020000002 | 0111 |
| 100004000020000004 | 0111 |
| 100004000020000010 | 0111 |
| 100004000020000020 | 0111 |
| 100004000020000030 | 0111 |
| 100004000020000040 | 0111 |
| 100004000020000100 | 1000 |
| 100004000020000003 | 1000 |

-continued

| Sequence of Code Symbols | x' |
|---|---|
| 100004000020000000 | 1000 |
| 100004000020000200 | 1001 |
| 100004000020000300 | 1001 |
| 100004000020000400 | 1001 |
| 100004000020000001 | 1001 |
| 100004000030000100 | 1011 |
| 100004000030000003 | 1011 |
| 100004000030000000 | 1011 |
| 100004000030000200 | 1100 |
| 100004000030000300 | 1100 |
| 100004000030000400 | 1100 |
| 100004000030000001 | 1100 |
| 100004000040000002 | 1101 |
| 100004000040000004 | 1101 |
| 100004000040000010 | 1101 |
| 100004000040000020 | 1101 |
| 100004000040000030 | 1101 |
| 100004000040000040 | 1101 |
| 100004000040000100 | 1110 |
| 100004000040000003 | 1110 |
| 100004000040000000 | 1110 |
| 100004000040000200 | 1111 |
| 100004000040000300 | 1111 |
| 100004000040000400 | 1111 |
| 100004000040000001 | 1111 |
| 400001000030000000 | 1100 |
| 400001000030000003 | 1100 |
| 400001000030000001 | 1100 |
| 400001000030000002 | 1101 |
| 400001000030000004 | 1101 |
| 400001000030000010 | 1101 |
| 400001000030000020 | 1101 |
| 400001000030000030 | 1101 |
| 400001000030000040 | 1101 |
| 400001000020000000 | 0000 |
| 400001000020000003 | 0000 |
| 400001000020000001 | 0000 |
| 400001000020000002 | 0001 |
| 400001000020000004 | 0001 |
| 400001000020000010 | 0001 |
| 400001000020000020 | 0001 |
| 400001000020000030 | 0001 |
| 400001000020000040 | 0001 |
| 400001000040000000 | 0010 |
| 400001000040000003 | 0010 |
| 400001000040000001 | 0010 |
| 400001000040000002 | 0011 |
| 400001000040000004 | 0011 |
| 400001000040000010 | 0011 |
| 400001000040000020 | 0011 |
| 400001000040000030 | 0011 |
| 400001000040000040 | 0011 |
| 400001000200000002 | 0111 |
| 400001000200000004 | 0111 |
| 400001000020000010 | 0111 |
| 400001000020000020 | 0111 |
| 400001000020000030 | 0111 |
| 400001000020000040 | 0111 |
| 400001000020000100 | 1000 |
| 400001000020000003 | 1000 |
| 400001000020000000 | 1000 |
| 400001000020000200 | 1001 |
| 400001000020000300 | 1001 |
| 400001000020000400 | 1001 |
| 400001000020000001 | 1001 |
| 400001000030000100 | 1011 |
| 400001000030000003 | 1011 |
| 400001000030000000 | 1011 |
| 400001000030000200 | 1100 |
| 400001000030000300 | 1100 |
| 400001000030000400 | 1100 |
| 400001000030000001 | 1100 |
| 400001000040000002 | 1101 |
| 400001000040000004 | 1101 |
| 400001000040000010 | 1101 |
| 400001000040000020 | 1101 |
| 400001000040000030 | 1101 |
| 400001000040000040 | 1101 |

-continued

| Sequence of Code Symbols | x' |
|---|---|
| 400001000040000100 | 1110 |
| 400001000040000003 | 1110 |
| 400001000040000000 | 1110 |
| 400001000040000200 | 1111 |
| 400001000040000300 | 1111 |
| 400001000040000400 | 1111 |
| 400001000040000001 | 1111 |
| 030000000020000002 | 0010 |
| 030000000020000004 | 0010 |
| 030000000020000010 | 0010 |
| 030000000020000020 | 0010 |
| 030000000020000030 | 0010 |
| 030000000020000040 | 0010 |
| 030000000020000100 | 0011 |
| 030000000020000003 | 0011 |
| 030000000020000000 | 0011 |
| 030000000020000200 | 0100 |
| 030000000020000300 | 0100 |
| 030000000020000400 | 0100 |
| 030000000020000001 | 0100 |
| 030000000040000002 | 1010 |
| 030000000040000004 | 1010 |
| 030000000040000010 | 1010 |
| 030000000040000020 | 1010 |
| 030000000040000030 | 1010 |
| 030000000040000040 | 1010 |
| 030000000040000100 | 1011 |
| 030000000040000003 | 1011 |
| 030000000040000000 | 1011 |
| 030000000040000200 | 1100 |
| 030000000040000300 | 1100 |
| 030000000040000400 | 1100 |
| 030000000040000001 | 1100 |
| 030000000200000002 | 0010 |
| 030000000200000004 | 0010 |
| 030000000200000010 | 0010 |
| 030000000200000020 | 0010 |
| 030000000200000030 | 0010 |
| 030000000200000040 | 0010 |
| 030000000200000100 | 0011 |
| 030000000200000003 | 0011 |
| 030000000200000000 | 0011 |
| 030000000200000200 | 0100 |
| 030000000200000300 | 0100 |
| 030000000200000400 | 0100 |
| 030000000200000001 | 0100 |
| 030000000200001000 | 0101 |
| 030000000200003000 | 0101 |
| 030000000200003000 | 0110 |
| 030000000200004000 | 0110 |
| 030000000400000002 | 1001 |
| 030000000400000004 | 1001 |
| 030000000400000010 | 1001 |
| 030000000400000020 | 1001 |
| 030000000400000030 | 1001 |
| 030000000400000040 | 1001 |
| 030000000400000100 | 1010 |
| 030000000400000003 | 1010 |
| 030000000400000000 | 1010 |
| 030000000400000200 | 1011 |
| 030000000400000300 | 1011 |
| 030000000400000400 | 1011 |
| 030000000400000001 | 1011 |
| 030000000400001000 | 1100 |
| 030000000400003000 | 1100 |
| 030000000400002000 | 1101 |
| 030000000400004000 | 1101 |
| 030000000030000100 | 1110 |
| 030000000030000003 | 1110 |
| 030000000030000000 | 1110 |
| 030000000030000200 | 1111 |
| 030000000030000300 | 1111 |
| 030000000030000400 | 1111 |
| 030000000030000001 | 1111 |
| 100001000003000000 | 1100 |
| 100001000003000003 | 1100 |
| 100001000003000001 | 1100 |
| 100001000003000002 | 1101 |

-continued

| Sequence of Code Symbols | x' |
|---|---|
| 100001000003000004 | 1101 |
| 100001000003000010 | 1101 |
| 100001000003000020 | 1101 |
| 100001000003000030 | 1101 |
| 100001000003000040 | 1101 |
| 100001000002000000 | 0000 |
| 100001000002000003 | 0000 |
| 100001000002000001 | 0000 |
| 100001000002000002 | 0001 |
| 100001000002000004 | 0001 |
| 100001000002000010 | 0001 |
| 100001000002000020 | 0001 |
| 100001000002000030 | 0001 |
| 100001000002000040 | 0001 |
| 100001000004000000 | 0010 |
| 100001000004000003 | 0010 |
| 100001000004000001 | 0010 |
| 100001000004000002 | 0011 |
| 100001000004000004 | 0011 |
| 100001000004000010 | 0011 |
| 100001000004000020 | 0011 |
| 100001000004000030 | 0011 |
| 100001000004000040 | 0011 |
| 100001000020000002 | 0111 |
| 100001000020000004 | 0111 |
| 100001000020000010 | 0111 |
| 100001000020000020 | 0111 |
| 100001000020000030 | 0111 |
| 100001000020000040 | 0111 |
| 100001000020000100 | 1000 |
| 100001000020000003 | 1000 |
| 100001000020000000 | 1000 |
| 100001000020000200 | 1001 |
| 100001000020000300 | 1001 |
| 100001000020000400 | 1001 |
| 100001000020000001 | 1001 |
| 100001000030000100 | 1011 |
| 100001000030000003 | 1011 |
| 100001000030000000 | 1011 |
| 100001000030000200 | 1100 |
| 100001000030000300 | 1100 |
| 100001000030000400 | 1100 |
| 100001000030000001 | 1100 |
| 100001000040000002 | 1101 |
| 100001000040000004 | 1101 |
| 100001000040000010 | 1101 |
| 100001000040000020 | 1101 |
| 100001000040000030 | 1101 |
| 100001000040000040 | 1101 |
| 100001000040000100 | 1110 |
| 100001000040000003 | 1110 |
| 100001000040000000 | 1110 |
| 100001000040000200 | 1111 |
| 100001000040000300 | 1111 |
| 100001000040000400 | 1111 |
| 100001000040000001 | 1111 |
| 400002000003000000 | 1100 |
| 400002000003000003 | 1100 |
| 400002000003000001 | 1100 |
| 400002000003000002 | 1101 |
| 400002000003000004 | 1101 |
| 400002000003000010 | 1101 |
| 400002000003000020 | 1101 |
| 400002000003000030 | 1101 |
| 400002000003000040 | 1101 |
| 400002000002000000 | 0000 |
| 400002000002000003 | 0000 |
| 400002000002000001 | 0000 |
| 400002000002000002 | 0001 |
| 400002000002000004 | 0001 |
| 400002000002000010 | 0001 |
| 400002000002000020 | 0001 |
| 400002000002000030 | 0001 |
| 400002000002000040 | 0001 |
| 400002000004000000 | 0010 |
| 400002000004000003 | 0010 |
| 400002000004000001 | 0010 |
| 400002000004000002 | 0011 |

-continued

| Sequence of Code Symbols | x' |
|---|---|
| 400002000004000004 | 0011 |
| 400002000004000010 | 0011 |
| 400002000004000020 | 0011 |
| 400002000004000030 | 0011 |
| 400002000004000040 | 0011 |
| 400002000020000002 | 0111 |
| 400002000020000004 | 0111 |
| 400002000020000010 | 0111 |
| 400002000020000020 | 0111 |
| 400002000020000030 | 0111 |
| 400002000020000040 | 0111 |
| 400002000020000100 | 1000 |
| 400002000020000003 | 1000 |
| 400002000020000000 | 1000 |
| 400002000020000200 | 1001 |
| 400002000020000300 | 1001 |
| 400002000020000400 | 1001 |
| 400002000020000001 | 1001 |
| 400002000030000100 | 1011 |
| 400002000030000003 | 1011 |
| 400002000030000000 | 1011 |
| 400002000030000200 | 1100 |
| 400002000030000300 | 1100 |
| 400002000030000400 | 1100 |
| 400002000030000001 | 1100 |
| 400002000040000002 | 1101 |
| 400002000040000004 | 1101 |
| 400002000040000010 | 1101 |
| 400002000040000020 | 1101 |
| 400002000040000030 | 1101 |
| 400002000040000040 | 1101 |
| 400002000040000100 | 1110 |
| 400002000040000003 | 1110 |
| 400002000040000000 | 1110 |
| 400002000040000200 | 1111 |
| 400002000040000300 | 1111 |
| 400002000040000400 | 1111 |
| 400002000040000001 | 1111 |
| 020000000020000002 | 0010 |
| 020000000020000004 | 0010 |
| 020000000020000010 | 0010 |
| 020000000020000020 | 0010 |
| 020000000020000030 | 0010 |
| 020000000020000040 | 0010 |
| 020000000020000100 | 0011 |
| 020000000020000003 | 0011 |
| 020000000020000000 | 0011 |
| 020000000020000200 | 0100 |
| 020000000020000300 | 0100 |
| 020000000020000400 | 0100 |
| 020000000020000001 | 0100 |
| 020000000040000002 | 1010 |
| 020000000040000004 | 1010 |
| 020000000040000010 | 1010 |
| 020000000040000020 | 1010 |
| 020000000040000030 | 1010 |
| 020000000040000040 | 1010 |
| 020000000040000100 | 1011 |
| 020000000040000003 | 1011 |
| 020000000040000000 | 1011 |
| 020000000040000200 | 1100 |
| 020000000040000300 | 1100 |
| 020000000040000400 | 1100 |
| 020000000040000001 | 1100 |
| 020000000200000002 | 0010 |
| 020000000200000004 | 0010 |
| 020000000200000010 | 0010 |
| 020000000200000020 | 0010 |
| 020000000200000030 | 0010 |
| 020000000200000040 | 0010 |
| 020000000200000100 | 0011 |
| 020000000200000003 | 0011 |
| 020000000200000000 | 0011 |
| 020000000200000200 | 0100 |
| 020000000200000300 | 0100 |
| 020000000200000400 | 0100 |
| 020000000200000001 | 0100 |
| 020000000200001000 | 0101 |

-continued

| Sequence of Code Symbols | x' |
|---|---|
| 020000000200003000 | 0101 |
| 020000000200002000 | 0110 |
| 020000000200004000 | 0110 |
| 020000000400000002 | 1001 |
| 020000000400000004 | 1001 |
| 020000000400000010 | 1001 |
| 020000000400000020 | 1001 |
| 020000000400000030 | 1001 |
| 020000000400000040 | 1001 |
| 020000000400000100 | 1010 |
| 020000000400000003 | 1010 |
| 020000000400000000 | 1010 |
| 020000000400000200 | 1011 |
| 020000000400000300 | 1011 |
| 020000000400000400 | 1011 |
| 020000000400000001 | 1011 |
| 020000000400001000 | 1100 |
| 020000000400003000 | 1100 |
| 020000000400002000 | 1101 |
| 020000000400004000 | 1101 |
| 020000000030000100 | 1110 |
| 020000000030000003 | 1110 |
| 020000000030000000 | 1110 |
| 020000000030000200 | 1111 |
| 020000000030000300 | 1111 |
| 020000000030000400 | 1111 |
| 020000000030000001 | 1111 |
| 100003000003000000 | 1100 |
| 100003000003000003 | 1100 |
| 100003000003000001 | 1100 |
| 100003000003000002 | 1101 |
| 100003000003000004 | 1101 |
| 100003000003000010 | 1101 |
| 100003000003000020 | 1101 |
| 100003000003000030 | 1101 |
| 100003000003000040 | 1101 |
| 100003000002000000 | 0000 |
| 100003000002000003 | 0000 |
| 100003000002000001 | 0000 |
| 100003000002000002 | 0001 |
| 100003000002000004 | 0001 |
| 100003000002000010 | 0001 |
| 100003000002000020 | 0001 |
| 100003000002000030 | 0001 |
| 100003000002000040 | 0001 |
| 100003000004000000 | 0010 |
| 100003000004000003 | 0010 |
| 100003000004000001 | 0010 |
| 100003000004000002 | 0011 |
| 100003000004000004 | 0011 |
| 100003000004000010 | 0011 |
| 100003000004000020 | 0011 |
| 100003000004000030 | 0011 |
| 100003000004000040 | 0011 |
| 100003000020000002 | 0111 |
| 100003000020000004 | 0111 |
| 100003000020000010 | 0111 |
| 100003000020000020 | 0111 |
| 100003000020000030 | 0111 |
| 100003000020000040 | 0111 |
| 100003000020000100 | 1000 |
| 100003000020000003 | 1000 |
| 100003000020000000 | 1000 |
| 100003000020000200 | 1001 |
| 100003000020000300 | 1001 |
| 100003000020000400 | 1001 |
| 100003000020000001 | 1001 |
| 100003000030000100 | 1011 |
| 100003000030000003 | 1011 |
| 100003000030000000 | 1011 |
| 100003000030000200 | 1100 |
| 100003000030000300 | 1100 |
| 100003000030000400 | 1100 |
| 100003000030000001 | 1100 |
| 100003000040000002 | 1101 |
| 100003000040000004 | 1101 |
| 100003000040000010 | 1101 |
| 100003000040000020 | 1101 |

-continued

| Sequence of Code Symbols | x' |
|---|---|
| 100003000040000030 | 1101 |
| 100003000040000040 | 1101 |
| 100003000040000100 | 1110 |
| 100003000040000003 | 1110 |
| 100003000040000000 | 1110 |
| 100003000040000200 | 1111 |
| 100003000040000300 | 1111 |
| 100003000040000400 | 1111 |
| 100003000040000001 | 1111 |
| 400003000003000000 | 1100 |
| 400003000003000003 | 1100 |
| 400003000003000001 | 1100 |
| 400003000003000002 | 1101 |
| 400003000003000004 | 1101 |
| 400003000003000010 | 1101 |
| 400003000003000020 | 1101 |
| 400003000003000030 | 1101 |
| 400003000003000040 | 1101 |
| 400003000002000000 | 0000 |
| 400003000002000003 | 0000 |
| 400003000002000001 | 0000 |
| 400003000002000002 | 0001 |
| 400003000002000004 | 0001 |
| 400003000002000010 | 0001 |
| 400003000002000020 | 0001 |
| 400003000002000030 | 0001 |
| 400003000002000040 | 0001 |
| 400003000004000000 | 0010 |
| 400003000004000003 | 0010 |
| 400003000004000001 | 0010 |
| 400003000004000002 | 0011 |
| 400003000004000004 | 0011 |
| 400003000004000010 | 0011 |
| 400003000004000020 | 0011 |
| 400003000004000030 | 0011 |
| 400003000004000040 | 0011 |
| 400003000020000002 | 0111 |
| 400003000020000004 | 0111 |
| 400003000020000010 | 0111 |
| 400003000020000020 | 0111 |
| 400003000020000030 | 0111 |
| 400003000020000040 | 0111 |
| 400003000020000100 | 1000 |
| 400003000020000003 | 1000 |
| 400003000020000000 | 1000 |
| 400003000020000200 | 1001 |
| 400003000020000300 | 1001 |
| 400003000020000400 | 1001 |
| 400003000020000001 | 1001 |
| 400003000030000100 | 1011 |
| 400003000030000003 | 1011 |
| 400003000030000000 | 1011 |
| 400003000030000200 | 1100 |
| 400003000030000300 | 1100 |
| 400003000030000400 | 1100 |
| 400003000030000001 | 1100 |
| 400003000040000002 | 1101 |
| 400003000040000004 | 1101 |
| 400003000040000010 | 1101 |
| 400003000040000020 | 1101 |
| 400003000040000030 | 1101 |
| 400003000040000040 | 1101 |
| 400003000040000100 | 1110 |
| 400003000040000003 | 1110 |
| 400003000040000000 | 1110 |
| 400003000040000200 | 1111 |
| 400003000040000300 | 1111 |
| 400003000040000400 | 1111 |
| 400003000040000001 | 1111 |
| 010000000020000002 | 0010 |
| 010000000020000004 | 0010 |
| 010000000020000010 | 0010 |
| 010000000020000020 | 0010 |
| 010000000020000030 | 0010 |
| 010000000020000040 | 0010 |
| 010000000020000100 | 0011 |
| 010000000020000003 | 0011 |
| 010000000020000000 | 0011 |

-continued

| Sequence of Code Symbols | x' |
|---|---|
| 01000000020000200 | 0100 |
| 01000000020000300 | 0100 |
| 01000000020000400 | 0100 |
| 01000000020000001 | 0100 |
| 01000000040000002 | 1010 |
| 01000000040000004 | 1010 |
| 01000000040000010 | 1010 |
| 01000000040000020 | 1010 |
| 01000000040000030 | 1010 |
| 01000000040000040 | 1010 |
| 01000000040000100 | 1011 |
| 01000000040000003 | 1011 |
| 01000000040000000 | 1011 |
| 01000000040000200 | 1100 |
| 01000000040000300 | 1100 |
| 01000000040000400 | 1100 |
| 01000000040000001 | 1100 |
| 01000000200000002 | 0010 |
| 01000000200000004 | 0010 |
| 01000000200000010 | 0010 |
| 01000000200000020 | 0010 |
| 01000000200000030 | 0010 |
| 01000000200000040 | 0010 |
| 01000000200000100 | 0011 |
| 01000000200000003 | 0011 |
| 01000000200000000 | 0011 |
| 01000000200000200 | 0100 |
| 01000000200000300 | 0100 |
| 01000000200000400 | 0100 |
| 01000000200000001 | 0100 |
| 01000000200001000 | 0101 |
| 01000000200003000 | 0101 |
| 01000000200002000 | 0110 |
| 01000000200004000 | 0110 |
| 01000000400000002 | 1001 |
| 01000000400000004 | 1001 |
| 01000000400000010 | 1001 |
| 01000000400000020 | 1001 |
| 01000000400000030 | 1001 |
| 01000000400000040 | 1001 |
| 01000000400000100 | 1010 |
| 01000000400000003 | 1010 |
| 01000000400000000 | 1010 |
| 01000000400000200 | 1011 |
| 01000000400000300 | 1011 |
| 01000000400000400 | 1011 |
| 01000000400000001 | 1011 |
| 01000000400001000 | 1100 |
| 01000000400003000 | 1100 |
| 01000000400002000 | 1101 |
| 01000000400004000 | 1101 |
| 01000000030000100 | 1110 |
| 01000000030000003 | 1110 |
| 01000000030000000 | 1110 |
| 01000000030000200 | 1111 |
| 01000000030000300 | 1111 |
| 01000000030000400 | 1111 |
| 01000000030000001 | 1111 |
| 10000200003000000 | 1100 |
| 10000200003000003 | 1100 |
| 10000200003000001 | 1100 |
| 10000200003000002 | 1101 |
| 10000200003000004 | 1101 |
| 10000200003000010 | 1101 |
| 10000200003000020 | 1101 |
| 10000200003000030 | 1101 |
| 10000200003000040 | 1101 |
| 10000200002000000 | 0000 |
| 10000200002000003 | 0000 |
| 10000200002000001 | 0000 |
| 10000200002000002 | 0001 |
| 10000200002000004 | 0001 |
| 10000200002000010 | 0001 |
| 10000200002000020 | 0001 |
| 10000200002000030 | 0001 |
| 10000200002000040 | 0001 |
| 10000200004000000 | 0010 |
| 10000200004000003 | 0010 |

-continued

| Sequence of Code Symbols | x' |
|---|---|
| 10000200004000001 | 0010 |
| 10000200004000002 | 0011 |
| 10000200004000004 | 0011 |
| 10000200004000010 | 0011 |
| 10000200004000020 | 0011 |
| 10000200004000030 | 0011 |
| 10000200004000040 | 0011 |
| 10000200020000002 | 0111 |
| 10000200020000004 | 0111 |
| 10000200020000010 | 0111 |
| 10000200020000020 | 0111 |
| 10000200020000030 | 0111 |
| 10000200020000040 | 0111 |
| 10000200020000100 | 1000 |
| 10000200020000003 | 1000 |
| 10000200020000000 | 1000 |
| 10000200020000200 | 1001 |
| 10000200020000300 | 1001 |
| 10000200020000400 | 1001 |
| 10000200020000001 | 1001 |
| 10000200030000100 | 1011 |
| 10000200030000003 | 1011 |
| 10000200030000000 | 1013 |
| 10000200030000200 | 1100 |
| 10000200030000300 | 1100 |
| 10000200030000400 | 1100 |
| 10000200030000001 | 1100 |
| 10000200040000002 | 1101 |
| 10000200040000004 | 1101 |
| 10000200040000010 | 1101 |
| 10000200040000020 | 1101 |
| 10000200040000030 | 1101 |
| 10000200040000040 | 1101 |
| 10000200040000100 | 1110 |
| 10000200040000003 | 1110 |
| 10000200040000000 | 1110 |
| 10000200040000200 | 1111 |
| 10000200040000300 | 1111 |
| 10000200040000400 | 1111 |
| 10000200040000001 | 1111 |
| 40000400003000000 | 1100 |
| 40000400003000003 | 1100 |
| 40000400003000001 | 1100 |
| 40000400003000002 | 1101 |
| 40000400003000004 | 1101 |
| 40000400003000010 | 1101 |
| 40000400003000020 | 1101 |
| 40000400003000030 | 1101 |
| 40000400003000040 | 1101 |
| 40000400002000000 | 0000 |
| 40000400002000003 | 0000 |
| 40000400002000001 | 0000 |
| 40000400002000002 | 0001 |
| 40000400002000004 | 0001 |
| 40000400002000010 | 0001 |
| 40000400002000020 | 0001 |
| 40000400002000030 | 0001 |
| 40000400002000040 | 0001 |
| 40000400004000000 | 0010 |
| 40000400004000003 | 0010 |
| 40000400004000001 | 0010 |
| 40000400004000002 | 0011 |
| 40000400004000004 | 0011 |
| 40000400004000010 | 0011 |
| 40000400004000020 | 0011 |
| 40000400004000030 | 0011 |
| 40000400004000040 | 0011 |
| 40000400020000002 | 0111 |
| 40000400020000004 | 0111 |
| 40000400020000010 | 0111 |
| 40000400020000020 | 0111 |
| 40000400020000030 | 0111 |
| 40000400020000040 | 0111 |
| 40000400020000100 | 1000 |
| 40000400020000003 | 1000 |
| 40000400020000000 | 1000 |
| 40000400020000200 | 1001 |
| 40000400020000300 | 1001 |

-continued

| Sequence of Code Symbols | x' |
|---|---|
| 400004000020000400 | 1001 |
| 400004000020000001 | 1001 |
| 400004000030000100 | 1011 |
| 400004000030000003 | 1011 |
| 400004000030000000 | 1011 |
| 400004000030000200 | 1100 |
| 400004000030000300 | 1100 |
| 400004000030000400 | 1100 |
| 400004000030000001 | 1100 |
| 400004000040000002 | 1101 |
| 400004000040000004 | 1101 |
| 400004000040000010 | 1101 |
| 400004000040000020 | 1101 |
| 400004000040000030 | 1101 |
| 400004000040000040 | 1101 |
| 400004000040000100 | 1110 |
| 400004000040000003 | 1110 |
| 400004000040000000 | 1110 |
| 400004000040000200 | 1111 |
| 400004000040000300 | 1111 |
| 400004000040000400 | 1111 |
| 400004000040000001 | 1111 |
| 000030000003000000 | 0001 |
| 000030000003000003 | 0001 |
| 000030000003000001 | 0001 |
| 000030000200000002 | 0000 |
| 000030000200000004 | 0000 |
| 000030000200000010 | 0000 |
| 000030000200000020 | 0000 |
| 000030000200000030 | 0000 |
| 000030000200000040 | 0000 |
| 000030000200000100 | 0001 |
| 000030000200000003 | 0001 |
| 000030000200000000 | 0001 |
| 000030000200000200 | 0010 |
| 000030000200000300 | 0010 |
| 000030000200000400 | 0010 |
| 000030000200000001 | 0010 |
| 000030000200001000 | 0011 |
| 000030000200003000 | 0011 |
| 000030000200002000 | 0100 |
| 000030000200004000 | 0100 |
| 000030000400000002 | 1010 |
| 000030000400000004 | 1010 |
| 000030000400000010 | 1010 |
| 000030000400000020 | 1010 |
| 000030000400000030 | 1010 |
| 000030000400000040 | 1010 |
| 000030000400000100 | 1011 |
| 000030000400000003 | 1011 |
| 000030000400000000 | 1011 |
| 000030000400000200 | 1100 |
| 000030000400000300 | 1100 |
| 000030000400000400 | 1100 |
| 000030000400000001 | 1100 |
| 000030000400001000 | 1101 |
| 000030000400003000 | 1101 |
| 000010000002000000 | 0000 |
| 000010000002000003 | 0000 |
| 000010000002000001 | 0000 |
| 000010000002000002 | 0001 |
| 000010000002000004 | 0001 |
| 000010000002000010 | 0001 |
| 000010000002000020 | 0001 |
| 000010000002000030 | 0001 |
| 000010000002000040 | 0001 |
| 000010000004000000 | 0010 |
| 000010000004000003 | 0010 |
| 000010000004000001 | 0010 |
| 000010000004000002 | 0011 |
| 000010000004000004 | 0011 |
| 000010000004000010 | 0011 |
| 000010000004000020 | 0011 |
| 000010000004000030 | 0011 |
| 000010000004000040 | 0011 |
| 000010000020000002 | 0111 |
| 000010000020000004 | 0111 |
| 000010000020000010 | 0111 |

-continued

| Sequence of Code Symbols | x' |
|---|---|
| 000010000020000020 | 0111 |
| 000010000020000030 | 0111 |
| 000010000020000040 | 0111 |
| 000010000020000100 | 1000 |
| 000010000020000003 | 1000 |
| 000010000020000000 | 1000 |
| 000010000020000200 | 1001 |
| 000010000020000300 | 1001 |
| 000010000020000400 | 1001 |
| 000010000020000001 | 1001 |
| 000010000030000100 | 1011 |
| 000010000030000003 | 1011 |
| 000010000030000000 | 1011 |
| 000010000030000200 | 1100 |
| 000010000030000300 | 1100 |
| 000010000030000400 | 1100 |
| 000010000030000001 | 1100 |
| 000010000040000002 | 1101 |
| 000010000040000004 | 1101 |
| 000010000040000010 | 1101 |
| 000010000040000020 | 1101 |
| 000010000040000030 | 1101 |
| 000010000040000040 | 1101 |
| 000010000040000100 | 1110 |
| 000010000040000003 | 1110 |
| 000010000040000000 | 1110 |
| 000010000040000200 | 1111 |
| 000010000040000300 | 1111 |
| 000010000040000400 | 1111 |
| 000010000040000001 | 1111 |
| 000010000003000000 | 0001 |
| 000010000003000003 | 0001 |
| 000010000003000001 | 0001 |
| 000010000200000002 | 0000 |
| 000010000200000004 | 0000 |
| 000010000200000010 | 0000 |
| 000010000200000020 | 0000 |
| 000010000200000030 | 0000 |
| 000010000200000040 | 0000 |
| 000010000200000100 | 0001 |
| 000010000200000003 | 0001 |
| 000010000200000000 | 0001 |
| 000010000200000200 | 0010 |
| 000010000200000300 | 0010 |
| 000010000200000400 | 0010 |
| 000010000200000001 | 0010 |
| 000010000200001000 | 0011 |
| 000010000200003000 | 0011 |
| 000010000200002000 | 0100 |
| 000010000200004000 | 0100 |
| 000010000400000002 | 1010 |
| 000010000400000004 | 1010 |
| 000010000400000010 | 1010 |
| 000010000400000020 | 1010 |
| 000010000400000030 | 1010 |
| 000010000400000040 | 1010 |
| 000010000400000100 | 1011 |
| 000010000400000003 | 1011 |
| 000010000400000000 | 1011 |
| 000010000400000200 | 1100 |
| 000010000400000300 | 1100 |
| 000010000400000400 | 1100 |
| 000010000400000001 | 1100 |
| 000010000400001000 | 1101 |
| 000010000400003000 | 1101 |
| 000030000002000000 | 0000 |
| 000030000002000003 | 0000 |
| 000030000002000001 | 0000 |
| 000030000002000002 | 0001 |
| 000030000002000004 | 0001 |
| 000030000002000010 | 0001 |
| 000030000002000020 | 0001 |
| 000030000002000030 | 0001 |
| 000030000002000040 | 0001 |
| 000030000004000000 | 0010 |
| 000030000004000003 | 0010 |
| 000030000004000001 | 0010 |
| 000030000004000002 | 0011 |

-continued

| Sequence of Code Symbols | x' |
|---|---|
| 000030000004000004 | 0011 |
| 000030000004000010 | 0011 |
| 000030000004000020 | 0011 |
| 000030000004000030 | 0011 |
| 000030000004000040 | 0011 |
| 000030000020000002 | 0111 |
| 000030000020000004 | 0111 |
| 000030000020000010 | 0111 |
| 000030000020000020 | 0111 |
| 000030000020000030 | 0111 |
| 000030000020000040 | 0111 |
| 000030000020000100 | 1000 |
| 000030000020000003 | 1000 |
| 000030000020000000 | 1000 |
| 000030000020000200 | 1001 |
| 000030000020000300 | 1001 |
| 000030000020000400 | 1001 |
| 000030000020000001 | 1001 |
| 000030000030000100 | 1011 |
| 000030000030000003 | 1011 |
| 000030000030000000 | 1011 |
| 000030000030000200 | 1100 |
| 000030000030000300 | 1100 |
| 000030000030000400 | 1100 |
| 000030000030000001 | 1100 |
| 000030000040000002 | 1101 |
| 000030000040000004 | 1101 |
| 000030000040000010 | 1101 |
| 000030000040000020 | 1101 |
| 000030000040000030 | 1101 |
| 000030000040000040 | 1101 |
| 000030000040000100 | 1110 |
| 000030000040000003 | 1110 |
| 000030000040000000 | 1110 |
| 000030000040000200 | 1111 |
| 000030000040000300 | 1111 |
| 000030000040000400 | 1111 |
| 000030000040000001 | 1111 |
| 040000000020000002 | 0010 |
| 040000000020000004 | 0010 |
| 040000000020000010 | 0010 |
| 040000000020000020 | 0010 |
| 040000000020000030 | 0010 |
| 040000000020000040 | 0010 |
| 040000000020000100 | 0011 |
| 040000000020000003 | 0011 |
| 040000000020000000 | 0011 |
| 040000000020000200 | 0100 |
| 040000000020000300 | 0100 |
| 040000000020000400 | 0100 |
| 040000000020000001 | 0100 |
| 040000000040000002 | 1010 |
| 040000000040000004 | 1010 |
| 040000000040000010 | 1010 |
| 040000000040000020 | 1010 |
| 040000000040000030 | 1010 |
| 040000000040000040 | 1010 |
| 040000000040000100 | 1011 |
| 040000000040000003 | 1011 |
| 040000000040000000 | 1031 |
| 040000000040000200 | 1100 |
| 040000000040000300 | 1100 |
| 040000000040000400 | 1100 |
| 040000000040000001 | 1100 |
| 040000000200000002 | 0010 |
| 040000000200000004 | 0010 |
| 040000000200000010 | 0010 |
| 040000000200000020 | 0010 |
| 040000000200000030 | 0010 |
| 040000000200000040 | 0010 |
| 040000000200000100 | 0011 |
| 040000000200000003 | 0011 |
| 040000000200000000 | 0011 |
| 040000000200000200 | 0100 |
| 040000000200000300 | 0100 |
| 040000000200000400 | 0100 |
| 040000000200000001 | 0100 |
| 040000000200001000 | 0101 |

-continued

| Sequence of Code Symbols | x' |
|---|---|
| 040000000200003000 | 0101 |
| 040000000200002000 | 0110 |
| 040000000200004000 | 0110 |
| 040000000400000002 | 1001 |
| 040000000400000004 | 1001 |
| 040000000400000010 | 1001 |
| 040000000400000020 | 1001 |
| 040000000400000030 | 1001 |
| 040000000400000040 | 1001 |
| 040000000400000100 | 1010 |
| 040000000400000003 | 1010 |
| 040000000400000000 | 1010 |
| 040000000400000200 | 1011 |
| 040000000400000300 | 1011 |
| 040000000400000400 | 1011 |
| 040000000400000001 | 1011 |
| 040000000400001000 | 1100 |
| 040000000400003000 | 1100 |
| 040000000400002000 | 1101 |
| 040000000400004000 | 1101 |
| 040000000030000100 | 1110 |
| 040000000030000003 | 1110 |
| 040000000030000000 | 1110 |
| 040000000030000200 | 1111 |
| 040000000030000300 | 1111 |
| 040000000030000400 | 1111 |
| 040000000030000001 | 1111 |
| 000003000003000000 | 1100 |
| 000003000003000003 | 1100 |
| 000003000003000001 | 1100 |
| 000003000003000002 | 1101 |
| 000003000003000004 | 1101 |
| 000003000003000010 | 1101 |
| 000003000003000020 | 1101 |
| 000003000003000030 | 1101 |
| 000003000003000040 | 1101 |
| 000003000002000000 | 0000 |
| 000003000002000003 | 0000 |
| 000003000002000001 | 0000 |
| 000003000002000002 | 0001 |
| 000003000002000004 | 0001 |
| 000003000002000010 | 0001 |
| 000003000002000020 | 0001 |
| 000003000002000030 | 0001 |
| 000003000002000040 | 0001 |
| 000003000004000000 | 0010 |
| 000003000004000003 | 0010 |
| 000003000004000001 | 0010 |
| 000003000004000002 | 0011 |
| 000003000004000004 | 0011 |
| 000003000004000010 | 0011 |
| 000003000004000020 | 0011 |
| 000003000004000030 | 0011 |
| 000003000004000040 | 0011 |
| 000003000020000002 | 0111 |
| 000003000020000004 | 0111 |
| 000003000020000010 | 0111 |
| 000003000020000020 | 0111 |
| 000003000020000030 | 0111 |
| 000003000020000040 | 0111 |
| 000003000020000100 | 1000 |
| 000003000020000003 | 1000 |
| 000003000020000000 | 1000 |
| 000003000020000200 | 1001 |
| 000003000020000300 | 1001 |
| 000003000020000400 | 1001 |
| 000003000020000001 | 1001 |
| 000003000030000100 | 1011 |
| 000003000030000003 | 1011 |
| 000003000030000000 | 1011 |
| 000003000030000200 | 1100 |
| 000003000030000300 | 1100 |
| 000003000030000400 | 1100 |
| 000003000030000001 | 1100 |
| 000003000040000002 | 1101 |
| 000003000040000004 | 1101 |
| 000003000040000010 | 1101 |
| 000003000040000020 | 1101 |

-continued

| Sequence of Code Symbols | x' |
|---|---|
| 000003000040000030 | 1101 |
| 000003000040000040 | 1101 |
| 000003000040000100 | 1110 |
| 000003000040000003 | 1110 |
| 000003000040000000 | 1110 |
| 000003000040000200 | 1111 |
| 000003000040000300 | 1111 |
| 000003000040000400 | 1111 |
| 000003000040000001 | 1111 |
| 000001000003000000 | 1100 |
| 000001000003000003 | 1100 |
| 000001000003000001 | 1100 |
| 000001000003000002 | 1101 |
| 000001000003000004 | 1101 |
| 000001000003000010 | 1101 |
| 000001000003000020 | 1101 |
| 000001000003000030 | 1101 |
| 000001000003000040 | 1101 |
| 000001000002000000 | 0000 |
| 000001000002000003 | 0000 |
| 000001000002000001 | 0000 |
| 000001000002000002 | 0001 |
| 000001000002000004 | 0001 |
| 000001000002000010 | 0001 |
| 000001000002000020 | 0001 |
| 000001000002000030 | 0001 |
| 000001000002000040 | 0001 |
| 000001000004000000 | 0010 |
| 000001000004000003 | 0010 |
| 000001000004000001 | 0010 |
| 000001000004000002 | 0013 |
| 000001000004000004 | 0011 |
| 000001000004000010 | 0011 |
| 000001000004000020 | 0011 |
| 000001000004000030 | 0011 |
| 000001000004000040 | 0011 |
| 000001000020000002 | 0111 |
| 000001000020000004 | 0111 |
| 000001000020000010 | 0111 |
| 00000&000020000020 | 0111 |
| 000001000020000030 | 0111 |
| 000001000020000040 | 0111 |
| 000001000020000100 | 1000 |
| 000001000020000003 | 1000 |
| 000001000020000000 | 1000 |
| 000001000020000200 | 1001 |
| 000001000020000300 | 1001 |
| 000001000020000400 | 1001 |
| 000001000020000001 | 1001 |
| 000001000030000100 | 1011 |
| 000001000030000003 | 1011 |
| 000001000030000000 | 1011 |
| 000001000030000200 | 1100 |
| 000001000030000300 | 1100 |
| 000001000030000400 | 1100 |
| 000001000030000001 | 1100 |
| 000001000040000002 | 1101 |
| 000001000040000004 | 1101 |
| 000001000040000010 | 1101 |
| 000001000040000020 | 1101 |
| 000001000040000030 | 1101 |
| 000001000040000040 | 1101 |
| 000001000040000100 | 1110 |
| 000001000040000003 | 1110 |
| 000001000040000000 | 1110 |
| 000001000040000200 | 1111 |
| 000001000040000300 | 1111 |
| 000001000040000400 | 1111 |
| 000001000040000001 | 1111 |
| 030000000020000002 | 0010 |
| 030000000020000004 | 0010 |
| 030000000020000010 | 0010 |
| 030000000020000020 | 0010 |
| 030000000020000030 | 0010 |
| 030000000020000040 | 0010 |
| 030000000020000100 | 0011 |
| 030000000020000003 | 0011 |
| 030000000020000000 | 0011 |

-continued

| Sequence of Code Symbols | x' |
|---|---|
| 030000000020000200 | 0100 |
| 030000000020000300 | 0100 |
| 030000000020000400 | 0100 |
| 030000000020000001 | 0100 |
| 030000000040000002 | 1010 |
| 030000000040000004 | 1010 |
| 030000000040000010 | 1010 |
| 030000000040000020 | 1010 |
| 030000000040000030 | 1010 |
| 030000000040000040 | 1010 |
| 030000000040000100 | 1011 |
| 030000000040000003 | 1011 |
| 030000000040000000 | 1011 |
| 030000000040000200 | 1100 |
| 030000000040000300 | 1100 |
| 030000000040000400 | 1100 |
| 030000000040000001 | 1100 |
| 030000000200000002 | 0010 |
| 030000000200000004 | 0010 |
| 030000000200000010 | 0010 |
| 030000000200000020 | 0010 |
| 030000000200000030 | 0010 |
| 030000000200000040 | 0010 |
| 030000000200000100 | 0011 |
| 030000000200000003 | 0011 |
| 030000000200000000 | 0011 |
| 030000000200000200 | 0100 |
| 030000000200000300 | 0100 |
| 030000000200000400 | 0100 |
| 030000000200000001 | 0100 |
| 030000000200001000 | 0101 |
| 030000000200003000 | 0101 |
| 030000000200002000 | 0110 |
| 030000000200004000 | 0110 |
| 030000000400000002 | 1001 |
| 030000000400000004 | 1001 |
| 030000000400000010 | 1001 |
| 030000000400000020 | 1001 |
| 030000000400000030 | 1001 |
| 030000000400000040 | 1001 |
| 030000000400000100 | 1010 |
| 030000000400000003 | 1010 |
| 030000000400000000 | 1010 |
| 030000000400000200 | 1011 |
| 030000000400000300 | 1011 |
| 030000000400000400 | 1011 |
| 030000000400000001 | 1011 |
| 030000000400001000 | 1100 |
| 030000000400003000 | 1100 |
| 030000000400002000 | 1101 |
| 030000000400004000 | 1101 |
| 030000000030000100 | 1110 |
| 030000000030000003 | 1110 |
| 030000000030000000 | 1110 |
| 030000000030000200 | 1111 |
| 030000000030000300 | 1111 |
| 030000000030000400 | 1111 |
| 030000000030000001 | 1111 |
| 000002000003000000 | 1100 |
| 000002000003000003 | 1100 |
| 000002000003000001 | 1100 |
| 000002000003000002 | 1101 |
| 000002000003000004 | 1101 |
| 000002000003000010 | 1101 |
| 000002000003000020 | 1101 |
| 000002000003000030 | 1101 |
| 000002000003000040 | 1101 |
| 000002000002000000 | 0000 |
| 000002000002000003 | 0000 |
| 000002000002000001 | 0000 |
| 000002000002000002 | 0001 |
| 000002000002000004 | 0001 |
| 000002000002000010 | 0001 |
| 000002000002000020 | 0001 |
| 000002000002000030 | 0001 |
| 000002000002000040 | 0001 |
| 000002000004000000 | 0010 |
| 000002000004000003 | 0010 |

-continued

| Sequence of Code Symbols | x' |
|---|---|
| 000002000004000001 | 0010 |
| 000002000004000002 | 0011 |
| 000002000004000004 | 0011 |
| 000002000004000010 | 0011 |
| 000002000004000020 | 0011 |
| 000002000004000030 | 0011 |
| 000002000004000040 | 0011 |
| 000002000020000002 | 0111 |
| 000002000020000004 | 0111 |
| 000002000020000010 | 0111 |
| 000002000020000020 | 0111 |
| 000002000020000030 | 0111 |
| 000002000020000040 | 0111 |
| 000002000020000100 | 1000 |
| 000002000020000003 | 1000 |
| 000002000020000000 | 1000 |
| 000002000020000200 | 1001 |
| 000002000020000300 | 1001 |
| 000002000020000400 | 1001 |
| 000002000020000001 | 1001 |
| 000002000030000100 | 1011 |
| 000002000030000003 | 1011 |
| 000002000030000000 | 1011 |
| 000002000030000200 | 1100 |
| 000002000030000300 | 1100 |
| 000002000030000400 | 1100 |
| 000002000030000001 | 1100 |
| 000002000040000002 | 1101 |
| 000002000040000004 | 1101 |
| 000002000040000010 | 1101 |
| 000002000040000020 | 1101 |
| 000002000040000030 | 1101 |
| 000002000040000040 | 1101 |
| 000002000040000100 | 1110 |
| 000002000040000003 | 1110 |
| 000002000040000000 | 1110 |
| 000002000040000200 | 1111 |
| 000002000040000300 | 1111 |
| 000002000040000400 | 1111 |
| 000002000040000001 | 1111 |
| 000004000003000000 | 1100 |
| 000004000003000003 | 1100 |
| 000004000003000001 | 1100 |
| 000004000003000002 | 1101 |
| 000004000003000004 | 1101 |
| 000004000003000010 | 1101 |
| 000004000003000020 | 1101 |
| 000004000003000030 | 1101 |
| 000004000003000040 | 1101 |
| 000004000002000000 | 0000 |
| 000004000002000003 | 0000 |
| 000004000002000001 | 0000 |
| 000004000002000002 | 0001 |
| 000004000002000004 | 0001 |
| 000004000002000010 | 0001 |
| 000004000002000020 | 0001 |
| 000004000002000030 | 0001 |
| 000004000002000040 | 0001 |
| 000004000004000000 | 0010 |
| 000004000004000003 | 0010 |
| 000004000004000001 | 0010 |
| 000004000004000002 | 0011 |
| 000004000004000004 | 0011 |
| 000004000004000010 | 0011 |
| 000004000004000020 | 0011 |
| 000004000004000030 | 0011 |
| 000004000004000040 | 0011 |
| 000004000020000002 | 0111 |
| 000004000020000004 | 0111 |
| 000004000020000010 | 0111 |
| 000004000020000020 | 0111 |
| 000004000020000030 | 0111 |
| 000004000020000040 | 0111 |
| 000004000020000100 | 1000 |
| 000004000020000003 | 1000 |
| 000004000020000000 | 1000 |
| 000004000020000200 | 1001 |
| 000004000020000300 | 1001 |

-continued

| Sequence of Code Symbols | x' |
|---|---|
| 000004000020000400 | 1001 |
| 000004000020000001 | 1001 |
| 000004000030000100 | 1011 |
| 000004000030000003 | 1011 |
| 000004000030000000 | 1011 |
| 000004000030000200 | 1100 |
| 000004000030000300 | 1100 |
| 000004000030000400 | 1100 |
| 000004000030000001 | 1100 |
| 000004000040000002 | 1101 |
| 000004000040000004 | 1101 |
| 000004000040000010 | 1101 |
| 000004000040000020 | 1101 |
| 000004000040000030 | 1101 |
| 000004000040000040 | 1101 |
| 000004000040000100 | 1110 |
| 000004000040000003 | 1110 |
| 000004000040000000 | 1110 |
| 000004000040000200 | 1111 |
| 000004000040000300 | 1111 |
| 000004000040000400 | 1111 |
| 000004000040000001 | 1111 |
| 020000000020000002 | 0010 |
| 020000000020000004 | 0010 |
| 020000000020000010 | 0010 |
| 020000000020000020 | 0010 |
| 020000000020000030 | 0010 |
| 020000000020000040 | 0010 |
| 020000000020000100 | 0011 |
| 020000000020000003 | 0011 |
| 020000000020000000 | 0011 |
| 020000000020000200 | 0100 |
| 020000000020000300 | 0100 |
| 020000000020000400 | 0100 |
| 020000000020000001 | 0100 |
| 020000000040000002 | 1010 |
| 020000000040000004 | 1010 |
| 020000000040000010 | 1010 |
| 020000000040000020 | 1010 |
| 020000000040000030 | 1010 |
| 020000000040000040 | 1010 |
| 020000000040000100 | 1011 |
| 020000000040000003 | 1011 |
| 020000000040000000 | 1011 |
| 020000000040000200 | 1100 |
| 020000000040000300 | 1100 |
| 020000000040000400 | 1100 |
| 020000000040000001 | 1100 |
| 020000000200000002 | 0010 |
| 020000000200000004 | 0010 |
| 020000000200000010 | 0010 |
| 020000000200000020 | 0010 |
| 020000000200000030 | 0010 |
| 020000000200000040 | 0010 |
| 020000000200000100 | 0011 |
| 020000000200000003 | 0011 |
| 020000000200000000 | 0011 |
| 020000000200000200 | 0100 |
| 020000000200000300 | 0100 |
| 020000000200000400 | 0100 |
| 020000000200000001 | 0100 |
| 020000000200001000 | 0101 |
| 020000000200003000 | 0101 |
| 020000000200002000 | 0110 |
| 020000000200004000 | 0110 |
| 020000000400000002 | 1001 |
| 020000000400000004 | 1001 |
| 020000000400000010 | 1001 |
| 020000000400000020 | 1001 |
| 020000000400000030 | 1001 |
| 020000000400000040 | 1001 |
| 020000000400000100 | 1010 |
| 020000000400000003 | 1010 |
| 020000000400000000 | 1010 |
| 020000000400000200 | 1011 |
| 020000000400000300 | 1011 |
| 020000000400000400 | 1011 |
| 020000000400000001 | 1011 |

-continued

| Sequence of Code Symbols | x' |
|---|---|
| 020000000400001000 | 1100 |
| 020000000400003000 | 1100 |
| 020000000400002000 | 1101 |
| 020000000400004000 | 1101 |
| 020000000030000100 | 1110 |
| 020000000030000003 | 1110 |
| 020000000030000000 | 1110 |
| 020000000030000200 | 1111 |
| 020000000030000300 | 1111 |
| 020000000030000400 | 1111 |
| 020000000030000001 | 1111 |
| 000200000002000000 | 0000 |
| 000200000002000003 | 0000 |
| 000200000002000001 | 0000 |
| 000200000002000002 | 0001 |
| 000200000002000004 | 0001 |
| 000200000002000010 | 0001 |
| 000200000002000020 | 0001 |
| 000200000002000030 | 0001 |
| 000200000002000040 | 0001 |
| 000200000004000000 | 0010 |
| 000200000004000003 | 0010 |
| 000200000004000001 | 0010 |
| 000200000004000002 | 0011 |
| 000200000004000004 | 0011 |
| 000200000004000010 | 0011 |
| 000200000004000020 | 0011 |
| 000200000004000030 | 0011 |
| 000200000004000040 | 0011 |
| 000200000020000002 | 0111 |
| 000200000020000004 | 0111 |
| 000200000020000010 | 0111 |
| 000200000020000020 | 0111 |
| 000200000020000030 | 0111 |
| 000200000020000040 | 0111 |
| 000200000020000100 | 1000 |
| 000200000020000003 | 1000 |
| 000200000020000000 | 1000 |
| 000200000020000200 | 1001 |
| 000200000020000300 | 1001 |
| 000200000020000400 | 1001 |
| 000200000020000001 | 1001 |
| 000200000030000100 | 1011 |
| 000200000030000003 | 1011 |
| 000200000030000000 | 1011 |
| 000200000030000200 | 1100 |
| 000200000030000300 | 1100 |
| 000200000030000400 | 1100 |
| 000200000030000001 | 1100 |
| 000200000040000002 | 1101 |
| 000200000040000004 | 1101 |
| 000200000040000010 | 1101 |
| 000200000040000020 | 1101 |
| 000200000040000030 | 1101 |
| 000200000040000040 | 1101 |
| 000200000040000100 | 1110 |
| 000200000040000003 | 1110 |
| 000200000040000000 | 1110 |
| 000200000040000200 | 1111 |
| 000200000040000300 | 1111 |
| 000200000040000400 | 1111 |
| 000200000040000001 | 1111 |
| 000200000003000000 | 0001 |
| 000200000003000003 | 0001 |
| 000200000003000001 | 0001 |
| 000200000200000002 | 0000 |
| 000200000200000004 | 0000 |
| 000200000200000010 | 0000 |
| 000200000200000020 | 0000 |
| 000200000200000030 | 0000 |
| 000200000200000040 | 0000 |
| 000200000200000100 | 0001 |
| 000200000200000003 | 0001 |
| 000200000200000000 | 0001 |
| 000200000200000200 | 0010 |
| 000200000200000300 | 0010 |
| 000200000200000400 | 0010 |
| 000200000200000001 | 0010 |

-continued

| Sequence of Code Symbols | x' |
|---|---|
| 000200000200001000 | 0011 |
| 000200000200003000 | 0011 |
| 000200000200002000 | 0100 |
| 000200000200004000 | 0100 |
| 000200000400000002 | 1010 |
| 000200000400000004 | 1010 |
| 000200000400000010 | 1010 |
| 000200000400000020 | 1010 |
| 000200000400000030 | 1010 |
| 000200000400000040 | 1010 |
| 000200000400000100 | 1011 |
| 000200000400000003 | 1011 |
| 000200000400000000 | 1011 |
| 000200000400000200 | 1100 |
| 000200000400000300 | 1100 |
| 000200000400000400 | 1100 |
| 000200000400000001 | 1100 |
| 000200000400001000 | 1101 |
| 000200000400003000 | 1101 |
| 010000000020000002 | 0010 |
| 010000000020000004 | 0010 |
| 010000000020000010 | 0010 |
| 010000000020000020 | 0010 |
| 010000000020000030 | 0010 |
| 010000000020000040 | 0010 |
| 010000000020000100 | 0011 |
| 010000000020000003 | 0011 |
| 010000000020000000 | 0011 |
| 010000000020000200 | 0100 |
| 010000000020000300 | 0100 |
| 010000000020000400 | 0100 |
| 010000000020000001 | 0100 |
| 010000000040000002 | 1010 |
| 010000000040000004 | 1010 |
| 010000000040000010 | 1010 |
| 010000000040000020 | 1010 |
| 010000000040000030 | 1010 |
| 010000000040000040 | 1010 |
| 010000000040000100 | 1011 |
| 010000000040000003 | 1011 |
| 010000000040000000 | 1011 |
| 010000000040000200 | 1100 |
| 010000000040000300 | 1100 |
| 010000000040000400 | 1100 |
| 010000000040000001 | 1100 |
| 010000000200000002 | 0010 |
| 010000000200000004 | 0010 |
| 010000000200000010 | 0010 |
| 010000000200000020 | 0010 |
| 010000000200000030 | 0010 |
| 010000000200000040 | 0010 |
| 010000000200000100 | 0011 |
| 010000000200000003 | 0011 |
| 010000000200000000 | 0001 |
| 010000000200000200 | 0100 |
| 010000000200000300 | 0100 |
| 010000000200000400 | 0100 |
| 010000000200000001 | 0100 |
| 010000000200003000 | 0101 |
| 010000000200003000 | 0101 |
| 010000000200002000 | 0110 |
| 010000000200004000 | 0110 |
| 010000000400000002 | 1001 |
| 010000000400000004 | 1001 |
| 010000000400000010 | 1001 |
| 010000000400000020 | 1001 |
| 010000000400000030 | 1001 |
| 010000000400000040 | 1001 |
| 010000000400000100 | 1010 |
| 010000000400000003 | 1010 |
| 010000000400000000 | 1010 |
| 010000000400000200 | 1011 |
| 010000000400000300 | 1011 |
| 010000000400000400 | 1011 |
| 010000000400000001 | 1011 |
| 010000000400001000 | 1100 |
| 010000000400003000 | 1100 |
| 010000000400002000 | 1101 |

-continued

| Sequence of Code Symbols | x' |
|---|---|
| 010000000400004000 | 1101 |
| 010000000030000100 | 1110 |
| 010000000030000003 | 1110 |
| 010000000030000000 | 1110 |
| 010000000030000200 | 1111 |
| 010000000030000300 | 1111 |
| 010000000030000400 | 1111 |
| 010000000030000001 | 1111 |
| 000400000002000000 | 0000 |
| 000400000002000003 | 0000 |
| 000400000002000001 | 0000 |
| 000400000002000002 | 0001 |
| 000400000002000004 | 0001 |
| 000400000002000010 | 0001 |
| 000400000002000020 | 0001 |
| 000400000002000030 | 0001 |
| 000400000002000040 | 0001 |
| 000400000004000000 | 0010 |
| 000400000004000003 | 0010 |
| 000400000004000001 | 0010 |
| 000400000004000002 | 0011 |
| 000400000004000004 | 0011 |
| 000400000004000010 | 0011 |
| 000400000004000020 | 0011 |
| 000400000004000030 | 0011 |
| 000400000004000040 | 0011 |
| 000400000020000002 | 0111 |
| 000400000020000004 | 0111 |
| 000400000020000010 | 0111 |
| 000400000020000020 | 0111 |
| 000400000020000030 | 0111 |
| 000400000020000040 | 0111 |
| 000400000020000100 | 1000 |
| 000400000020000003 | 1000 |
| 000400000020000000 | 1000 |
| 000400000020000200 | 1001 |
| 000400000020000300 | 1001 |
| 000400000020000400 | 1001 |
| 000400000020000001 | 1001 |
| 000400000030000100 | 1011 |
| 000400000030000003 | 1011 |
| 000400000030000000 | 1011 |
| 000400000030000200 | 1100 |
| 000400000030000300 | 1100 |
| 000400000030000400 | 1100 |
| 000400000030000001 | 1100 |
| 000400000040000002 | 1101 |
| 000400000040000004 | 1101 |
| 000400000040000010 | 1101 |
| 000400000040000020 | 1101 |

-continued

| Sequence of Code Symbols | x' |
|---|---|
| 000400000040000030 | 1101 |
| 000400000040000040 | 1101 |
| 000400000040000100 | 1110 |
| 000400000040000003 | 1110 |
| 000400000040000000 | 1110 |
| 000400000040000200 | 1111 |
| 000400000040000300 | 1111 |
| 000400000040000400 | 1111 |
| 000400000040000001 | 1111 |
| 000400000003000000 | 0001 |
| 000400000003000003 | 0001 |
| 000400000003000001 | 0001 |
| 000400000200000002 | 0000 |
| 000400000200000004 | 0000 |
| 000400000200000010 | 0000 |
| 000400000200000020 | 0000 |
| 000400000200000030 | 0000 |
| 000400000200000040 | 0000 |
| 000400000200000100 | 0001 |
| 000400000200000003 | 0001 |
| 000400000200000000 | 0001 |
| 000400000200000200 | 0010 |
| 000400000200000300 | 0010 |
| 000400000200000400 | 0010 |
| 000400000200000001 | 0010 |
| 000400000200001000 | 0011 |
| 000400000200003000 | 0011 |
| 000400000200002000 | 0100 |
| 000400000200004000 | 0100 |
| 000400000400000002 | 1010 |
| 000400000400000004 | 1010 |
| 000400000400000010 | 1010 |
| 000400000400000020 | 1010 |
| 000400000400000030 | 1010 |
| 000400000400000040 | 1010 |
| 000400000400000100 | 1011 |
| 000400000400000003 | 1011 |
| 000400000400000000 | 1011 |
| 000400000400000200 | 1100 |
| 000400000400000300 | 1100 |
| 000400000400000400 | 1100 |
| 000400000400000001 | 1100 |
| 000400000400001000 | 1101 |
| 000400000400003000 | 1101 |

* * * * *